United States Patent [19]

Young

[11] Patent Number: 4,815,016

[45] Date of Patent: Mar. 21, 1989

[54] HIGH SPEED LOGICAL CIRCUIT SIMULATOR

[75] Inventor: Pamela J. Young, Duarte, Calif.

[73] Assignee: Unisys Corp., Detroit, Mich.

[21] Appl. No.: 889,132

[22] Filed: Jul. 24, 1986

[51] Int. Cl.[4] .......................... G06F 9/30; G06F 9/44

[52] U.S. Cl. .......................... 364/578; 364/300

[58] Field of Search .............. 364/200, 300, 578, 900; 371/23

[56] References Cited

U.S. PATENT DOCUMENTS 4,306,286 12/1981 Cocke et al. .................... 364/200

4,583,169 4/1986 Cooledge ........................ 364/300

4,590,581 5/1986 Widdoes .......................... 364/578

4,628,471 12/1986 Schuler et al. .................. 364/578

FOREIGN PATENT DOCUMENTS 3221819 2/1984 Fed. Rep. of Germany ........ 371/23

*Primary Examiner*—Felix D. Gruber

*Attorney, Agent, or Firm*—Nathan Cass; Kevin R. Peterson

[57] ABSTRACT

An apparatus and method are provided for automatically converting a bottom-up software representation of a logical circuit design, such as created by a computer aided design (CAD) system, into a behavioral software representation which can be simulated at relatively high speed.

7 Claims, 6 Drawing Sheets

```
M201$YA = A+B+C+D            (1)
M201$YB = A+B+C+D
M201$YC = A'*B'*C'*D'
M201$YD = A'*B'*C'*D'

M291$YA = STATE$M291$M
M291$YD = STATE$M291$M'
M291$YE = STATE$M291$S
M291$YH = STATE$M291$S'
M291$M#STATE = (A*C'*D')+(B*C'*D')        (9)
        +(C*E'* STATE$M291$M)
M291$S#STATE = (C'*D'*STATE$M291$S)           (10)
    +(C*STRATE$M291)+(DXSTATE$M291$M)

M202$YA = A+B
M202$YB = A+B
M202$YC = A'*B'
M202$YD = A'*B'

X201$XA = A+B
X201$ZA = A+B
X201$XB = A'+B'
X201$ZB = A'+B'
```

| ELEMENT | INSTANCE | PIN | NETNAME | I/O | EXT/INT |
|---|---|---|---|---|---|
| M202 | 1 | A | IN1 | IN | EXT |
| M202 | 1 | B | NS1 | IN | INT |
| M202 | 1 | YA | NS2 | OP | INT |
| M202 | 1 | YB | NS4 | OP | INT |
| M202 | 1 | YC | NS5 | OP | INT |
| M202 | 1 | YD | NS6 | OP | |
| M291 | 2 | A | NS2 | IN | INT |
| M291 | 2 | B | IN2 | IN | EXT |
| M291 | 2 | C | VEE | IN | EXT |
| M291 | 2 | D | CLOCK | IN | EXT |
| M291 | 2 | E | RESET | IN | EXT |
| M291 | 2 | YA | NS7 | OP | INT |
| M291 | 2 | YD | NS8 | OP | INT |
| M291 | 2 | YE | NS1 | OP | INT |
| M291 | 2 | YH | NS3 | OP | INT |
| X201 | 3 | A | NS2 | IN | INT |
| X201 | 3 | B | NS1 | IN | INT |
| X201 | 3 | XA | OUT1 | OP | EXT |
| X201 | 3 | ZA | NS9 | OP | INT |
| X201 | 3 | XB | NS10 | OP | INT |
| X201 | 3 | ZB | NS11 | OP | INT |
| X201 | 4 | A | NS4 | IN | INT |
| X201 | 4 | B | NS3 | IN | INT |
| X201 | 4 | XA | NS12 | OP | INT |
| X201 | 4 | ZA | NS13 | OP | INT |
| X201 | 4 | XB | OUT2 | OP | INT |
| X201 | 4 | ZB | NS14 | OP | INT |

Fig. 5

RANK 1 EQUATIONS

NS1 = M291$SQ$2
NS3 = M291$SQ$2

RANK 2 EQUATIONS

NS2 = IN1 + NS1
NS4 = IN1 + NS1

RANK 3 EQUATIONS

OUT1 = NS2 + NS1
OUT2 = NS4 - NS3

M291$MQ$2 = (NS2 * VEE * CLOCK')
+ (IN2 * VEE' * CLOCK')
+ (IN2 * VEE' * CLOCK')

M291$SQ$2 = (VEE' * CLOCK' * M291$SQ$2)
+ (VEE * M291$MQ$2)
+ (CLOCK * M291$MQ$2)

HIGH SPEED LOGICAL CIRCUIT SIMULATOR

BACKGROUND OF THE INVENTION

The present invention relates to improved means and methods for simulating the design and operation of computer logical circuitry.

In recent years, various apparatus and methods have been developed for the purpose of aiding an engineer in the design evaluation and simulation of logical circuitry, such as illustrated for example, in U.S. Pat. No. 4,583,169 and U.S. Pat. No. 4,590,581. However, such approaches do not significantly relieve the heavy burden on the design engineer in designing, simulating and evaluating computer logical circuitry.

An approach which goes significantly further in aiding the design engineer is exemplified by computer-aided engineering systems wherein an engineer is aided in the design of logical circuitry by interacting with a display terminal controlled by the computer. Systems of this type also tyically provide for a software simulation of the designed logical circuits so that their performance can be tested without having to build the actual hardware. A typical computer aided design (CAD) system currently in use is the Mentor IDEA 1000 system commercially available from Mentor Graphics Corporation, Newport Beach, Calif.

The Mentor system provides for the creation by an engineer, using highly sophisticated graphic aids, of a "bottom-up" software representation of a desired logical circuit design whereby "macrocells" form the lowest level in the design structure. In a typical Mentor system up to 440 different macrocells based on MCA2500ECL technology are available for use in designing logical circuits such as, for example, the logical circuits to be provided for a gate array. Using Mentor, an engineer would design logical circuitry for a gate array by interconnecting the inputs and outputs of particular selected ones of these macrocells to provide the various logical functions desired for the array. The Mentor system permits this to be accomplished much more conveniently and expeditiously than would be possible if this were done in the old way, by hand, or by using the teachings of the aforementioned U.S. Pat. No. 4,583,169.

The resulting design connectivity information for the circuitry being designed (for example, a gate array) is stored in the Mentor design data base. Mentor also provides for storage of a Macrocell Library which defines the logical operations provided by each macrocell. Together, these constitute a "bottom-up" software representation of the logical circuitry designed by the engineer using the Mentor system. The Mentor system also provides for simulating the operation of logical circuitry using such a "bottom-up" software representation. However, only a relatively slow simulation is possible using this "bottom-up" software representation because of the relatively large number of processing operations which such a representation requires be performed in order to simulate the required logical functions. This problem is particularly severe where simulation is to be performed for a large number of interconnected Mentor-created logical circuits. As is well known, a slow simulation capability can seriously hamper the development of computer logical circuitry.

SUMMARY OF THE PRESENT INVENTION

A broad object of the present invention is to provide improved means and methods for representing and/or simulating the operation of computer logical circuitry.

A more specific object of the invention is to provide improved means and methods for converting a low order software logical circuit design representation, such as the "bottom-up" logical representation provided by the Mentor system, into a higher order behavioral software representation which can be simulated at much higher speeds.

A further object of the invention is to provide improved means and methods for designing and simulating logic circuitry which permits taking advantage of the features and conveniences of the Mentor system, while at the same time providing for significantly faster simulation speeds.

Another object of the invention is to provide for achieving the above objects in a relatively simple and inexpensive manner.

In a particular preferred embodiment of the invention, a stored bottom-up logical circuit design representation provided by the Mentor system is automatically converted into a stored behavioral software representation which can be simulated at high speed using the simulation capability provided by the Mentor system.

The specific nature of the invention as well as other objects, features, advantages and uses thereof will become evident from the following description of a particular preferred embodiment of the invention along with the accompanying drawings.

BRIEF DESCRIPTION OF THE DRAWINGS

FIG. 3 illustrates the contents of the Macrocell Definition Library M1 stored in the memory 10 in FIG. 1.

FIG. 4 illustrates the contents of the macrocell connectivity data M2 stored in the memory 10 in FIG. 1.

FIG. 5 illustrates the contents of the behavioral software representation M3 produced by the converter 15 in FIG. 1 in response to M1 and M2.

DETAILED DESCRIPTION OF A PREFERRED EMBODIMENT

Figure 1:
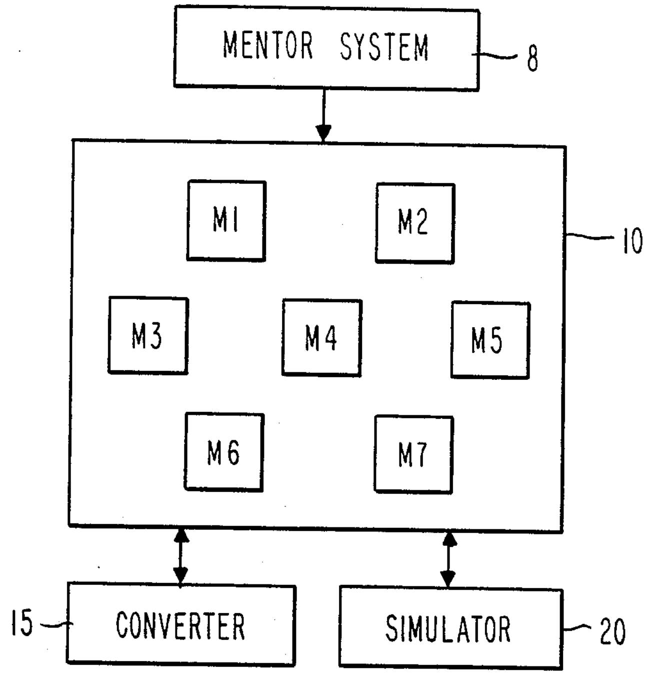
FIG. 1 is a block diagram illustrating a particular preferred embodiment in accordance with the invention.

For The particular preferred embodiment to be described, which is illustrated in FIG. 1, the aforementioned Mentor system 8 is used to provide a "bottom-up" representation of a desired logical circuit design, such as a gate array. This "bottom-up" representation is stored in a memory 10 and comprises a stored Macrocell Definition Library M1 which defines the logical operations performed by each of up to 440 different macrocells, and Mentor macrocell connectivity data M2 which represents the interconnection between selected macrocells corresponding to the desired logic circuit design. It will be understood that the memory 10 may be part of the Mentor system, or may be a separate memory.

In the preferred embodiment of the invention, a converter 15 makes use of the stored Mentor data M1 and M2 in the memory 10 so as to automatically produce a stored behavioral software representation M3 in the memory 10 of the desired logical circuit design. As is well known, a behavioral representation need merely simulate the external functioning of a logical circuit, while a bottom-up representation (such as provided by the Mentor system) simulates internal logical structure.

In accordance with the invention, a simulator 20 makes use of this higher order behavioral software representation M3 to simulate the operation of its corresponding logic circuit. The design and operation of the converter 15 and the simulator 20 are chosen so that this behavioral software representation produced by the converter 15 is such as to permit relatively fast simulation of the corresponding logical circuit by the simulator 20. In this regard, it is to be understood that the operation of the converter 15 and the simulator 20 may be performed by a data processor appropriately programmed to perform the conversion functions, and in some applications this may be the preferred mode. In the particular preferred embodiment being described, the simulator provided by the Mentor system is used as the simulator 20.

Figure 2:
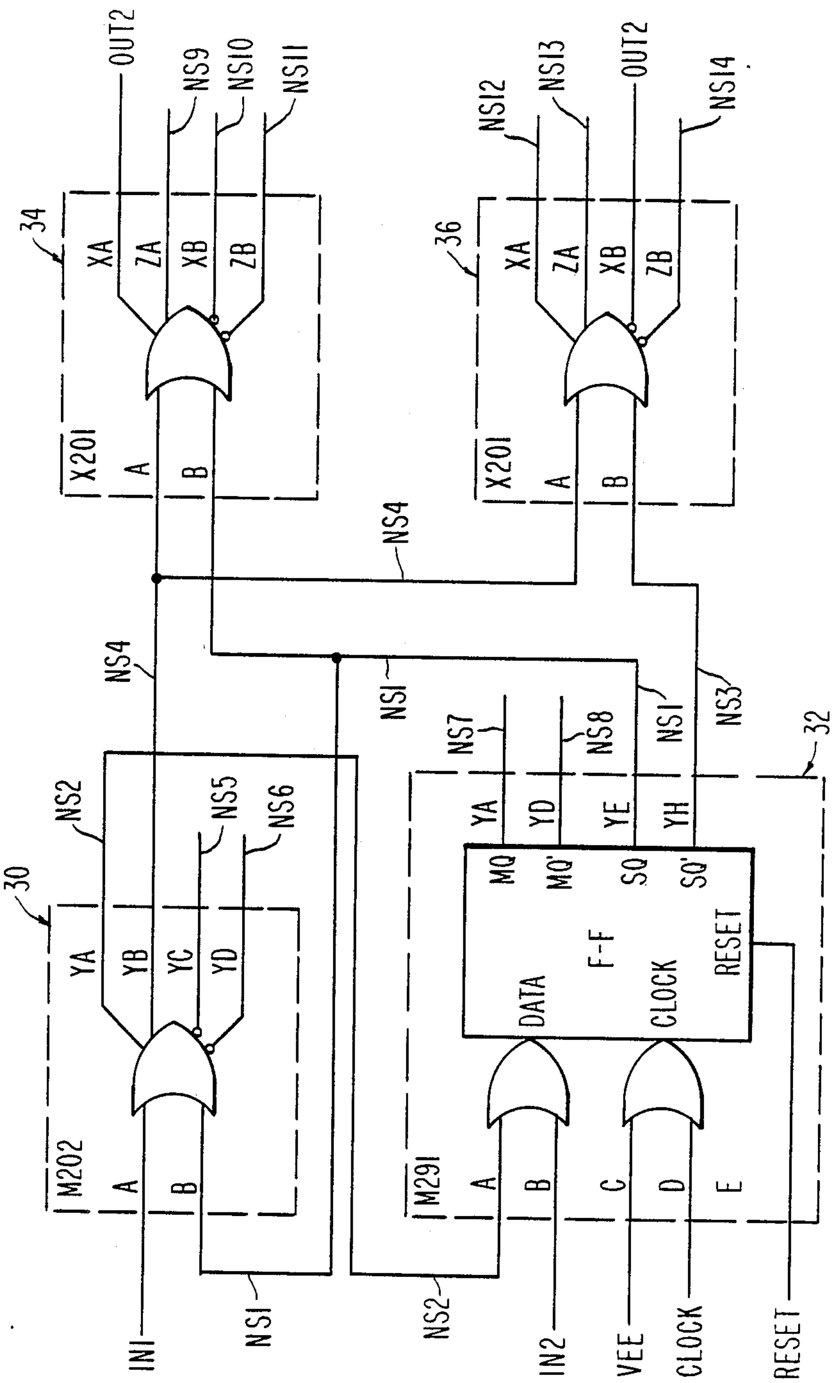
FIG. 2 is a schematic electrical diagram of a logical circuit which is used to illustrate how the present invention is put into practice.
Figure 7:
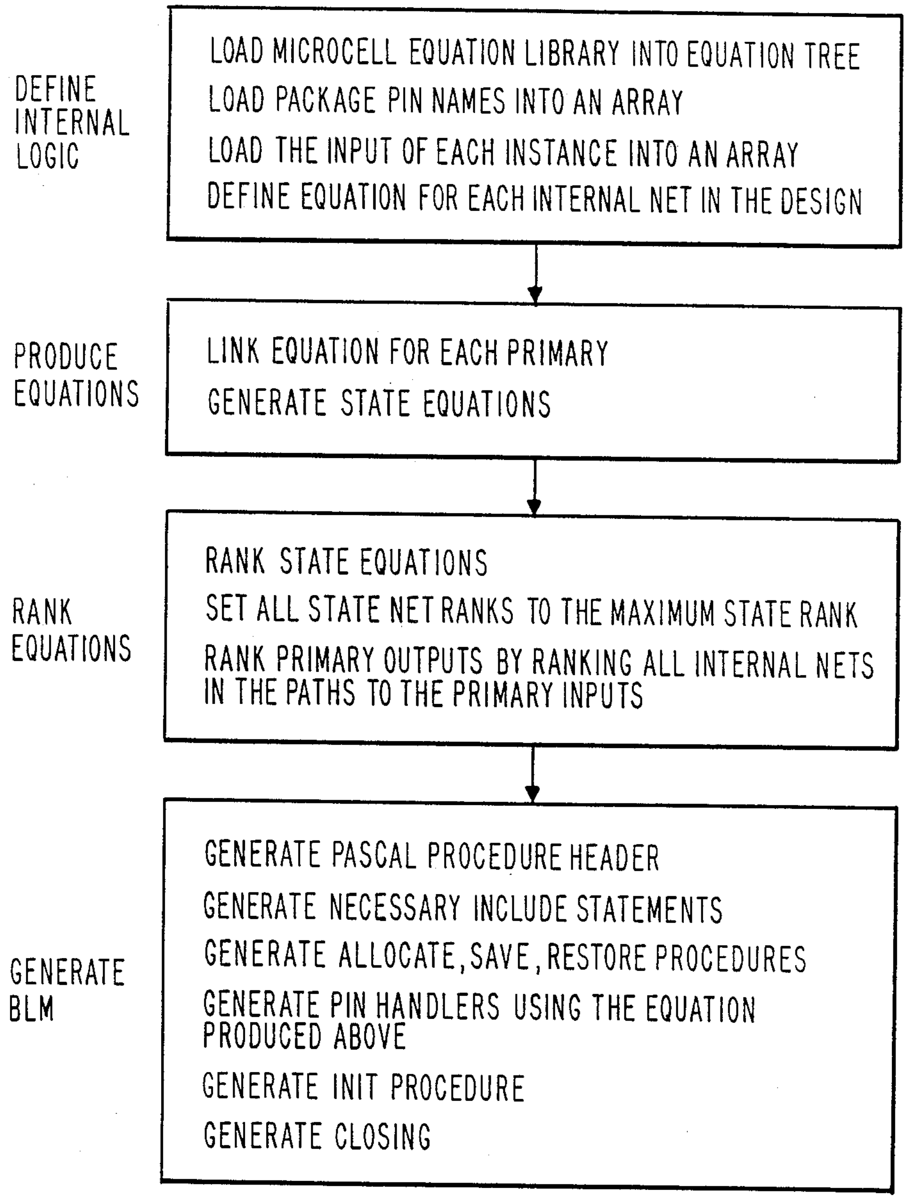
FIG. 7 is a flow chart of a specific illustrative Pascal-based program which may be used to implement the invention.

In order to illustrate how the invention may be put into practice, an example will be presented for which it will be assumed that the logical circuit to be simulated in accordance with the invention is the one shown in FIG. 2 containing the four macrocells 30, 32, 34 and 36 connected as shown between a plurality of inputs designated as IN1, IN2, and VEE (along with CLOCK and RESET inputs) and a plurality of outputs designated as OUT1 and OUT2. It will be noted in FIG. 2 that macrocell 30 is designated as being an M202 macrocell, macrocell 32 is designated as being an M291 macrocell and macrocells 34 and 36 are each designated as being an X201 macrocell.

As mentioned previously, for the purposes of this example, it will be assumed that a Mentor representation of the logical circuit of FIG. 2 has been created using the Mentor system, wherein the resulting Mentor connectivity data corresponds to the stored data M2 in the memory 10 of FIG. 1, while the definitions of the M202, M291 and X201 macrocells are contained in the stored Macrocell Definition Library indicated by M1 in FIG. 1. In accordance with the invention, the converter 15 in FIG. 1 operates to access particular data stored in M1 and M2 in the memory 10 and, in response thereto, produce a behavioral software representation of the logical circuit of FIG. 2 which is stored in the memory 10 of FIG. 1, as indicated by M3. The nature of the data in M1 and M2 which is extracted by the converter 15 in producing this behavioral software representation M3 corresponding to the assumed logical circuit of FIG. 2 are illustrated in FIGS. 3 and 4, respectively.

First to be considered is the Macrocell Definition Library M1. The pertinent contents of M1 which are applicable to the circuit of FIG. 2 are shown in FIG. 3. It will be understood from FIG. 3 that the logical operation of each of the three types of macrocells, M202, M291 and X201 used in FIG. 2, is represented by one or more Boolean equations. Each type of macrocell contains a macrocell output equation for each macrocell output (for example, note equation (1) in FIG. 3 for the YA output of the M201 macrocell). If a macrocell contains internal storage (such as the M291 macrocell 32 in FIG. 2), a macrocell state equation will also be provided for each internal state of the macrocell. Since the M291 macrocell is a D flip-flop with reset, it is represented in FIG. 3 by two state equations, one for the master and another for the slave (see equation (9) in FIG. 3, which represents the master state equation of a M291 macrocell, and equation (10), which represents the slave state equation of a M291 macrocell).

It will thus be evident from FIG. 3, that each macrocell output equation sets forth the logical function of the corresponding macrocell output pin in terms of the macrocell's input pins and states (if any), while each macrocell state equation sets forth the conditions for switching the corresponding internal storage of the macrocell to that state in terms of the macrocell input pins and any other states of the macrocell including its own state. Note that output and state equations for different macrocells are not mixed—that is, the logical operation represented by each macrocell equation is expressed in terms of the macrocell's own inputs and states and does not contain any outputs or states from any other macrocell.

It should also now be evident that the format for a macrocell output equation in FIG. 3 is:

<macrocell type>$<output pinname>=<Boolean expression>;

and that the format for a macrocell master state equation is:

<macrocell>$M#STATE=<Boolean expression>;

and that the format for a macrocell slave state equation is:

<macrocell type>$S#STATE=<Boolean expression>;

wherein each <Boolean expression> in a macrocell equation is expressed in terms of its own input pins and internal states.

Next to be considered is the Mentor connectivity data M2 illustrated in FIG. 4 for the logical circuit of FIG. 2. For illustrative purposes, the Mentor connectivity data in FIG. 4 is arranged in six columns labeled ELEMENT, INSTANCE, PIN, NETNAME, I/O, and EXT/INT.

The ELEMENT column identifies the type of macrocell (such as M202) while the INSTANCE column uniquely identifies a particular macrocell in the logical circuit of FIG. 2 (see instance number above upper left portion of each of the macrocells 30, 32, 34 and 36 in FIG. 2). For example, note in FIG. 2 that macrocell 30 has the INSTANCE number 1. The PIN column in FIG. 4 identifies the name of the corresponding macrocell PIN for which the following NETNAME column, I/O column and EXT/INT column provide connectivity information. More specifically, the NETNAME column identifies the name of the particular net in the logical circuit of FIG. 2 to which the macrocell pin named in the previous column is connected, the I/O column specifies the signal direction (IN indicates "input" and OP indicates "output"), and the EXT/INT column indicates whether the pin is connected to an internal point (IN) or is connected to a primary input or output of the logical circuit (EXT).

Using the data contained in M1 and M2 illustrated in FIGS. 3 and 4 for the circuit of FIG. 2, the converter 15 in FIG. 1 produces the behavioral representation M3 shown in FIG. 1 corresponding to the logical circuit of FIG. 2. The data represented by M3 is illustrated in more detail in FIG. 5 which sets forth the logical equation representations produced by the converter 15 in FIG. 1 for each of the nets NS1, NS2, NS3 and NS4, primary outputs OUT1 and OUT2 and states M291$MQ2 and M291$SQ$2 of the logical circuit of FIG. 2. As also illustrated in FIG. 5, the converter 15 additionally provides rankings for these equations so that they will be evaluated in proper order to appropriately take into account logic settling times, IO nets being ranked so that they are evaluated after other nets of the same rank. This ranking assures that the logical output value of a net will not be generated until the logical values for all higher ranked inputs to the net have been determined. To further enhance the value of the behavioral representation M3, the converter 15 preferably also provides for assigning an appropriate delay value to each primary output based on the number (and optionally also the type) of macrocells between the primary output and the primary inputs and state outputs.

Next to be considered is the manner in which simulation is provided for a behavioral representation of a logical circuit produced as described above and stored in memory 10, such as indicated by M3 in FIG. 1. For the particular preferred embodiment being described, the converter 15 is constructed and arranged to provide the higher order representation M3 in the form of a Pascal-based behavioral language representation (a form of representation well known in the art). An advantage of using such a representation is that M3 can be directly simulated by using as the simulator 20 in FIG. 1 the interactive logic simulator provided as part of the Mentor system.

Figure 6:
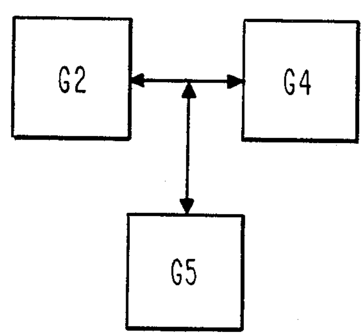
FIG. 6 illustrates three interconnected gate arrays which may be simulated in accordance with the invention.

It is to be understood that additional Mentor connectivity data representations for other logical circuits, such as indicated by M4 and M5 in FIG. 1, may be created using the Mentor system in the same manner as described above for M2. For the purposes of this description, it will be assumed that these logical circuit connectivity representations M2, M4 and M5 correspond to gate arrays G2, G4 and G5, respectively, which are to be interconnected together as shown in FIG. 6. Using the Mentor system, this FIG. 6 logical circuit can in turn be represented by a Mentor connectivity representation, as indicated by M6 in FIG. 1. Then, in the same manner as previously described for producing M3 corresponding to the logical circuit of FIG. 2, M6 is converted by the converter 15 into a higher order Pascal-based behavioral language representation of FIG. 6, as indicated by M7 in FIG. 1 which, like M3, can be be simulated at high speed using the Mentor simulator.

It is to be understood that the present invention is not limited to the particular implementations and/or examples disclosed herein, but is to be considered as including all modifications and variations coming within the scope of the invention as defined in the appended claims.

The following is a well documented program listing of a PASCAl-based program entitled "GENBLM". This program may be considered as a software implementation of the converter 15 in FIG. 1.

EXHIBIT B

```
{Compilation and binding:
   PAS GENBLM -L -COND -DBA -SUBCHK;
   BIND GENBLM.BIN /IDEA/SYS/LIB/DFI.BIN /IDEA/SYS/LIB/IUTIL.BIN -B GENBLM.BIN;
   CPF GENBLM.BIN  GENBLM
}

{ Abstract:
          Program GENBLM will take a design file or  Burlap format
          netlist (BURLIST) and produce a Pascal Behavioral Language
          Model (BLM) for simulation on the MENTOR system.
          GENBLM is designed for use with gate arrays to produce
          one BLM for one gate array. Inorder to generate a BLM for
          an entire module, board or  system  the MAX_constant_name
          constants will need to be  increased.  Error messages are
          designed to indicate which  constant needs to be increased
          as the need arises.

* * * * * * * * * H E L P   F I L E * * * * * * * * * * * * * * * * *

Usage     GENBLM  component_name [-BUILD] [-CHAIN] [-DDRIVE] [-DUMPSIM] [-I interface]
                                 [-L technology] [-MYLIB][-NBLM | -NOBLM] [-NOFEEDBACK | -NF]
                                 [-V symbol_version]
Description:

   component_name        String  specifying the file  system name  of the
                         component symbol to generate the BLM for.

Options:

   -BUILD                Generate a primitive for the BUILD simulator.

   -CHAIN                Trace the chain order for parallel loading of
                         the chain.

   -DDRIVE               Produce a DDRIVE_INFO file.  This option
                         will activate the chain option.  It
                         also requires a BURLIST.EXT file. See below.

   -DUMPSIM              Dump information during simulation of the chain.

   -I interface          String specifying the source for connectivity
                         information.  The presently supported interfaces are
                         DFI (design file) and BURLIST (Burlap netlist).
                         Default interface = DFI.

   -L technology         String specifying the keyword in the equation library
                         to be used, where equation library titles are of the
                         form technologyEQNLIBRARY.  Example:  MCAIIEQNLIBRARY.
                         Default technology = MCAII.

   -MYLIB                If this option is specified, the equation library under
                         the current working directory will be used.
                         This is intended for library debug only.
```

```
  -NBLM                  No blm will be generated.  This is useful only in
                         combination with the -BUILD switch when the  blm is
                         unnecessary or has been previously generated.

  -NOFEEDBACK            When this option is used no checking will be done for
                         feedback.  If feedback is present on a combinatorial
                         path, then an infinite loop will occur in RANKING EQUATIONS.

  -V symbol_version      Number specifying the version of the symbol corresponding
                         to component_name.  If no symbol version is specified the
                         component's directory is searched for the latest symbol
                         version.  If no symbol is found then a default of
                         symbol_version = 1 is assumed.

GENBLM will generate a Pascal Behavioral Language Model (BLM) for use in
Mentor simulation (SIM) and/or a BUILD (Burroughs Interactive Logic Design)
primitive and module for use in BUILD simulation.


Required files (for BURLIST interface only):

  component_name/PINLIST   File containing the package pin names and pin types.
                           Each record should have the following format
                             pinname    pintype
                           where pinname identifies the pin and pintype specifies
                           signal direction on the corresponding pin.
                           Pinname's must be legal Pascal identifiers.
                           Pintype may be either IN for input, OP for output,
                           or IO for bidirectional.

  component_name/BURLIST   Netlist produced by the Burlap netlist program.

Required files (for DFI interface only):

  component_name/DESIGN.EREL                Both of these files are produced by
  component_name/DESIGN.EREL_$df_version    successful completion of EXPAND.

Required files (for BUILD option only):
  component_name/PINLOCK       File containing the package pin names and pin numbers.
                               Each record should have the following format
                                 pinname    pinnumber
                               where pinname identifies the pin and pinnumber specifies
                               the corresponding physical pin.
                               Pinname must be the final netname as received from Motorola.
                               Pinnumber must be a valid package pin.

Required files (for BUILD and DDRIVE option only):
  component_name/BURLIST.EXT   Translation file produced by GADCBI.  This file maps
                               Mentor external netnames to BIF netnames.  BIF netnames
                               will be returned as is from Motorola.

Optional file (Used for CHAIN and DDRIVE option only):
  component_name/CHAIN_INFO    Contains information regarding the SDO, SDI, CLOCK,
                               and SHIFT ENABLE(s) for each chain piece.  The format is
```

```
<# of chain pieces>
<sdo chain piece 1>
<sdi chain piece 1>
<clock chain piece 1>
<shift enable chain piece 1> -- May have multiple (0-20) shift enable records
<blank record separating pieces>
<records for other pieces>
```

If this file is not present, the user will be asked for the necessary information.

Resulting files:

| | |
|---|---|
| component_name/BLM.PAS | Pascal source for the BLM. If any errors were issued, this file will not exist. |
| component_name/BLM.PL.PAS | Pascal source for the BLM if the "-CHAIN" option is used. If there were errors, this file will not exist. |
| component_name/BUILD_PRIM | Produced if "-BUILD" is specified. Algol source for the gate array. If any errors were issued, this file will not exist. |
| component_name/BUILD_PRIM.PL | Produced if "-BUILD" and "-CHAIN" are specified. Algol source for the gate array. If any errors were issued, this file will not exist. |
| component_name/DDRIVE_INFO | Contains information required by board level DDRIVE. This is produced only when the DDRIVE switch is used. |
| component_name/TRANS_INFO | Translation file mapping BIF netnames from the BURLIST.EXT file to pin numbers from the PINLOCK file. Pintype and eltype are also supplied for use by the DESIGN program on the mainframe. Mentor netnames are supplied for use by the Mentor to Burroughs board level netlister. |

See also

| | |
|---|---|
| EXPAND | Expands a design through lower hierarchical levels, generating a design file |
| SYMED | Creates a symbol |
| SYMCHECK | Checks the validity of a symbol |
| PFGEN | Creates pin files used in creating BLM's for the simulator. See Volume III, "Design Analysis Tools," Appendix B for details. |
| PAS | Compiles a Pascal source file. |

Examples:

```
GENBLM bcdadder
```

Generate a BLM for the component bcdadder using the corresponding design file.

```
 GENBLM bcdadder -v 9 -l mcaii

Generate a BLM for the component bcdadder using symbol version 9, the MCAII
equation library and the corresponding design file.

 GENBLM bcdadder  -BUILD -NOBLM

Generate a BUILD primitive for bcdadder.

*  *  *  *  *  *  *  *  *  *  *  *  *  *  *  *  *  *  *  *  *  *  *  *  *  *  *  *  *  *  *

        The macrocell equation library is a file which contains one equation
        for each output and each state of every macrocell to be used. The
        equations must have the following format:

          <macrocell name>$<output pinname> = <boolean expression> ;
        OR
          <macrocell name>$<output pinname> %DUPOUT = <output pinname> ;
        OR
          <state> #STATE = <boolean expression> ;
        OR
          <state> #LATCH = <boolean expression> ;

        <macrocell name> should not contain any '$' because these are
        used as the delimiter between macrocell name and output pinname.

        A <boolean expression> is the logical representation of the
        corresponding output or state using input pinnames and other
        defined states as variables.  Legal operators are "+" for OR,
        "*" for AND, "@" for XOR, "'" for NOT.  "'" may be applied
        to variables and parenthesized expressions, not to other operators.

        Order of precedence is
             (,),'    parenthesis, not
             *        and
             +,@      or,xor

*  *  *  *  *  *  *  *  *  *  *  *  *  *  *  *  *  *  *  *  *  *  *  *  *  *  *  *  *  *  *

        Gate array BLM generation is a 4 step process:

          1.  Define internal logic:
                Load macrocell equation library into an equation tree.
                Load package pin names into an array.
                Load the inputs of each instance into an array.
                Define equations for each internal net in the design.

          2.  Produce equations:
                Link equations for each of the primary outputs.
                Generate state equations.

          3.  Rank equations:
                Rank state equations.
                Set all state net ranks to the maximum state rank
```

```
            Rank primary outputs by ranking all internal nets in the
              path to the primary inputs.

        4.  Generate BLM:
            Generate Pascal procedure header.
            Generate necessary INCLUDE statements.
            Generate ALLOCATE, SAVE, RESTORE procedures.
            Generate pin handlers using the equations produced above.
            Generate INIT procedure.
            Generate closing.

* * * * *  More detailed comments are provided in each procedure.    * * * * * *
}

{ I N C L U D E   F I L E S }

{%NOLIST}
%INCLUDE '/SYS/INS/BASE.INS.PAS';
%INCLUDE '/SYS/INS/PGM.INS.PAS';
%INCLUDE '/SYS/INS/PFM.INS.PAS';
%INCLUDE '/SYS/INS/CAL.INS.PAS';
%INCLUDE '/SYS/INS/STREAMS.INS.PAS';
%INCLUDE '/SYS/INS/VFMT.INS.PAS';
%INCLUDE '/SYS/INS/NAME.INS.PAS';
%INCLUDE '/IDEA/SYS/INS/DFI.INS.PAS';
%INCLUDE '/IDEA/SYS/INS/IUTIL.INS.PAS';
{%LIST}

{ C O N S T A N T S }

CONST

  { Constants for setting the ranks of nets. }

      init_rank = -1;    { Nets and instances are assigned this rank initially. }
      io_weight = 1;     { Bi-directional pins execute after all other equations at that
                           rank; therefore, they are weighted. }
      rank_increment = 1;

{ Constants for net's delay.
  These must be an INTEGER for the BUILD program
  and REAL for the Mentor simulator (SIM).}

{ If the technology being used does not have a delay defined,
  the delays for MCAII will be used.}

    ALS_delay = 2.0;
    ALS_delay_build = 2;
    cmos_delay = 4.0;
    cmos_delay_build = 4;
    ETL_delay = 1.0;
    ETL_delay_build = 1;
    mcaii_delay = 1.0;
    mcaii_delay_build = 1;
```

```
min_delay = 1;  {minimum delay for nets}

{ Constants for simulation of the chain.}

SIM_INIT_VALUE = FALSE;

{ This group of constants is dependent upon the netlist being used.}
{ Currently set for BURLIST }

element_col = 1;            lelement_name = 12;
  {On the Mentor, this should be the MODEL property of the primitives. }

instance_col = 14;          linstance_name = 5;
  {This value must uniquely identify each primitive instance. }

iospecifier_col = 53;       liospecifier = 3;
  {Pintype: IN=input, OP=output, IO=bi-directional }

netname_col = 26;           lnetname = 20;
  {Name of net }

pin_name_col = 20;          lpin_name = 5;
  {Name of pin on primitive to which this net is connected.}

{The largest equation name will be of the form <element>$<pin>$<instance>.}
{Make sure leqn_name>=lnetname. }

leqn_name = (lelement_name+lpin_name+linstance_name+2);


{ Constants for BURLIST.EXT  file. }

BUS_NAME_COL = 1;           LBUS_NAME = 12;
  {Name of net or bus.}

BIT_COL = 14;               LBIT = 3;
  {If bus then bit position, otherwise blank.}

BIF_NETNAME_COL = 18;       LBIF_NETNAME = 12;
  {Netname sent to Motorola.}

ELTYPE_COL = 31;            LELTYPE = 12;
  {Model property of the primitive attached to this net.}


{ Constants for TRANS_INFO  file. }

{ This file contains one record for every package pin
  of the design.}

{ NOTE:  This is targeted for the DBDESIGN database.
  Therefore the lengths of the fields should match the
```

```
corresponding database fields.}
                                    TI_L_MODEL = 12; {NOTE: COMP_NAME_LENGTH must be <= TI_L_MODEL.}

  TI_ELTYPE_COL = 41;               TI_L_ELTYPE = 12;
    {The MODEL property of the primitive attached to this pin. }
  TI_NAME_COL = 1;                  TI_L_NAME = LBIF_NETNAME;
    {Netname sent to Motorola.}
  TI_PINTYPE_COL = 21;              TI_L_PINTYPE = 1;
    {PINTYPE: I=input, O=output, B=bi-directional}
  TI_PINNUMBER_COL = 31;            TI_L_PINNUMBER = 3;
    {Package pin name. }
  TI_MENTOR_NAME_COL = 51;          TI_L_MENTOR_NAME = 20;
    {Mentor name in BUS(BIT) format.}


{ Design file constants }

   largument = 128;
   lfile_title = 256;
   l_id = 32;  {A Pascal identifier may be up to 32 chars}
   l_string_t = dfi_$string_len_max;  { = 256}
   ltype = 5;  {max length of IN, OP, IO, IXO, OTHER for PIN_TYPE}

   terms_per_line = 15;

   {Constants for bim generation.}

   beg = 'BEGIN ' ;
   ennd = 'END; ' ;
   proc = 'PROCEDURE ' ;
   separator = '{* * * * * * * * * * * * * * * * * * * * * * * * * * * * * * * * * * * * * * * * * *}';
   separator2 = '%* * * * * * * * * * * * * * * * * * * * * * * * * * * * * * * * * * * * * *';
   withstart_i = 'WITH SIMBASE_$INSTANCE_PTR^:I  DO BEGIN' ;
   x2 = '  ';
   x4 = '    ';
   x6 = '      ';
   x8 = '        ';
   x10 = '          ';
   x20 = '                    ';

{ These values may be changed for larger applications.}

   MAX_CHAINS = 5;                  {Maximum number of chain piece per element. }
   max_constants =100;              {maximum number of net with property INIT.}
   max_drives = 1;                  {maximum number of outputs per net.  Note: twin-outs are ignored. }
   max_inpins = 20;                 {maximum number of inputs per macrocell.}
   max_nets=5000;                   {maximum number of internal nets and package pins combined.}
   max_ninst=3000;                  {maximum number of instances.}
   max_nlibrary_LATCHes = 20;       {maximum number of macrocell LATCH definitions.}
   max_nlibrary_states = 50;        {maximum number of macrocell state definitions.}
   max_nmacros = 100;               {maximum number of macrocell definitions.}
   max_nLATCHEs = 500;              {maximum number of internal LATCHES per gate array.}
   max_nstates = 500;               {maximum number of internal states per gate array.}
```

```
     max_outpins = 20;              {maximum number of outputs per macrocell.}
     max_package_pins=300;
     MAX_SHIFT_ENABLES = 20,       {Maximum number of shift enables per chain piece. }


{ M I S C E L L A N E O U S }

     NET_CHARS = ['A'..'Z','0'..'9','_','$']; { Used to parse the equation library.}
     [illegible]

     nul = ' ';

LABEL abort;

{****************************************************************************************}

{ T Y P E   D E C L A R A T I O N S }

TYPE
     link = ^node;
     ptr_beq = ^boolean_equation;
     ptr_constant = ^constant_rec;
     PTR_DUPREC = ^DUPPIN_RECORD;
     ptr_inst = ^instance_record;
     ptr_neteqn = ^net_equation;
     ptr_package_pin = ^package_pin;

     signal_values = (zero,unknown,one);  {used for constant generation in BLM}

     data_type = (pin_id,LATCH_ID,state_id,operator_id);
     interface_type = (design_file,burlist);
     pin_type = (primary_input,primary_output,
                 primary_io,primary_ixo,primary_other);
     termination_type = (normal,abnormal);
     which_type = (frst,nxt,quit_scan);

     buffer300 = packed array [1..300] of char;
     buffer256 = packed array [1..256] of char;
     buffer80 = packed array [1..80] of char;
     buffer70 = packed array [1..70] of char;
     buffer10 = packed array [1..10] of char;

{    When the design file interface was added the following types
     were replaced by the standard type dynamic_string_t:

     element_name = packed array [1..lelement_name] of char;
     equation_name = packed array [1..leqn_name] of char;
     inst_name = packed array [1..linstance_name] of char;
     name = packed array [1..lnetname] of char;
     pin_name = packed array [1..lpin_name] of char;
}

     argument = packed array[1..largument] of char;
     blm_var = packed array[1..l_id] of char;
```

```
    file_title = packed array[1..lfile_title] of char;
    iospecifier = packed array [1..liospecifier] of char;

    eqn_array = array [1..max_outpins] of ptr_beq;
    DUPPIN_array = array [1..max_outpins] of PTR_DUPREC;
    inst_array = array [1..max_drives] of ptr_inst;
    NET_ARRAY = ARRAY [1..MAX_NETS] OF PTR_NETEQN;
    STATE_ARRAY = ARRAY [1..MAX_NSTATES] OF PTR_NETEQN;

 { r e c o r d s }

    dynamic_string_t = record
      chars:istr_$ptr;
      len:integer16;
    end;

    INLIST_REC = array [1..max_inpins] of packed record
      id:dynamic_string_t;
      index:integer; {This indicates the location of ID in NET_EQNS.}
    end;
package_pin = packed record
  id:dynamic_string_t; { Normally, this will have the same value as the
                         ID field in the record that NET is pointing to.
                         However, when the BURLIST.EXT file is read, this
                         will be changed to the BIF_NETNAME value.  This
                         will allow reference to this pin when the Motorolla
                         pinlock file is read. }
  net:ptr_neteqn;
  type_id:pin_type;
  { Added in version 1.4 }
  ELTYPE:DYNAMIC_STRING_T;        {Element type of the internal cell this pin is connected to.}
  PIN_NUMBER:DYNAMIC_STRING_T;    {Physical pin this pin is connected to.}
  STATE:BOOLEAN;                  {TRUE if there is a state on the path to the primary inpins.}
  DELAY:INTEGER;                  {The delay value -- used for outputs only.
                                   It will be multiplied times a unit delay on output.}

end;

boolean_equation = packed record
  id:dynamic_string_t;
  eqn:link;
end;

CHAIN_REC = PACKED RECORD
  SDO:PACKAGE_PIN;
  SDI:PACKAGE_PIN;
  CLK:PACKAGE_PIN;
  SHIFT_ENABLE:ARRAY [1..MAX_SHIFT_ENABLES] OF PACKAGE_PIN;
  STATES:STATE_ARRAY;
  LEN:0..MAX_NSTATES;
END;

constant_rec = packed record
  id:dynamic_string_t;
```

```
    value:signal_values;
  end;

  data_rec = packed record
    id:dynamic_string_t;
    type_id:data_type; { pin_id,LATCH_ID,state_id,operator_id }
    index:-1..MAX_NETS;
  end;

  DUPPIN_RECORD = PACKED RECORD
    ID:DYNAMIC_STRING_T;
    DEF_PIN_INDEX:INTEGER16; { This index indicates the position of the defining pin in OUT_DEFS. }
  END;

  inpin_ptr_rec = packed record
    i:blm_var;
    pin:^package_pin;
  end;

  instance_record = packed record
    name : dynamic_string_t;
    rank:integer;
    in_list : INLIST_REC;
  end;

  macro_record = packed record
    id:dynamic_string_t;
    out_defs : eqn_array;    {output equations for this macrocell}
    DUPINVS : DUPPIN_ARRAY; {record of outputs which are logically inverted}
    DUPPINS : DUPPIN_ARRAY; {record of outputs which are logically equivalent}
    in_list : INLIST_REC;    {legal inputs for this macrocell}
  end;

{ Note: Single pin nets are treated as busses with a width of 1. }

                                     [illegible] with this eqn.}
 bus_id:dfi_$object_identifier;  {bus_id = 0  ==>  not a bus}
 bus_name:dynamic_string_t;      {if bus_id <> 0 then this is the bus name.
                                  if bus_id = 0 this is the netname.}
 bit:0..255;                     {if bus_id = 0 then bit = 0 else bit is bit number in bus.}
 offset:0..255;                  { position of bit within bus }
 eqn:link;                       {Equation defining this net.}
 inst:inst_array;                {Contains ptrs to insts driving the net.}
 rank:integer;                   {Max of all ranks of the driving insts.}
 state:boolean;                  {TRUE if eqn is driven by a state. }
 path:boolean;                   {TRUE if passed on the current path. Used in CHECKING_FOR_FEEDBACK.}
 valid:boolean;                  {TRUE if a valid eqn is produced.}
 VALUE:BOOLEAN;                  {Used in simulation of the chain.}
end;

node = packed record
 data : data_rec;  {may be a pin name, latch name, state name, or operator}
 rlink,llink : link;
end;
```

```
outpin_ptr_rec = packed record
  i:blm_var;
  o:blm_var;
  pin:^package_pin;
end;

{***************************************************************************}

{ V A R   D E C L A R A T I O N S }

VAR
  { f i l e s }

    blm,
    build,
    CHAIN_INFO,
    DDRIVE_INFO,
    EXT,
    instance_netlist,
    library,
    net_netlist,
    package_pins,
    PINLOCK,
    TRANS_INFO              : text;

  { c o u n t e r s }

    error_count,
    warning_count,

    NCHAINS,
    nconstants,
    NDUMMY_INSTS,
    NDUMMY_NETS,
    ninpins,
    ninst,
    NLATCHES,
    nlibrary_LATCHes,
    nlibrary_states,
    nmacros,

    nnet,
    noutpins,
    npins,
    NSIM_NETS,
    NSIM_LATCH_EQNS,
    nstate_nets,
    nstates,
    NEW_NSTATES,
    NTWIN_OUTS,

    max_rank,
    max state_rank,
```

```
  preorder_count,
  inorder_count  : integer16:=0;

{ p o i n t e r s }

  pnode : link;        {Indicates most recently created node.}

{ a r r a y s }

  dummy_buf : buffer80;

  component,
  interface_select,
  switch,
  symbol_version,
  technology  : argument;

  CONNV:ARRAY [1..2] OF STREAM_$ID_T;

  WORKING_DIR:DYNAMIC_STRING_T;

  blm_title,
  build_title,
  CHAIN_INFO_TITLE,
  DDRIVE_INFO_TITLE,
  EXT_TITLE,    {BURLIST.EXT file}
  library_title,
  netlist_title,
  pinlist_title,
  PINLOCK_TITLE,
  sorted_netlist_title,
  TRANS_INFO_TITLE      : file_title;


  CHAINS : ARRAY [1..MAX_CHAINS] OF CHAIN_REC;

  constants : array [1..max_constants] of ptr_constant;

  instance_array : array [1..max_ninst] of ptr_inst;

  macro_library : array [1..max_nmacros] of macro_record;
  macro_state_library : array [1..max_nlibrary_states] of boolean_equation;
  macro_LATCH_library : array [1..max_nlibrary_LATCHes] of boolean_equation;

  net_eqns : NET_ARRAY;

  primary_inpins : array [1..max_package_pins] of package_pin;      { Pintype = IO will appear in }
  primary_outpins : array [1..max_package_pins] of package_pin;     { both lists.                 }

  SIM_NETS : NET_ARRAY;
  SIM_LATCH_EQNS : STATE_ARRAY;
```

```
state_eqns : STATE_ARRAY;   {  Contains one net_equation record    }
                            {  for each state variable.  A state   }
                            {  variable is made for each state     }
                            {  element.  Note:  master-slave ff's  }
                            {  produce two state variable entries.}

NEW_STATE_EQNS:STATE_ARRAY;{  Points to STATE_EQNS records.       }
                            {  This array is used to preseve the  }
                            {  records in STATE_EQNS after        }
                            {  they are reorganized by            }
                            {  FIND_CHAIN_ORDER.                  }

LATCH_eqns : STATE_ARRAY;   {  Contains one net_equation record    }
                            {  for each LATCH variable.  A LATCH   }
                            {  variable is made for each LATCH     }
                            {  element.   }

state_nets : NET_ARRAY; {  Array which points  into NET_EQNS  }
                        {  to indicate which nets are driven  }
                        {  by a state variable  (flip-flop).  }


{ d f i  }

  comp_string_t : dfi_$string_t;   {record containing component info for dfi}

  inpin_set,
  outpin_set,
  read_only_dfi : boolean;

  channel_dfi : UNIV_PTR;

  INST_REC_PTR        :DFI_$INST_REC_PTR;
  MASTER_NET_REC_PTR,
  NET_REC_PTR         :DFI_$NET_REC_PTR;
  PIN_REC_PTR         :DFI_$PIN_REC_PTR;

  IO_PROP,MODEL_PROP,INIT_PROP:INTEGER;


{ f l a g s }

  CHAIN_INFO_OPEN,
  checking_for_feedback,
  DDRIVE,
  DUMP_SIM,
  files_open,
  gen_blm,
  gen_build,
  gen_schematics,
  MY_LIB,
  TRACE_CHAIN   : boolean:=false;

{ e t c . }
```

```
interface : interface_type;
iutil_check_options : iutil_$opts_set; { check for iutil problems      }
time_stamp:buffer80;
name:buffer300;
num_32:integer32;
state_name:BUFFER300;

BLM_TITLE_LENGTH,
BUILD_TITLE_LENGTH,
comp_name_length,           {length of COMPONENT}
symbol_version_length,      {length of SYMBOL_VERSION}
tech name length:           {length of TECHNOLOGY}.

{****************************************************************************}
{****************************************************************************}
Procedure Terminate(IN TERM_STATUS:TERMINATION_TYPE);forward; {level 1}
{****************************************************************************}

Procedure Msg(IN msgtext: buffer80); {level 1}
Begin {msg}

  {Write-the message as a comment to OUTPUT.}

  WRITELN(OUTPUT,'# ',MSGTEXT:-1);
End; {msg}
{****************************************************************************}

Procedure Error(IN msgtext: BUFFER80); {level 1}
Begin {Error}

  {Write the message as a comment to OUTPUT.
   Increment the ERROR_COUNT.}

  WRITELN(OUTPUT,'# ERROR:  ',MSGTEXT:-1);
  ERROR_COUNT:=ERROR_COUNT+1;
End; {Error}
{****************************************************************************}

Procedure Warning(IN msgtext: BUFFER80); {level 1}
Begin {Warning}

  {Write the message as a comment to OUTPUT.
   Increment the WARNING_COUNT.}

  WRITELN('# WARNING:  ',MSGTEXT:-1);
  WARNING_COUNT:=WARNING_COUNT+1;
End; {Warning}
{****************************************************************************}
{****************************************************************************}

{ F U N C T I O N S }

Function Next_char_library : char; {level 1}
VAR DUMMY_CHAR:CHAR;
```

```
Begin {next_char_library}
  IF EOF(LIBRARY) THEN RETURN;
  REPEAT
    READ(LIBRARY,DUMMY_CHAR);
  UNTIL (DUMMY_CHAR <> ' ') OR EOF(LIBRARY);
  NEXT_CHAR_LIBRARY:=DUMMY_CHAR;
End; {next_char_library}

{****************************************************************************}
Function Next_rec_instance_netlist : buffer80; {level 1}
VAR DUMMY_REC:BUFFER80;VAR I:INTEGER;
Begin {Next_rec_instance_netlist}
  IF  NOT EOF(INSTANCE_NETLIST) THEN
    READLN(INSTANCE_NETLIST,DUMMY_REC)
  ELSE
    FOR I:= 1 TO 80 DO DUMMY_REC[I]:=NUL;
  NEXT_REC_INSTANCE_NETLIST:=DUMMY_REC;
End; {Next_rec_instance_netlist}
{****************************************************************************}

Function Next_rec_net_netlist : buffer80; {level 1}
VAR DUMMY_REC:BUFFER80; I:INTEGER;
Begin {Next_rec_net_netlist}
  IF  NOT EOF(NET_NETLIST) THEN
    READLN(NET_NETLIST,DUMMY_REC)

  ELSE
    FOR I:= 1 TO 80 DO DUMMY_REC[I]:=NUL;
  NEXT_REC_NET_NETLIST:=DUMMY_REC;
End; {Next_rec_net_netlist}
{****************************************************************************}
Function Next_rec_package_pins : buffer80; {level 1}
VAR DUMMY_REC:BUFFER80; I:INTEGER;
Begin {Next_rec_package_pins}
  IF  NOT EOF(PACKAGE_PINS) THEN
    READLN(PACKAGE_PINS,DUMMY_REC)
  ELSE
    FOR I:= 1 TO 80 DO DUMMY_REC[I]:=NUL;
  NEXT_REC_PACKAGE_PINS:=DUMMY_REC;
End; {Next_rec_package_pins}
{****************************************************************************}
Function Max(IN A,B:INTEGER) :INTEGER; {level 1}
Begin {Max}
  IF A >= B THEN
    MAX:=A
  ELSE
    MAX:=B;
End; {Max}
{****************************************************************************}
Function Min(IN A,B:INTEGER) :INTEGER; {level 1}
Begin {Min}
  IF A <= B THEN
    MIN:=A
  ELSE
    MIN:=B;
```

```
End; {Min}
{****************************************************************************}
FUNCTION EQUIV(IN A,B:dynamic_string_t):boolean;{level 1}
VAR I:INTEGER;
Begin {Equiv}
  EQUIV:=TRUE;
  IF A.LEN <> B.LEN THEN
    EQUIV:=FALSE
  ELSE {Compare characters}
  BEGIN
    FOR I:=1 TO A.LEN DO
      IF (A.CHARS^[I] <> B.CHARS^[I]) THEN
      BEGIN
        EQUIV:=FALSE;
        RETURN;
      END;
  END;
End; {Equiv}
{****************************************************************************}
FUNCTION upper_case(IN c: char): char;
{ This procedure will convert a lower case letter to upper case.      }
BEGIN
IF c in ['a'..'z'] THEN
  upper_case := chr(ord(c) - 32)
ELSE
  upper_case := c;
END { upper_case };
{****************************************************************************}
{****************************************************************************}

{ P R O C E D U R E S }
Procedure Move(IN rec:UNIV buffer300; IN rec_start_index,length:integer;
               IN OUT dest_rec:UNIV buffer300; IN dest_start_index:integer);
VAR I,J:INTEGER;


{ Procedure MOVE takes the string from REC starting at the REC_START_INDEX
  character it moves LENGTH characters into DEST_REC starting from the
  DEST_START_INDEX position in DEST_REC.

  MOVE can handle strings of up to 300 characters.  However, it does not
  check to make sure the number of characters to be moved (LENGTH) either
  exist in REC or will fit in DEST_REC. If DEST_REC will not hold at
  least (DEST_START_INDEX + LENGTH) characters, whatever follows DEST_REC
  in memory will be overwritten. }

Begin {Move}
{  WRITELN('REC=',REC:80);}
{  WRITELN('DEST=',DEST_REC);}
{  WRITELN('REC_START_INDEX=',REC_START_INDEX,', LENGTH=',LENGTH,', DEST_START_INDEX=',DEST_START_INDEX);}

  J:=DEST_START_INDEX;
  FOR I:=REC_START_INDEX TO REC_START_INDEX+LENGTH-1 DO
```

```
  BEGIN
    DEST_REC[J]:=REC[I];
    J:=J+1;
  END;
End;  {Move}
{*******************************************************************************}
Procedure Init_nul(IN OUT rec:UNIV buffer300; IN length:integer);
VAR I,J:INTEGER;

{ Procedure INIT_NUL sets REC to NUL for LENGTH characters.

  INIT_NUL can handle strings of up to 300 characters.  However, it does not
  check to make sure the number of characters to be set (LENGTH) exist in REC.
  If REC will not hold at least  LENGTH characters, whatever follows REC
  in memory will be overwritten. }

Begin {Init_nul}
{  WRITELN('REC=',REC:-1);}
  IF LENGTH = 0 THEN RETURN;

  FOR I:=1 TO LENGTH DO
    REC[I]:=NUL;
End;{Init_nul}
{*******************************************************************************}
Procedure New_string_t (IN OUT REC:dynamic_string_t);

{NEW_STRING_T initializes the dynamic_string_t in REC by setting REC.LEN to 0 and
 allocating a new ptr for REC.CHARS which is uninitialized.}

Begin {New_string_t}
  ISTR_$NEW(REC.CHARS);
  REC.LEN:=ISTR_$LENGTH(REC.CHARS);
End; {New_string_t}
{*******************************************************************************}
Procedure Copy_string_t (IN OLD_REC:dynamic_string_t; IN OUT DEST_REC:dynamic_string_t);

{COPY_STRING_T should be used when one dynamic_string_t in DEST_REC needs to
 point to a copy of the value in OLD_REC.CHARS.  COPY_STRING_T allocates
 space for DEST_REC.CHARS; therefore, if space has previously been allocated
 (such as with a call to NEW_STRING_T) then use SUBST_STRING_T to change the
 value in DEST_REC.CHARS^.}

Begin {Copy_string_t}
  ISTR_$NEW(DEST_REC.CHARS);
  IF OLD_REC.LEN > 0 THEN
  BEGIN
    ISTR_$COPY(OLD_REC.CHARS,DEST_REC.CHARS);
    DEST_REC.LEN:=ISTR_$LENGTH(DEST_REC.CHARS);
  END;
End; {Copy_string_t}
{*******************************************************************************}
Procedure Subst_string_t (IN OLD_REC:dynamic_string_t;
                          IN OUT DEST_REC:dynamic_string_t);
```

```
{SUBST_STRING_T should be used when one dynamic_string_t in DEST_REC needs to
 point to a copy of the value in OLD_REC.CHARS.  SUBST_STRING_T does not allocate
 space for DEST_REC.CHARS; therefore, if space has not been allocated
 (such as with a call to NEW_STRING_T) then use COPY_STRING_T to allocate space
  for  DEST_REC.CHARS.}

Begin {Subst_string_t}
  IF OLD_REC.LEN > 0 THEN
  BEGIN
    ISTR_$COPY(OLD_REC.CHARS,DEST_REC.CHARS);
    DEST_REC.LEN:=ISTR_$LENGTH(DEST_REC.CHARS);
  END
  ELSE
    DEST_REC.LEN:=0;
End; {Subst_string_t}
{****************************************************************************}
Procedure Dispose_string_t (IN OUT REC:dynamic_string_t);

{DISPOSE_STRING_T should be used to return REC.CHARS to free space.
 REC.LEN will be set to -1 to indicate an invalid ptr.}
Begin {Dynamic_string_t}
  ISTR_$DISPOSE(REC.CHARS);
  REC.LEN:=-1;
End; {Dynamic_string_t}
{****************************************************************************}
Procedure Subst_string_t_from_static (IN OLD_REC:UNIV BUFFER300;IN LEN:INTEGER;
                                      IN OUT DEST_REC:dynamic_string_t);

Begin {Subst_string_t_from_static}
  ISTR_$COPY_FROM_STATIC(OLD_REC,LEN,DEST_REC.CHARS);
  DEST_REC.LEN:=ISTR_$LENGTH(DEST_REC.CHARS);
End; {Subst_string_t_from_static}
{****************************************************************************}
Procedure MOVE_string_t_from_static (IN OLD_REC:UNIV BUFFER300;
  IN START_POS,NCHARS:INTEGER16; IN OUT DEST_REC:dynamic_string_t);
VAR BUF:BUFFER300;

{MOVE_STRING_T_FROM_STATIC should be used when one dynamic_string_t in
 DEST_REC needs to point to a copy of a portion of the value in the static string
 OLD_REC.  MOVE_STRING_T_FROM_STATIC does not allocate space for DEST_REC.CHARS;
 therefore, if space has not been allocated  (such as with a call to NEW_STRING_T)
 then use NEW_STRING_T to allocate space  for  DEST_REC.CHARS
 before calling this procedure.}

Begin {MOVE_string_t_from_static}
  MOVE(OLD_REC,START_POS,NCHARS,BUF,1);
  ISTR_$COPY_FROM_STATIC(BUF,NCHARS,DEST_REC.CHARS);
  DEST_REC.LEN:=ISTR_$LENGTH(DEST_REC.CHARS);
End; {MOVE_string_t_from_static}
{****************************************************************************}
Procedure Get_pin_property_num(IN REC:DFI_$PIN_REC_PTR;
                     IN PROPERTY : DFI_$STRING_ARY; OUT PROPERTY_NUM:INTEGER);
VAR I,J:INTEGER; TEMP:DFI_$STRING_ARY;
Begin {Get_pin_property_num}
```

```
PROPERTY_NUM:=1;

FOR I:=1 TO REC^.PROPERTY_COUNT DO
BEGIN
  INIT_NUL(TEMP,L_STRING_T);
  FOR J:= 1 TO REC^.PROPERTIES[I].NAME.LEN DO
    TEMP[J]:=UPPER_CASE(REC^.PROPERTIES[I].NAME.CHARS^[J]);

    {%DEBUG WRITELN('PROPERTY ',I:-1,X2,TEMP:-1,' VALUE ',REC^.PROPERTIES[I].VALUE.CHARS^:REC^.PROPERTIES[I].VALUE.LEN);}
    IF TEMP = PROPERTY THEN
    BEGIN
      PROPERTY_NUM:=I;
      RETURN;
    END;
  END;

  ERROR ('Missing property in design file.');
  WRITEln('>> ',property:-1,'- Must be included during EXPAND.');
  TERMINATE(ABNORMAL);
End; {Get_pin_property_num}

{***************************************************************************}
Procedure Get_inst_property_num(IN REC:DFI_$INST_REC_PTR; IN PROPERTY : DFI_$STRING_ARY; OUT PROPERTY_NUM:INTEGER);
VAR I,J:INTEGER; TEMP:DFI_$STRING_ARY;
Begin {Get_inst_property_num}
  PROPERTY_NUM:=1;

  FOR I:=1 TO REC^.PROPERTY_COUNT DO
  BEGIN
    INIT_NUL(TEMP,L_STRING_T);
    FOR J:= 1 TO REC^.PROPERTIES[I].NAME.LEN DO
      TEMP[J]:=UPPER_CASE(REC^.PROPERTIES[I].NAME.CHARS^[J]);

    {%DEBUG WRITELN('PROPERTY ',I:-1,X2,TEMP:-1,' VALUE ',REC^.PROPERTIES[I].VALUE.CHARS^:REC^.PROPERTIES[I].VALUE.LEN);}
    IF TEMP = PROPERTY THEN
    BEGIN
      PROPERTY_NUM:=I;
      RETURN;
    END;
  END;

  ERROR ('Missing property in design file.');
  WRITEln('>> ',property:-1,'- Must be included during EXPAND.');
  TERMINATE(ABNORMAL);
End; {Get_inst_property_num}

{***************************************************************************}
Procedure Get_net_property_num(IN REC:DFI_$NET_REC_PTR; IN PROPERTY : DFI_$STRING_ARY; OUT PROPERTY_NUM:INTEGER);
VAR I,J:INTEGER; TEMP:DFI_$STRING_ARY;
Begin {Get_net_property_num}
  PROPERTY_NUM:=1;

  FOR I:=1 TO REC^.PROPERTY_COUNT DO
  BEGIN
```

```
    INIT_NUL(TEMP,L_STRING_T);
    FOR J:= 1 TO REC^.PROPERTIES[I].NAME.LEN DO
      TEMP[J]:=UPPER_CASE(REC^.PROPERTIES[I].NAME.CHARS^[J]);

    {%DEBUG WRITELN('PROPERTY ',I:-1,X2,TEMP:-1,' VALUE ',REC^.PROPERTIES[I].VALUE.CHARS^:REC^.PROPERTIES[I].VALUE.LEN);}
    IF TEMP = PROPERTY THEN
    BEGIN
      PROPERTY_NUM:=I;
      RETURN;
    END;
  END;

  ERROR ('Missing property in design file.');
  WRITEln('>> ',property:-1,'- Must be included during EXPAND.');
  TERMINATE(ABNORMAL);
End; {Get_net_property_num}

{****************************************************************************}
Procedure Count_chars(IN word:UNIV BUFFER300; IN length:integer; {LEVEL 1}
                      OUT nchars:INTEGER);

VAR I:INTEGER;

{Procedure COUNT_CHARS takes the string in WORD with LENGTH characters total
 and returns the number of characters (NCHARS) before the first blank character
 in WORD.}
Begin {Count_chars}
  NCHARS:=LENGTH;
  FOR I:=1 TO LENGTH DO
    IF WORD[I] = NUL_THEN
    BEGIN
      NCHARS:=I-1;
      EXIT;
    END;
End; {Count_chars}

{****************************************************************************}
  FUNCTION DECODE_NUM16(IN BUF:BUFFER256; IN POS,BUF_LEN:INTEGER16;
    IN OUT NUM:INTEGER16):BOOLEAN;
  VAR INUM1,INUM2:INTEGER16;
    NCHARS,END_POS,N_FIELDS:INTEGER16;
    STATUS:STATUS_$T;
    TEMP:BUFFER256;

  { DECODE_NUM16 will be true if the next field in BUF is a number.
    This number will be placed in NUM.  Reals will be truncated; a message
    will be generated to this affect. If the next field is not a number,
    DECODE_NUM16 will be false and NUM will be unchanged.

  }

  BEGIN {DECODE_NUM16}
    INUM1:=0;
    INUM2:=0;
    DECODE_NUM16:=FALSE;
```

```
INIT_NUL(TEMP,256);

NCHARS:=BUF_LEN-POS+1;
MOVE(BUF,POS,NCHARS,TEMP,1);

END_POS:=VFMT_$DECODE2('%". " %EUWD %". " %EUWD %$',TEMP,NCHARS,
  N_FIELDS,STATUS,INUM1,INUM2);
IF (STATUS.ALL <> STATUS_$OK) AND (N_FIELDS < 1) THEN
BEGIN
  DECODE_NUM16:=FALSE;
  ERROR ('Decode bit failed. ');
  WRITELN('STATUS CODE >>',status.all);
END
ELSE
BEGIN
  NUM:=INUM1;
  {% DEBUG  WRITELN('NUM=',NUM);}
  DECODE_NUM16:=TRUE;
  IF INUM2 > 0 THEN
  BEGIN
    WRITELN('# ',BUF:BUF_LEN);
    WARNING ('Number will be truncated to a 16 bit integer value.');
  END;
 END;
END; {DECODE_NUM16}

{**************************************************************************}
 FUNCTION DECODE_NUM(IN OUT REC:UNIV BUFFER300; IN REC_LEN:INTEGER16;
   IN OUT NUM:INTEGER16):BOOLEAN;
 VAR INUM1,INUM2:INTEGER16;
   END_POS,N_FIELDS:INTEGER16;
   STATUS:STATUS_$T;
   BUF:BUFFER256;

{ DECODE_NUM will be true if  REC is a number.
  This number will be placed in NUM.  Reals will be truncated; a message
  will be generated to this affect. If the REC not a number,
  DECODE_NUM will be false and NUM will be unchanged.

}

BEGIN {DECODE_NUM}
  INUM1:=0;
  INUM2:=0;
  DECODE_NUM:=FALSE;

  END_POS:=VFMT_$DECODE2('%".; " %EUWD %",; "%EUWD %$',REC,REC_LEN,
    N_FIELDS,STATUS,INUM1,INUM2);
  IF (STATUS.ALL <> STATUS_$OK) AND (N_FIELDS < 1) THEN
  BEGIN
    {NO NUMBER}
    DECODE_NUM:=FALSE;
    RETURN;
  END
```

```
    ELSE
    BEGIN
      NUM:=INUM1;
      {% DEBUG WRITELN('TIME=',NUM,'.',INUM2:-1);}
      DECODE_NUM:=TRUE;
      IF INUM2 > 0 THEN
      BEGIN
        WRITELN('# ',REC:REC_LEN);
        WARNING ('Number will be truncated to an integer value.');
      END;
    END;
  END; {DECODE_NUM}
 {* * * * * * * * * * * * * * * * * * * * * * * * * * * * * * * * * * * * * *}
{**************************************************************************}
Procedure Trans_num_to_char(IN NUM:INTEGER32;IN OUT C_STRING:UNIV BUFFER300; {level 1}
                            OUT NUM_CHARS:INTEGER);

VAR REVERSED:BUFFER80;
    L,I:INTEGER;
    NEGATIVE:BOOLEAN;

{Procedure TRANS_NUM_TO_CHAR takes the integer in NUM and translates it into
 its character representation.  It stores the translated string in C_STRING
 which is of length NUM_CHARS.}

Begin {trans_num_to_char};

  NEGATIVE := FALSE;
  L := NUM;
  I := 1;
  IF L < 0 THEN
  BEGIN
    NEGATIVE := TRUE;
    L := (-L);
  END;
  REPEAT
    REVERSED[I] := CHR(ORD('0') + (L MOD 10));
    I := I + 1;
    L := L DIV 10;
  UNTIL L = 0;
  IF NEGATIVE THEN
  BEGIN
    NUM_CHARS := I;
    REVERSED[I] := '-';

 END
 ELSE
   NUM_CHARS := I - 1;
 FOR I := NUM_CHARS DOWNTO 1 DO
   C_STRING[NUM_CHARS-I+1] := REVERSED[I];

End; {trans_num_to_char}
{**************************************************************************}
PROCEDURE DECODE_BUS_NAME(IN SIG:DYNAMIC_STRING_T; IN OUT BUS:DYNAMIC_STRING_T;
            OUT BIT1,BIT2:INTEGER16);
```

```
VAR POSR, { Right paren position }
  POSC,   { Colon position       }
  POSL    { Left paren position  }
  :INTEGER16;
BEGIN { DECODE_BUS_NAME }
   { DECODE_BUS_NAME will decode a bus name in the form
           bus(bit1) or bus
     the form
           bus(bit1:bit2)
     will be flagged as an error. }


  BIT1:=0;
  BIT2:=0;

  { Find left paren. }

  IF ISTR_$SEARCH_NEXT_STATIC_PATTERN(SIG.CHARS,'(',1,1,POSL) THEN
  BEGIN

    { Move bus name }
    MOVE_STRING_T_FROM_STATIC(SIG.CHARS^,1,POSL-1,BUS);


    { Find right paren. }

    IF ISTR_$SEARCH_NEXT_STATIC_PATTERN(SIG.CHARS,')',1,POSL,POSR) THEN
    BEGIN

      { Find colon - if any. }

      IF ISTR_$SEARCH_NEXT_STATIC_PATTERN(SIG.CHARS,':',1,POSL,POSC) THEN
      BEGIN

        { Range - Get bits }
        IF DECODE_NUM16(SIG.CHARS^,POSL+1,POSC-1,BIT1) THEN
        BEGIN
          IF DECODE_NUM16(SIG.CHARS^,POSC+1,POSR-1,BIT2) THEN
          BEGIN

            { Correct bus name decoded. }
            {%DEBUG  WRITELN('SIG=',SIG.CHARS^:SIG.LEN,', BUS=',BUS.CHARS^:BUS.LEN,X2,BIT1:-1,X2,BIT2:-1);}
            RETURN;
          END;
        END;

      END
      ELSE
      BEGIN

        { Single bit reference - Get bit }
        IF DECODE_NUM16(SIG.CHARS^,POSL+1,POSC-1,BIT1) THEN
        BEGIN
```

```
          BIT2:=BIT1;

          { Correct bus name decoded. }

          {%DEBUG  WRITELN('SIG=',SIG.CHARS^:SIG.LEN,', BUS=',BUS.CHARS^:BUS.LEN,X2,BIT1:-1,X2,BIT2:-1);}
          RETURN;
        END;
      END;
    END;
  END
  ELSE
  BEGIN
    { No range specified. }
    SUBST_STRING_T(SIG,BUS);
    { Correct bus name decoded. }

    {%DEBUG  WRITELN('SIG=',SIG.CHARS^:SIG.LEN,', BUS=',BUS.CHARS^:BUS.LEN,X2,BIT1:-1,X2,BIT2:-1);}
    RETURN;

  END;

  { If it gets here, there was a problem parsing the bus name. }

  WRITELN('BUS NAME >>',SIG.CHARS^:SIG.LEN);
  ERROR ('Incorrect bus name format.');

END; { DECODE_BUS_NAME }

{*****************************************************************************************}
Procedure Get_name(IN NET:PTR_NETCON; OUT NAME:buffer300);
VAR NUMBER:BUFFER80; NDIG,POSITION:INTEGER;

{  GET_NAME is used to produce a unique mnuemonic name for
   error messages and comments in the BLM and BUILD files.
   NAME will be set to the bus_name and bit if appropriate.
   If interface = design_file then the $SELF property needs
   to be added for uniqueness.  (BURLIST generates unique
   names already.)  By using get_name, messages will be able
   to give the netname the user assigned to the net, if at
   all possible.  If the user did not name the net, the
   name will either be one MENTOR generated (for design_file
   interface) or one BURLIST generated (for BURLIST interface).
}

Begin {Get_name}
  INIT_NUL(NAME,300);
  INIT_NUL(NUMBER,80);
  MOVE(NET^.BUS_NAME.CHARS^,1,NET^.BUS_NAME.LEN,NAME,1);
  POSITION:=NET^.BUS_NAME.LEN+1;

  IF NET^.BUS_ID <> 0 THEN
  BEGIN
    NAME[POSITION]:='(';
    POSITION:=POSITION+1;
```

```
  TRANS_NUM_TO_CHAR(NET^.BIT,NUMBER,NDIG);
  MOVE(NUMBER,1,NDIG,NAME,POSITION);
  POSITION:=POSITION+NDIG;
  NAME[POSITION]:=')';
  POSITION:=POSITION+1;
END;

IF INTERFACE = DESIGN_FILE THEN
BEGIN
  POSITION:=POSITION+2; {Skip 2}
  MOVE('$SELF=',1,6,NAME,POSITION);
  POSITION:=POSITION+6;
  MOVE(NET^.ID.CHARS^,1,NET^.ID.LEN,NAME,POSITION);

 END;
End; {Get_name}
{*****************************************************************************}
 Procedure Preorder(p:link);

 {Procedure PREORDER performs a preorder tranversal of the tree beginning at
  P.  This is a recursive procedure which terminates after the entire tree
  has been traversed. PREORDER can be used for debugging the tree structures.
  a PREORDER trace of the tree is printed to STDOUT.
  NOTE: This gives Polish notation.  }

 Begin {preorder}
   IF P <> NIL THEN
   BEGIN
     PREORDER_COUNT:=PREORDER_COUNT+1;
     IF PREORDER_COUNT>=TERMS_PER_LINE THEN
     BEGIN
       PREORDER_COUNT:=0;
       WRITELN; WRITE('                ');
     END;
     WRITE(' ',P^.DATA.ID.CHARS^:P^.DATA.ID.LEN,' ');
     PREORDER(P^.LLINK);
     PREORDER(P^.RLINK);
   END;
 End;  {preorder}
{*****************************************************************************}
 Procedure Inorder(p:link);

 {Procedure INORDER performs an inorder tranversal of the tree beginning at
  P.  This is a recursive procedure which terminates after the entire tree
  has been traversed. INORDER can be used for debugging the tree structures.
  an INORDER trace of the tree is printed to STDOUT.
  NOTE: This gives standard notation.  }

 Begin {inorder}
   IF P <> NIL THEN
   BEGIN
     INORDER(P^.LLINK);
     INORDER_COUNT:=INORDER_COUNT+1;
     IF INORDER_COUNT>=TERMS_PER_LINE THEN
```

```
      BEGIN
        INORDER_COUNT:=0;
        WRITELN; WRITE('               ');
      END;
      WRITE(' ',P^.DATA.ID.CHARS^:P^.DATA.ID.LEN,' ');
      INORDER(P^.RLINK);
    END;
  End;  {inorder}
{************************************************************************}
  Procedure Postorder(p:link);

  {Procedure POSTORDER performs a postorder tranversal of the tree beginning at
   P.  This is a recursive procedure which terminates after the entire tree
   has been traversed. POSTORDER can be used for debugging the tree structures.
   a POSTORDER trace of the tree is printed to STDOUT.
   NOTE: This gives Reverse Polish notation. }

  Begin {postorder}
    IF P <> NIL THEN
    BEGIN
      POSTORDER(P^.LLINK);
      POSTORDER(P^.RLINK);
      WRITE(P^.DATA.ID.CHARS^:P^.DATA.ID.LEN);
    END;
  End;  {postorder}
{************************************************************************}

Procedure New_inst(IN INST:dynamic_string_t);  {level 3}
VAR I,J:INTEGER;
Begin {New_inst}
  NINST:=NINST+1;
  IF NINST > MAX_NINST THEN
  BEGIN
    ERROR ('Too many instances.  MAX_NINST must be increased.');
    TERMINATE(ABNORMAL);
  END;

  NEW(INSTANCE_ARRAY[NINST]);
  COPY_STRING_T(INST,INSTANCE_ARRAY[NINST]^.NAME);
  INSTANCE_ARRAY[NINST]^.RANK:=INIT_RANK;
  FOR I:= 1 TO MAX_INFINS DO
  BEGIN
{   INSTANCE_ARRAY[NINST]^.IN_LIST[I].ID.CHARS:=NIL; don't do this!!!}
    INSTANCE_ARRAY[NINST]^.IN_LIST[I].ID.LEN:=0;
    INSTANCE_ARRAY[NINST]^.IN_LIST[I].INDEX:=-1;
  END;
End;  {New_inst}

{************************************************************************}

Procedure New_net_eqn(IN NETNAME,BUS_NAME:DYNAMIC_STRING_T;
  IN BUS_ID,BIT,OFFSET:INTEGER16);  {level 1}
VAR I:INTEGER;
```

```
Begin {New_net_eqn}
  NNET:=NNET+1;

  IF NNET > MAX_NETS THEN
  BEGIN
    ERROR ('Internal net limit exceeded.  MAX_NETS must be increased.');
    TERMINATE(ABNORMAL);
  END;

  NEW(NET_EQNS[NNET]);

  COPY_STRING_T(NETNAME,NET_EQNS[NNET]^.ID);
  COPY_STRING_T(BUS_NAME,NET_EQNS[NNET]^.BUS_NAME);
  NET_EQNS[NNET]^.BUS_ID:=BUS_ID;
  NET_EQNS[NNET]^.BIT:=BIT;
  NET_EQNS[NNET]^.OFFSET:=OFFSET;

  NET_EQNS[NNET]^.EQN:=NIL;
  NET_EQNS[NNET]^.PATH:=FALSE;
  NET_EQNS[NNET]^.STATE:=FALSE;
  FOR I:=1 TO MAX_DRIVES DO
    NET_EQNS[NNET]^.INST[I]:=NIL;
  NET_EQNS[NNET]^.RANK:= INIT_RANK;
  NET_EQNS[NNET]^.VALID:=TRUE;
  NET_EQNS[NNET]^.VALUE:=FALSE;
End;  {New_net_eqn}
{***************************************************************************}

Procedure Find_net_eqn(IN EQN_NAME:dynamic_string_t; IN ADD_IF_NOT_FOUND:BOOLEAN;
  OUT INDEX:INTEGER); {level 1}
VAR I:INTEGER;

{Procedure Find_net_eqn finds the EQN_NAME in array NET_EQNS.
 INDEX is set to corresponding subscript.  If EQN_NAME cannot
 be found, INDEX is set to 1 to allow the program to continue
 with out illegal array accessing.}

Begin {Find_net_eqn}


FOR I:= 1 TO NNET DO
BEGIN
  IF EQUIV(NET_EQNS[I]^.ID,EQN_NAME) THEN
  BEGIN
    INDEX:=I;
    EXIT;
  END;
END;

IF INDEX <= 0 THEN
BEGIN
  IF ADD_IF_NOT_FOUND THEN
  BEGIN
    NEW_NET_EQN(EQN_NAME,EQN_NAME,0,0,0); {NETNAME,BUS_NAME,BUS_ID,BIT,OFFSET}
```

```
      INDEX:=NNET;
    END
    ELSE
    BEGIN
      INDEX:=1;
      ERROR ('Missing net in FIND_NET_EQN.');
      WRITELN('NET >>',EQN_NAME.CHARS^:EQN_NAME.LEN,' was not found in the netlist/design file.  ');
    END;
  END;
End;  {Find_net_eqn}
{***************************************************************************}
Procedure Find_eqn_in_state_library(IN EQN_NAME:dynamic_string_t; {level 3}
                                    OUT INDEX:INTEGER);
VAR I:INTEGER;
Begin {Find_eqn_in_state_library}
  INDEX:=-1;
  FOR I:= 1 TO NLIBRARY_STATES DO
  BEGIN
    IF EQUIV(MACRO_STATE_LIBRARY[I].ID, EQN_NAME) THEN
    BEGIN
      INDEX:=I;
      EXIT;
    END;
  END;
  IF INDEX <= 0 THEN
  BEGIN
    ERROR ('State is not defined in library.');
    WRITELN('STATE >>',EQN_NAME.CHARS^:EQN_NAME.LEN);
    INDEX:=1;
  END;
End;  {Find_eqn_in_state_library}

{***************************************************************************}
Procedure Find_eqn_in_LATCH_library(IN EQN_NAME:dynamic_string_t; {level 3}
                                    OUT INDEX:INTEGER);
VAR I:INTEGER;
Begin {Find_eqn_in_LATCH_library}
  INDEX:=-1;
  FOR I:= 1 TO NLIBRARY_LATCHES DO
  BEGIN
    IF EQUIV(MACRO_LATCH_LIBRARY[I].ID, EQN_NAME) THEN
    BEGIN
      INDEX:=I;
      EXIT;
    END;
  END;
  IF INDEX <= 0 THEN
  BEGIN
    ERROR ('Latch is not defined in library');
    WRITELN('LATCH >>',EQN_NAME.CHARS^:EQN_NAME.LEN);
    INDEX:=1;
```

```
End;  {Find_eqn_in_LATCH_library}
{****************************************************************************}
PROCEDURE FIND_PRIMARY_PIN(IN BUS_NAME:DYNAMIC_STRING_T; IN BIT:INTEGER16;
  OUT P_TYPE:PIN_TYPE; OUT INDEX_I,INDEX_O:INTEGER16);
VAR I:INTEGER;
 { Uses the BUS_NAME and BIT to find the correct pin in either
   PRIMARY_INPINS or PRIMARY_OUTPINS or both if IO pin.
   If no match is found P_TYPE=PRIMARY_OTHER.        }

BEGIN {FIND_PRIMARY_PIN}
  {%DEBUG WRITELN('LOOKING FOR PRIMARY PIN>>',BUS_NAME.CHARS^:BUS_NAME.LEN,', ',BIT:-1);}

  INDEX_I:=-1;
  INDEX_O:=-1;
  P_TYPE:=PRIMARY_OTHER;

  FOR I:= 1 TO NINPINS DO
  BEGIN
    {%DEBUG WRITELN('      PRIMARY INPIN>>',PRIMARY_INPINS[I].NET^.BUS_NAME.CHARS^:PRIMARY_INPINS[I].NET^.BUS_NAME.LEN,', ',PRIMARY_INPIN
    IF EQUIV(PRIMARY_INPINS[I].NET^.BUS_NAME, BUS_NAME)
      AND (PRIMARY_INPINS[I].NET^.BIT = BIT) THEN
    BEGIN
      INDEX_I:=I;
      P_TYPE:=PRIMARY_INPINS[I].TYPE_ID;

       { If the pin is a PRIMARY_INPUT then we're through,
         if it is of type PRIMARY_IO then set INDEX_O also. }

      IF P_TYPE = PRIMARY_INPUT THEN
        RETURN
      ELSE
        EXIT;
    END;
  END;


  FOR I:= 1 TO NOUTPINS DO
  BEGIN
    {%DEBUG WRITELN('      PRIMARY OUTPIN>>',PRIMARY_OUTPINS[I].NET^.BUS_NAME.CHARS^:PRIMARY_OUTPINS[I].NET^.BUS_NAME.LEN,', ',PRIMARY_OU
    IF EQUIV(PRIMARY_OUTPINS[I].NET^.BUS_NAME, BUS_NAME)
      AND (PRIMARY_OUTPINS[I].NET^.BIT = BIT) THEN
    BEGIN
      INDEX_O:=I;
      P_TYPE:=PRIMARY_OUTPINS[I].TYPE_ID;
      RETURN;
    END;
  END;

  { If we reach here there was no match. }

  { Error will be noted by the calling procedure. }

END; {FIND_PRIMARY_PIN}
{****************************************************************************}
```

```
PROCEDURE GET_BIF_NETNAMES;
VAR BUS_NAME, BIF_NETNAME,ELTYPE:DYNAMIC_STRING_T;
    BIT,INDEX_I,INDEX_O:INTEGER16;
    P_TYPE:PIN_TYPE;


 (*    *     *     *     *     *     *     *     *     *     *     *     *     )
  PROCEDURE SKIP_EXT_INFO_HEADER;
  VAR BUF:BUFFER300;
  MATCH_POS:INTEGER16;
BEGIN {SKIP_EXT_INFO_HEADER}
  { At present, the BIFLIST format header info
    in the BURLIST.EXT file will be skipped.
    In the future this should be parsed for the
    necessary info.

    The expected format of the BURLIST.EXT file is

      <multiple BIF format header records>
      $ DATA
      <technology>
      <external pin info records>
   }

  WHILE NOT EOF(EXT) DO
  BEGIN

    READLN(EXT,BUF);
    IF BUF[1] = '$' THEN
    BEGIN
      IF ISTR_$STATIC_SEARCH_NEXT_STATIC_PATTERN(BUF,300,'DATA',4,1,MATCH_POS) THEN
      BEGIN
        { Skip technology card and return. }

         IF NOT EOF(EXT) THEN
           READLN(EXT);
         RETURN;
      END;
    END;
  END;
END; {SKIP_EXT_INFO_HEADER}

(*    *     *     *     *     *     *     *     *     *     *     *     *     )
FUNCTION GET_EXT_INFO(IN OUT BUS_NAME:DYNAMIC_STRING_T;IN OUT BIT:INTEGER16;
  IN OUT BIF_NETNAME,ELTYPE:DYNAMIC_STRING_T): BOOLEAN;
VAR REC:BUFFER300;
  LEN:INTEGER16;
  T_BUS_NAME,T_ELTYPE,T_BIF_NETNAME,T_BIT:BUFFER80;
  OK:BOOLEAN;
BEGIN {GET_EXT_INFO}
  { This function will read the BURLIST.EXT file for
    the fields necessary for translating the current netnames
    into those found in the Motorola pinlock file.
```

```
 GET_EXT_INFO will be TRUE until EOF(EXT).
}
GET_EXT_INFO:=TRUE;
BIT:=0;
INIT_NUL(T_BUS_NAME,80);
INIT_NUL(T_ELTYPE,80);
INIT_NUL(T_BIT,80);
INIT_NUL(T_BIF_NETNAME,80);
INIT_NUL(REC,300);


WHILE REC[1] = NUL DO
BEGIN
  IF EOF(EXT) THEN
  BEGIN
    GET_EXT_INFO:=FALSE;
    RETURN;
  END
  ELSE
  BEGIN
    READLN(EXT,REC);
  END;
END;


   MOVE(REC,BUS_NAME_COL,LBUS_NAME,T_BUS_NAME,1);
   MOVE(REC,ELTYPE_COL,LELTYPE,T_ELTYPE,1);
   MOVE(REC,BIT_COL,LBIT,T_BIT,1);
   MOVE(REC,BIF_NETNAME_COL,LBIF_NETNAME,T_BIF_NETNAME,1);

   COUNT_CHARS(T_BUS_NAME,80,LEN);
   SUBST_STRING_T_FROM_STATIC(T_BUS_NAME,LEN,BUS_NAME);

   COUNT_CHARS(T_ELTYPE,80,LEN);
   SUBST_STRING_T_FROM_STATIC(T_ELTYPE,LEN,ELTYPE);

   COUNT_CHARS(T_BIF_NETNAME,80,LEN);
   SUBST_STRING_T_FROM_STATIC(T_BIF_NETNAME,LEN,BIF_NETNAME);

   IF NOT DECODE_NUM(T_BIT,80,BIT) THEN BIT:=0;

   {%DEBUG WRITELN('BUS=',T_BUS_NAME:-1,', BIT=',BIT:-1,', ELTYPE=',T_ELTYPE:-1,', BIF_NETNAME=',T_BIF_NETNAME:-1);}
END; {GET_EXT_INFO}
{*    *    *    *    *    *    *    *    *    *    *    *    *    }
PROCEDURE CHECK_CHAIN(IN ID,BIF_NETNAME:DYNAMIC_STRING_T);
VAR C,S:INTEGER16;
BEGIN {CHECK_CHAIN}
  FOR C:=1 TO NCHAINS DO
  BEGIN
    { Substitute the names of the chain for
      future reference. }

    IF EQUIV(ID,CHAIN^[C].[illegible]) THEN
```

```
      SUBST_STRING_T(BIF_NETNAME,CHAINS[C].SDI.ID);

    IF EQUIV(ID,CHAINS[C].SDO.ID) THEN
      SUBST_STRING_T(BIF_NETNAME,CHAINS[C].SDO.ID);

    IF EQUIV(ID,CHAINS[C].CLK.ID) THEN
      SUBST_STRING_T(BIF_NETNAME,CHAINS[C].CLK.ID);

    FOR S:= 1 TO MAX_SHIFT_ENABLES DO
    BEGIN
      IF CHAINS[C].SHIFT_ENABLE[S].ID.LEN <= 0 THEN
        EXIT;
      IF EQUIV(ID,CHAINS[C].SHIFT_ENABLE[S].ID) THEN
      BEGIN
        SUBST_STRING_T(BIF_NETNAME,CHAINS[C].SHIFT_ENABLE[S].ID);
        EXIT;
      END;
    END;
  END;

 END; {CHECK_CHAIN}
{*    *    *    *    *    *    *    *    *    *    *    *    *    }

BEGIN {GET_BIF_NETNAMES}

 { First, the BURLIST.EXT file associated with the component must be read.
   This file should have been produced by GADCBI, the program which
   creates the BIFLIST.  This file contains the MENTOR_NETNAME,
   bit number (it calls it BUS_ID), and the corresponding BIF_NETNAME.
   By replacing the ID field of PRIMARY_INPINS and PRIMARY_OUTPINS with
   the corresponding BIF_NETNAME, it will be possible to map these names
   to the pinlock as received from Motorola.}

NEW_STRING_T(BUS_NAME);
NEW_STRING_T(BIF_NETNAME);
NEW_STRING_T(ELTYPE);


SKIP_EXT_INFO_HEADER;

WHILE GET_EXT_INFO(BUS_NAME,BIT,BIF_NETNAME,ELTYPE) DO
BEGIN

 FIND_PRIMARY_PIN(BUS_NAME,BIT,P_TYPE,INDEX_I,INDEX_O);

 CASE P_TYPE OF
   PRIMARY_INPUT :
   BEGIN

     CHECK_CHAIN(PRIMARY_INPINS[INDEX_I].ID,BIF_NETNAME);
     SUBST_STRING_T(BIF_NETNAME,PRIMARY_INPINS[INDEX_I].ID);
     SUBST_STRING_T(BIF_NETNAME,PRIMARY_INPINS[INDEX_I].NET^.ID);
     SUBST_STRING_T(ELTYPE,PRIMARY_INPINS[INDEX_I].ELTYPE);
   END;
```

```
    PRIMARY_OUTPUT:
    BEGIN
      CHECK_CHAIN(PRIMARY_OUTPINS[INDEX_O].ID,BIF_NETNAME);
      SUBST_STRING_T(BIF_NETNAME,PRIMARY_OUTPINS[INDEX_O].ID);
      SUBST_STRING_T(BIF_NETNAME,PRIMARY_OUTPINS[INDEX_O].NET^.ID);
      SUBST_STRING_T(ELTYPE,PRIMARY_OUTPINS[INDEX_O].ELTYPE);
    END;

    PRIMARY_IO:
    BEGIN
      CHECK_CHAIN(PRIMARY_INPINS[INDEX_I].ID,BIF_NETNAME);
      SUBST_STRING_T(BIF_NETNAME,PRIMARY_INPINS[INDEX_I].ID);
      SUBST_STRING_T(BIF_NETNAME,PRIMARY_OUTPINS[INDEX_O].ID);
      SUBST_STRING_T(BIF_NETNAME,PRIMARY_OUTPINS[INDEX_O].NET^.ID);
      SUBST_STRING_T(ELTYPE,PRIMARY_INPINS[INDEX_I].ELTYPE);
      SUBST_STRING_T(ELTYPE,PRIMARY_OUTPINS[INDEX_O].ELTYPE);
    END;

    OTHERWISE
    BEGIN
      ERROR ('BURLIST.EXT file does not match external pins.');
  {    TERMINATE(ABNORMAL); }
    END;
   END;

  END;

  DISPOSE_STRING_T(BUS_NAME);
  DISPOSE_STRING_T(BIF_NETNAME);
  DISPOSE_STRING_T(ELTYPE);

END; {GET_BIF_NETNAMES}

{*****************************************************************************}
{*****************************************************************************}

Procedure Close_files;
VAR STATUS:STATUS_$T;
{CLOSE_FILES closes LIBRARY, PACKAGE_PINS, INSTANCE_NETLIST,
 NET_NETLIST, DESIGN_FILE, CHAIN_INFO.
 This procedure is to allow many files to be closed when GENBEM is
 finished with them to free space in memory.}
Begin {Close_files}

FILES_OPEN:=FALSE;

CLOSE(library);
CLOSE(PACKAGE_PINS);
IF CHAIN_INFO_OPEN THEN
  CLOSE(CHAIN_INFO);

IF INTERFACE = BURLIST THEN
BEGIN
```

```
    CLOSE(INSTANCE_NETLIST);
    CLOSE(NET_NETLIST);
    STREAM_$OPEN(SORTED_NETLIST_TITLE,COMP_NAME_LENGTH+18,STREAM_$OVERWRITE,STREAM_$UNREGULATED,CONNV[2],STATUS);
    STREAM_$DELETE(CONNV[2],STATUS);
  END
  ELSE  IF INTERFACE = DESIGN_FILE THEN
  BEGIN
    {Close and release dfi files}

    DFI_$CLOSE(CHANNEL_DFI,STATUS);
    IF STATUS.ALL <> STATUS_$OK THEN
    BEGIN
      WRITELN('# Design file failed to close. ');
    END;

    DFI_$TERM(STATUS);
    IF STATUS.ALL <> STATUS_$OK THEN
    BEGIN
      WRITELN('# Design file failed to terminate. ');
      DFI_$ERROR_PRINT(STATUS);
    END;
  END;
End; {Close_files}
{*****************************************************************************}

Procedure Initialize; {level 1}
VAR STATUS:STATUS_$T;


 {* * * * * * * * * * * * * * * * * * * * * * * * * * * * * * * * * * * * * *}
 Procedure Get_time_stamp(IN OUT TS:BUFFER80);
 VAR CLOCK:CAL_$TIMEDATE_REC_T;
   WEEKDAY:CAL_$SUN..CAL_$SAT;
   BUF,AM_PM:BUFFER10;
   NCHARS,POSITION:INTEGER;
   TRANS_DAYS:STATIC ARRAY [CAL_$SUN..CAL_$SAT] OF BUFFER10:=['Sunday','Monday','Tuesday','Wednesday',
     'Thursday','Friday','Saturday'];
   TRANS_MONTHS:STATIC ARRAY [1..12] OF BUFFER10:=['January','February','March','April',
     'May','June','July','August','September','October','November','December'];

 Begin {Get_time_stamp}
   AM_PM:='am';
   CAL_$DECODE_LOCAL_TIME(CLOCK);
   WEEKDAY:=CAL_$WEEKDAY(CLOCK.YEAR,CLOCK.MONTH,CLOCK.DAY);

   INIT_NUL(TS,80);
   POSITION:=1;
   COUNT_CHARS(TRANS_DAYS[WEEKDAY],10,NCHARS);
   MOVE(TRANS_DAYS[WEEKDAY],1,NCHARS,TS,POSITION);
   POSITION:=POSITION+NCHARS;
   TS[POSITION]:=',';
   TS[POSITION+1]:=NUL;
   POSITION:=POSITION+2;
```

```
COUNT_CHARS(TRANS_MONTHS[CLOCK.MONTH],10,NCHARS);
MOVE(TRANS_MONTHS[CLOCK.MONTH],1,NCHARS,TS,POSITION);
POSITION:=POSITION+NCHARS;
TS[POSITION]:=NUL;
POSITION:=POSITION+1;

TRANS_NUM_TO_CHAR(CLOCK.DAY,BUF,NCHARS);
MOVE(BUF,1,NCHARS,TS,POSITION);
POSITION:=POSITION+NCHARS;
TS[POSITION]:=',';
TS[POSITION+1]:=NUL;
POSITION:=POSITION+2;

TRANS_NUM_TO_CHAR(CLOCK.YEAR,BUF,NCHARS);
MOVE(BUF,1,NCHARS,TS,POSITION);
POSITION:=POSITION+NCHARS;
TS[POSITION]:=NUL;
TS[POSITION+1]:=NUL;
POSITION:=POSITION+2;

IF CLOCK.HOUR >= 12 THEN
BEGIN
  AM_PM:='pm';
  IF CLOCK.HOUR > 12 THEN
    CLOCK.HOUR:=CLOCK.HOUR-12;
END;

TRANS_NUM_TO_CHAR(CLOCK.HOUR,BUF,NCHARS);
MOVE(BUF,1,NCHARS,TS,POSITION);
POSITION:=POSITION+NCHARS;
TS[POSITION]:=':';
POSITION:=POSITION+1;

TRANS_NUM_TO_CHAR(CLOCK.MINUTE,BUF,NCHARS);
IF NCHARS=1 THEN
BEGIN
  TS[POSITION]:='0';
  POSITION:=POSITION+1;
END;
MOVE(BUF,1,NCHARS,TS,POSITION);
POSITION:=POSITION+NCHARS;
TS[POSITION]:=':';
POSITION:=POSITION+1;

TRANS_NUM_TO_CHAR(CLOCK.SECOND,BUF,NCHARS);
IF NCHARS=1 THEN
BEGIN
  TS[POSITION]:='0';
  POSITION:=POSITION+1;
END;
MOVE(BUF,1,NCHARS,TS,POSITION);
POSITION:=POSITION+NCHARS;
TS[POSITION+1]:=NUL;
POSITION:=POSITION+1;
```

```
  MOVE(AM_PM,1,2,TS,POSITION);

End; {Get_time_stamp}
{* * * * * * * * * * * * * * * * * * * * * * * * * * * * * * * * * * * * * * *}

 Procedure Initialize_globals; {level 2}
 VAR I,POS,MATCH_POS:INTEGER;

{ *   *   *   *   *   *   *   *   *   *   *   *   *   *   *   *   *   *   *   *   *}
   PROCEDURE GET_WORKING_DIR; {LEVEL 3}
   VAR BUF,TEMP:BUFFER256;
     STATUS:STATUS_$T;
  BEGIN {GET_WORKING_DIR}
    NAME_$GET_WDIR(BUF,LEN,STATUS);
    IF STATUS.ALL <> STATUS_$OK THEN
    BEGIN
      ERROR ('Working directory problems.');
      MSG('Check working directory and restart GENBLM.');
      TERMINATE(ABNORMAL);
    END;

    NEW_STRING_T(WORKING_DIR);
    POS:=1;

    IF ISTR_$STATIC_SEARCH_NEXT_STATIC_PATTERN(BUF,LEN,'USER/',5,POS,MATCH_POS) THEN
    BEGIN
      { Replace the string '//node_id/local_user/' with '/USER/' to allow for
        movement of users around the network. }
      TEMP[1]:='/';
      POS:=MATCH_POS;
      LEN:=LEN-MATCH_POS+1;
      MOVE(BUF,POS,LEN,TEMP,2);
      LEN:=LEN+1; { Accounts for '/'. }
      SUBST_STRING_T_FROM_STATIC(TEMP,LEN,WORKING_DIR);
    END
    ELSE
      SUBST_STRING_T_FROM_STATIC(BUF,LEN,WORKING_DIR);

  END; {GET_WORKING_DIR}

{ *   *   *   *   *   *   *   *   *   *   *   *   *   *   *   *   *   *   *   *   *}

  Procedure Parse_command_line; {level 3}
  VAR STATUS:INTEGER32; ARG_STATUS:STATUS_$T;
    NCHARS,LLINK,N_ARG,I,DUMMY_LENGTH,SWITCH_LENGTH:INTEGER;
    BUF,LINK:BUFFER256;
  Begin {Parse_command_line}

    INIT_NUL(SYMBOL_VERSION,LARGUMENT);
    INIT_NUL(TECHNOLOGY,LARGUMENT);
    INIT_NUL(COMPONENT,LARGUMENT);
    INIT_NUL(SWITCH,LARGUMENT);
    INIT_NUL(INTERFACE_SELECT,LARGUMENT);
```

```
COMP_NAME_LENGTH:= PGM_$GET_ARG(1,COMPONENT,ARG_STATUS,LARGUMENT);
FOR I:= 1 TO COMP_NAME_LENGTH DO COMPONENT[I]:=UPPER_CASE(COMPONENT[I]);
GEN_SCHEMATICS := FALSE;

IF (COMPONENT = '-S')  THEN
  GEN_SCHEMATICS := TRUE
ELSE
BEGIN
IF COMP_NAME_LENGTH<=0 THEN
BEGIN
  ERROR ('Missing component name.');
  MSG('Read the help file on GENBLM for proper syntax.');
  TERMINATE(ABNORMAL);
END
ELSE IF COMP_NAME_LENGTH > TI_L_MODEL THEN
BEGIN
  {NOTE: COMP_NAME_LENGTH must be <= TI_L_MODEL.}
  ERROR ('Component name too long.');
  WRITELN('>>',COMPONENT:COMP_NAME_LENGTH);
  WRITELN('# Component name may not exceed ',TI_L_MODEL:-1,' characters.');
  TERMINATE(ABNORMAL);
END;

TECH_NAME_LENGTH:=0;
SYMBOL_VERSION_LENGTH:=0;

INTERFACE:=DESIGN_FILE;  {Default}
{INTERFACE:=BURLIST;}` {Default}
GEN_BUILD:=FALSE; {Default}
GEN_BLM:=TRUE; {Default}
CHECKING_FOR_FEEDBACK:=TRUE; {Default}
DDRIVE:=FALSE; {Default}
TRACE_CHAIN:=FALSE; {Default}
DUMP_SIM :=FALSE; {Default}
MY_LIB:=FALSE; {DEFAULT}


N_ARG:=2;
SWITCH_LENGTH:=PGM_$GET_ARG(N_ARG,SWITCH,ARG_STATUS,LARGUMENT);

WHILE SWITCH_LENGTH >= 2 DO
BEGIN
  FOR I:= 1 TO SWITCH_LENGTH DO SWITCH[I]:=UPPER_CASE(SWITCH[I]);
  N_ARG:=N_ARG+1;
  DUMMY_LENGTH:=0;

  IF (SWITCH = '-V') THEN
  BEGIN
    SYMBOL_VERSION_LENGTH:= PGM_$GET_ARG(N_ARG,SYMBOL_VERSION,ARG_STATUS,LARGUMENT);
    IF SYMBOL_VERSION_LENGTH>0 THEN
    BEGIN
      N_ARG:=N_ARG+1;
    END
    ELSE
```

```
    WRITELN('# * * ',SYMBOL_VERSION:-1,' * * * is an illegal switch.  Further arguments ignored.');
END
ELSE  IF (SWITCH = '-L') THEN
BEGIN
  TECH_NAME_LENGTH:= PGM_$GET_ARG(N_ARG,TECHNOLOGY,ARG_STATUS,LARGUMENT);
  IF TECH_NAME_LENGTH>0 THEN
  BEGIN
    N_ARG:=N_ARG+1;
  END
  ELSE
    WRITELN('# * * ',TECHNOLOGY:-1,' * * * is an illegal switch.  Further arguments ignored.');
END
ELSE  IF (SWITCH = '-I') THEN
BEGIN
  DUMMY_LENGTH:= PGM_$GET_ARG(N_ARG,INTERFACE_SELECT,ARG_STATUS,LARGUMENT);
  FOR I:= 1 TO DUMMY_LENGTH DO INTERFACE_SELECT[I]:=UPPER_CASE(INTERFACE_SELECT[I]);
  IF DUMMY_LENGTH>0 THEN
  BEGIN
    N_ARG:=N_ARG+1;
    IF (INTERFACE_SELECT = 'BURLIST') THEN
    BEGIN
      INTERFACE:=BURLIST;
    END
    ELSE IF (INTERFACE_SELECT = 'DFI') OR (INTERFACE_SELECT = 'DESIGN')
      OR (INTERFACE_SELECT = 'DESIGN_FILE') OR (INTERFACE_SELECT = 'DESIGNFILE')  THEN
    BEGIN
      INTERFACE:=DESIGN_FILE;
    END
    ELSE
    BEGIN
      INTERFACE:=DESIGN_FILE; {DEFAULT}
      WRITELN('# * * ',INTERFACE_SELECT:-1,' * * * is an unsupported interface.');
      WRITELN('# Supported interfaces include BURLIST and DFI (design file).');
      WRITELN('# DFI (design file) is the default interface.');
                                              -,  * * * is an illegal switch.  Further arguments ignored.');

ELSE  IF (SWITCH = '-BUILD') THEN
BEGIN
  GEN_BUILD:=TRUE;
END
ELSE  IF (SWITCH = '-DDRIVE') THEN
BEGIN
  DDRIVE:=TRUE;
  TRACE_CHAIN:=TRUE;
END
ELSE  IF (SWITCH = '-NBLM') OR (SWITCH = '-NOBLM') OR (SWITCH = '-NO_BLM') THEN
BEGIN
  GEN_BLM:= FALSE;
END
ELSE  IF (SWITCH = '-NOFEEDBACK') OR (SWITCH = '-NF') OR (SWITCH = '-NOF') THEN
BEGIN
  CHECKING_FOR_FEEDBACK:=FALSE;
END
ELSE  IF (SWITCH = '-CHAIN') OR (SWITCH = '-CH') THEN
```

```
   BEGIN
     TRACE_CHAIN:=TRUE;
   END
   ELSE  IF (SWITCH = '-NOCHAIN') OR (SWITCH = '-NC') OR (SWITCH = '-NOCH') THEN
   BEGIN
     TRACE_CHAIN:=FALSE;
   END
   ELSE  IF (SWITCH = '-DUMPSIM') THEN
   BEGIN
     DUMP_SIM:=TRUE;
   END
   ELSE  IF (SWITCH = '-MYLIB') THEN
   BEGIN
     MY_LIB:=TRUE;;
   END
   ELSE
   BEGIN
     WRITELN('# * * ',switch:-1,' * * * is an illegal switch.  Further arguments ignored.');
     EXIT;
   END;

   INIT_NUL(SWITCH,SWITCH_LENGTH);
   SWITCH_LENGTH:=PGM_$GET_ARG(N_ARG,SWITCH,ARG_STATUS,LARGUMENT);

END;

IF TECH_NAME_LENGTH<=0 THEN
BEGIN
  TECH_NAME_LENGTH:=5;
  INIT_NUL(TECHNOLOGY,LARGUMENT);
  TECHNOLOGY:='MCAII'; { default technology is MCAII}
END;

IF SYMBOL_VERSION_LENGTH<=0 THEN
BEGIN
  {Version was not specified.  Try to find
   the latest version of the symbol.       }


  INIT_NUL(BUF,256);
  INIT_NUL(LINK,256);
  INIT_NUL(SYMBOL_VERSION,LARGUMENT);
  NCHARS:=0;
  LLINK:=0;

{Search for a link with a name of the form
   COMPONENT/symbol.pic
 }

MOVE(COMPONENT,1,COMP_NAME_LENGTH,BUF,1);
MOVE('/SYMBOL.PIC',1,11,BUF,COMP_NAME_LENGTH+1);
NCHARS:=COMP_NAME_LENGTH+11;

NAME_$READ_LINK(BUF,NCHARS,LINK,LLINK,ARG_STATUS);
IF ARG_STATUS.ALL <> STATUS_$OK THEN
```

```
  BEGIN
    {%DEBUG WRITELN(BUF:-1,' is not a link.');}

    SYMBOL_VERSION_LENGTH:=1;
    SYMBOL_VERSION[1]:='1'; { default version is 1}
  END
  ELSE
  BEGIN
    {Successful! Link name is in the form
       $SYMBOL_VERSION
     }

    {%DEBUG WRITELN('Link=',link:llink);        }

    SYMBOL_VERSION_LENGTH:=LLINK-1;
    MOVE(LINK,2,SYMBOL_VERSION_LENGTH,SYMBOL_VERSION,1);

    {%DEBUG  WRITELN('Symbol_version=',SYMBOL_VERSION:SYMBOL_VERSION_LENGTH);}
  END;


 END;

 IF DDRIVE AND NOT TRACE_CHAIN THEN
 BEGIN
   ERROR ('The DDRIVE option may not be used without the CHAIN option.');
   TERMINATE(ABNORMAL);
 END
 ELSE
 BEGIN
   WRITELN('# Processing component ',COMPONENT:-1,' with symbol version ',SYMBOL_VERSION:-1,'.');
 END;
 END;

End; {Parse_command_line}

(*   *    *    *    *    *    *    *    *    *    *    *    *    *)
Procedure Open_files; {level 3}
VAR STATUS:INTEGER32; ARG_STATUS:STATUS_$T; N_ARG,I:INTEGER;

{OPEN_FILES uses the COMPONENT name supplied as an argument to the
 GENBLM command to create file names for the other files needed for the
 program.  It gets the COMPONENT name by calling the Program Manager.
 See the include file  '/SYS/INS/PGM.INS.PAS' for more information on
 Program Manager calls. }

Begin {open_files}


  {Make file titles}

  INIT_NUL(PINLIST_TITLE,LFILE_TITLE);
```

```
INIT_NUL(BLM_TITLE,LFILE_TITLE);
INIT_NUL(BUILD_TITLE,LFILE_TITLE);
INIT_NUL(LIBRARY_TITLE,LFILE_TITLE);
INIT_NUL(EXT_TITLE,LFILE_TITLE);
INIT_NUL(CHAIN_INFO_TITLE,LFILE_TITLE);
INIT_NUL(DDRIVE_INFO_TITLE,LFILE_TITLE);
INIT_NUL(TRANS_INFO_TITLE,LFILE_TITLE);
INIT_NUL(PINLOCK_TITLE,LFILE_TITLE);
INIT_NUL(NETLIST_TITLE,LFILE_TITLE);
INIT_NUL(SORTED_NETLIST_TITLE,LFILE_TITLE);


IF MY_LIB THEN
BEGIN
  { Use eqnlibrary under my directory for debug.}
  MOVE(TECHNOLOGY,1,TECH_NAME_LENGTH,LIBRARY_TITLE,1);
  MOVE('EQNLIBRARY',1,10,LIBRARY_TITLE,TECH_NAME_LENGTH+1);
END
ELSE
BEGIN
  MOVE('/IDEA/COM/',1,10,LIBRARY_TITLE,1);
  MOVE(TECHNOLOGY,1,TECH_NAME_LENGTH,LIBRARY_TITLE,11);
  MOVE('EQNLIBRARY',1,10,LIBRARY_TITLE,TECH_NAME_LENGTH+11);
END;


IF GEN_BUILD THEN
BEGIN
  MOVE(COMPONENT,1,COMP_NAME_LENGTH,BUILD_TITLE,1);

  IF TRACE_CHAIN THEN
  BEGIN
    MOVE('/BUILD_PRIM.PL',1,14,BUILD_TITLE,COMP_NAME_LENGTH+1);
    BUILD_TITLE_LENGTH:=COMP_NAME_LENGTH+14;
  END
  ELSE
  BEGIN
    MOVE('/BUILD_PRIM',1,11,BUILD_TITLE,COMP_NAME_LENGTH+1);
    BUILD_TITLE_LENGTH:=COMP_NAME_LENGTH+11;
  END;

  MOVE(COMPONENT,1,COMP_NAME_LENGTH,EXT_TITLE,1);
  MOVE('/BURLIST.EXT',1,12,EXT_TITLE,COMP_NAME_LENGTH+1);

  MOVE(COMPONENT,1,COMP_NAME_LENGTH,PINLOCK_TITLE,1);
  MOVE('/PINLOCK',1,8,PINLOCK_TITLE,COMP_NAME_LENGTH+1);

  MOVE(COMPONENT,1,COMP_NAME_LENGTH,TRANS_INFO_TITLE,1);
  MOVE('/TRANS_INFO.',1,12,TRANS_INFO_TITLE,COMP_NAME_LENGTH+1);
  MOVE(TECHNOLOGY,1,TECH_NAME_LENGTH,TRANS_INFO_TITLE,COMP_NAME_LENGTH+13);
END;
```

```
IF GEN_BLM THEN
BEGIN
  MOVE(COMPONENT,1,COMP_NAME_LENGTH,BLM_TITLE,1);

  IF TRACE_CHAIN THEN
  BEGIN
    MOVE('/BLM.PL.PAS',1,11,BLM_TITLE,COMP_NAME_LENGTH+1);
    BLM_TITLE_LENGTH:=COMP_NAME_LENGTH+11;
  END
  ELSE
  BEGIN
    MOVE('/BLM.PAS',1,8,BLM_TITLE,COMP_NAME_LENGTH+1);
    BLM_TITLE_LENGTH:=COMP_NAME_LENGTH+8;
  END;
END;

IF INTERFACE = BURLIST THEN
BEGIN
  MOVE(COMPONENT,1,COMP_NAME_LENGTH,PINLIST_TITLE,1);
  MOVE('/PINLIST',1,8,PINLIST_TITLE,COMP_NAME_LENGTH+1);

  MOVE(COMPONENT,1,COMP_NAME_LENGTH,NETLIST_TITLE,1);
  MOVE('/BURLIST',1,8,NETLIST_TITLE,COMP_NAME_LENGTH+1);

  MOVE(NETLIST_TITLE,1,COMP_NAME_LENGTH+8,SORTED_NETLIST_TITLE,1);
  MOVE('NETORDERED',1,10,SORTED_NETLIST_TITLE,COMP_NAME_LENGTH+9);
END;

IF TRACE_CHAIN THEN
BEGIN
  MOVE(COMPONENT,1,COMP_NAME_LENGTH,CHAIN_INFO_TITLE,1);
  MOVE('/CHAIN_INFO',1,11,CHAIN_INFO_TITLE,COMP_NAME_LENGTH+1);
END;

IF DDRIVE THEN
BEGIN
  MOVE(COMPONENT,1,COMP_NAME_LENGTH,DDRIVE_INFO_TITLE,1);
  MOVE('/DDRIVE_INFO',1,12,DDRIVE_INFO_TITLE,COMP_NAME_LENGTH+1);
END;

{Open files}

Open(library,LIBRARY_TITLE,'old',status);
IF STATUS > 0 THEN
BEGIN
  ERROR ('Problem with file.');
  WRITELN('>>',LIBRARY_TITLE:-1);
  TERMINATE(ABNORMAL);
END;
Reset(library);

IF GEN_BLM THEN
BEGIN
```

```
  OPEN(BLM,BLM_TITLE,'UNKNOWN',STATUS);
  IF STATUS > 0 THEN
  BEGIN
    ERROR ('Problem with file.');
    WRITELN('>>',BLM_TITLE:-1);
    TERMINATE(ABNORMAL);
  END;
  REWRITE(BLM);
END;

IF GEN_BUILD THEN
BEGIN
  OPEN(BUILD,BUILD_TITLE,'UNKNOWN',STATUS);
  IF STATUS > 0 THEN
  BEGIN
    ERROR ('Problem with file.');
    WRITELN('>>',BUILD_TITLE:-1);
    TERMINATE(ABNORMAL);
  END;
  REWRITE(BUILD);

  OPEN(EXT,EXT_TITLE,'OLD',STATUS);
  IF STATUS > 0 THEN
  BEGIN
  OPEN(PINLOCK,PINLOCK_TITLE,'OLD',STATUS);
  IF STATUS > 0 THEN
  BEGIN
    ERROR ('Problem with file.');
    WRITELN('>>',PINLOCK_TITLE:-1);
    TERMINATE(ABNORMAL);
  END;
  RESET(PINLOCK);

  OPEN(TRANS_INFO,TRANS_INFO_TITLE,'UNKNOWN',STATUS);
  IF STATUS > 0 THEN
  BEGIN
    ERROR ('Problem with file.');
    WRITELN('>>',TRANS_INFO_TITLE:-1);
    TERMINATE(ABNORMAL);
  END;
  REWRITE(TRANS_INFO);
END;

IF INTERFACE = BURLIST THEN
BEGIN

  OPEN(PACKAGE_PINS,PINLIST_TITLE,'OLD',STATUS);
  IF STATUS > 0 THEN
  BEGIN
    ERROR ('Problem with file.');
    WRITELN('>>',PINLIST_TITLE:-1);
    TERMINATE(ABNORMAL);
  END;
  RESET(PACKAGE_PINS);
```

```
END
ELSE IF INTERFACE = DESIGN_FILE THEN
BEGIN

  {Open design file}

  COMP_STRING_T.LEN:=COMP_NAME_LENGTH;
  COMP_STRING_T.CHARS:=ADDR(COMPONENT);
  READ_ONLY_DFI:=TRUE;

%INCLUDE '/idea/sys/ins/dfi_$init.ins.pas' ; {sets fault handler     }

  IF dfi_$stat.all <> status_$ok THEN          {must be in main section}
  BEGIN
    ERROR ('Design file open attempt failed.');
    DFI_$ERROR_PRINT(DFI_$STAT);
    TERMINATE(ABNORMAL);
  END;

  DFI_$OPEN(COMP_STRING_T,READ_ONLY_DFI,CHANNEL_DFI,ARG_STATUS);
  IF ARG_STATUS.ALL <> STATUS_$OK THEN
  BEGIN
    ERROR ('Design file open attempt failed.');
    DFI_$ERROR_PRINT(ARG_STATUS);
    TERMINATE(ABNORMAL);
  END;
END
ELSE
BEGIN
  ERROR ('Unsupported interface.');
  WRITE('>>',INTERFACE:-1);
  TERMINATE(ABNORMAL);
END;
IF TRACE_CHAIN THEN
BEGIN
  OPEN(CHAIN_INFO,CHAIN_INFO_TITLE,'OLD',STATUS);
  IF STATUS > 0 THEN
  BEGIN
    CHAIN_INFO_OPEN:=FALSE;
  END
  ELSE
  BEGIN
    CHAIN_INFO_OPEN:=TRUE;
    RESET(CHAIN_INFO);
  END;
END;

IF DDRIVE THEN
BEGIN
  OPEN(DDRIVE_INFO,DDRIVE_INFO_TITLE,'UNKNOWN',STATUS);
  IF STATUS > 0 THEN
  BEGIN
    ERROR ('Problem with file.');
    WRITELN('>>',DDRIVE_INFO_TITLE:-1);
```

```
      TERMINATE(ABNORMAL);
    END;
    REWRITE(DDRIVE_INFO);
  END;


  FILES_OPEN:=TRUE;

End; {open_files}
(*   *   *   *   *   *   *   *   *   *   *   *   *   *   *)
PROCEDURE GET_CHAIN_INFO;
VAR I,N,S,NCHARS:INTEGER16;
  BUF:BUFFER256;
(*       *       *       *       *       *       *       *)
  PROCEDURE NEW_CHAINS(IN NCHAINS:INTEGER16);
  VAR I,J,S:INTEGER16;
  BEGIN {NEW_CHAINS}

    IF NCHAINS > MAX_CHAINS THEN
    BEGIN
      ERROR ('Too many chain pieces.  MAX_CHAINS must be increased.');
      TERMINATE(ABNORMAL);
    END;


    FOR I:= 1 TO NCHAINS DO
    BEGIN

      NEW_STRING_T(CHAINS[I].SDO.ID);
      CHAINS[I].SDO.NET:=NIL;
      CHAINS[I].SDO.TYPE_ID:=PRIMARY_OUTPUT;
      NEW_STRING_T(CHAINS[I].SDO.ELTYPE);
      NEW_STRING_T(CHAINS[I].SDO.PIN_NUMBER);
      CHAINS[I].SDO.STATE:=FALSE; '
      CHAINS[I].SDO.DELAY:=MIN_DELAY;


      NEW_STRING_T(CHAINS[I].SDI.ID);
      CHAINS[I].SDI.NET:=NIL;
      CHAINS[I].SDI.TYPE_ID:=PRIMARY_INPUT;
      NEW_STRING_T(CHAINS[I].SDI.ELTYPE);
      NEW_STRING_T(CHAINS[I].SDI.PIN_NUMBER);
      CHAINS[I].SDI.STATE:=FALSE;
      CHAINS[I].SDI.DELAY:=MIN_DELAY;

     NEW_STRING_T(CHAINS[I].CLK.ID);
     CHAINS[I].CLK.NET:=NIL;
     CHAINS[I].CLK.TYPE_ID:=PRIMARY_INPUT;
     NEW_STRING_T(CHAINS[I].CLK.ELTYPE);
     NEW_STRING_T(CHAINS[I].CLK.PIN_NUMBER);
     CHAINS[I].CLK.STATE:=FALSE;
     CHAINS[I].CLK.DELAY:=MIN_DELAY;


     FOR S:= 1 TO MAX_SHIFT_ENABLES DO
```

```
      BEGIN
        NEW_STRING_T(CHAINS[I].SHIFT_ENABLE[S].ID);
        CHAINS[I].SHIFT_ENABLE[S].NET:=NIL;
        CHAINS[I].SHIFT_ENABLE[S].TYPE_ID:=PRIMARY_INPUT;
        NEW_STRING_T(CHAINS[I].SHIFT_ENABLE[S].ELTYPE);
        NEW_STRING_T(CHAINS[I].SHIFT_ENABLE[S].PIN_NUMBER);
        CHAINS[I].SHIFT_ENABLE[S].STATE:=FALSE;
        CHAINS[I].SHIFT_ENABLE[S].DELAY:=MIN_DELAY;
     END;

      CHAINS[I].LEN:=0;

      FOR J:= 1 TO MAX_NSTATES DO
        CHAINS[I].STATES[J]:=NIL;

    END;

  END; {NEW_CHAINS}
{*        *         *          *          *          *          *        *}

BEGIN {GET_CHAIN_INFO}

  NCHAINS := 0;

  IF CHAIN_INFO_OPEN THEN
  BEGIN

    {%DEBUG  MSG('READING CHAIN_INFO FILE.');}

    IF EOF(CHAIN_INFO) THEN RETURN;
    READLN(CHAIN_INFO,NCHAINS);
    {%DEBUG  WRITELN('NCHAINS=',NCHAINS);}

    IF NCHAINS <= 0 THEN
    BEGIN
      TRACE_CHAIN:=FALSE;
    END
    ELSE
    BEGIN
      NEW_CHAINS(NCHAINS);

      { Get the SDO and SDI for each chain piece. }


      FOR I:= 1 TO NCHAINS DO
      BEGIN
        INIT_NUL(BUF,256);

        { SDO }
```

```
      IF EOF(CHAIN_INFO) THEN EXIT;
      READLN(CHAIN_INFO,BUF);
      COUNT_CHARS(BUF,256,NCHARS);
      FOR N:= 1 TO NCHARS DO
        BUF[N]:=UPPER_CASE(BUF[N]);
      SUBST_STRING_T_FROM_STATIC(BUF,NCHARS,CHAINS[I].SDO.ID);

      { SDI }

      INIT_NUL(BUF,256);
      IF EOF(CHAIN_INFO) THEN EXIT;
      READLN(CHAIN_INFO,BUF);
      COUNT_CHARS(BUF,256,NCHARS);
      FOR N:= 1 TO NCHARS DO
        BUF[N]:=UPPER_CASE(BUF[N]);
      SUBST_STRING_T_FROM_STATIC(BUF,NCHARS,CHAINS[I].SDI.ID);

      { CLK }

      INIT_NUL(BUF,256);
      IF EOF(CHAIN_INFO) THEN EXIT;
      READLN(CHAIN_INFO,BUF);
      COUNT_CHARS(BUF,256,NCHARS);
      FOR N:= 1 TO NCHARS DO
        BUF[N]:=UPPER_CASE(BUF[N]);
      SUBST_STRING_T_FROM_STATIC(BUF,NCHARS,CHAINS[I].CLK.ID);

      { SHIFT_ENABLES }

      FOR S:= 1 TO MAX_SHIFT_ENABLES DO
      BEGIN

        INIT_NUL(BUF,256);
        IF EOF(CHAIN_INFO) THEN EXIT;
        READLN(CHAIN_INFO,BUF);
        COUNT_CHARS(BUF,256,NCHARS);
         IF (NCHARS = 0) THEN EXIT;
        FOR N:= 1 TO NCHARS DO
          BUF[N]:=UPPER_CASE(BUF[N]);
        SUBST_STRING_T_FROM_STATIC(BUF,NCHARS,CHAINS[I].SHIFT_ENABLE[S].ID);
      END;

    END;
  END;
END
ELSE
BEGIN

  { No CHAIN_INFO file so ask the user. }

  MSG('How many chain pieces are in this element?');
  WRITE('# Enter number of pieces (0-',MAX_CHAINS:-1,') >>');
  IF EOF(INPUT) THEN NCHAINS:=0
  ELSE  READLN(NCHAINS);
```

```
{%DEBUG  WRITELN('NCHAINS=',NCHAINS);}

IF NCHAINS <= 0 THEN
BEGIN
  TRACE_CHAIN:=FALSE;
END
ELSE
BEGIN
  NEW_CHAINS(NCHAINS);


  { Get the SDO and SDI for each chain piece. }

MSG('Now enter the package pin names of the SDO, SDI,');
MSG('CLOCK, and SHIFT_ENABLES for each chain piece.');

FOR I:= 1 TO NCHAINS DO
BEGIN
  INIT_NUL(BUF,256);

  { SDO }

  MSG('');
  WRITE('Enter the name for SDO #',I:-1,' >>');
  IF EOF(INPUT) THEN EXIT;
  READLN(BUF);
  COUNT_CHARS(BUF,256,NCHARS);
  FOR N:= 1 TO NCHARS DO
    BUF[N]:=UPPER_CASE(BUF[N]);
  SUBST_STRING_T_FROM_STATIC(BUF,NCHARS,CHAINS[I].SDO.ID);

  { SDI }

  MSG('');
  INIT_NUL(BUF,256);
  WRITE('Enter the name for SDI #',I:-1,' >>');
  IF EOF(INPUT) THEN EXIT;
  READLN(BUF);
  COUNT_CHARS(BUF,256,NCHARS);
  FOR N:= 1 TO NCHARS DO
    BUF[N]:=UPPER_CASE(BUF[N]);
  SUBST_STRING_T_FROM_STATIC(BUF,NCHARS,CHAINS[I].SDI.ID);

  { CLK }

  MSG('');
  INIT_NUL(BUF,256);
  WRITE('Enter the name for CLK #',I:-1,' >>');
  IF EOF(INPUT) THEN EXIT;
  READLN(BUF);
  COUNT_CHARS(BUF,256,NCHARS);
  FOR N:= 1 TO NCHARS DO
    BUF[N]:=UPPER_CASE(BUF[N]);
  SUBST_STRING_T_FROM_STATIC(BUF,NCHARS,CHAINS[I].CLK.ID);
```

```
{ SHIFT_ENABLES }

MSG('');
MSG('Now enter the names of those pins which');
MSG('must be HIGH in order to shift.');
MSG('Enter ONE name per transmit.');
MSG('When finished, transmit a blank.');

FOR S:= 1 TO MAX_SHIFT_ENABLES DO
BEGIN
  INIT_NUL(BUF,256);
  WRITE('Enter the name for SHIFT ENABLE #',S:-1,' for chain piece #',I:-1,' >>');
  IF EOF(INPUT) THEN EXIT;
  READLN(BUF);
  COUNT_CHARS(BUF,256,NCHARS);
  IF NCHARS = 0 THEN EXIT;
  FOR N:= 1 TO NCHARS DO
    BUF[N]:=UPPER_CASE(BUF[N]);
  SUBST_STRING_T_FROM_STATIC(BUF,NCHARS,CHAINS[I].SHIFT_ENABLE[S].ID);
 END;
END;
END;
END;
END; {GET_CHAIN_INFO}
Begin {initialize_globals}

 MSG(VERSION_STM);
 GET_TIME_STAMP(TIME_STAMP);
 MSG(TIME_STAMP);

 ERROR_COUNT := 0;
 WARNING_COUNT := 0;
 NMACROS := 0;
 NLIBRARY_LATCHES:=0;
 NLATCHES:=0;
 NLIBRARY_STATES := 0;
 NEW_NSTATES:=0;
 NSTATES:=0;
 NINST := 0;
 NNET := 0;
 NSIM_NETS:=0;
 NSIM_LATCH_EQNS:=0;
 NSTATE_NETS:=0;
 NCONSTANTS:=0;
 NTWIN_OUTS:=0;
 NDUMMY_INSTS:=0;
 NDUMMY_NETS:=0;

 NPINS := 0;
 NOUTPINS:= 0;
 NINPINS := 0;

 NCHAINS:=0;
```

```
MAX_RANK:= INIT_RANK;
MAX_STATE_RANK:= INIT_RANK+1;

PREORDER_COUNT:=0;
INORDER_COUNT:=0;

GET_WORKING_DIR;
PARSE_COMMAND_LINE;

IF NOT GEN_SCHEMATICS THEN
BEGIN
  OPEN_FILES;
  IF TRACE_CHAIN THEN
  BEGIN
    GET_CHAIN_INFO;
  END;
END;

End; {initialize_globals}
{* * * * * * * * * * * * * * * * * * * * * * * * * * * * * * * * * * * * * * *}

Procedure Sort_netlist; {level 2}
TYPE ARGRECORD = RECORD
       LENGTH:INTEGER;
       DATA:ARRAY[1..32] OF CHAR;
     END;
VAR
    MODE:PGM_$MODE;
    ARGS:ARRAY [1..5] OF ARGRECORD;
    ARGVECTOR:ARRAY [1..5] OF ^ARGRECORD;
    RESERVED:ARRAY[1..8] OF REAL;
    STATUS:STATUS_$T;
    STAT:INTEGER32;
    I:INTEGER;
Begin {sort_netlist}
  {%debug MSG('SORT NETLIST REACHED!'); }
     ARGS[1].LENGTH:=3;
     ARGS[1].DATA:='SRF';
     ARGS[2].LENGTH:=2;
     ARGS[2].DATA:='-S';
     ARGS[3].LENGTH:=2;
     ARGS[3].DATA:='26';
     ARGS[4].LENGTH:=2;
     ARGS[4].DATA:='-F';
     ARGS[5].LENGTH:=2;
     ARGS[5].DATA:='-I';
     FOR I:=1 TO 5 DO
       ARGVECTOR[I]:=ADDR(ARGS[I]);
     STREAM_$OPEN(NETLIST_TITLE,COMP_NAME_LENGTH+8,STREAM_$READ,STREAM_$UNREGULATED,CONNV[1],STATUS);
     IF STATUS.ALL <> STATUS_$OK THEN
     BEGIN
       ERROR ('Problem with file.');
       WRITELN('>>',NETLIST_TITLE:-1);
       TERMINATE(ABNORMAL);
```

```
    END;

    STREAM_$CREATE(SORTED_NETLIST_TITLE,COMP_NAME_LENGTH+18,STREAM_$OVERWRITE,STREAM_$UNREGULATED,CONNV[2],STATUS);
    IF STATUS.ALL <> STATUS_$OK THEN
    BEGIN
      ERROR ('Problem with file.');
      WRITEln('>>',SORTED_NETLIST_TITLE:-1);
      TERMINATE(ABNORMAL);
    END;

    MODE:=[PGM_$WAIT];
    PGM_$INVOKE('/COM/SRF',8,5,ARGVECTOR,2,CONNV,MODE, RESERVED,STATUS);

    STREAM_$CLOSE(CONNV[1],STATUS);
    STREAM_$CLOSE(CONNV[2],STATUS);

    OPEN(INSTANCE_NETLIST,NETLIST_TITLE,'OLD',STAT);
    IF STAT > 0 THEN
    BEGIN
      ERROR ('Problem with file.');
      WRITE('>>',NETLIST_TITLE:-1);
      TERMINATE(ABNORMAL);
    END;
    RESET(INSTANCE_NETLIST);

    OPEN(NET_NETLIST,SORTED_NETLIST_TITLE,'OLD',STAT);
    IF STAT > 0 THEN
    BEGIN
      ERROR ('Problem with file.');
      WRITE('>>',SORTED_NETLIST_TITLE:-1);
      TERMINATE(ABNORMAL);
    END;
    RESET(NET_NETLIST);

  End; {sort_netlist}

 (* * * * * * * * * * * * * * * * * * * * * * * * * * * * * * * * * * * * * * *)


Begin {initialize}
  IUTIL_CHECK_OPTIONS := [];
  IUTIL_$INIT(IUTIL_CHECK_OPTIONS,STATUS);
  IF STATUS.ALL <> STATUS_$OK THEN
  BEGIN
    ERROR ('IUTIL failed to initialize.');
    TERMINATE(ABNORMAL);
  END;
    Initialize_globals;
    IF INTERFACE = BURLIST THEN Sort_netlist;
  End; {initialize}

   (* * * * * * * * * * * * * * * * * * * * * * * * * * * * * * * * * * * * * * *)
    Procedure New_node(IN OUT pnode: link); {level 1}
    VAR I:INTEGER;
```

```
{NEW_NODE is used by procedures LOAD_MACROCELL_EQN_LIBRARY, COPY,  and
 DEFINE_NET_EQUATIONS to create and initialize new nodes for the tree
 structures.  }

Begin {new_node}

  NEW(PNODE);
  NEW_STRING_T(PNODE^.DATA.ID);
  PNODE^.DATA.TYPE_ID := OPERATOR_ID;
  PNODE^.DATA.INDEX := -1;
  PNODE^.LLINK := NIL;
  PNODE^.RLINK := NIL;
End; {new_node}
{* * * * * * * * * * * * * * * * * * * * * * * * * * * * * * * * * * * * * * *}
Procedure MAKE_EQN_NAME(IN ELEMENT,PIN:DYNAMIC_STRING_T; IN OUT NAME:DYNAMIC_STRING_T);
VAR NCHARS:INTEGER;
    TEMP:BUFFER300;
Begin {MAKE_EQN_NAME}

        {Equation names are in the form ELEMENT$PIN }

  INIT_NUL(TEMP,300);
  MOVE(ELEMENT.CHARS^, 1, ELEMENT.LEN, TEMP, 1);
  TEMP[ELEMENT.LEN+1]:='$';
  MOVE(PIN.CHARS^, 1, PIN.LEN, TEMP, ELEMENT.LEN+2);
  NCHARS:=ELEMENT.LEN+PIN.LEN+1;
  SUBST_STRING_T_FROM_STATIC(TEMP,NCHARS,NAME);
End;  {MAKE_EQN_NAME}
{* * * * * * * * * * * * * * * * * * * * * * * * * * * * * * * * * * * * * * *}

Procedure Find_eqn_in_library(IN EQN_NAME:dynamic_string_t;
                              OUT INDEX1,INDEX2:INTEGER);
VAR I,N:INTEGER;
Begin {Find_eqn_in_library}
  INDEX1:=-1;
  INDEX2:=-1;

  FOR I:= 1 TO NMACROS DO
  BEGIN
    FOR N:=1 TO MAX_OUTPINS DO
    BEGIN
      IF MACRO_LIBRARY[I].out_defs[n] = NIL THEN
        EXIT;

      IF EQUIV(MACRO_LIBRARY[I].out_defs[n]^.ID, EQN_NAME) THEN
      BEGIN
        INDEX1:=I;
        INDEX2:=N;
        RETURN;
      END;
    END;
  END;

 {Equation not found.}
```

```
  INDEX1:=1; {Allow program to continue.}
  INDEX2:=1; {Allow program to continue.}
  ERROR ('Primitive used is not in library.');
  WRITELN('>>',EQN_NAME.CHARS^:EQN_NAME.LEN);
End;  {Find_eqn_in_library}
{  *     *     *     *     *     *     *     *     *     *     *     *     * }
FUNCTION DUPLICATE_PIN(IN PIN:DYNAMIC_STRING_T;IN NMACRO:INTEGER16; IN OUT INDEX:INTEGER16):BOOLEAN;
VAR I:INTEGER16;
BEGIN {DUPLICATE_PIN}
  DUPLICATE_PIN:=FALSE;

  FOR I:=1 TO MAX_OUTPINS DO
  BEGIN
    IF MACRO_LIBRARY[NMACRO].DUPPINS[I] = NIL THEN EXIT;

    IF EQUIV( MACRO_LIBRARY[NMACRO].DUPPINS[I]^.ID, PIN) THEN
    BEGIN
      { success! }
      INDEX:= MACRO_LIBRARY[NMACRO].DUPPINS[I]^.DEF_PIN_INDEX;
      {%DEBUG WRITELN('#FOUND DEFINING PIN ',PIN.CHARS^:PIN.LEN,', INDEX=',INDEX:-1);}
      DUPLICATE_PIN:=TRUE;
      RETURN;
    END;
  END;

END;  {DUPLICATE_PIN}
{  *     *     *     *     *     *     *     *     *     *     *     *     * }
FUNCTION DUPLICATE_INV(IN PIN:DYNAMIC_STRING_T;IN NMACRO:INTEGER16; IN OUT INDEX:INTEGER16):BOOLEAN;
VAR I:INTEGER16;
BEGIN {DUPLICATE_INV}
  DUPLICATE_INV:=FALSE;

  FOR I:=1 TO MAX_OUTPINS DO
  BEGIN
    IF MACRO_LIBRARY[NMACRO].DUPINVS[I] = NIL THEN EXIT;

    IF EQUIV( MACRO_LIBRARY[NMACRO].DUPINVS[I]^.ID, PIN) THEN
    BEGIN
      { success! }
      INDEX:= MACRO_LIBRARY[NMACRO].DUPINVS[I]^.DEF_PIN_INDEX;
      {%DEBUG WRITELN('#FOUND DEFINING PIN ',PIN.CHARS^:PIN.LEN,', INDEX=',INDEX:-1);}
      DUPLICATE_INV:=TRUE;
      RETURN;
    END;
  END;

END;  {DUPLICATE_INV}
{* * * * * * * * * * * * * * * * * * * * * * * * * * * * * * * * * * * * * * *}
Procedure Load_macrocell_eqn_library; {level 1}
VAR CH:CHAR;
    NET,EQN_NAME,MACRO_NAME,THIS_MACRO:dynamic_string_t;
    I,J,LEN,NOUT_DEFS:INTEGER;
    TEMP:BUFFER300;

    plink,          {Points to the next node whose links are to be set.}
```

```
   proot_term,
   proot_factor,
   proot_expression: link;
                  {Points to the current root of the quantity being
                   parsed.  May indicate a subtree of an expression.}

 {LOAD_MACROCELL_EQN_LIBRARY is called by DEFINE_INTERNAL_LOGIC.
  Its responsibility is to take the equation library and create one
  tree structure defining each equation. The array MACRO_LIBRARY contains
  one record for each macrocell definition in the library.  The field
  MACRO_LIBRARY[I].OUT_DEFS contains one record of type boolean_equation
  for every combinatorial logic equation in the library.  The array
{ *   *   *   *   *   *   *   *   *   *   *   *

  Function Set_type(IN ID:dynamic_string_t):data_type; {level 3}
  VAR I:INTEGER;
    TEMP:BUFFER10;

  {Each token from the library equations must be either an
   OPERATOR_ID, LATCH_ID, STATE_ID, or PIN_ID.  Tokens (ID) must meet one of the
   following criteria.

     Legal operators are OR '+', XOR '@', AND '*', and NOT ''''.
     Strings which are to indicate STATE_ID's must begin with 'STATE$',
     LATCH_ID'S with 'LATCH$'.  Any other token must be a PIN_ID. }

  Begin {Set_type}
    IF ID.CHARS^[1] IN ['+','*','@',''''] THEN
      SET_TYPE:=OPERATOR_ID
    ELSE
    BEGIN
      INIT_NUL(TEMP,10);
      MOVE(ID.CHARS^,1,MIN(6,ID.LEN),TEMP,1);
      IF (TEMP  = 'STATE$') THEN
        SET_TYPE:=STATE_ID
      ELSE IF (TEMP  = 'LATCH$') THEN
        SET_TYPE:=LATCH_ID
      ELSE
        SET_TYPE:=PIN_ID;
    END;
  End;  {Set_type}

{ *   *   *   *   *   *   *   *   *   *   *   *   *   *   *  }

  Procedure Pack_net(IN OUT NET:dynamic_string_t); {level 3}
  VAR I,CHAR_NUM:INTEGER;
      TEMP:BUFFER300;
  {PACK_NET is used to pack characters from the library into NET.  It will
   only pack L_STRING_T number of characters which are legal NET_CHARS. If the
   number of NET_CHARS found is fewer than L_STRING_T it left justifies and
   blank fills to the right. PACK_NET will also set NET.LEN  .}

  Begin {pack_net}
    INIT_NUL(TEMP,300);
```

```
CHAR_NUM:=0;
WHILE (CH IN NET_CHARS) AND (CHAR_NUM < L_STRING_T) DO
BEGIN
  CHAR_NUM:=CHAR_NUM+1;
  TEMP[CHAR_NUM]:=CH;
  CH:=NEXT_CHAR_LIBRARY;
END;
SUBST_STRING_T_FROM_STATIC(TEMP,CHAR_NUM,NET);
End; {pack_net}
{ *   *   *   *   *   *   *   *   *   *   *   *   *   *   *   }

Function Map_pin(IN pinname: dynamic_string_t) : integer;  {level 3}
VAR I:INTEGER;
Begin {Map_pin}
  FOR I:=1 TO MAX_INPINS DO
  BEGIN
    IF MACRO_LIBRARY[NMACROS].IN_LIST[I].ID.LEN <= 0 THEN
    BEGIN
      MAP_PIN:=I;
      COPY_STRING_T(PINNAME,MACRO_LIBRARY[NMACROS].IN_LIST[I].ID);
      RETURN;

    END
    ELSE IF EQUIV(MACRO_LIBRARY[NMACROS].IN_LIST[I].ID,PINNAME) THEN
    BEGIN
      MAP_PIN:=I;
      RETURN;
    END;
  END;
  ERROR ('Too many inputs in equation.  MAX_INPINS must be increased.');
  WRITELN('>>', macro_library[nmacros].id.CHARS^:macro_library[nmacros].id.LEN);
End;  {Map_pin}
{ *   *   *   *   *   *   *   *   *   *   *   *   *   *   *   }

Procedure Parse_equation; {level 3}
VAR
  psub_root:  {Points to the current root of the subtree.}
              link;

{PARSE_EQUATION does the actual work of library equation translation.
 It is a recursive procedure which is initially called by either
 DEFINE_CELL (for combinatorial equations) or PARSE_STATE_EQUATION
 (for state equations).       }

 Procedure Link_and; {level 4}
 Begin {Link_and}
   NEW_NODE(PNODE);
   SUBST_STRING_T_FROM_STATIC('*',1,PNODE^.DATA.ID);
   PNODE^.DATA.TYPE_ID:=OPERATOR_ID;
   PNODE^.LLINK := PROOT_TERM;
   PROOT_TERM:=NIL;
   PROOT_FACTOR := PNODE;
   PLINK:=PNODE;
 End;  {link_and}
```

```
Procedure Link_or; {level 4}
Begin {Link_or}
  NEW_NODE(PNODE);
  SUBST_STRING_T_FROM_STATIC('+',1,PNODE^.DATA.ID);
  PNODE^.DATA.TYPE_ID:=OPERATOR_ID;
  PNODE^.LLINK := PROOT_FACTOR;
  PROOT_FACTOR:=NIL;
  PROOT_EXPRESSION := PNODE;
End;  {link_or}

Procedure Link_xor; {level 4}
Begin {Link_xor}
  NEW_NODE(PNODE);
  SUBST_STRING_T_FROM_STATIC('@',1,PNODE^.DATA.ID);
  PNODE^.DATA.TYPE_ID:=OPERATOR_ID;
  PNODE^.LLINK := PROOT_FACTOR;
  PROOT_FACTOR:=NIL;
  PROOT_EXPRESSION := PNODE;
End;  {link_xor}

Procedure Link_not_net; {level 4}
Begin {Link_not_net}
  NEW_NODE(PNODE);
  SUBST_STRING_T_FROM_STATIC('''',1,PNODE^.DATA.ID);
  PNODE^.DATA.TYPE_ID:=OPERATOR_ID;
  IF PLINK <> NIL THEN
  BEGIN
    IF PLINK^.LLINK = NIL THEN
      PLINK^.LLINK := PNODE
    ELSE
      PLINK^.RLINK := PNODE;
    PROOT_TERM:=PLINK;
    PLINK := PNODE;
  END
  ELSE
  BEGIN
    PLINK := PNODE;
    PROOT_TERM := PNODE;
  END;

End;  {link_not_net}

Procedure Link_not_exp; {level 4}
Begin {Link_not_exp}
  NEW_NODE(PNODE);
  SUBST_STRING_T_FROM_STATIC('''',1,PNODE^.DATA.ID);
  PNODE^.DATA.TYPE_ID:=OPERATOR_ID;
  PNODE^.LLINK := PROOT_EXPRESSION;
  PROOT_EXPRESSION := PNODE;
End;  {link_not_exp}

Procedure Link_net; {level 4}
Begin {Link_net}
  NEW_NODE(PNODE);
```

```
  SUBST_STRING_T(NET,PNODE^.DATA.ID);
  PNODE^.DATA.TYPE_ID:=SET_TYPE(NET);
  IF PNODE^.DATA.TYPE_ID = PIN_ID THEN {State indexes will be set latter.}
    PNODE^.DATA.INDEX:=MAP_PIN(NET);
  IF PLINK <> NIL THEN
  BEGIN
    IF PLINK^.LLINK = NIL THEN
      PLINK^.LLINK := PNODE
    ELSE
      PLINK^.RLINK := PNODE;
    IF PROOT_TERM = NIL THEN
      PROOT_TERM:=PLINK;
    PLINK := NIL;
  END
  ELSE
    PROOT_TERM := PNODE;
End;  {link_net}

Procedure Create_subtree; {level 4}
Begin {create_subtree}
  IF PROOT_EXPRESSION <> NIL THEN
    PSUB_ROOT := PROOT_EXPRESSION
  ELSE IF PROOT_FACTOR <> NIL THEN
    PSUB_ROOT:=PROOT_FACTOR
  ELSE IF PROOT_TERM <> NIL THEN
    PSUB_ROOT:=PROOT_TERM;
  PLINK := NIL;
  PROOT_EXPRESSION := NIL;
  PROOT_TERM:=NIL;
  PROOT_FACTOR:=NIL;
End;  {create_subtree}

Procedure Link_subtree; {level 4}
Begin {link_subtree}
  IF PSUB_ROOT <> NIL THEN
  BEGIN
    IF PSUB_ROOT^.LLINK = NIL THEN
      PSUB_ROOT^.LLINK := PROOT_EXPRESSION
    ELSE
      PSUB_ROOT^.RLINK := PROOT_EXPRESSION;
    PROOT_EXPRESSION := NIL;
    PROOT_FACTOR:=NIL;
    PROOT_TERM := PSUB_ROOT;
    PSUB_ROOT := NIL;
    PLINK:=NIL;
  END
  ELSE
  BEGIN
    PROOT_TERM:=PROOT_EXPRESSION;
    PROOT_EXPRESSION:=NIL;
  END;
End;  {link_subtree}

Procedure Parse_factor; {level 4}
```

```
Procedure Parse_term; {level 5}
Begin {parse_term}

  CASE CH OF

    'A','B','C','D','E','F',
    'G','H','I','J','K','L',
    'M','N','O','P','Q','R',
    'S','T','U','V','W','X',
    'Y','Z':
    {NET_INIT_CHAR}     BEGIN
                          PACK_NET(NET);
                          IF CH = '''' THEN
                          BEGIN
                            LINK_NOT_NET;
                            CH:=NEXT_CHAR_LIBRARY;
                          END;
                          LINK_NET;
                        END;

    '(' :               BEGIN
                          CREATE_SUBTREE;
                          CH:=NEXT_CHAR_LIBRARY;
                          PARSE_EQUATION;
                          IF CH = ')' THEN
                          BEGIN
                            CH:=NEXT_CHAR_LIBRARY;

                            IF CH = '''' THEN
                            BEGIN
                              LINK_NOT_EXP;
                              CH:=NEXT_CHAR_LIBRARY;
                            END;

                            LINK_SUBTREE;
                          END
                          ELSE
                          BEGIN
                            ERROR ('Bad syntax in library.  Right paren expected.');
                            WRITELN('>>',EQN_NAME.CHARS^:EQN_NAME.LEN);
                          END;
                        END;

      OTHERWISE         BEGIN
                          ERROR ('Bad syntax in library.  Boolean expression expected.');
                          WRITELN('>>',EQN_NAME.CHARS^:EQN_NAME.LEN);
                        END;

    END;
  End; {parse_term}

Begin {parse_factor}
  PARSE_TERM;
```

```
    WHILE CH = '*' DO
    BEGIN
      LINK_AND;
      CH:=NEXT_CHAR_LIBRARY;
      PARSE_TERM;
    END;
    IF PROOT_FACTOR = NIL THEN
    BEGIN
      PROOT_FACTOR := PROOT_TERM;
    END;
    PROOT_TERM:=NIL;
  End; {parse_factor}


Begin {parse_equation}
  PSUB_ROOT := NIL;
  PARSE_FACTOR;

  WHILE CH IN ['+','@'] DO
  BEGIN
    IF CH = '+' THEN
      LINK_OR
    ELSE IF CH = '@' THEN
      LINK_XOR;
    CH:=NEXT_CHAR_LIBRARY;
    PARSE_FACTOR;
    IF PROOT_EXPRESSION<> NIL THEN
    BEGIN
      PROOT_EXPRESSION^.RLINK:=PROOT_FACTOR;
      PROOT_FACTOR:=PROOT_EXPRESSION;
    END;
  END;
  IF PROOT_EXPRESSION = NIL THEN
  BEGIN
    PROOT_EXPRESSION:=PROOT_FACTOR;
  END;
  PROOT_FACTOR:=NIL;
End; {parse_equation}

{ *   *   *   *   *   *   *   *   *   *   *   *   *   *   *   }

Procedure Parse_state_equation; {level 3}
VAR TEMP:BUFFER10;
  { *   *   *   *   *   *   *   *   *   *   *   *   *   *   *   }
  PROCEDURE NEW_MACRO_STATE_EQN;
  BEGIN {NEW_MACRO_STATE_EQN}
    NLIBRARY_STATES:=NLIBRARY_STATES+1;
    IF NLIBRARY_STATES > MAX_NLIBRARY_STATES THEN
    BEGIN
      ERROR ('Too many state equations in library. MAX_NLIBRARY_STATES must be increased.');
      TERMINATE(ABNORMAL);
    END;

    COPY_STRING_T(EQN_NAME, MACRO_STATE_LIBRARY[NLIBRARY_STATES].ID);
```

```
END;{NEW_MACRO_STATE_EQN}
{ *    *    *    *    *    *    *    *    *    *    *    *    *    *    *  }
PROCEDURE NEW_MACRO_LATCH_EQN;
BEGIN {NEW_MACRO_LATCH_EQN}
  NLIBRARY_LATCHES:=NLIBRARY_LATCHES+1;
  IF NLIBRARY_LATCHES > MAX_NLIBRARY_LATCHES THEN
  BEGIN
    ERROR ('Too many latch equations in library. MAX_NLIBRARY_LATCHES must be increased.');
    TERMINATE(ABNORMAL);
  END;

  COPY_STRING_T(EQN_NAME, MACRO_LATCH_LIBRARY[NLIBRARY_LATCHES].ID);
END;{NEW_MACRO_LATCH_EQN}
{ *    *    *    *    *    *    *    *    *    *    *    *    *    *    *  }
Begin {parse state equation}
  CH:=NEXT_CHAR_LIBRARY;

  { Note: Before release AH this was a noise word. Now it is required.}
  PACK_NET(NET); {Should be "STATE" or "LATCH" identification.}

  INIT_NUL(TEMP,10);
  MOVE(NET.CHARS^,1,MIN(10,NET.LEN),TEMP,1);
  IF TEMP  = 'STATE' THEN
    NEW_MACRO_STATE_EQN
  ELSE IF TEMP = 'LATCH' THEN
    NEW_MACRO_LATCH_EQN
  ELSE
  BEGIN
    ERROR ('Bad syntax in library.  Missing STATE or LATCH identification.');
    WRITELN('>>',EQN_NAME.CHARS^:EQN_NAME.LEN);
  END;


  IF CH = '=' THEN
  BEGIN   { equation found}
    CH := NEXT_CHAR_LIBRARY;
    PARSE_EQUATION;

    IF TEMP  = 'STATE' THEN
    BEGIN
      MACRO_STATE_LIBRARY[ NLIBRARY_STATES ].EQN := PROOT_EXPRESSION
      {%DEBUG WRITE(MACRO_STATE_LIBRARY[NLIBRARY_STATES].ID.CHARS^:MACRO_STATE_LIBRARY[NLIBRARY_STATES].ID.LEN,'=');INORDER_COUNT:=0
      {%DEBUG WRITE(MACRO_STATE_LIBRARY[NLIBRARY_STATES].ID.CHARS^:MACRO_STATE_LIBRARY[NLIBRARY_STATES].ID.LEN,'=');PREORDER_COUNT:=
    END
    ELSE IF TEMP = 'LATCH' THEN
    BEGIN
      MACRO_LATCH_LIBRARY[ NLIBRARY_LATCHES ].EQN := PROOT_EXPRESSION;
      {%DEBUG WRITE(MACRO_LATCH_LIBRARY[NLIBRARY_LATCHES].ID.CHARS^:MACRO_LATCH_LIBRARY[NLIBRARY_LATCHES].ID.LEN,'=');INORDER_COUNT:
      {%DEBUG WRITE(MACRO_LATCH_LIBRARY[NLIBRARY_LATCHES].ID.CHARS^:MACRO_LATCH_LIBRARY[NLIBRARY_LATCHES].ID.LEN,'=');PREORDER_COUNT
    END;
  END
  ELSE
  BEGIN
    ERROR ('Bad syntax in library.  State equation expected.');
```

```
    WRITELN('>>',EQN_NAME.CHARS^:EQN_NAME.LEN);
  END;
End; {parse state equation}
{ *    *    *    *    *    *    *    *    *    *    *    *    *    *    *    }

Procedure Parse_duplicate_pin; {level 3}
VAR INDEX:INTEGER16;
    TEMP:BUFFER10;

  {  *    *    *    *    *    *    *    *    *    *    *    *    *  }
  PROCEDURE FIND_PIN_IN_OUT_DEFS(IN PIN:DYNAMIC_STRING_T; IN OUT INDEX:INTEGER16);
  VAR I:INTEGER16;
  BEGIN {FIND_PIN_IN_OUT_DEFS}
    INDEX:=1; { This default will allow the program to continue in case of error.}

    FOR I:=1 TO NOUT_DEFS-1 DO
    BEGIN
      IF MACRO_LIBRARY[NMACROS].OUT_DEFS[I] = NIL THEN EXIT;

      IF EQUIV( MACRO_LIBRARY[NMACROS].OUT_DEFS[I]^.ID, PIN) THEN
      BEGIN
        { success! }
        INDEX:=I;
        {%DEBUG WRITELN('#FOUND PIN ',PIN.CHARS^:PIN.LEN,' in library equation ',EQN_NAME.CHARS^:EQN_NAME.LEN,', INDEX=',INDEX:-1);}
        RETURN;
      END;
    { Problems !}

    ERROR ('Bad syntax in library.  Reference to an undefined DUPPIN.');
    WRITELN('PIN >>',NET.CHARS^:NET.LEN,', EQN >>',EQN_NAME.CHARS^:EQN_NAME.LEN);

  END;  {FIND_PIN_IN_OUT_DEFS}
{  *    *    *    *    *    *    *    *    *    *    *    *    *    *  }
  PROCEDURE ADD_PIN_TO_DUPPINS(IN EQN_NAME:DYNAMIC_STRING_T; IN INDEX:INTEGER16);
  VAR I,NDUPS,START,NCHARS:INTEGER16;
  BEGIN

    { EQN_NAME is of the form MACRO_NAME$PIN.
      Cut out the PIN for the ID field.
      Use NET as a buffer for the PIN. }

    START:=MACRO_NAME.LEN+2;
    NCHARS:=EQN_NAME.LEN-START+1;
    MOVE_STRING_T_FROM_STATIC(EQN_NAME.CHARS^,START,NCHARS,NET);

     { Check to see if the PIN already exists. }

    NDUPS:=0;

    FOR I:= 1 TO MAX_OUTPINS DO
    BEGIN
      IF MACRO_LIBRARY[NMACROS].DUPPINS[I] = NIL THEN
      BEGIN
        NDUPS:=I;
```

```
      EXIT;
    END;

    IF EQUIV(MACRO_LIBRARY[NMACROS].DUPPINS[I]^.ID, NET) THEN
    BEGIN
      ERROR ('Bad library syntax.  Previously defined pin.');
      WRITELN('>>',EQN_NAME.CHARS^:EQN_NAME.LEN);
      RETURN;
    END;

  END;

  IF NDUPS <= 0 THEN
  BEGIN
    ERROR ('MAX_OUTPINS MUST BE INCREASED.');
    TERMINATE(ABNORMAL);
  END
  ELSE
  BEGIN
    { Add pin to DUPPINS list. }

    NEW(MACRO_LIBRARY[NMACROS].DUPPINS[NDUPS]);
    COPY_STRING_T(NET, MACRO_LIBRARY[NMACROS].DUPPINS[NDUPS]^.ID);
    MACRO_LIBRARY[NMACROS].DUPPINS[I]^.DEF_PIN_INDEX:=INDEX;
  END;


END; {ADD_PIN_TO_DUPPINS}
{  *     *     *     *     *     *     *     *     *     *     *     *     * }
PROCEDURE ADD_PIN_TO_DUPINVS(IN EQN_NAME:DYNAMIC_STRING_T; IN INDEX:INTEGER16);
VAR I,NDUPS,START,NCHARS:INTEGER16;
BEGIN {ADD_PIN_TO_DUPINVS}

  { EQN_NAME is of the form MACRO_NAME$PIN.
    Cut out the PIN for the ID field.
    Use NET as a buffer for the PIN. }

START:=MACRO_NAME.LEN+2;
NCHARS:=EQN_NAME.LEN-START+1;
MOVE_STRING_T_FROM_STATIC(EQN_NAME.CHARS^,START,NCHARS,NET);

 { Check to see if the PIN already exists. }

NDUPS:=0;

FOR I:= 1 TO MAX_OUTPINS DO
BEGIN
  IF MACRO_LIBRARY[NMACROS].DUPINVS[I] = NIL THEN
  BEGIN
    NDUPS:=I;
    EXIT;
  END;

  IF EQUIV(MACRO_LIBRARY[NMACROS].DUPINVS[I]^.ID, NET) THEN
  BEGIN
```

```
      ERROR ('Bad library syntax.  Previously defined pin.');
      WRITELN('>>',EQN_NAME.CHARS^:EQN_NAME.LEN);
      RETURN;
    END;

  END;

  IF NDUPS <= 0 THEN
  BEGIN
    ERROR ('MAX_OUTPINS MUST BE INCREASED.');
    TERMINATE(ABNORMAL);
  END
  ELSE
  BEGIN
    { Add pin to DUPINVS list. }

    NEW(MACRO_LIBRARY[NMACROS].DUPINVS[NDUPS]);
    COPY_STRING_T(NET, MACRO_LIBRARY[NMACROS].DUPINVS[NDUPS]^.ID);
    MACRO_LIBRARY[NMACROS].DUPINVS[I]^.DEF_PIN_INDEX:=INDEX;
  END;


 END;   {ADD_PIN_TO_DUPINVS}
{  *    *    *    *    *    *    *    *    *    *    *    *    * }


Begin {parse_duplicate_pin}

 CH:=NEXT_CHAR_LIBRARY;
 PACK_NET(NET); {NET must be equal to either "DUPOUT" or "DUPINV".}

 INIT_NUL(TEMP,10);
 MOVE(NET.CHARS^,1,MIN(10,NET.LEN),TEMP,1);
 IF NOT ((TEMP  = 'DUPOUT') OR (TEMP = 'DUPINV')) THEN
 BEGIN
   ERROR ('Bad library syntax.  Missing DUPOUT or DUPINV identification.');
   WRITELN('>>',EQN_NAME.CHARS^:EQN_NAME.LEN);
 END;


 IF CH = '=' THEN
 BEGIN
   CH := NEXT_CHAR_LIBRARY;

   { Get name of the defining pin.}

    PACK_NET(NET);

    { NET is the defining pin.  Check to see if NET
      is already on the DUPPINS list for this macro.}

    IF NOT DUPLICATE_PIN(NET,NMACROS, INDEX) THEN
    BEGIN
```

```
      {Equation names are in the form MACRO_NAME$PIN }
      {Create equation name for the duplicate pin.}

      MAKE_EQN_NAME(MACRO_NAME,NET,NET);

      {Find the duplicate pin reference in OUT_DEFS.}

      FIND_PIN_IN_OUT_DEFS(NET, INDEX);

    END;

    IF TEMP = 'DUPOUT' THEN
    BEGIN
      ADD_PIN_TO_DUPPINS(EQN_NAME, INDEX);

      {EQN will be the same as for the duplicate pin.}

      MACRO_LIBRARY[NMACROS].out_defs[nout_defs]^.EQN:=MACRO_LIBRARY[NMACROS].out_defs[INDEX]^.EQN
    END
    ELSE IF TEMP = 'DUPINV' THEN
    BEGIN
      ADD_PIN_TO_DUPINVS(EQN_NAME, INDEX);

      {Add a NOT operator to invert the equation for the defining pin.}

      NEW_NODE(PNODE);
      SUBST_STRING_T_FROM_STATIC('''',1,PNODE^.DATA.ID);
      PNODE^.DATA.TYPE_ID:=OPERATOR_ID;
      PNODE^.LLINK := MACRO_LIBRARY[NMACROS].out_defs[INDEX]^.EQN;

      MACRO_LIBRARY[NMACROS].out_defs[nout_defs]^.EQN := PNODE;
    END;

  END
  ELSE
  BEGIN
    ERROR ('Bad library syntax.  DUPLICATE PIN expected.');
    WRITELN('>>',EQN_NAME.CHARS^:EQN_NAME.LEN);
  END;

  PROOT_EXPRESSION:=MACRO_LIBRARY[NMACROS].out_defs[nout_defs]^.EQN;
End; {parse_duplicate_pin}

{ *    *    *    *    *    *    *    *    *    *    *    *    *    *    *  }

Procedure Define_cell;  {level 3}
VAR I,J:INTEGER;
Begin {define_cell}

  PNODE := NIL;
  PLINK := NIL;
```

```
   PROOT_EXPRESSION := NIL;
   PROOT_FACTOR:= NIL;
   PROOT_TERM := NIL;

   CASE CH OF
     '=' :          BEGIN
                         NOUT_DEFS:=NOUT_DEFS+1;
                         IF NOUT_DEFS > MAX_OUTPINS THEN
                         BEGIN
                           ERROR ('MAX_OUTPINS must be increased.');
                           WRITELN('>>',macro_name.CHARS^:macro_name.LEN);
                           TERMINATE(ABNORMAL);
                         END
                         ELSE
                         BEGIN
                           NEW(MACRO_LIBRARY[NMACROS].OUT_DEFS[NOUT_DEFS]);
                           COPY_STRING_T(EQN_NAME, MACRO_LIBRARY[NMACROS].OUT_DEFS[NOUT_DEFS]^.ID);
                           CH:=NEXT_CHAR_LIBRARY;
                           PARSE_EQUATION;

{%DEBUG  WRITE(MACRO_LIBRARY[NMACROS].out_defs[nout_defs]^.ID.CHARS^:MACRO_LIBRARY[NMACROS].out_defs[nout_defs]^.ID.LEN,'=');INORDER_COU
{%DEBUG WRITE(MACRO_LIBRARY[NMACROS].out_defs[nout_defs]^.ID.CHARS^:MACRO_LIBRARY[NMACROS].out_defs[nout_defs]^.ID.LEN,'=');PREORDER_COU

                           MACRO_LIBRARY[NMACROS].out_defs[nout_defs]^.EQN := PROOT_EXPRESSION;
                         END;
                    END;
{ STATE EQUATION }

      '#' :         BEGIN
                      PARSE_STATE_EQUATION;
                    END;
{ DUPLICATE PIN }

      '%' :         BEGIN

                      NOUT_DEFS:=NOUT_DEFS+1;
                      IF NOUT_DEFS > MAX_OUTPINS THEN
                      BEGIN
                        ERROR ('MAX_OUTPINS must be increased.');
                        WRITELN('>>',macro_name.CHARS^:macro_name.LEN);
                        TERMINATE(ABNORMAL);
                      END
                      ELSE
                      BEGIN
                        NEW(MACRO_LIBRARY[NMACROS].OUT_DEFS[NOUT_DEFS]);
                        COPY_STRING_T(EQN_NAME, MACRO_LIBRARY[NMACROS].OUT_DEFS[NOUT_DEFS]^.ID);
                        PARSE_DUPLICATE_PIN;

{%DEBUG WRITE(MACRO_LIBRARY[NMACROS].out_defs[nout_defs]^.ID.CHARS^:MACRO_LIBRARY[NMACROS].out_defs[nout_defs]^.ID.LEN,'=');INORDER_COUN
{%DEBUG WRITE(MACRO_LIBRARY[NMACROS].out_defs[nout_defs]^.ID.CHARS^:MACRO_LIBRARY[NMACROS].out_defs[nout_defs]^.ID.LEN,'=');PREORDER_COU

                      END;
                    END;
```

```
    OTHERWISE      BEGIN
                     ERROR ('Bad library syntax.  Cell definition expected.');
                     WRITELN('>>',EQN_NAME.CHARS^:EQN_NAME.LEN);
                   END;
  END;
End; {define_cell}


Procedure New_macro;
VAR I,J:INTEGER;
Begin{New_macro}

  NMACROS := NMACROS+1;
  IF NMACROS > MAX_NMACROS THEN
  BEGIN
    ERROR ('Too many elements in library.  MAX_NMACROS must be increased.');
    TERMINATE(ABNORMAL);
  END;
    COPY_STRING_T(MACRO_NAME,MACRO_LIBRARY[NMACROS].ID);
    FOR I:= 1 TO MAX_INPINS DO
    BEGIN
{       MACRO_LIBRARY[NMACROS].IN_LIST[I].ID.CHARS:=NIL;}
      MACRO_LIBRARY[NMACROS].IN_LIST[I].ID.LEN:=0;
      MACRO_LIBRARY[NMACROS].IN_LIST[I].INDEX:=-1;
    END;
    FOR I:=1 TO MAX_OUTPINS DO
    BEGIN
        MACRO_LIBRARY[NMACROS].OUT_DEFS[I]:=NIL;
        MACRO_LIBRARY[NMACROS].DUPINVS[I]:=NIL;
        MACRO_LIBRARY[NMACROS].DUPPINS[I]:=NIL;
    END;
    NOUT_DEFS:=0;
  End; {New_macro}



  Begin {load_macrocell_eqn_library}

    WRITELN('# Using ',LIBRARY_TITLE:-1,'.');

    NEW_STRING_T(NET);
    NEW_STRING_T(EQN_NAME);
    NEW_STRING_T(MACRO_NAME);
    NEW_STRING_T(THIS_MACRO);
    CH:=NEXT_CHAR_LIBRARY;

    WHILE NOT EOF(LIBRARY) DO
    BEGIN

      IF CH IN NET_INIT_CHAR THEN
      BEGIN
        PACK_NET(EQN_NAME) ;
```

```
{EQN_NAME.CHARS^ is of the form MACRO_NAME$PIN}
{Set MACRO_NAME}

LEN:=EQN_NAME.LEN;
FOR I:=1 TO LEN DO
BEGIN
  IF EQN_NAME.CHARS^[I] = '$' THEN
  BEGIN
    LEN:=I-1;
    EXIT;
  END;
END;

INIT_NUL(TEMP,300);
MOVE(EQN_NAME.CHARS^,1,LEN,TEMP,1);
SUBST_STRING_T_FROM_STATIC(TEMP,LEN,MACRO_NAME);

{Make one record for each MACRO_NAME}

IF NOT EQUIV(MACRO_NAME,THIS_MACRO) THEN
BEGIN
  NEW_MACRO;
  SUBST_STRING_T(MACRO_NAME,THIS_MACRO);
END;

      DEFINE_CELL;
      IF CH <> ';' THEN
      BEGIN
        ERROR ('Bad library syntax.  Semi-colon expected.');
        WRITELN('>>',EQN_NAME.CHARS^:EQN_NAME.LEN);
      END;
    END
    ELSE
    BEGIN
      ERROR ('Bad library syntax.  Equation name expected.');
      WRITELN('>>',CH:-1);
    END;

    CH:=NEXT_CHAR_LIBRARY;
  END;

  DISPOSE_STRING_T(NET);
  DISPOSE_STRING_T(EQN_NAME);
  DISPOSE_STRING_T(MACRO_NAME);
  DISPOSE_STRING_T(THIS_MACRO);

{%DEBUG
  FOR I:=1 TO NMACROS DO
  BEGIN
    WRITELN('Inputs for macro ',macro_library[i].id.CHARS^:macro_library[i].id.LEN);
    FOR J:=1 TO MAX_INPINS DO
    BEGIN
      IF MACRO_LIBRARY[I].IN_LIST[J].ID.LEN <= 0 THEN EXIT;
      WRITELN(MACRO_LIBRARY[I].IN_LIST[J].ID.CHARS^:LELEMENT_NAME,', ');
```

```
      END;
      WRITELN;
    END;
}

  End; {load_macrocell_eqn_library}


{*******************************************************************************}
{*******************************************************************************}
Procedure Define_internal_logic; {level 1}
 {* * * * * * * * * * * * * * * * * * * * * * * * * * * * * * * * * * * * * * *}
  Procedure Pack_net_info(IN REC:BUFFER80; IN OUT ELEMENT, {level 2}
                         INST, PIN, NETNAME:dynamic_string_t; OUT IOSPEC:IOSPECIFIER);
  VAR T_ELEMENT,T_INST,T_PIN,T_NETNAME:BUFFER80;
      LEN:INTEGER;

  {PACK_NET_INFO is used by Procedures LOAD_INSTANCE_ARRAY and
   DEFINE_NET_EQUATIONS to take one record of the netlist (REC) and
   return distinct strings specifying the ELEMENT, INST, PIN, NETNAME, and
   IOSPEC.  This procedure could easily apply to any netlist by changing
   the values of the constants which indicate the starting column and
   length of each string.}

  Begin {Pack_net_info}
    INIT_NUL(T_ELEMENT,80);
    INIT_NUL(T_INST,80);
    INIT_NUL(T_PIN,80);
    INIT_NUL(T_NETNAME,80);

    MOVE(REC,ELEMENT_COL,LELEMENT_NAME,T_ELEMENT,1);
    MOVE(REC,INSTANCE_COL,LINSTANCE_NAME,T_INST,1);
    MOVE(REC,PIN_NAME_COL,LPIN_NAME,T_PIN,1);
    MOVE(REC,NETNAME_COL,LNETNAME,T_NETNAME,1);
    MOVE(REC,IOSPECIFIER_COL,LIOSPECIFIER,IOSPEC,1);

    COUNT_CHARS(T_ELEMENT,80,LEN);
    SUBST_STRING_T_FROM_STATIC(T_ELEMENT,LEN,ELEMENT);

    COUNT_CHARS(T_INST,80,LEN);
    SUBST_STRING_T_FROM_STATIC(T_INST,LEN,INST);

    COUNT_CHARS(T_PIN,80,LEN);
    SUBST_STRING_T_FROM_STATIC(T_PIN,LEN,PIN);

    COUNT_CHARS(T_NETNAME,80,LEN);
    SUBST_STRING_T_FROM_STATIC(T_NETNAME,LEN,NETNAME);

  End;  {Pack_net_info}

 {* * * * * * * * * * * * * * * * * * * * * * * * * * * * * * * * * * * * * * *}

 {* * * * * * * * * * * * * * * * * * * * * * * * * * * * * * * * * * * * * * *}
```

```
Procedure New_primary_outpin(IN PIN:dynamic_string_t;IN PTYPE:PIN_TYPE);
VAR I:INTEGER;
Begin {New_primary_outpin}
    {%DEBUG WRITELN('NEW_OUTPIN ',PIN.CHARS^:PIN.LEN);}
    OUTPIN_SET:=TRUE;

    NOUTPINS:=NOUTPINS+1;
    IF NOUTPINS > MAX_PACKAGE_PINS THEN
    BEGIN
      ERROR ('Too many package outputs.  MAX_PACKAGE_PINS must be increased.');
      TERMINATE(ABNORMAL);
    END;

    COPY_STRING_T(PIN,PRIMARY_OUTPINS[NOUTPINS].ID);
    PRIMARY_OUTPINS[NOUTPINS].NET:=NIL;
    PRIMARY_OUTPINS[NOUTPINS].TYPE_ID:=PTYPE;
    NEW_STRING_T(PRIMARY_OUTPINS[NOUTPINS].ELTYPE);
    NEW_STRING_T(PRIMARY_OUTPINS[NOUTPINS].PIN_NUMBER);
    PRIMARY_OUTPINS[NOUTPINS].STATE:=FALSE;
    PRIMARY_OUTPINS[NOUTPINS].DELAY:=MIN_DELAY;
End; {New_primary_outpin}

Procedure New_primary_inpin(IN PIN:dynamic_string_t;IN PTYPE:PIN_TYPE);
Begin {New_primary_inpin}
    {%DEBUG WRITELN('NEW_INPIN ',PIN.CHARS^:PIN.LEN);}
    INPIN_SET:=TRUE;

    NINPINS:=NINPINS+1;
    IF NINPINS > MAX_PACKAGE_PINS THEN
    BEGIN
      ERROR ('Too many package inputs.  MAX_PACKAGE_PINS must be increased.');
      TERMINATE(ABNORMAL);
    END;

    COPY_STRING_T(PIN,PRIMARY_INPINS[NINPINS].ID);
    PRIMARY_INPINS[NINPINS].NET:=NIL;
    PRIMARY_INPINS[NINPINS].TYPE_ID:=PTYPE;
    NEW_STRING_T(PRIMARY_INPINS[NINPINS].ELTYPE);
    NEW_STRING_T(PRIMARY_INPINS[NINPINS].PIN_NUMBER);
    PRIMARY_INPINS[NINPINS].STATE:=TRUE;
    PRIMARY_INPINS[NINPINS].DELAY:=MIN_DELAY;
  End; {New_primary_inpin}
(* * * * * * * * * * * * * * * * * * * * * * * * * * * * * * * * * * * * * * *)

Procedure Load_package_pin_names; {level 2}
VAR PIN,BUS_NAME:dynamic_string_t;
  PTYPE:PIN_TYPE;
  BUS_ID:DFI_$OBJECT_IDENTIFIER;
```

```
(* * * * * * * * * * * * * * * * * * * *)

Function Get_pin_info(IN OUT PIN:dynamic_string_t; OUT PTYPE:PIN_TYPE):boolean;  {level 3}
VAR I,J,LEN,LAST_PIN_CH,FIRST_PIN_CH:INTEGER;
    REC:BUFFER80;
    PIN_NAME_FOUND:BOOLEAN;
    TYP:PACKED ARRAY [1..5] OF CHAR;
    TEMP:BUFFER300;
Begin {Get_pin_info}
  GET_PIN_INFO:=FALSE;
  PTYPE:=PRIMARY_OTHER;

  IF NOT EOF(PACKAGE_PINS) THEN
  BEGIN
    GET_PIN_INFO:=TRUE;
    PIN_NAME_FOUND:=FALSE;

    REPEAT
    BEGIN
      IF EOF(PACKAGE_PINS) THEN
      BEGIN
        GET_PIN_INFO:=FALSE;
        RETURN;
      END;
      REC:=NEXT_REC_PACKAGE_PINS;
      FOR I:= 1 TO 80 DO
      BEGIN
        IF REC[I] <> NUL THEN
        BEGIN
          PIN_NAME_FOUND:=TRUE;
          FIRST_PIN_CH:=I;
          EXIT;
        END;
      END;
    END
    UNTIL PIN_NAME_FOUND;

    LAST_PIN_CH:=-1;
    J:=-1;
    FOR I:= FIRST_PIN_CH TO 80 DO
      IF REC[I] = NUL THEN
      BEGIN
        LAST_PIN_CH:=I-1;
        EXIT;
      END;

    IF (LAST_PIN_CH < FIRST_PIN_CH) OR
       ((LAST_PIN_CH-FIRST_PIN_CH+1) > L_STRING_T) THEN
    BEGIN
      ERROR ('Illegal package pin name.');
      WRITELN('>>',REC:-1);
    END;
```

```
INIT_NUL(TEMP,300);
LEN:=LAST_PIN_CH - FIRST_PIN_CH + 1;
MOVE(REC,FIRST_PIN_CH,LEN,TEMP,1);
SUBST_STRING_T_FROM_STATIC(TEMP,LEN,PIN);

FOR I := LAST_PIN_CH+1 TO 80 DO
  IF REC[I] <> NUL THEN
  BEGIN
    J:=1;
    EXIT;
  END;
  IF (J<0) THEN
  BEGIN
    ERROR ('Illegal package pin io specifier detected.');
    WRITELN('>>',REC:-1);
  END;
  PTYPE:=PRIMARY_OTHER;  {default}

  IF REC[J] IN ['0','1','2','3','4'] THEN
  BEGIN
    CASE REC[J] OF

      '0' :               PTYPE:=PRIMARY_INPUT;
      '1' :               PTYPE:=PRIMARY_OUTPUT;
      '2' :               PTYPE:=PRIMARY_IO;
      '3' :               PTYPE:=PRIMARY_IXO;
      '4' :               PTYPE:=PRIMARY_OTHER;
    OTHERWISE  BEGIN
                 ERROR ('Illegal package pin io specifier detected.');
                 WRITELN('>>',REC:-1);
               END;
    END;
  END
  ELSE
  BEGIN
    INIT_NUL(TYP,LTYPE);
    MOVE(REC,J,LTYPE,TYP,1);
    IF TYP = 'IN' THEN
      PTYPE:=PRIMARY_INPUT
    ELSE IF TYP = 'OP' THEN
      PTYPE:=PRIMARY_OUTPUT
    ELSE IF TYP = 'IO' THEN
      PTYPE:=PRIMARY_IO
    ELSE IF TYP = 'IXO' THEN
      PTYPE:=PRIMARY_IXO
    ELSE IF TYP = 'OTHER' THEN
      PTYPE:=PRIMARY_OTHER
    ELSE
    BEGIN
      ERROR ('Illegal package pin io specifier detected.');
      WRITELN('>>',TYP:-1);
    END;
  END;
```

```
    END;
  End;  {Get_pin_info}


Begin {load_package_pin_names}
  {%debug MSG('LOAD_PACKAGE_PIN_NAMES REACHED!');}
  NEW_STRING_T(PIN);
  NEW_STRING_T(BUS_NAME); {Remains null for BURLIST}
  BUS_ID:=0;

  WHILE NOT EOF(PACKAGE_PINS) DO
  BEGIN
    IF NOT GET_PIN_INFO(PIN,PTYPE) THEN RETURN;
    NPINS:=NPINS+1;
    IF PTYPE = PRIMARY_INPUT THEN
    BEGIN
      NEW_PRIMARY_INPIN(PIN,PTYPE);
    END
    ELSE IF PTYPE = PRIMARY_OUTPUT THEN
    BEGIN
      NEW_PRIMARY_OUTPIN(PIN,PTYPE);
    END
    ELSE IF PTYPE = PRIMARY_IO THEN
    BEGIN
      NEW_PRIMARY_INPIN(PIN,PTYPE);
    END
    ELSE
    BEGIN
      ERROR ('Illegal pintype detected.');
      WRITELN('>>',PTYPE:-1);
    END;
  END;

  DISPOSE_STRING_T(PIN);
  DISPOSE_STRING_T(BUS_NAME);
End; {load_package_pin_names}
{* * * * * * * * * * * * * * * * * * * * * * * * * * * * * * * * * * * * * * *}
Procedure Load_instance_array; {level 2}
VAR
  PINNUM,I,J:INTEGER;
  THIS_INST,NETNAME,INST,PIN,ELEMENT:dynamic_string_t;
  IOSPEC:IOSPECIFIER;
{ *   *   *   *   *   *   *   *   *   *   *   *   *   *   *   *   *   *   *   *}

  Function Get_pinnum(IN pin, ELEMENT:dynamic_string_t) : integer;  {level 3}
  VAR  INDEX,I:INTEGER;
  Begin {Get_pinnum}

    GET_PINNUM:=1; {Default}
    INDEX:=-1;

    FOR I:= 1 TO NMACROS  DO
    BEGIN
```

```
    IF EQUIV(MACRO_LIBRARY[I].ID, ELEMENT) THEN
    BEGIN
       INDEX:=I;
      EXIT;
    END;
  END;

  IF INDEX>0 THEN
  BEGIN
    FOR I:=1 TO MAX_INPINS DO
    BEGIN
      IF MACRO_LIBRARY[INDEX].IN_LIST[I].ID.LEN <= 0 THEN NEXT;

      IF EQUIV(MACRO_LIBRARY[INDEX].IN_LIST[I].ID, PIN) THEN
      BEGIN
        GET_PINNUM:=I;
        RETURN;
      END;
    END;
  END
  ELSE
  BEGIN
    ERROR ('Element was not found in the library.');
    WRITELN('>>',element.CHARS^:ELEMENT.LEN);
    RETURN;
  END;

  ERROR ('Pin does not correspond to any input in the library for this element.');
  WRITELN('PIN >>',pin.CHARS^:PIN.LEN,', ELEMENT >>',element.CHARS^:ELEMENT.LEN);
 End;  {Get_pinnum}
{ *   *   *   *   *   *   *   *   *   *   *   *   *   *   *   *   *   *   *   *}
 Procedure Get_instance(IN WHICH_INST:WHICH_TYPE); {level 3}
 VAR
   REC,NET_SELF,INST_SELF:BUFFER80;
   LEN:INTEGER;
   TEMP:BUFFER10;
 Begin {Get_instance}
   IF WHICH_INST = FRST THEN

BEGIN
  NEW_STRING_T(ELEMENT);
  NEW_STRING_T(INST);
  NEW_STRING_T(PIN);
  NEW_STRING_T(NETNAME);
  INIT_NUL(IOSPEC,LIOSPECIFIER);
END;


IF INTERFACE = BURLIST THEN
BEGIN
  REC:=NEXT_REC_INSTANCE_NETLIST;
  PACK_NET_INFO(REC, ELEMENT, INST, PIN, NETNAME, IOSPEC);
END
ELSE IF INTERFACE = DESIGN_FILE THEN
BEGIN
```

```
{%debug  msg('Accessing dfi--inst');}

IF WHICH_INST = FRST THEN
BEGIN
  DFI_$GET_FIRST_PRIM_INST(CHANNEL_DFI,INST_REC_PTR);
  IF INST_REC_PTR = NIL THEN
  BEGIN
    ERROR ('Bad design file.');
    TERMINATE(ABNORMAL);
  END;

  DFI_$GET_FIRST_PIN_OF(CHANNEL_DFI,INST_REC_PTR^.SELF,dfi_$null_obj_id,
                        PIN_REC_PTR);

  WHILE PIN_REC_PTR = NIL DO
  BEGIN
    {%DEBUG WRITELN('# END OF PIN SCAN.');}
    DFI_$GET_NEXT_INST(INST_REC_PTR);
    IF INST_REC_PTR = NIL THEN
    BEGIN
      {%DEBUG WRITELN('# END OF INST SCAN.');}
      DISPOSE_STRING_T(ELEMENT);
      DISPOSE_STRING_T(INST);
      DISPOSE_STRING_T(PIN);
      DISPOSE_STRING_T(NETNAME);
      RETURN;
    END
    ELSE
    BEGIN
      DFI_$GET_FIRST_PIN_OF(CHANNEL_DFI,INST_REC_PTR^.SELF,dfi_$null_obj_id,
                            PIN_REC_PTR);

    END;
  END;

  GET_INST_PROPERTY_NUM(INST_REC_PTR,'MODEL',MODEL_PROP);
  GET_PIN_PROPERTY_NUM(PIN_REC_PTR,'PINTYPE',IO_PROP);

END
ELSE IF WHICH_INST =  NXT THEN
BEGIN
  ELEMENT.LEN:=0;
  INST.LEN:=0;
  PIN.LEN:=0;
  NETNAME.LEN:=0;
  INIT_NUL(IOSPEC,LIOSPECIFIER);

  DFI_$GET_NEXT_PIN(PIN_REC_PTR);
  WHILE PIN_REC_PTR = NIL DO
  BEGIN
    {%DEBUG WRITELN('# END OF PIN SCAN.');}
    DFI_$GET_NEXT_INST(INST_REC_PTR);
    IF INST_REC_PTR = NIL THEN
```

```
    BEGIN
      {%DEBUG WRITELN('# END OF INST SCAN.');}
      DISPOSE_STRING_T(ELEMENT);
      DISPOSE_STRING_T(INST);
      DISPOSE_STRING_T(PIN);
      DISPOSE_STRING_T(NETNAME);

      RETURN;
    END
    ELSE
    BEGIN
      DFI_$GET_FIRST_PIN_OF(CHANNEL_DFI,INST_REC_PTR^.SELF,dfi_$null_obj_id,
                            PIN_REC_PTR);
    END;
  END;


END
ELSE {QUIT_SCAN}
BEGIN
  ELEMENT.LEN:=0;
  INST.LEN:=0;
  PIN.LEN:=0;
  NETNAME.LEN:=0;
  INIT_NUL(IOSPEC,LIOSPECIFIER);

  DFI_$QUIT_PIN_SCAN(PIN_REC_PTR);
  DFI_$QUIT_INST_SCAN(INST_REC_PTR);

  DISPOSE_STRING_T(ELEMENT);
  DISPOSE_STRING_T(INST);
  DISPOSE_STRING_T(PIN);
  DISPOSE_STRING_T(NETNAME);

  RETURN;
END;

{Assign values to ELEMENT, INST, PIN, NETNAME, IOSPEC}

{ ELEMENT }

SUBST_STRING_T_FROM_STATIC(INST_REC_PTR^.PROPERTIES[MODEL_PROP].VALUE.CHARS^,
  INST_REC_PTR^.PROPERTIES[MODEL_PROP].VALUE.LEN,ELEMENT);

{ PIN }

SUBST_STRING_T_FROM_STATIC(PIN_REC_PTR^.PIN_NAME.CHARS^,PIN_REC_PTR^.PIN_NAME.LEN,PIN);

{ IOSPEC }

IF PIN_REC_PTR^.PROPERTIES[IO_PROP].VALUE.LEN > LIOSPECIFIER THEN
BEGIN
  ERROR ('Illegal PINTYPE.');
  WRITELN('>>',
```

```
    PIN_REC_PTR^.PROPERTIES[IO_PROP].VALUE.CHARS^:PIN_REC_PTR^.PROPERTIES[IO_PROP].VALUE.LEN);
END
ELSE
BEGIN
  MOVE(PIN_REC_PTR^.PROPERTIES[IO_PROP].VALUE.CHARS^,1,
    PIN_REC_PTR^.PROPERTIES[IO_PROP].VALUE.LEN,IOSPEC,1);
END;

      { IOSPEC KLUDGE }

      INIT_NUL(TEMP,10);
      MOVE(ELEMENT.CHARS^,1,MIN(10,ELEMENT.LEN),TEMP,1);
      IF (TEMP = 'VB25') OR (TEMP = 'VB50') THEN
      BEGIN
        INIT_NUL(TEMP,10);
        MOVE(PIN.CHARS^,1,MIN(10,PIN.LEN),TEMP,1);
        IF TEMP = 'PAD' THEN
        BEGIN
          {  VB25 and VB50 have the wrong PINTYPE on their PAD pin.  }
          {  It should be IO. }
          INIT_NUL(IOSPEC,LIOSPECIFIER);
          MOVE('IO',1,2,IOSPEC,1);
        END;
      END;

      { INST }

      TRANS_NUM_TO_CHAR(INST_REC_PTR^.SELF,INST_SELF,LEN);
      SUBST_STRING_T_FROM_STATIC(INST_SELF,LEN,INST);

      { NETNAME }

      DFI_$GET_NET(CHANNEL_DFI,PIN_REC_PTR^.ATTACHED_NET,NET_REC_PTR);

      { Use NET_REC_PTR^.SELF for NETNAME.  }

      TRANS_NUM_TO_CHAR(NET_REC_PTR^.SELF,NET_SELF,LEN);
      SUBST_STRING_T_FROM_STATIC(NET_SELF,LEN,NETNAME);

    END
    ELSE
    BEGIN
      ERROR ('Unsupported interface.');
      WRITELN('>>',INTERFACE:-1);
      TERMINATE(ABNORMAL);
    END;

 End; {Get_instance}
{ *   *   *   *   *   *   *   *   *   *   *   *   *   *   *   *   *   *   *   *}

 Begin {Load_instance_array}
   {%debug MSG('LOAD INSTANCE ARRAY REACHED!');}
   NEW_STRING_T(THIS_INST);
   GET_INSTANCE(FRST);
```

```
WHILE (INST.LEN > 0) DO
BEGIN
  SUBST_STRING_T(INST,THIS_INST);
  NEW_INST(INST);

  REPEAT
  BEGIN
    {%DEBUG WRITELN('ELEMENT=',ELEMENT.CHARS^:ELEMENT.LEN,', INST=',INST.CHARS^:INST.LEN,', PIN=',PIN.CHARS^:PIN.LEN,', NETNAME=',NE
    IF (IOSPEC = 'IN') OR (IOSPEC = 'IO') THEN
    BEGIN
      PINNUM:=GET_PINNUM(PIN,ELEMENT);
      IF INSTANCE_ARRAY[NINST]^.IN_LIST[PINNUM].ID.LEN <= 0 THEN
        COPY_STRING_T(NETNAME,INSTANCE_ARRAY[NINST]^.IN_LIST[PINNUM].ID)
      ELSE
      BEGIN
        ERROR ('Previously defined pin.');
        WRITELN('PIN >>',PIN.CHARS^:PIN.LEN,', ELEMENT >>',
          ELEMENT.CHARS^:ELEMENT.LEN,', INSTANCE>>',INST.CHARS^:INST.LEN);
      END;
    END;
      END
      UNTIL NOT EQUIV(THIS_INST, INST);
    END;

    DISPOSE_STRING_T(THIS_INST);

{%DEBUG
    FOR I:= 1 TO NINST DO
    BEGIN
      WRITELN;
      WRITE(INSTANCE_ARRAY[I]^.NAME.CHARS^:INSTANCE_ARRAY[I]^.NAME.LEN,'=');
      FOR J:= 1 TO MAX_INPINS DO
      BEGIN
        IF INSTANCE_ARRAY[I]^.IN_LIST[J].ID.LEN <= 0 THEN EXIT;
        WRITE(INSTANCE_ARRAY[I]^.IN_LIST[J].ID.CHARS^:INSTANCE_ARRAY[I]^.IN_LIST[J].ID.LEN,', ');
      END;
    END;
    WRITELN;
}
  End;  {Load_instance_array}
 {* * * * * * * * * * * * * * * * * * * * * * * * * * * * * * * * * * * * * * *}
 {* * * * * * * * * * * * * * * * * * * * * * * * * * * * * * * * * * * * * * *}
  Procedure New_state_net(IN NNET:INTEGER); {level 2}
  Begin {New_state_net}
    NSTATE_NETS:=NSTATE_NETS+1;
    IF NSTATE_NETS > MAX_NETS THEN
    BEGIN
      ERROR ('Internal net limit exceeded. MAX_NETS must be increased. ');
      TERMINATE(ABNORMAL);
    END;
    STATE_NETS[NSTATE_NETS]:=NET_EQNS[NNET];
  End; {New_state_net}
```

```
{* * * * * * * * * * * * * * * * * * * * * * * * * * * * * * * * * * * * * * *}
 Function Find_inst_rec(IN INST:dynamic_string_t):PTR_INST;  {level 2}
 VAR I:INTEGER;
 Begin {Find_inst_rec}
   FOR I:=1 TO NINST DO
     IF EQUIV(INSTANCE_ARRAY[I]^.NAME,INST) THEN
     BEGIN
       FIND_INST_REC:=INSTANCE_ARRAY[I];
       RETURN;
     END;

   {If it gets to here, the inst_rec was not found.}
   FIND_INST_REC:=INSTANCE_ARRAY[1];
   ERROR ('Instance was not in the netlist/design file.');
   WRITELN('>>',INST.CHARS^:INST.LEN);
 End;  {Find_inst_rec}
{* * * * * * * * * * * * * * * * * * * * * * * * * * * * * * * * * * * * * * *}

 Procedure Get_data(IN ORIG_DATA:DATA_REC;IN INST:dynamic_string_t; {level 2}
                    IN OUT STATE_NET:BOOLEAN; IN OUT DEST_DATA:data_rec);
 VAR INDEX:INTEGER;INST_REC:PTR_INST;

{ *    *    *    *    *    *    *    *    *    *    *    *    *    *    *    *    *    *    *    *}

   Procedure Set_state_values(IN OUT DATA:DATA_REC;  {level 3}
                              IN INST:dynamic_string_t);
   VAR I,INDEX:INTEGER; STATE_NAME, EQN_NAME:dynamic_string_t;


     Procedure Make_state_name(IN ID:dynamic_string_t; IN INST:dynamic_string_t; {level 4}
                               IN OUT STATE_NAME:dynamic_string_t);
     VAR NCHARS,POSITION,I:INTEGER;
         TEMP:BUFFER300;
     Begin {Make_state_name}
       {State nets will originally be of the form:
     STATE$<element>$<pin>
   Make_state_name will change this to:
     <element>$<pin>$<instance>
   NOTE:  INST.LEN  must be <= (L_STRING_T - ID.LEN - 5) so
     that when STATE is removed the # of charaters in the
     STATE_NAME is not exceeded.      }

  INIT_NUL(TEMP,300);
  NEW_STRING_T(STATE_NAME);
  POSITION:=1;
  NCHARS:=ID.LEN-6;
  MOVE(ID.CHARS^,7,NCHARS,TEMP,POSITION); {Skips 'STATE$' }
  POSITION:=POSITION+NCHARS;
  TEMP[POSITION]:='$';
  NCHARS:=NCHARS+1;
  POSITION:=POSITION+1;
  MOVE(INST.CHARS^,1,INST.LEN,TEMP,POSITION);
  NCHARS:=NCHARS+INST.LEN;
```

```
  SUBST_STRING_T_FROM_STATIC(TEMP,NCHARS,STATE_NAME);
End;  {Make_state_name}


Procedure New_state_eqn(IN EQN_NAME:dynamic_string_t);  {level 4}
VAR I:INTEGER;
Begin {New_state_eqn}
  NSTATES:=NSTATES+1;
  IF NSTATES > MAX_NSTATES THEN
  BEGIN
    ERROR ('STATE limit exceeded.  MAX_NSTATES must be increased.');
    TERMINATE(ABNORMAL);
  END;
  NEW(STATE_EQNS[NSTATES]);
  COPY_STRING_T(EQN_NAME,STATE_EQNS[NSTATES]^.ID);
  STATE_EQNS[NSTATES]^.EQN:=NIL;
  STATE_EQNS[NSTATES]^.PATH:=FALSE;
  STATE_EQNS[NSTATES]^.STATE:=FALSE;
  FOR I:=1 TO MAX_DRIVES DO
    STATE_EQNS[NSTATES]^.INST[I]:=NIL;
  STATE_EQNS[NSTATES]^.RANK:=INIT_RANK;
  STATE_EQNS[NSTATES]^.VALID:=TRUE;
  STATE_EQNS[NSTATES]^.VALUE:=FALSE;
End;  {New_state_eqn}


Procedure Find_state_eqn(IN EQN_NAME:dynamic_string_t; {level 4}
                         OUT INDEX:INTEGER);
VAR I:INTEGER;
Begin {Find_state_eqn}
  {Look for STATE_NAME in STATE_EQNS.  If not there, add it.}

  INDEX:=-1;
  FOR I:= 1 TO NSTATES DO
  BEGIN
    IF EQUIV(STATE_EQNS[I]^.ID,EQN_NAME) THEN
    BEGIN
      INDEX:=I;
      EXIT;
    END;
  END;
  IF INDEX <= 0 THEN
  BEGIN
    NEW_STATE_EQN(EQN_NAME);
    INDEX:=NSTATES;
  END;
End;  {Find_state_eqn}

  Begin {Set_state_values}
    MAKE_STATE_NAME(DATA.ID,INST,STATE_NAME);
    SUBST_STRING_T(STATE_NAME,DATA.ID);
    FIND_STATE_EQN(STATE_NAME,INDEX);
    DATA.INDEX:=INDEX;
    DISPOSE_STRING_T(STATE_NAME);
  End;  {Set_state_values}
```

```
{ *   *   *   *   *   *   *   *   *   *   *   *   *   *   *   *   *   *   *   *}
  Procedure Set_LATCH_values(IN OUT DATA:DATA_REC;  {level 3}
                             IN INST:dynamic_string_t);
  VAR I,INDEX:INTEGER; LATCH_NAME, EQN_NAME:dynamic_string_t;


    Procedure Make_LATCH_name(IN ID:dynamic_string_t; IN INST:dynamic_string_t; {level 4}
                              IN OUT LATCH_NAME:dynamic_string_t);
    VAR NCHARS,POSITION,I:INTEGER;
        TEMP:BUFFER300;
    Begin {Make_LATCH_name}
      {State nets will originally be of the form:
         LATCH$<element>$<pin>
       Make_LATCH_name will change this to:
         <element>$<pin>$<instance>
       NOTE:  INST.LEN  must be <= (L_STRING_T - ID.LEN - 5) so
         that when LATCH is removed the # of charaters in the
         LATCH_NAME is not exceeded.       }

      INIT_NUL(TEMP,300);
      NEW_STRING_T(LATCH_NAME);
      POSITION:=1;
      NCHARS:=ID.LEN-6;
      MOVE(ID.CHARS^,7,NCHARS,TEMP,POSITION); {Skips 'LATCH$' }
      POSITION:=POSITION+NCHARS;
      TEMP[POSITION]:='$';
      NCHARS:=NCHARS+1;
      POSITION:=POSITION+1;
      MOVE(INST.CHARS^,1,INST.LEN,TEMP,POSITION);
      NCHARS:=NCHARS+INST.LEN;
      SUBST_STRING_T_FROM_STATIC(TEMP,NCHARS,LATCH_NAME);
    End;  {Make_LATCH_name}


    Procedure New_LATCH_eqn(IN EQN_NAME:dynamic_string_t);  {level 4}
    VAR I:INTEGER;
    Begin {New_LATCH_eqn}
      NLATCHES:=NLATCHES+1;
      IF NLATCHES > MAX_NLATCHES THEN
      BEGIN
        ERROR ('LATCH limit exceeded.  MAX_NLATCHES must be increased.');
        TERMINATE(ABNORMAL);
      END;
      NEW(LATCH_EQNS[NLATCHES]);
      COPY_STRING_T(EQN_NAME,LATCH_EQNS[NLATCHES]^.ID);
      LATCH_EQNS[NLATCHES]^.FQN:=NIL;
      LATCH_EQNS[NLATCHES]^.PATH:=FALSE;
      LATCH_EQNS[NLATCHES]^.STATE:=FALSE;
      FOR I:=1 TO MAX_DRIVES DO
        LATCH_EQNS[NLATCHES]^.INST[I]:=NIL;
      LATCH_EQNS[NLATCHES]^.RANK:=INIT_RANK;
      LATCH_EQNS[NLATCHES]^.VALID:=TRUE;
      LATCH_EQNS[NLATCHES]^.VALUE:=FALSE;
    End;  {New_LATCH_eqn}
```

```
    Procedure Find_LATCH_eqn(IN EQN_NAME:dynamic_string_t; {level 4}
                             OUT INDEX:INTEGER);
    VAR I:INTEGER;
    Begin {Find_LATCH_eqn}
      {Look for LATCH_NAME in LATCH_EQNS.  If not there, add it.}

      INDEX:=-1;
      FOR I:= 1 TO NLATCHES DO
      BEGIN
        IF EQUIV(LATCH_EQNS[I]^.ID,EQN_NAME) THEN
        BEGIN
          INDEX:=I;
          EXIT;
        END;
      END;
      IF INDEX <= 0 THEN
      BEGIN
        NEW_LATCH_EQN(EQN_NAME);
        INDEX:=NLATCHES;
      END;
    End;  {Find_LATCH_eqn}


  Begin {Set_LATCH_values}
    MAKE_LATCH_NAME(DATA.ID,INST,LATCH_NAME);
    SUBST_STRING_T(LATCH_NAME,DATA.ID);
    FIND_LATCH_EQN(LATCH_NAME,INDEX);
    DATA.INDEX:=INDEX;
    DISPOSE_STRING_T(LATCH_NAME);
  End;  {Set_LATCH_values}

{ *   *   *   *   *   *   *   *   *   *   *   *   *   *   *   *   *   *   *   *}

 Begin {Get_data}

  IF ORIG_DATA.TYPE_ID = OPERATOR_ID THEN
  BEGIN
    DEST_DATA.TYPE_ID := OPERATOR_ID;
    DEST_DATA.INDEX := ORIG_DATA.INDEX;
    SUBST_STRING_T(ORIG_DATA.ID,DEST_DATA.ID);
  END
  ELSE IF ORIG_DATA.TYPE_ID = STATE_ID THEN
  BEGIN
    DEST_DATA.TYPE_ID := STATE_ID;
    SUBST_STRING_T(ORIG_DATA.ID,DEST_DATA.ID);
    STATE_NET:=TRUE;
    SET_STATE_VALUES(DEST_DATA,INST);
    {%DEBUG WRITELN('STATE ID=',DEST_DATA.ID.CHARS^:DEST_DATA.ID.LEN,'.');}
  END
  ELSE IF ORIG_DATA.TYPE_ID = LATCH_ID THEN
  BEGIN
    DEST_DATA.TYPE_ID := LATCH_ID;
    SUBST_STRING_T(ORIG_DATA.ID,DEST_DATA.ID);
    STATE_NET:=TRUE;
```

```
  SET_LATCH_VALUES(DEST_DATA,INST);
  {%DEBUG  WRITELN('LATCH ID=',DEST_DATA.ID.CHARS^:DEST_DATA.ID.LEN,'.');}
END
ELSE IF ORIG_DATA.TYPE_ID = PIN_ID THEN
BEGIN
  INST_REC:=FIND_INST_REC(INST);
  DEST_DATA.TYPE_ID := PIN_ID;
  SUBST_STRING_T(INST_REC^.IN_LIST[ORIG_DATA.INDEX].ID,DEST_DATA.ID);

  { The INDEX will be set latter in FIND_DATA_IN_INST_IN_LIST. }
  DEST_DATA.INDEX:=-1;

  END
  ELSE
  BEGIN
    ERROR ('Error in data translation.');
    WRITELN('INSTANCE >>',INST.CHARS^:INST.LEN);
  END;
End; {Get_data}

{* * * * * * * * * * * * * * * * * * * * * * * * * * * * * * * * * * * * * * *}

Function Copy(IN l:link; IN INST:dynamic_string_t;
              IN OUT STATE_NET:BOOLEAN) : link; {level 2}
VAR DUMMY_LINK:LINK;
Begin {Copy}
  IF L <> NIL THEN
  BEGIN
    NEW_NODE(DUMMY_LINK);
    GET_DATA(L^.DATA,INST,STATE_NET,DUMMY_LINK^.DATA);
    DUMMY_LINK^.LLINK:=COPY(L^.LLINK,INST,STATE_NET);
    DUMMY_LINK^.RLINK:=COPY(L^.RLINK,INST,STATE_NET);
    COPY:=DUMMY_LINK;
  END
  ELSE
    COPY:=NIL;
End; {Copy}

{* * * * * * * * * * * * * * * * * * * * * * * * * * * * * * * * * * * * * * *}

Procedure Define_net_equations; {level 2}
VAR REC,MSGTEXT : BUFFER80; PINS_PER_NET,NSOURCES,POSITION:INTEGER;
    CONSTANT_ID,THIS_NET, DRIVE_INSTANCE, NETNAME, BUS_NAME, INST, PIN, ELEMENT,
    LAST_PIN,LAST_INST,TEMP_NAME, DUMMY_NAME:dynamic_string_t;
    IOSPEC:IOSPECIFIER;
    BUS_ID,BIT,OFFSET, MAIN_NET:INTEGER;
    UNCONN,STATE_NET:BOOLEAN;
    BUS_INFO:RECORD
      ID,FIRST,SECOND:INTEGER;
    END;

{ *   *   *   *   *   *   *   *   *   *   *   *   *   *   *   *   *   *   *   *   *}
  Function Copy_net_eqn(IN ELEMENT, PIN, INST:dynamic_string_t;
                        IN OUT STATE_NET:BOOLEAN) : link;
  VAR  INDEX1,INDEX2:INTEGER;
```

```
{  Modifies the variable TEMP_NAME.     }

Begin {Copy_net_eqn}
  MAKE_EQN_NAME(ELEMENT,PIN,TEMP_NAME);
  FIND_EQN_IN_LIBRARY(TEMP_NAME,INDEX1,INDEX2);
  COPY_NET_EQN:=COPY(MACRO_LIBRARY[INDEX1].out_defs[INDEX2]^.EQN,INST,STATE_NET);
End; {Copy_net_eqn}

{ *   *   *   *   *   *   *   *   *   *   *   *   *   *   *   *   *   *   *   *}

Procedure Wire_or(IN OUT NSOURCES:INTEGER;IN OUT STATE_NET:BOOLEAN); {level 3}
VAR PDATA:LINK;
 { *   *   *   *   *   *   *   *   *   *   *   *   *   *   *   *   *   *   *   *}

  PROCEDURE CREATE_DUMMY_NAME(IN COUNT:INTEGER16; OUT NAME:DYNAMIC_STRING_T);
  VAR TEMP1,TEMP2:BUFFER10;
    NCHARS:INTEGER16;
  BEGIN {CREATE_DUMMY_NAME}
   .{ dummy names will be in the form
          -count
     }

    TRANS_NUM_TO_CHAR(COUNT,TEMP1,NCHARS);

 MOVE(TEMP1,1,NCHARS,TEMP2,2);
 TEMP2[1]:='-';
 NCHARS:=NCHARS+1;

 SUBST_STRING_T_FROM_STATIC(TEMP2,NCHARS,NAME);

 {%DEBUG  WRITELN('DUMMY_NAME>>',NAME.CHARS^:NAME.LEN,'<<');}
END; {CREATE_DUMMY_NAME}
{ *   *   *   *   *   *   *   *   *   *   *   *   *   *   *   *   *   *   *   *}

PROCEDURE CREATE_DUMMY_NET;
BEGIN {CREATE_DUMMY_NET}
  NDUMMY_NETS:=NDUMMY_NETS+1;
  CREATE_DUMMY_NAME(NDUMMY_NETS,DUMMY_NAME);
  NEW_NET_EQN(DUMMY_NAME,DUMMY_NAME,0,0,0);
END; {CREATE_DUMMY_NET}
{ *   *   *   *   *   *   *   *   *   *   *   *   *   *   *   *   *   *   *   *}

PROCEDURE CREATE_DATA_NODE(IN ID:DYNAMIC_STRING_T; IN INDEX:INTEGER16;OUT PDATA:LINK);
BEGIN {CREATE_DATA_NODE}
  NEW_NODE(PDATA);
  SUBST_STRING_T(ID,PDATA^.DATA.ID);
  PDATA^.DATA.TYPE_ID:=PIN_ID;
  PDATA^.DATA.INDEX:= -1;
END; {CREATE_DATA_NODE}
{ *   *   *   *   *   *   *   *   *   *   *   *   *   *   *   *   *   *   *   *}

PROCEDURE  CREATE_WOR_GATE;

  { *   *   *   *   *   *   *   *   *   *   *   *   *   *   *   *   *   *   *   *}
```

```
    PROCEDURE CREATE_DUMMY_INST;
    BEGIN {CREATE_DUMMY_INST}
      NDUMMY_INSTS:=NDUMMY_INSTS+1;
      CREATE_DUMMY_NAME(NDUMMY_INSTS,DUMMY_NAME);
      NEW_INST(DUMMY_NAME);
    END; {CREATE_DUMMY_INST}
    { *   *   *   *   *   *   *   *   *   *   *   *   *   *   *   *   *   *   *   *}

  BEGIN { CREATE_WOR_GATE}
    MAIN_NET:=NNET;

    CREATE_DUMMY_INST;

    { Set up first dummy net }

    CREATE_DUMMY_NET;
    { Each net will now have only one drive.  The drives
      which were being wire or'ed will be the inpins to
      the newly created wor gate denoted by NINST. }

    { The driving instance, eqn, and state fields on this first dummy net
      are taken from the corresponding fields on NNET-1 (MAIN_NET).}

    NET_EQNS[NNET]^.INST[1]:=NET_EQNS[MAIN_NET]^.INST[1];
    NET_EQNS[NNET]^.EQN := NET_EQNS[MAIN_NET]^.EQN;
    NET_EQNS[NNET]^.STATE:= NET_EQNS[MAIN_NET]^.STATE;

    IF STATE_NET THEN
    BEGIN
      NEW_STATE_NET(NNET);
      NET_EQNS[NNET]^.RANK:=MAX_STATE_RANK;
    END;

   { Set up the fields for the newly created instance.
     The inputs to this OR gate will be the dummy nets
     which were intended to be wire-or'ed. The output
     from this new gate will drive the original net. }


   COPY_STRING_T(DUMMY_NAME,INSTANCE_ARRAY[NINST]^.IN_LIST[1].ID);
   NET_EQNS[MAIN_NET]^.INST[1]:=INSTANCE_ARRAY[NINST];
   NET_EQNS[MAIN_NET]^.STATE:= FALSE;

   CREATE_DATA_NODE(DUMMY_NAME,1,PDATA);

   NET_EQNS[MAIN_NET]^.EQN := PDATA;

 END; { CREATE_WOR_GATE}

 { *   *   *   *   *   *   *   *   *   *   *   *   *   *   *   *   *   *   *   *}
 PROCEDURE ADD_NET_TO_IN_LIST;
 VAR INDEX,I:INTEGER;
 BEGIN {ADD_NET_TO_IN_LIST}
```

```
    NSOURCES:=NSOURCES+1;
    IF NSOURCES > MAX_INPINS THEN
    BEGIN
      WRITELN('>>',NET_EQNS[MAIN_NET]^.ID.CHARS^:NET_EQNS[MAIN_NET]^.ID.LEN);
      ERROR ('Drive limit exceeded on net.  MAX_INPINS may be increased. ');
      TERMINATE(ABNORMAL);
    END;

    COPY_STRING_T(DUMMY_NAME,INSTANCE_ARRAY[NINST]^.IN_LIST[NSOURCES].ID);

  END; {ADD_NET_TO_IN_LIST}
  { *   *   *   *   *   *   *   *   *   *   *   *   *   *   *   *   *   *   *   *}

Begin {Wire_or}
  { Version AI changes.

      Create an OR gate and dummy net for each wire or. }


  IF NSOURCES = 1 THEN
  BEGIN
    CREATE_WOR_GATE;
  END;

  {%DEBUG  WRITELN('WIRE OR ** MAIN_NET=',MAIN_NET:-1,',  NNET=',NNET:-1,', NSOURCES=',NSOURCES:-1,', NET=',NETNAME.CHARS^:NETNAME.L

  STATE_NET:=FALSE;


  { Set up next dummy net }

  CREATE_DUMMY_NET;
   { Each net will now have only one drive.  The drives
     which were being wire or'ed will be the inpins to
     the newly created wor gate denoted by NINST. }
  ADD_NET_TO_IN_LIST;
  NET_EQNS[NNET]^.INST[1]:=FIND_INST_REC(INST);
  NET_EQNS[NNET]^.EQN := COPY_NET_EQN(ELEMENT,PIN,INST,STATE_NET);
  NET_EQNS[NNET]^.STATE:=STATE_NET;

  IF STATE_NET THEN
  BEGIN
    NEW_STATE_NET(NNET);
    NET_EQNS[NNET]^.RANK:=MAX_STATE_RANK;
    STATE_NET:=FALSE;
  END;

  { Create node representing the dummy net.
    This node will be ORed in the eqn for
    MAIN_NET.}


  CREATE_DATA_NODE(DUMMY_NAME,NSOURCES,PDATA);

  { OR the new dummy net onto all the others. }
```

```
    NEW_NODE(PNODE);
    SUBST_STRING_T_FROM_STATIC('+',1,PNODE^.DATA.ID);
    PNODE^.DATA.TYPE_ID:=OPERATOR_ID;
    PNODE^.LLINK := NET_EQNS[MAIN_NET]^.EQN;
    PNODE^.RLINK := PDATA;
    NET_EQNS[MAIN_NET]^.EQN := PNODE;

  End;  {Wire_or}

{ *  *  *  *  *  *  *  *  *  *  *  *  *  *  *  *  *  *  *  *}
  Function Unconnected(IN THIS_NET:dynamic_string_t; {level 3}
                       IN OUT NNET:INTEGER): boolean;
  VAR  I:INTEGER;
  Begin {Unconnected}
    UNCONNECTED:=TRUE;

    FOR I:=1 TO NINPINS DO
      IF EQUIV(PRIMARY_INPINS[I].ID,THIS_NET) THEN
      BEGIN
        UNCONNECTED:=FALSE;
        RETURN;
      END;
    FOR I:=1 TO NOUTPINS DO
      IF EQUIV(PRIMARY_OUTPINS[I].ID, THIS_NET) THEN
      BEGIN
        UNCONNECTED:=FALSE;
        RETURN;
      END;

     {%DEBUG WRITELN('UNCONN ',THIS_NET.CHARS^:THIS_NET.LEN);}
     IF NNET>1 THEN
       NNET:=NNET-1;
  End; {Unconnected}


  { *  *  *  *  *  *  *  *  *  *  *  *  *  *  *  *  *  *  *  *}

  Procedure Get_net(IN WHICH_NET:WHICH_TYPE);

    { *      *      *      *      *      *      *      *      *      *      *}
    Procedure Init_vars;
    Begin {Init_vars}
      ELEMENT.LEN:=0;
      INST.LEN:=0;
      PIN.LEN:=0;
      NETNAME.LEN:=0;
      BUS_NAME.LEN:=0;

      INIT_NUL(IOSPEC,LIOSPECIFIER);
      BUS_ID:=0;
      BIT:=0;
      OFFSET:=0;
    End; {Init_vars}
    { *      *      *      *      *      *      *      *      *      *      *}
```

```
Procedure Dispose_vars;
Begin {Dispose_vars}

  DISPOSE_STRING_T(ELEMENT);
  DISPOSE_STRING_T(INST);
  DISPOSE_STRING_T(PIN);
  DISPOSE_STRING_T(NETNAME);
  DISPOSE_STRING_T(BUS_NAME);
  DISPOSE_STRING_T(CONSTANT_ID);

  INIT_NUL(IOSPEC,LIOSPECIFIER);
  BUS_ID:=0;
  BIT:=0;
  OFFSET:=0;
End; {Dispose_vars}
{ *         *         *         *         *         *         *         *         *         *}
Procedure Check_bus(IN NET_REC_PTR:DFI_$NET_REC_PTR);
Begin {Check_bus}
  IF NET_REC_PTR <> NIL THEN
  BEGIN
    IF NET_REC_PTR^.BUS_IDENTIFIER <> 0 THEN
    BEGIN
      IF NET_REC_PTR^.MASTER_BUS THEN
      BEGIN
        BUS_INFO.ID:=NET_REC_PTR^.BUS_IDENTIFIER;
        BUS_INFO.FIRST:=NET_REC_PTR^.SUBSCRIPT_INFO.FIRST;
        BUS_INFO.SECOND:=NET_REC_PTR^.SUBSCRIPT_INFO.SECOND;
      END;
    END;
  END;
End; {Check_bus}
{ *         *         *         *         *         *         *         *         *         *}
Procedure Set_offset(IN BUS_ID,BIT:INTEGER; IN OUT offset:integer);
Begin {Set_offset}

  {OFFSET is used to map the bit into the corresponding position in
   MENTOR's array BITS in the blm.  The record element BITS[0..255]
   contains the actual pin value.  BITS[0] contains the value for
   single wire pins.  For buses, the rightmost bit is BITS[0], and the
   leftmost bit is BITS[pin_width] where pin_width is one less than the
   number of bits in the bus.  This convention must be followed to
   access the correct location in MENTOR's BITS array.  For further
   documentation, see MENTOR's BLM manual regarding bit mapping,}

  {NOTE:  OFFSET is only significant for external signals.}

  IF BUS_ID = BUS_INFO.ID THEN
  BEGIN
    OFFSET:=ABS(BIT-BUS_INFO.SECOND);
  END
  ELSE IF BUS_ID = 0 THEN
  BEGIN
    OFFSET:=0;
  END
```

```
.
ELSE
BEGIN
  {%DEBUG WRITELN('Getting Master Net ',bus_id);}
  MASTER_NET_REC_PTR:=NIL;
  DFI_$GET_NET(CHANNEL_DFI,BUS_ID,MASTER_NET_REC_PTR);
  IF MASTER_NET_REC_PTR <> NIL THEN
  BEGIN
    CHECK_BUS(MASTER_NET_REC_PTR);
    IF BUS_ID = BUS_INFO.ID THEN
    BEGIN
      OFFSET:=ABS(BIT-BUS_INFO.SECOND);
    END
    ELSE
    BEGIN
      ERROR ('Design file error.  Invalid MASTER BUS.');
      WRITELN('net bus_id >>',bus_id:-1,', master bus_id >>',bus_info.id:-1);
    END
   END
   ELSE
   BEGIN
     ERROR ('Design file error.  Net record does not have corresponding MASTER BUS.');
     WRITELN('net bus_id >>',bus_id:-1,', master bus_id >>',bus_info.id:-1);
   END;
  END;
End;  {Set_offset}
{ *       *       *       *       *       *       *       *       *       *       *}

Procedure Set_primary_pin(IN PIN:dynamic_string_t;   IN IOSPEC:IOSPECIFIER);
VAR I:INTEGER;
Begin {Set_primary_pin}

  IF (NOT INPIN_SET) AND (NOT OUTPIN_SET) THEN
    NPINS:=NPINS+1;

  IF IOSPEC = 'IN' THEN
  BEGIN
    IF NOT INPIN_SET THEN
    BEGIN
      NEW_PRIMARY_INPIN(PIN,PRIMARY_INPUT);
    END;
  END
  ELSE IF (IOSPEC = 'OUT')
       OR (IOSPEC = 'OP') THEN
  BEGIN
    IF NOT OUTPIN_SET THEN
    BEGIN
      NEW_PRIMARY_OUTPIN(PIN,PRIMARY_OUTPUT);
    END;
  END
  ELSE IF IOSPEC = 'IO' THEN
  BEGIN
    IF NOT INPIN_SET THEN
    BEGIN
      NEW_PRIMARY_INPIN(PIN,PRIMARY_IO)
    END;
```

```
    IF NOT OUTPIN_SET THEN
    BEGIN
      NEW_PRIMARY_OUTPIN(PIN,PRIMARY_IO);
    END;
  END
  ELSE
  BEGIN
    ERROR ('Illegal PINTYPE on package pin.');
    WRITELN('PINTYPE >>',iospec:-1,' PIN >>',pin.chars^:PIN.LEN);
  END;
End;  {Set_primary_pin}
{ *       *       *       *       *       *       *       *       *       *       *}

Procedure Set_constant_net(IN NET:dynamic_string_t;IN VALUE:dfi_$string_t);
Begin {Set_constant_net}
  NCONSTANTS:=NCONSTANTS+1;
  NEW(CONSTANTS[NCONSTANTS]);
  IF NCONSTANTS > MAX_CONSTANTS THEN
  BEGIN
    ERROR ('Too many nets with INIT property.  MAX_CONSTANTS must be increased.');
    TERMINATE(ABNORMAL);
  END;

  COPY_STRING_T(NET,CONSTANTS[NCONSTANTS]^.ID);

  CASE VALUE.CHARS^[1] OF

    '0':  CONSTANTS[NCONSTANTS]^.VALUE:= ZERO;
    '1':  CONSTANTS[NCONSTANTS]^.VALUE:= ONE;
    OTHERWISE BEGIN
                NCONSTANTS:=NCONSTANTS-1;
                WRITELN('INIT value ',value.chars^:value.len,'on net ',net.chars^:net.len,' is being ignored.');
              END;
  END;

  {%DEBUG WRITELN('New constant ',NET.CHARS^:NET.LEN,' = ',VALUE.CHARS^:VALUE.LEN,' = ',constants[nconstants]^.value:-1);}
End; {Set_constant_net}
{ *       *       *       *       *       *       *       *       *       *       *}

Procedure Get_net_pin(IN OUT PIN_REC_PTR:DFI_$PIN_REC_PTR;
                      IN OUT NET_REC_PTR:DFI_$NET_REC_PTR);
VAR NEW_NET:BOOLEAN;
  TEMP:BUFFER10;
  NCHARS:INTEGER;
{GET_NET_PIN sets PIN_REC_PTR to the next pin on the net in the
 current scan which was initiated by the DFI_$GET_FIRST_OF_ALL_NET call.
 If no pins are found on the current net, the next net is scanned.}

Begin {Get_net_pin}
  NEW_NET:=FALSE;

  {Get all PIN_REC_PTR for current NET_REC_PTR}

  DFI_$GET_NEXT_PIN(PIN_REC_PTR);
```

```
  WHILE PIN_REC_PTR = NIL DO
  BEGIN

    {Move on to next NET_REC_PTR}

    {%DEBUG WRITELN('# END OF PIN SCAN.');}
    NEW_NET:=TRUE;
    INPIN_SET:=FALSE;
    OUTPIN_SET:=FALSE;

    DFI_$GET_NEXT_NET(NET_REC_PTR);
    IF NET_REC_PTR = NIL THEN
    BEGIN
      {%DEBUG WRITELN('# END OF NET SCAN.');}
      RETURN;
    END
    ELSE
    BEGIN
      DFI_$GET_FIRST_PIN_OF(CHANNEL_DFI,dfi_$null_obj_id,NET_REC_PTR^.SELF,
                            PIN_REC_PTR);
    END;
  END; {WHILE}

  IF NEW_NET THEN
  BEGIN
    {Check for initialization values on net.}

    IF NET_REC_PTR^.PROPERTIES[INIT_PROP].VALUE.CHARS <> NIL THEN
    BEGIN
      INIT_NUL(TEMP,10);
      TRANS_NUM_TO_CHAR(NET_REC_PTR^.SELF,TEMP,NCHARS);
      SUBST_STRING_T_FROM_STATIC(TEMP,NCHARS,CONSTANT_ID);
      SET_CONSTANT_NET(CONSTANT_ID,NET_REC_PTR^.PROPERTIES[INIT_PROP].VALUE);
    END;
  END;
End; {Get_net_pin}

{ *         *        *        *        *        *        *        *        *        *        *}
 Procedure Assign_values;
 VAR NET_SELF,INST_SELF:BUFFER80;
     TEMP:BUFFER10;
     LEN:INTEGER;
 Begin {Assign_values}
   {Assign values to ELEMENT, INST, PIN, NETNAME, IOSPEC, BUS_ID, BIT, and OFFSET}

   IF PIN_REC_PTR^.PROPERTIES[IO_PROP].VALUE.LEN > LIOSPECIFIER THEN
   BEGIN
     ERROR ('Illegal PINTYPE.');
     WRITELN('>>',PIN_REC_PTR^.PROPERTIES[IO_PROP].VALUE.CHARS^:PIN_REC_PTR^.PROPERTIES[IO_PROP].VALUE.LEN);
   END
   ELSE
   BEGIN
     MOVE(PIN_REC_PTR^.PROPERTIES[IO_PROP].VALUE.CHARS^,1,
       PIN_REC_PTR^.PROPERTIES[IO_PROP].VALUE.LEN,IOSPEC,1);
```

```
END;

DFI_$GET_INST(CHANNEL_DFI,PIN_REC_PTR^.ATTACHED_INSTANCE,INST_REC_PTR);
SUBST_STRING_T_FROM_STATIC(INST_REC_PTR^.PROPERTIES[MODEL_PROP].VALUE.CHARS^,
  INST_REC_PTR^.PROPERTIES[MODEL_PROP].VALUE.LEN,ELEMENT);

TRANS_NUM_TO_CHAR(INST_REC_PTR^.SELF,INST_SELF,LEN);
SUBST_STRING_T_FROM_STATIC(INST_SELF,LEN,INST);

SUBST_STRING_T_FROM_STATIC(PIN_REC_PTR^.PIN_NAME.CHARS^,PIN_REC_PTR^.PIN_NAME.LEN,PIN);

BUS_ID:=NET_REC_PTR^.BUS_IDENTIFIER;
BIT:=NET_REC_PTR^.SUBSCRIPT_INFO.FIRST;

{   Use NET_REC_PTR^.NET_NAME for BUS_NAME.              }

TRANS_NUM_TO_CHAR(NET_REC_PTR^.SELF,NET_SELF,LEN);
SUBST_STRING_T_FROM_STATIC(NET_SELF,LEN,NETNAME);

SUBST_STRING_T_FROM_STATIC(NET_REC_PTR^.NET_NAME.CHARS^,NET_REC_PTR^.NET_NAME.LEN,BUS_NAME);

{Set package pin names}

IF NET_REC_PTR^.EXTERNAL THEN
BEGIN
  CHECK_BUS(NET_REC_PTR);
  SET_OFFSET(BUS_ID,BIT,OFFSET);
  INIT_NUL(TEMP,10);
  MOVE(ELEMENT.CHARS^,1,MIN(10,ELEMENT.LEN),TEMP,1);
  IF (TEMP = 'INPAD') OR (TEMP = 'INPADRC') THEN
  BEGIN
    {  INPAD's output pin causes the net to appear to be a primary_outpin.  }
    {  KLUDGE this by skipping the pin. }
    IF (IOSPEC = 'IN') THEN
      SET_PRIMARY_PIN(NETNAME,IOSPEC);
  END
  ELSE IF (TEMP = 'VB25') OR (TEMP = 'VB50') THEN
  BEGIN
    INIT_NUL(TEMP,10);
    MOVE(PIN.CHARS^,1,MIN(10,PIN.LEN),TEMP,1);
    IF TEMP = 'PAD' THEN
    BEGIN
      {  VB25 and VB50 have the wrong PINTYPE on their PAD pin.  }
      {  It should be IO. }
      INIT_NUL(IOSPEC,IOSPECIFIER);
      MOVE('IO',1,2,IOSPEC,1);


        END;
        SET_PRIMARY_PIN(NETNAME,IOSPEC);
      END
      ELSE
        SET_PRIMARY_PIN(NETNAME,IOSPEC);
    END;
```

```
  {%debug WRITELN(NET_REC_PTR^.SELF:-1,X2,NET_REC_PTR^.NET_NAME.CHARS^:NET_REC_PTR^.NET_NAME.LEN,X2,NET_REC_PTR^.SUBSCRIPT_INFO.FI
 End;  {Assign_values}

{ *      *      *      *      *      *      *      *      *      *      *}
 Procedure Get_first;
 VAR TEMP:BUFFER10;
     NCHARS:INTEGER;
 Begin {Get_first}
     INPIN_SET:=FALSE;
     OUTPIN_SET:=FALSE;

     DFI_$GET_FIRST_OF_ALL_NET(CHANNEL_DFI,NET_REC_PTR);
     IF NET_REC_PTR = NIL THEN
     BEGIN
       ERROR ('Bad design file.');
       TERMINATE(ABNORMAL);
     END;

     GET_NET_PROPERTY_NUM(NET_REC_PTR,'INIT',INIT_PROP);

     DFI_$GET_FIRST_PIN_OF(CHANNEL_DFI,dfi_$null_obj_id,NET_REC_PTR^.SELF,
                           PIN_REC_PTR);
     IF PIN_REC_PTR = NIL THEN
     BEGIN
       GET_NET_PIN(PIN_REC_PTR,NET_REC_PTR);
       IF NET_REC_PTR = NIL THEN
       BEGIN
         DISPOSE_VARS;
         RETURN;
       END;
     END
     ELSE
     BEGIN

        {Check for initialization values on net.  (PROPERTY INIT)}

        IF NET_REC_PTR^.PROPERTIES[INIT_PROP].VALUE.CHARS <> NIL THEN
        BEGIN
          INIT_NUL(TEMP,10);
          TRANS_NUM_TO_CHAR(NET_REC_PTR^.SELF,TEMP,NCHARS);
          SUBST_STRING_T_FROM_STATIC(TEMP,NCHARS,CONSTANT_ID);
          SET_CONSTANT_NET(CONSTANT_ID,NET_REC_PTR^.PROPERTIES[INIT_PROP].VALUE);
        END;
      END;

  End;  {Get_first}

{ *      *      *      *      *      *      *      *      *      *      *}
{ *      *      *      *      *      *      *      *      *      *      *}

Begin {Get_net}
  IF WHICH_NET = FRST THEN
  BEGIN
```

```
{Initialize for both BURLIST and DFI}
  NEW_STRING_T(ELEMENT);
  NEW_STRING_T(INST);
  NEW_STRING_T(PIN);
  NEW_STRING_T(NETNAME);
  NEW_STRING_T(BUS_NAME);
  NEW_STRING_T(CONSTANT_ID);
  INIT_NUL(IOSPEC,LIOSPECIFIER);
  BUS_ID:=0;
  BIT:=0;
  BUS_INFO.ID:=0;
  BUS_INFO.FIRST:=0;
  BUS_INFO.SECOND:=0;
END;
IF INTERFACE = BURLIST THEN
BEGIN
  REC:=NEXT_REC_NET_NETLIST;
  PACK_NET_INFO(REC, ELEMENT, INST, PIN, NETNAME, IOSPEC);
  SUBST_STRING_T(NETNAME,BUS_NAME);
END
ELSE IF INTERFACE = DESIGN_FILE THEN
BEGIN
  {%debug  msg('Accessing dfi--net');}

  {Get NET_REC_PTR and PIN_REC_PTR}

  IF WHICH_NET = FRST THEN
  BEGIN

    GET_FIRST;

  END
  ELSE IF WHICH_NET =  NXT THEN
  BEGIN
    INIT_VARS;

    GET_NET_PIN(PIN_REC_PTR,NET_REC_PTR);
    IF NET_REC_PTR = NIL THEN
    BEGIN
      DISPOSE_VARS;
      RETURN;
    END;
  END
  ELSE {QUIT_SCAN}
  BEGIN
    DFI_$QUIT_PIN_SCAN(PIN_REC_PTR);
    DFI_$QUIT_NET_SCAN(NET_REC_PTR);
    DISPOSE_VARS;
    RETURN;
  END;

  ASSIGN_VALUES;

END
```

```
      ELSE
      BEGIN
        ERROR ('Unsupported interface.');
        WRITELN('>>',INTERFACE:-1);
        TERMINATE(ABNORMAL);
      END;

 End; {Get_net}

{ *   *   *   *   *   *   *   *   *   *   *   *   *   *   *   *   *   *   *   *}
 FUNCTION TWIN_OUT(IN ELEMENT,PIN,INST,LAST_INST,LAST_PIN:DYNAMIC_STRING_T):BOOLEAN;
 VAR I,INDEX1,INDEX2,INDEX3:INTEGER16;
 BEGIN {TWIN_OUT}
   { Returns TRUE if the PIN is a twin out of the LAST_PIN of the LAST_INST.
     Modifies the variable TEMP_NAME.     }

   {%debug WRITELN('CHECK FOR TWIN OUT>>',INST.CHARS^:INST.LEN,X2,ELEMENT.CHARS^:ELEMENT.LEN,X2,PIN.CHARS^:PIN.LEN);}

TWIN_OUT:=FALSE;


IF EQUIV(LAST_INST, INST) THEN
BEGIN
  MAKE_EQN_NAME(ELEMENT,PIN,TEMP_NAME);
  {INDEX1 will indicate the correct macro record.
   INDEX2 will indicate the macro eqn in OUT_DEFS.}
  FIND_EQN_IN_LIBRARY(TEMP_NAME,INDEX1,INDEX2);

  {%debug WRITELN('EQN FOUND>>',INST.CHARS^:INST.LEN,X2,ELEMENT.CHARS^:ELEMENT.LEN,X2,PIN.CHARS^:PIN.LEN,', INDEX1=',INDEX1:-1,', IN

  IF DUPLICATE_PIN(PIN, INDEX1, INDEX3) THEN
  BEGIN
    { INDEX3 indicates the DEF_PIN_INDEX in DUPPINS of the macro record.}

    {%debug WRITELN('PIN FOUND>>',INST.CHARS^:INST.LEN,X2,ELEMENT.CHARS^:ELEMENT.LEN,X2,PIN.CHARS^:PIN.LEN,', INDEX3=',INDEX3:-1);}

    IF INDEX2 = INDEX3 THEN
    BEGIN
      { TWIN OUT!!!}

      {%debug WRITELN('TWIN OUT FOUND!>>',INST.CHARS^;INST.LEN,X2,ELEMENT.CHARS^:ELEMENT.LEN,X2,PIN.CHARS^:PIN.LEN);}
      NTWIN_OUTS:=NTWIN_OUTS+1;
      TWIN_OUT:=TRUE;
    END;
  END
  ELSE  IF DUPLICATE_PIN(LAST_PIN, INDEX1, INDEX3) THEN
  BEGIN
    { INDEX3 indicates the DEF_PIN_INDEX in DUPPINS of the macro record.}

    {%debug WRITELN('PIN FOUND>>',INST.CHARS^:INST.LEN,X2,ELEMENT.CHARS^:ELEMENT.LEN,X2,PIN.CHARS^:PIN.LEN,', INDEX3=',INDEX3:-1);}

    IF INDEX2 = INDEX3 THEN
    BEGIN
```

```
      { TWIN OUT!!!}

      {%debug WRITELN('TWIN OUT FOUND!>>',INST.CHARS^:INST.LEN,X2,ELEMENT.CHARS^:ELEMENT.LEN,X2,PIN.CHARS^:PIN.LEN);}
      NTWIN_OUTS:=NTWIN_OUTS+1;
      TWIN_OUT:=TRUE;
    END;
  END
 END;

END; {TWIN_OUT}
{ *   *   *   *   *   *   *   *   *   *   *   *   *   *   *   *   *   *   *   *}


Begin {define_net_equations}
 {%debug MSG('DEFINE NET EQUATIONS REACHED!');}

 GET_NET(FRST);
 NEW_STRING_T(THIS_NET);
 NEW_STRING_T(LAST_INST);
 NEW_STRING_T(LAST_PIN);
 NEW_STRING_T(TEMP_NAME);
 NEW_STRING_T(DUMMY_NAME);

 WHILE NETNAME.LEN > 0 DO
 BEGIN

   SUBST_STRING_T(NETNAME,THIS_NET);
   NEW_NET_EQN(NETNAME,BUS_NAME,BUS_ID,BIT,OFFSET);
   NSOURCES:=0;
   PINS_PER_NET:=0;
   STATE_NET:=FALSE;

   REPEAT
   BEGIN
     {%DEBUG WRITELN('DEFINE_NET: ELEMENT=',ELEMENT.CHARS^:ELEMENT.LEN,', INST=',INST.CHARS^:INST.LEN,', PIN=',PIN.CHARS^:PIN.LEN,',

     PINS_PER_NET:=PINS_PER_NET+1;

     IF (IOSPEC = 'OUT') OR (IOSPEC = 'OP') OR (IOSPEC = 'IO') THEN
     BEGIN

       IF NSOURCES = 0 THEN
       BEGIN
         NSOURCES:=NSOURCES+1;

         NET_EQNS[NNET]^.EQN:=COPY_NET_EQN(ELEMENT,PIN,INST,STATE_NET);
         NET_EQNS[NNET]^.STATE:=STATE_NET;

         NET_EQNS[NNET]^.INST[NSOURCES]:=FIND_INST_REC(INST);

         {Save driving pin info for TWIN_OUT checking.}

         SUBST_STRING_T(INST,LAST_INST);
         SUBST_STRING_T(PIN,LAST_PIN);
       END
```

```
        ELSE
        BEGIN
          {Skip twin outs. }

          IF NOT TWIN_OUT(ELEMENT,PIN,INST,LAST_INST,LAST_PIN) THEN
            WIRE_OR(NSOURCES,STATE_NET);

          { Note: WIRE_OR always sets STATE_NET to false when finished.}

          SUBST_STRING_T(INST,LAST_INST);
          SUBST_STRING_T(PIN,LAST_PIN);
        END;
      END;

      GET_NET(NXT);
    END
    UNTIL NOT EQUIV(THIS_NET, NETNAME);


    IF PINS_PER_NET>=2 THEN
      UNCONN:=FALSE
    ELSE
      UNCONN:=UNCONNECTED(THIS_NET,NNET);

    IF STATE_NET AND NOT UNCONN THEN
    BEGIN
      NEW_STATE_NET(NNET);
      NET_EQNS[NNET]^.RANK:=MAX_STATE_RANK;
    END;

   {%DEBUG  IF NOT UNCONN THEN BEGIN INORDER_COUNT:=0; WRITE(NET_EQNS[NNET]^.ID.CHARS^:NET_EQNS[NNET]^.ID.LEN,'='); INORDER(NET_EQNS[N

  END;

  DISPOSE_STRING_T(THIS_NET);
  DISPOSE_STRING_T(LAST_INST);
  DISPOSE_STRING_T(LAST_PIN);
  DISPOSE_STRING_T(TEMP_NAME);
  DISPOSE_STRING_T(DUMMY_NAME);
 End; {define_net_equations}
{* * * * * * * * * * * * * * * * * * * * * * * * * * * * * * * * * * * * * * *}
 Procedure Index_package_pins; {level 2}
 VAR I,INDEX:INTEGER;

Procedure Sort_package_pins;
VAR I,J:INTEGER; TEMP:PACKAGE_PIN;
    CHANGE:BOOLEAN;

{ SORT_PACKAGE_PINS sorts arrays PRIMARY_INPINS and PRIMARY_OUTPINS by
  BUS_ID and then in decreasing order of BIT number within a bus. }

Begin {Sort_package_pins}

  FOR I:=1 TO NINPINS-1 DO
  BEGIN
```

```
  CHANGE:=FALSE;

  FOR  J:=I+1 TO NINPINS DO
  BEGIN

    IF PRIMARY_INPINS[J].NET^.BUS_ID < PRIMARY_INPINS[I].NET^.BUS_ID THEN
    BEGIN
      TEMP:=PRIMARY_INPINS[I];
      PRIMARY_INPINS[I]:=PRIMARY_INPINS[J];
      PRIMARY_INPINS[J]:=TEMP;
      CHANGE:=TRUE;
    END
    ELSE IF PRIMARY_INPINS[J].NET^.BUS_ID = PRIMARY_INPINS[I].NET^.BUS_ID THEN
    BEGIN
      IF PRIMARY_INPINS[J].NET^.BIT > PRIMARY_INPINS[I].NET^.BIT THEN
      BEGIN
        TEMP:=PRIMARY_INPINS[I];
        PRIMARY_INPINS[I]:=PRIMARY_INPINS[J];
        PRIMARY_INPINS[J]:=TEMP;
        CHANGE:=TRUE;
      END;
    END;
  END;

  IF NOT CHANGE THEN EXIT;
END;

FOR I:=1 TO NOUTPINS-1 DO
BEGIN
  CHANGE:=FALSE;

  FOR  J:=I+1 TO NOUTPINS DO
  BEGIN

    IF PRIMARY_OUTPINS[J].NET^.BUS_ID < PRIMARY_OUTPINS[I].NET^.BUS_ID THEN
    BEGIN
      TEMP:=PRIMARY_OUTPINS[I];
      PRIMARY_OUTPINS[I]:=PRIMARY_OUTPINS[J];
      PRIMARY_OUTPINS[J]:=TEMP;
      CHANGE:=TRUE;
    END
    ELSE IF PRIMARY_OUTPINS[J].NET^.BUS_ID = PRIMARY_OUTPINS[I].NET^.BUS_ID THEN
    BEGIN
      IF PRIMARY_OUTPINS[J].NET^.BIT > PRIMARY_OUTPINS[I].NET^.BIT THEN
      BEGIN
        TEMP:=PRIMARY_OUTPINS[I];
        PRIMARY_OUTPINS[I]:=PRIMARY_OUTPINS[J];
        PRIMARY_OUTPINS[J]:=TEMP;
        CHANGE:=TRUE;
      END;
    END;
  END;
```

```
      IF NOT CHANGE THEN EXIT;
    END;

{%debug
    WRITELN('INPUTS:');

    FOR I:=1 TO NINPINS DO
    BEGIN
      GET_NAME(PRIMARY_INPINS[I].NET,NAME);
      WRITELN(NAME:-1);
    END;

    WRITELN;
    WRITELN('OUTPUTS:');

    FOR I:=1 TO NOUTPINS DO
    BEGIN
      GET_NAME(PRIMARY_OUTPINS[I].NET,NAME);
      WRITELN(NAME:-1);
    END;
}

  End;  {Sort_package_pins}

 Begin {Index_package_pins}
  {%debug MSG('INDEX_PACKAGE_PINS REACHED!');}

  FOR I:=1 TO NINPINS DO
  BEGIN
    FIND_NET_EQN(PRIMARY_INPINS[I].ID,FALSE,INDEX);
    PRIMARY_INPINS[I].NET:=NET_EQNS[INDEX];
  END;

  FOR I:=1 TO NOUTPINS DO
  BEGIN
    FIND_NET_EQN(PRIMARY_OUTPINS[I].ID,FALSE,INDEX);
    PRIMARY_OUTPINS[I].NET:=NET_EQNS[INDEX];
  END;

  SORT_PACKAGE_PINS;

End; {Index_package_pins}
{* * * * * * * * * * * * * * * * * * * * * * * * * * * * * * * * * * * * * * *}
Procedure Index_in_lists; {level 2}
VAR N,D,I,INDEX:INTEGER;
Begin {Index_in_lists}
  {%debug MSG('INDEX_IN_LISTS REACHED!');}
  FOR N:=1 TO NNET DO
  BEGIN
    {%DEBUG WRITE('NET =',NET_EQNS[N]^.ID.CHARS^:NET_EQNS[N]^.ID.LEN);}

    FOR D:=1 TO MAX_DRIVES DO
```

```
BEGIN
  IF  NET_EQNS[N]^.INST[D] = NIL THEN EXIT;
  {%DEBUG WRITE(', DRIVE=',NET_EQNS[N]^.INST[D]^.NAME.CHARS^:NET_EQNS[N]^.INST[D]^.NAME.LEN);}

  FOR I:=1 TO MAX_INPINS DO
  BEGIN
    IF  NET_EQNS[N]^.INST[D]^.IN_LIST[I].ID.LEN <= 0 THEN EXIT;
    {%DEBUG WRITE(', ',NET_EQNS[N]^.INST[D]^.IN_LIST[I].ID.CHARS^:NET_EQNS[N]^.INST[D]^.IN_LIST[I].ID.LEN);}
    FIND_NET_EQN(NET_EQNS[N]^.INST[D]^.IN_LIST[I].ID,TRUE,INDEX);
    NET_EQNS[N]^.INST[D]^.IN_LIST[I].INDEX:=INDEX;
  END;
 END;
 {%DEBUG WRITELN;}
END;
End; {Index_in_lists}
{* * * * * * * * * * * * * * * * * * * * * * * * * * * * * * * * * * * * * * *}
Procedure Define_state_equations;  {level 2}
VAR I,INDEX,START,THIS_NSTATES:INTEGER;
   LIB_NAME, INST:dynamic_string_t; STATE_NET:BOOLEAN;
{ *    *    *    *    *    *    *    *    *    *    *    *    *    *    *    *    *    *    *}
  Procedure Get_lib_name_and_inst(IN ORIG_NAME:dynamic_string_t;  {level 3}
                          IN OUT LIB_NAME, INST:dynamic_string_t);

  VAR I,N:INTEGER;
     TEMP:BUFFER300;
  Begin {Get_lib_name_and_inst}
   {ORIG_NAME.CHARS^ must be in the form:
      <lib_name>$<inst>
    where
      <lib_name> =  <element>$<pin>      }

   N:=-1;

   FOR I:=ORIG_NAME.LEN DOWNTO 1 DO
     IF ORIG_NAME.CHARS^[I] = '$' THEN
     BEGIN
       N:=I;
       EXIT;
     END;
   IF N <= 0 THEN
   BEGIN
     ERROR ('Invalid state equation name.');
     WRITELN(' > ',ORIG_NAME.CHARS^:ORIG_NAME.LEN);
     RETURN;
   END;

   INIT_NUL(TEMP,300);
   MOVE(ORIG_NAME.CHARS^,N+1,ORIG_NAME.LEN-N,TEMP,1);
   SUBST_STRING_I_FROM_STATIC(TEMP,(ORIG_NAME.LEN-N),INST);

   INIT_NUL(TEMP,300);
   MOVE(ORIG_NAME.CHARS^,1,N-1,TEMP,1);
   SUBST_STRING_I_FROM_STATIC(TEMP,(N-1),LIB_NAME);
   {%DEBUG WRITELN('LIB-NAME=',LIB_NAME.CHARS^:LIB_NAME.LEN,', INST=',INST.CHARS^:INST.LEN);}
  End;  {Get_lib_name_and_inst}
```

```
{ *   *   *   *   *   *   *   *   *   *   *   *   *   *   *   *   *   *   *   *}

 Begin {Define_state_equations}
   {%debug  MSG('DEFINE_STATE_EQUATIONS REACHED!');}
   START:=1;
   NEW_STRING_T(LIB_NAME);
   NEW_STRING_T(INST);

   REPEAT
   BEGIN
     THIS_NSTATES:=NSTATES;
     FOR I:= START TO THIS_NSTATES DO
     BEGIN
       STATE_NET:=FALSE;
       GET_LIB_NAME_AND_INST(STATE_EQNS[I]^.ID,LIB_NAME,INST);
       {%DEBUG WRITELN('LIB-NAME=',LIB_NAME.CHARS^:LIB_NAME.LEN,', INST=',INST.CHARS^:INST.LEN);}
       FIND_EQN_IN_STATE_LIBRARY(LIB_NAME,INDEX);
       STATE_EQNS[I]^.EQN:=COPY(MACRO_STATE_LIBRARY[INDEX].EQN,INST,STATE_NET);
       STATE_EQNS[I]^.INST[1]:=FIND_INST_REC(INST);


       STATE_EQNS[I]^.STATE:=STATE_NET;

      {%DEBUG INORDER_COUNT:=0; WRITE(STATE_EQNS[I]^.ID.CHARS^:STATE_EQNS[I]^.ID.LEN,'='); INORDER(STATE_EQNS[I]^.EQN); WRITELN;}
     END;
     START:=THIS_NSTATES+1;
   END
   UNTIL THIS_NSTATES=NSTATES;
   DISPOSE_STRING_T(LIB_NAME);
   DISPOSE_STRING_T(INST);
 End;  {Define_state_equations}

{* * * * * * * * * * * * * * * * * * * * * * * * * * * * * * * * * * * * * * *}

 Procedure Define_LATCH_equations;  {level 2}
 VAR I,INDEX,START,THIS_NLATCHES:INTEGER;
     LIB_NAME, INST:dynamic_string_t; STATE_NET:BOOLEAN;
{ *   *   *   *   *   *   *   *   *   *   *   *   *   *   *   *   *   *   *   *}
   Procedure Get_lib_name_and_inst(IN ORIG_NAME:dynamic_string_t;  {level 3}
                            IN OUT LIB_NAME, INST:dynamic_string_t);
   VAR I,N:INTEGER;
       TEMP:BUFFER300;
   Begin {Get_lib_name_and_inst}
     {ORIG_NAME.CHARS^ must be in the form:
          <lib_name>$<inst>
      where
          <lib_name> =  <element>$<pin>      }

     N:=-1;

     FOR I:=ORIG_NAME.LEN DOWNTO 1 DO
       IF ORIG_NAME.CHARS^[I] = '$' THEN
       BEGIN
         N:=I;
```

```
      EXIT;
    END;
  IF N <= 0 THEN
  BEGIN
    ERROR ('Invalid LATCH equation name.');
    WRITELN('>>',ORIG_NAME.CHARS^:ORIG_NAME.LEN);
    RETURN;
  END;

  INIT_NUL(TEMP,300);
  MOVE(ORIG_NAME.CHARS^,N+1,ORIG_NAME.LEN-N,TEMP,1);
  SUBST_STRING_T_FROM_STATIC(TEMP,(ORIG_NAME.LEN-N),INST);

  INIT_NUL(TEMP,300);
  MOVE(ORIG_NAME.CHARS^,1,N-1,TEMP,1);
  SUBST_STRING_T_FROM_STATIC(TEMP,(N-1),LIB_NAME);
  {%DEBUG WRITELN('LIB-NAME=',LIB_NAME.CHARS^:LIB_NAME.LEN,', INST=',INST.CHARS^:INST.LEN);}
End;  {Get_lib_name_and_inst}

{ *  *  *  *  *  *  *  *  *  *  *  *  *  *  *  *  *  *  *  *}

Begin {Define_LATCH_equations}
  {%debug  MSG('DEFINE_LATCH_EQUATIONS REACHED!');}
  START:=1;
  NEW_STRING_T(LIB_NAME);
  NEW_STRING_T(INST);

  REPEAT
  BEGIN
    THIS_NLATCHES:=NLATCHES;
    FOR I:= START TO THIS_NLATCHES DO
    BEGIN
      STATE_NET:=FALSE;
      GET_LIB_NAME_AND_INST(LATCH_EQNS[I]^.ID,LIB_NAME,INST);
      {%DEBUG WRITELN('LIB-NAME=',LIB_NAME.CHARS^:LIB_NAME.LEN,', INST=',INST.CHARS^:INST.LEN);}
      FIND_EQN_IN_LATCH_LIBRARY(LIB_NAME,INDEX);
      LATCH_EQNS[I]^.EQN:=COPY(MACRO_LATCH_LIBRARY[INDEX].EQN,INST,STATE_NET);
      LATCH_EQNS[I]^.INST[1]:=FIND_INST_REC(INST);

      LATCH_EQNS[I]^.STATE:=STATE_NET;

     {%DEBUG INORDER_COUNT:=0; WRITE(LATCH_EQNS[I]^.ID.CHARS^:LATCH_EQNS[I]^.ID.LEN,'='); INORDER(LATCH_EQNS[I]^.EQN); WRITELN;}
    END;
    START:=THIS_NLATCHES+1;
  END
  UNTIL THIS_NLATCHES=NLATCHES;
  DISPOSE_STRING_T(LIB_NAME);
  DISPOSE_STRING_T(INST);
End;  {Define_LATCH_equations}

{ *  *  *  *  *  *  *  *  *  *  *  *  *  *  *  *  *  *  *  *}

Begin {Define_internal_logic}
  Load_macrocell_eqn_library;
```

```
MSG('Defining internal logic.');

IF INTERFACE = BURLIST THEN
BEGIN
  Load_package_pin_names;
  Load_instance_array;
  Define_net_equations;
END
ELSE IF INTERFACE = DESIGN_FILE THEN
BEGIN
  Load_instance_array;
  Define_net_equations;
END
ELSE
BEGIN
  ERROR ('Unsupported interface.');
  WRITELN('>>',INTERFACE:-1);
  TERMINATE(ABNORMAL);
END;

INDEX_PACKAGE_PINS;
Index_in_lists;
Define_LATCH_equations;
Define_state_equations;

CLOSE_FILES;

End; {Define_internal_logic}
{****************************************************************************}

Procedure Rank_equations; {level 1}
VAR I,J,RANK,INDEX:INTEGER; DUMMY_PP:PACKAGE_PIN;

{* * * * * * * * * * * * * * * * * * * * * * * * * * * * * * * * * * * * * *}

 Function Rank_net(IN OUT NET:PTR_NETEQN;       {level 2}
                   IN OUT EQUATION:PACKAGE_PIN):INTEGER;
 VAR I,MAX_RNK,RANK:INTEGER;

{ *   *   *   *   *   *   *   *   *   *   *   *   *   *   *   *   *   *   *   *}
   Function Rank_inst(IN OUT INSTANCE:PTR_INST;IN ID:DYNAMIC_STRING_T;
     IN OUT IO_NET:BOOLEAN):INTEGER; {LEVEL 3}
   VAR I,J,MAX_RNK,RANK,INDEX:INTEGER;
   Begin {Rank_inst}

     {%DEBUG WRITELN('RANKING INST ',INSTANCE^.NAME.CHARS^:INSTANCE^.NAME.LEN);}

     { IO_NET is used to indicate to RANK_NET that ID is driven by an IO
       pin.  This net will then be weighted with IO_WEIGHT to insure that
       it executes after other nets at that rank. }
     IO_NET:=FALSE;

     IF (INSTANCE^.RANK < 0) OR CHECKING_FOR_FEEDBACK THEN
     BEGIN
```

```
MAX_RNK:=0;

FOR I:= 1 TO MAX_INPINS DO
BEGIN
  IF INSTANCE^.IN_LIST[I].ID.LEN <= 0 THEN EXIT;
  IF EQUIV(INSTANCE^.IN_LIST[I].ID,ID) THEN
  BEGIN
    {  IO pin found }
    {  Because we only support IO pins on the package, rank of input must be 0.}
    {% DEBUG  GET_NAME(NET,NAME);
    WRITELN('IO PIN ',NAME:-1,' BEING RANKED!');}
    RANK:=0;
    IO_NET:=TRUE;
  END
          ELSE
            RANK:= RANK_INCREMENT + RANK_NET(NET_EQNS[INSTANCE^.IN_LIST[I].INDEX],EQUATION);
          IF RANK > MAX_RNK THEN MAX_RNK:=RANK;
        END;

        IF INSTANCE^.RANK < 0 THEN INSTANCE^.RANK:=MAX_RNK;
      END;

      RANK_INST:=INSTANCE^.RANK;
      {%DEBUG  WRITELN('RANK OF INST ',INSTANCE^.NAME.CHARS^:INSTANCE^.NAME.LEN,'=',INSTANCE^.RANK);}
    End; {Rank_inst}
{ *   *   *   *   *   *   *   *   *   *   *   *   *   *   *   *   *   *   *   *}
    Procedure Compute_max_rnk_net(IN OUT  MAX_RNK:INTEGER); {level 3}
    VAR I:INTEGER;
        IO_NET:BOOLEAN;
    Begin {Compute_max_rnk_net}
      MAX_RNK:=0;

      FOR I:= 1 TO MAX_DRIVES DO
      BEGIN
        IF NET^.INST[I] = NIL THEN EXIT;
        RANK:=RANK_INST(NET^.INST[I],NET^.ID,IO_NET);
        IF IO_NET THEN RANK:=RANK+IO_WEIGHT;
        IF RANK > MAX_RNK THEN MAX_RNK:=RANK;
      END;
    End; {Compute_max_rnk_net}

  Begin {Rank_net}

    {%DEBUG  GET_NAME(NET,NAME); WRITELN('RANKING NET ',NAME:-1);}
    IF CHECKING_FOR_FEEDBACK AND NOT NET^.STATE THEN
    BEGIN

      IF NOT NET^.PATH THEN
      BEGIN
        NET^.PATH:=TRUE;
        COMPUTE_MAX_RNK_NET(MAX_RNK);
        IF NET^.RANK < 0 THEN NET^.RANK:=MAX_RNK;
        NET^.PATH:=FALSE;
```

```
END
ELSE
BEGIN
      { F e e d b a c k   loop found !!!!!}
      GET_NAME(NET,NAME);
      WARNING ('FEEDBACK ON NET.');
      WRITELN('>>',NAME:-1);
      WRITELN('#                    Driving instance(s) on this net is');
      FOR I:= 1 TO MAX_DRIVES DO
      BEGIN
        IF NET^.INST[I] = NIL THEN EXIT;
        WRITELN('#                          ',NET^.INST[I]^.NAME.CHARS^:NET^.INST[I]^.NAME.LEN);
      END;
      EQUATION.NET^.VALID:=FALSE;
      NET^.VALID:=FALSE;
    END;
  END
  ELSE
  BEGIN
    IF NET^.RANK < 0 THEN
    BEGIN
      COMPUTE_MAX_RNK_NET(MAX_RNK);
      NET^.RANK:=MAX_RNK;
    END;

    {Mark the equation as a state equation.}

    EQUATION.STATE:=TRUE;

    {%DEBUG WRITELN('STATE EQN=',EQUATION.ID.CHARS^:EQUATION.ID.LEN);}
  END;

  RANK_NET:=NET^.RANK;
  {%DEBUG  GET_NAME(NET,NAME); WRITELN('* * * RANK OF NET ',NAME:-1,'=',NET^.RANK);}
End; {Rank_net}
{* * * * * * * * * * * * * * * * * * * * * * * * * * * * * * * * * * * * * * *}
Procedure Sort_nets_by_rank;
VAR I,J:INTEGER;
  TEMP:PTR_NETEQN;

  PROCEDURE CHECK_FOR_UNUSED_PRIMARY_INPUTS;
  VAR I:INTEGER16;
  BEGIN {CHECK_FOR_UNUSED_PRIMARY_INPUTS}
    FOR I:=1 TO NINPINS DO
    BEGIN
      IF PRIMARY_INPINS[I].NET^.RANK < 0 THEN
      BEGIN
        PRIMARY_INPINS[I].NET^.RANK:=0;  { Give it a rank of zero so it
                                           won't be deleted.}
        GET_NAME(PRIMARY_INPINS[I].NET,NAME);
        WARNING ('Primary input was not used.');
        WRITELN('>>',NAME:-1);
      END;
    END;
```

```
  END; {CHECK_FOR_UNUSED_PRIMARY_INPUTS}

Begin {Sort_nets_by_rank}

  CHECK_FOR_UNUSED_PRIMARY_INPUTS;

  {Arrange NET_EQNS in order of rank.}

  I:=0;
  FOR RANK:= 0 TO MAX_RANK DO
  BEGIN
    FOR J:= I+1 TO NNET DO
    BEGIN
      IF NET_EQNS[J]^.RANK = RANK THEN
      BEGIN
        I:=I+1;
        IF I = J THEN NEXT;
        TEMP:=NET_EQNS[I];
        NET_EQNS[I]:=NET_EQNS[J];
        NET_EQNS[J]:=TEMP;
      END;
    END;
  END;
  {%DEBUG FOR J:= 1 TO NNET DO  WRITELN('NET ',J:-1,' = ',NET_EQNS[J]^.ID.CHARS^:NET_EQNS[J]^.ID.LEN,', rank=',net_eqns[j]^.rank:-1);

  {Check for unranked nets.  If a net is not ranked, then it was not on
   any path for PRIMARY_OUTPINS.}

  IF I < NNET THEN
  BEGIN
    {%DEBUG WRITELN('I=',I,', NNET=',NNET);}
    FOR J:= I+1 TO NNET DO
    BEGIN
      IF NET_EQNS[J]^.RANK < 0 THEN
      BEGIN
        {%DEBUG WRITE('NET #=',J:-1,', ');}
        GET_NAME(NET_EQNS[J],NAME);
        WARNING ('Net was not used.');
        WRITELN('>>',NAME:-1);
      END;
    END;
    NNET:=I;    {Reduce nnet by number of unused nets.}
    IF NNET =0 THEN
    BEGIN
      ERROR ('No nets were used by the specified outputs.');
      MSG('No BLM can be generated.');
      TERMINATE(ABNORMAL);
    END;
  END;

End;  {Sort_nets_by_rank}
{* * * * * * * * * * * * * * * * * * * * * * * * * * * * * * * * * * * * * * *}
Procedure Recode_package_pins; {level 2}
VAR I,INDEX:INTEGER;
```

```
Begin {Reindex_package_pins}
  {%debug MSG('INDEX_PACKAGE_PINS REACHED!');}

  FOR I:=1 TO NINPINS DO
  BEGIN
    FIND_NET_EQN(PRIMARY_INPINS[I].ID,FALSE,INDEX);
    PRIMARY_INPINS[I].NET:=NET_EQNS[INDEX];
  END;

  FOR I:=1 TO NOUTPINS DO
  BEGIN
    FIND_NET_EQN(PRIMARY_OUTPINS[I].ID,FALSE,INDEX);
    PRIMARY_OUTPINS[I].NET:=NET_EQNS[INDEX];
  END;

{     SORT_PACKAGE_PINS;} {PINS SHOULD BE ALREADY_SORTED.}
End; {Reindex_package_pins}
{* * * * * * * * * * * * * * * * * * * * * * * * * * * * * * * * * * * * * * *}
Procedure Reindex_in_lists; {level 2}
VAR N,D,I,K,INDEX:INTEGER;
Begin {Reindex_in_lists}
  {%debug MSG('RE_INDEX_IN_LISTS REACHED!');}
  FOR N:=1 TO NNET DO
  BEGIN
    {%DEBUG WRITE('NET =',NET_EQNS[N]^.ID.CHARS^:NET_EQNS[N]^.ID.LEN);}

    FOR D:=1 TO MAX_DRIVES DO
    BEGIN
      IF  NET_EQNS[N]^.INST[D] = NIL THEN EXIT;
      {%DEBUG WRITE(', DRIVE=',NET_EQNS[N]^.INST[D]^.NAME.CHARS^:NET_EQNS[N]^.INST[D]^.NAME.LEN);}

      FOR I:=1 TO MAX_INPINS DO
      BEGIN
        IF  NET_EQNS[N]^.INST[D]^.IN_LIST[I].ID.LEN <= 0 THEN EXIT;
        {%DEBUG WRITE(', ',NET_EQNS[N]^.INST[D]^.IN_LIST[I].ID.CHARS^:NET_EQNS[N]^.INST[D]^.IN_LIST[I].ID.LEN);}
        FIND_NET_EQN(NET_EQNS[N]^.INST[D]^.IN_LIST[I].ID,FALSE,INDEX);
        NET_EQNS[N]^.INST[D]^.IN_LIST[I].INDEX:=INDEX;
      END;
    END;
    {%DEBUG WRITELN;}
  END;
End; {Reindex_in_lists}
{* * * * * * * * * * * * * * * * * * * * * * * * * * * * * * * * * * * * * * *}


Begin {Rank_equations}
  MSG('Ranking equations.');

  {  Rank state equations.                              }
  {  These equations are found in array STATE_EQNS.     }

  {Set up a dummy package pin for state ranking.}
  NEW_STRING_T(DUMMY_PP.ID);
  DUMMY_PP.NET:=NIL;
  DUMMY_PP.TYPE_ID:=PRIMARY_OTHER;
```

```
FOR I:= 1 TO NSTATES DO
BEGIN
  SUBST_STRING_T(STATE_EQNS[I]^.ID,DUMMY_PP.ID);
  DUMMY_PP.NET:=STATE_EQNS[I];
  STATE_EQNS[I]^.RANK := RANK_NET(STATE_EQNS[I],DUMMY_PP);
  IF STATE_EQNS[I]^.RANK > MAX_STATE_RANK THEN
    MAX_STATE_RANK:=STATE_EQNS[I]^.RANK;
  {%DEBUG WRITELN('RANK OF STATE ', STATE_EQNS[I]^.ID.CHARS^:STATE_EQNS[I]^.ID.LEN,'=',STATE_EQNS[I]^.RANK);}
  {%DEBUG WRITE('STATE ',STATE_EQNS[I]^.ID.CHARS^:STATE_EQNS[I]^.ID.LEN,'='); INORDER_COUNT:=0; INORDER(STATE_EQNS[I]^.EQN); WRITELN;}
END;

{  Rank LATCH equations.                              }
{  These equations are found in array LATCH_EQNS.     }

FOR I:= 1 TO NLATCHES DO
BEGIN
  SUBST_STRING_T(LATCH_EQNS[I]^.ID,DUMMY_PP.ID);
  DUMMY_PP.NET:=LATCH_EQNS[I];
  LATCH_EQNS[I]^.RANK := RANK_NET(LATCH_EQNS[I],DUMMY_PP);
  IF LATCH_EQNS[I]^.RANK > MAX_STATE_RANK THEN
    MAX_STATE_RANK:=LATCH_EQNS[I]^.RANK;
  {%DEBUG  WRITELN('RANK OF LATCH ', LATCH_EQNS[I]^.ID.CHARS^:LATCH_EQNS[I]^.ID.LEN,'=',LATCH_EQNS[I]^.RANK);}
  {%DEBUG  WRITE('LATCH ',LATCH_EQNS[I]^.ID.CHARS^:LATCH_EQNS[I]^.ID.LEN,'='); INORDER_COUNT:=0; INORDER(LATCH_EQNS[I]^.EQN); WRITELN;
END;

DISPOSE_STRING_T(DUMMY_PP.ID);

{%DEBUG WRITELN('MAX_STATE_RANK=',MAX_STATE_RANK);}

 {  Rerank STATE_NETS so all have same rank as MAX_STATE_RANK.        }
 {  STATE_NETS index into NET_EQNS; therefore, the rank is actually   }
 {  begin changed in the corresponding NET_EQNS record.               }

FOR I:=1 TO NSTATE_NETS DO
BEGIN
  IF NOT STATE_NETS[I]^.VALID THEN
  BEGIN
    GET_NAME(STATE_NETS[I],NAME);
    WRITELN('#  Combinational feedback on path from state ',NAME:-1);
    WRITELN('#  The equation for this state is not valid.');
    WRITELN('#  Please verify this design in NETED.');
    WRITELN('#  If feedback is correct the equation must be completed by hand.');
  END
  ELSE
  BEGIN
    {%debug GET_NAME(STATE_NETS[I],NAME);}
    {%debug WRITELN('STATE_NET ',NAME:-1,' IS VALID.');}
  END;
  STATE_NETS[I]^.RANK:=MAX_STATE_RANK;
END;


{Rank primary outputs}
```

```
MAX_RANK:=MAX_STATE_RANK;

FOR I:=1 TO NOUTPINS DO
BEGIN
  FIND_NET_EQN(PRIMARY_OUTPINS[I].ID,FALSE,INDEX);

  PRIMARY_OUTPINS[I].NET^.RANK:=
    RANK_NET(NET_EQNS[INDEX],PRIMARY_OUTPINS[I]);
  IF PRIMARY_OUTPINS[I].NET^.RANK > MAX_RANK THEN
    MAX_RANK:=PRIMARY_OUTPINS[I].NET^.RANK;

  GET_NAME(PRIMARY_OUTPINS[I].NET,NAME);
  IF NOT PRIMARY_OUTPINS[I].NET^.VALID THEN
  BEGIN
    WRITELN('#  Feedback on path from package output ',NAME:-1);
    WRITELN('#  The equation for this package pin is not valid.');
    WRITELN('#  Please verify this design in NETED.');
    WRITELN('#  If feedback is correct the equation must be completed by hand.');
  END
  ELSE
  BEGIN
    {%debug WRITELN('PRIMARY_OUTPIN ',NAME:-1,' IS VALID.');}
  END;

  { Combinatorial outputs will have a delay equal to their rank.  }
  { Outputs which are affected by states will have a delay equal to
    their rank minus MAX_STATE_RANK. }
  { The minimum delay is MIN_DELAY. }

  IF PRIMARY_OUTPINS[I].STATE THEN
    PRIMARY_OUTPINS[I].DELAY:=MAX((PRIMARY_OUTPINS[I].NET^.RANK-MAX_STATE_RANK),MIN_DELAY)
  ELSE
    PRIMARY_OUTPINS[I].DELAY:=MAX(PRIMARY_OUTPINS[I].NET^.RANK,MIN_DELAY);

END;

{%DEBUG WRITELN('MAX_RANK=',MAX_RANK);}

SORT_NETS_BY_RANK;
REINDEX_PACKAGE_PINS;
REINDEX_IN_LISTS;

{%DEBUG
 FOR J:=1 TO NNET DO
 BEGIN
      WRITE('NET ',NET_EQNS[J]^.ID.CHARS^:NET_EQNS[J]^.ID.LEN,'='); INORDER_COUNT:=0; INORDER(NET_EQNS[J]^.EQN); WRITELN;
 END;
}
End; {Rank_equations}
{******************************************************************************}
{******************************************************************************}

Procedure Minimize_equations; {level 1}
Begin {minimize_equations}
```

```
  {%debug} MSG('Minimizing equations.');
End; {minimize_equations}

{***************************************************************************}
Procedure Find_data_in_inst_in_list (IN OUT DATA: DATA_REC;
                                     IN INST:INST_ARRAY; OUT INDEX:INTEGER);

VAR D,I,K:INTEGER;
Begin {Find_data_in_inst_in_list}
  { In order to avoid repeated searches, the
    index found will be stored in DATA.INDEX.

    If DATA.INDEX is <= zero then look for
    the correct index, otherwise assign
    INDEX:=DATA.INDEX and return.}


  IF DATA.INDEX > 0 THEN
  BEGIN
    INDEX:=DATA.INDEX;
  END
  ELSE
  BEGIN
  INDEX:=-1;

  FOR D:=1 TO MAX_DRIVES DO
  BEGIN
    IF INST[D] = NIL THEN EXIT;
    {%DEBUG WRITE('INST ',INST[D]^.NAME.CHARS^:INST[D]^.NAME.LEN);}
    FOR I:=1 TO MAX_INPINS DO
    BEGIN
      IF INST[D]^.IN_LIST[I].ID.LEN <= 0 THEN EXIT;
      {%DEBUG WRITE(', ',INST[D]^.IN_LIST[I].ID.CHARS^:INST[D]^.IN_LIST[I].ID.LEN);}
      IF EQUIV(INST[D]^.IN_LIST[I].ID, DATA.ID) THEN
      BEGIN
        INDEX:=INST[D]^.IN_LIST[I].INDEX;
        DATA.INDEX:=INDEX;
        RETURN;
      END;
    END;
  END;

  {DATA not found!}
  IF INTERFACE = BURLIST THEN
  BEGIN
    ERROR ('Net not found in input list.');
    WRITEln('>>',DATA.ID.CHARS^:DATA.ID.LEN)
  END
  ELSE
  BEGIN
    ERROR ('Net not found in input list.');
    WRITEln('SELF >>',DATA.ID.CHARS^:DATA.ID.LEN)
  END;
  WRITE('#    Check inputs in library for instance(s) (property $self) ');
  FOR D:=1 TO MAX_DRIVES DO
```

```
  BEGIN
    IF INST[D] = NIL THEN
    BEGIN
      WRITELN;
      EXIT;
    END;
    WRITE(INST[D]^.NAME.CHARS^:INST[D]^.NAME.LEN,', ');
  END;

  INDEX:=1; {Allow prog to continue.}
  DATA.INDEX:=INDEX;
 END;
End;  {Find_data_in_inst_in_list}

{***************************************************************************}
{***************************************************************************}
Procedure Generate_files; {level 1}
VAR
  NNET_DIG,LEN:INTEGER;
  CHAR_NNET:BUFFER80;

  Procedure Generate_blm; {level 2}
  CONST   CHARS_PER_LINE = 80;
  CONST PRIORITY=3;
  VAR
      BLM_LINE,BUF:BUFFER80;
      NOUTPIN_PTRS,
      NINPIN_PTRS:INTEGER;
      in_pin_ptr : array[1..max_package_pins] of inpin_ptr_rec;
      out_pin_ptr : array[1..max_package_pins] of outpin_ptr_rec;

      {Variables for the BLM}

      COMP_REC_PTR_TYPE,
      COMP_REC_NAME,
      COMP_REC_PTR_NAME:BLM_VAR;
   {* * * * * * * * * * * * * * * * * * * * * * * * * * * * * * * * * * * * * *}
    Procedure Find_in_pin_ptr(IN pin_name:dynamic_string_t; OUT INDEX:INTEGER); {level 3}
    VAR I:INTEGER;
    Begin {Find_in_pin_ptr}
      INDEX:=-1;

      FOR I:= 1 TO NINPIN_PTRS DO
      BEGIN
        IF IN_PIN_PTR[I].PIN = NIL THEN
          RETURN
        ELSE IF IN_PIN_PTR[I].PIN^.NET^.bus_name.LEN <= 0 THEN
          RETURN
        ELSE IF EQUIV(IN_PIN_PTR[I].PIN^.NET^.bus_name, PIN_NAME) THEN
        BEGIN
          INDEX:=I;
          RETURN;
        END;
      END;
    End; {Find_in_pin_ptr}
```

```
(* * * * * * * * * * * * * * * * * * * * * * * * * * * * * * * * * * * * * * *)

Procedure Make_pin_pointers; (level 3)
VAR I,J,INDEX,POSITION,NCHARS,IOCHAR:INTEGER; DUMMY_NAME:BLM_VAR;
  THIS_BUS_ID:DFI_$OBJECT_IDENTIFIER;
Begin (Make_pin_pointers)

  (Pin_ptr_names will be of the form COMPONENT_$O$PIN or COMPONENT_$I$PIN.)
  (Output pins have both input and output ptrs.)

POSITION:=1;
INIT_NUL(DUMMY_NAME,L_ID);
MOVE(COMPONENT,1,LEN,DUMMY_NAME,POSITION);
NINPIN_PTRS:=0;
NOUTPIN_PTRS:=0;
THIS_BUS_ID:=DFI_$NULL_OBJ_ID;

FOR I:= 1 TO NINPINS DO
BEGIN
  POSITION:=POSITION+LEN;
  IOCHAR:=LEN+3;
  MOVE('_$I$',1,4,DUMMY_NAME,POSITION);
  POSITION:=POSITION+4;
  FOR J:=POSITION TO L_ID DO DUMMY_NAME[J]:=NUL;
  IF (PRIMARY_INPINS[I].NET^.BUS_ID <> 0) AND (PRIMARY_INPINS[I].NET^.BUS_ID = THIS_BUS_ID) THEN
  BEGIN
    POSITION:=1;
    NEXT;
  END
  ELSE
  BEGIN
    THIS_BUS_ID:=PRIMARY_INPINS[I].NET^.BUS_ID;
    MOVE(PRIMARY_INPINS[I].NET^.BUS_NAME.CHARS^,1,PRIMARY_INPINS[I].NET^.BUS_NAME.LEN,DUMMY_NAME,POSITION);
  END;

  POSITION:=1;
  (%DEBUG WRITELN(DUMMY_NAME);)
  NINPIN_PTRS:=NINPIN_PTRS+1;
  IN_PIN_PTR[NINPIN_PTRS].I:=DUMMY_NAME;
  IN_PIN_PTR[NINPIN_PTRS].PIN:=ADDR(PRIMARY_INPINS[I]);
END;

THIS_BUS_ID:=DFI_$NULL_OBJ_ID;

FOR I:=1 TO NOUTPINS DO
BEGIN
  POSITION:=POSITION+LEN;
  MOVE('_$I$',1,4,DUMMY_NAME,POSITION);
  POSITION:=POSITION+4;
  FOR J:=POSITION TO L_ID DO DUMMY_NAME[I]:=NUL;
  IF (PRIMARY_OUTPINS[I].NET^.BUS_ID <> 0) AND (PRIMARY_OUTPINS[I].NET^.BUS_ID = THIS_BUS_ID) THEN
  BEGIN
    POSITION:=1;
    NEXT;
  END
```

```
    ELSE
    BEGIN
      THIS_BUS_ID:=PRIMARY_OUTPINS[I].NET^.BUS_ID;
      MOVE(PRIMARY_OUTPINS[I].NET^.BUS_NAME.CHARS^,1,PRIMARY_OUTPINS[I].NET^.BUS_NAME.LEN,DUMMY_NAME,POSITION);
    END;

    POSITION:=1;
    NOUTPIN_PTRS:=NOUTPIN_PTRS+1;
    {%DEBUG WRITELN(DUMMY_NAME);}
    OUT_PIN_PTR[NOUTPIN_PTRS].I:=DUMMY_NAME;
    DUMMY_NAME[IOCHAR]:='O';
    {%DEBUG WRITELN(DUMMY_NAME);}
    OUT_PIN_PTR[NOUTPIN_PTRS].O:=DUMMY_NAME;
    OUT_PIN_PTR[NOUTPIN_PTRS].PIN:=ADDR(PRIMARY_OUTPINS[I]);
  END;
End;  {Make_pin_pointers}

{* * * * * * * * * * * * * * * * * * * * * * * * * * * * * * * * * * * * * * * *}
 Procedure Make_blm_variables; {level 3}
 VAR I:INTEGER;
 Begin {Make_blm_variables}

   {Make COMP_REC_NAME}

   INIT_NUL(COMP_REC_NAME,L_ID);
   MOVE(COMPONENT,1,LEN,COMP_REC_NAME,1);
   MOVE('_REC',1,4,COMP_REC_NAME,LEN+1);


   {Make COMP_REC_PTR_NAME}

   INIT_NUL(COMP_REC_PTR_NAME,L_ID);
   MOVE(COMPONENT,1,LEN,COMP_REC_PTR_NAME,1);
   MOVE('_REC_PTR',1,8,COMP_REC_PTR_NAME,LEN+1);

   {Make COMP_REC_PTR_TYPE}

   INIT_NUL(COMP_REC_PTR_TYPE,L_ID);
   MOVE(COMPONENT,1,LEN,COMP_REC_PTR_TYPE,1);
   MOVE('_PTR',1,4,COMP_REC_PTR_TYPE,LEN+1);

 End; {Make_blm_variables}

{* * * * * * * * * * * * * * * * * * * * * * * * * * * * * * * * * * * * * * * *}

 Procedure Generate_header; {level 3}
 VAR I:INTEGER;
 Begin {Generate_header}
   WRITELN(BLM,'MODULE ',COMPONENT:LEN,';');
   WRITELN(BLM,'{',X10,VERSION_STM,X10,'}');
   WRITELN(BLM,'{',X10,TIME_STAMP:-1,X10,'    }');

   WRITELN(BLM,'{');
   WRITELN(BLM,'#------------------------------------------');
```

```
WRITELN(BLM,'# Instances processed:  ',ninst:5);
WRITELN(BLM,'# Nets processed:       ',nnet:5);
WRITELN(BLM,'# Twin outs:            ',ntwin_outs:5);
WRITELN(BLM,'# Flip flops:           ',nstates DIV 2:5);
WRITELN(BLM,'# Latches:              ',nLATCHES:5);
WRITELN(BLM,'# Package pins:         ',npins:5);
WRITELN(BLM,'#   input pins:        ',ninpins:5);
WRITELN(BLM,'#   output pins:       ',noutpins:5);
WRITELN(BLM);

IF NCHAINS > 0 THEN
BEGIN
  WRITELN(BLM,'#----------- CHAIN STATISTICS ------------');
  WRITELN(BLM,'# ',NCHAINS:2,' chain piece(s) found.');
  WRITELN(BLM,'# SDO                          LENGTH');

  FOR I:=1 TO NCHAINS DO
  BEGIN
    GET_NAME(CHAINS[I].SDO.NET,NAME);
    WRITELN(BLM,'# ',NAME:25,X4,(CHAINS[I].LEN DIV 2):4);

  END;
  WRITELN(BLM,'#----------------------------------------');
END;

WRITELN(BLM,'# Warnings :  ',warning_count:5);
WRITELN(BLM,'# Errors :    ',ERROR_COUNT:5);
WRITELN(BLM,'#----------------------------------------');

WRITELN(BLM,'}');
End; {Generate_header}
{* * * * * * * * * * * * * * * * * * * * * * * * * * * * * * * * * * * * * * *}

Procedure Generate_includes; {level 3}
Begin {Generate_includes}
  {%debug MSG('GENERATE INCLUDES REACHED!');}
  WRITELN(BLM);
  WRITELN(BLM,'{%NOLIST}');
  WRITELN(BLM,'%INCLUDE ''/IDEA/SYS/INS/SIM.INS.PAS'' ;');
  WRITELN(BLM,'%INCLUDE ''',WORKING_DIR.CHARS^:WORKING_DIR.LEN,'/',
    COMPONENT:LEN,'/SYMBOL.PF_$',symbol_version:-1,''' ;');
  WRITELN(BLM,'{%LIST}');
  WRITELN(BLM);
End; {Generate_includes}
{* * * * * * * * * * * * * * * * * * * * * * * * * * * * * * * * * * * * * * *}

Procedure Generate_declarations; {level 3}
VAR I,C,NCHARS,N:INTEGER;
Begin {Generate_declarations}
  {%debug MSG('GENERATE DECLARATIONS REACHED!');}
  WRITELN(BLM);

  {Revision AJ: Add chain information. }
```

```
IF NCHAINS > 0 THEN
BEGIN
  WRITELN(BLM,'CONST MAX_CHAIN_LEN = 4000;');
  WRITELN(BLM);
END;

WRITELN(BLM,'TYPE ');
WRITELN(BLM,'  SIGNAL_VALUES = SIM_$ZERO..SIM_$ONE;');

IF NCHAINS > 0 THEN
BEGIN
  WRITELN(BLM);
  WRITELN(BLM,X2,'BUFFER300 = PACKED ARRAY [1..300] OF CHAR;');
  WRITELN(BLM,X2,'BUFFER12  = PACKED ARRAY [1..12] OF CHAR;');
  WRITELN(BLM,X2,'CHAIN_DATA_PTR = ^CHAIN_DATA;');
  WRITELN(BLM,X2,'CHAIN_DATA = ARRAY [0..MAX_CHAIN_LEN] OF SIGNAL_VALUES;');
  WRITELN(BLM,X2,'FLAG_PTR = ^BOOLEAN_REC;');

  {This BOOLEAN_RECORD is VERY IMPORTANT! It is unpacked on purpose to
   allow for a pointer to the SET_CHAIN^.FLAG in the CHAIN_CONTROLLER.}

  WRITELN(BLM,X2,'BOOLEAN_REC = RECORD');
  WRITELN(BLM,X4,'FLAG:BOOLEAN;');
  WRITELN(BLM,X2,'END;');
  WRITELN(BLM);

END;


WRITELN(BLM,'  ',COMP_REC_PTR_TYPE:LEN+4,' = ^',COMP_REC_NAME:LEN+4,';');
WRITELN(BLM,'  ',COMP_REC_NAME:LEN+4,' = PACKED RECORD');
WRITELN(BLM,'    LAST_TIME : INTEGER32;');
WRITELN(BLM,'    LAST_ITERATION : INTEGER;');
WRITELN(BLM,'    EXECUTION_COUNT : INTEGER;');
IF (NSTATES > 0) OR (NLATCHES > 0)   THEN
BEGIN
  WRITE(BLM,'  ');
  NCHARS:=2;

  { Put STATES in user data area. }

FOR I:=1 TO NEW_NSTATES DO
BEGIN
  N:=NEW_STATE_EQNS[I]^.ID.LEN;
  NCHARS:=NCHARS+N+3;
  IF NCHARS > CHARS_PER_LINE THEN
  BEGIN
    WRITELN(BLM);
    WRITE(BLM,X2);
    NCHARS:=5+N;
  END;
  IF (I = NEW_NSTATES) AND (NLATCHES <= 0) AND (NCHAINS <=0) THEN
    WRITELN(BLM,X2,NEW_STATE_EQNS[I]^.ID.CHARS^:N)
  ELSE
```

```
    WRITE(BLM,X2,NEW_STATE_EQNS[I]^.ID.CHARS^:N,',');
END;

FOR C:= 1 TO NCHAINS DO
BEGIN
  FOR I:= 1 TO CHAINS[C].LEN DO
  BEGIN
    N:=CHAINS[C].STATES[I]^.ID.LEN;
    NCHARS:=NCHARS+N+3;
    IF NCHARS > CHARS_PER_LINE THEN
    BEGIN
      WRITELN(BLM);
      WRITE(BLM,X2);
      NCHARS:=5+N;
    END;
    IF (I = CHAINS[C].LEN) AND (C = NCHAINS) AND (NLATCHES <= 0) THEN
      WRITELN(BLM,X2,CHAINS[C].STATES[I]^.ID.CHARS^:N)
    ELSE
      WRITE(BLM,X2,CHAINS[C].STATES[I]^.ID.CHARS^:N,',');
  END;
END;

{ Put LATCHES in user data area. }

FOR I:=1 TO NLATCHES DO
BEGIN
  N:=LATCH_EQNS[I]^.ID.LEN;
  NCHARS:=NCHARS+N+3;
  IF NCHARS > CHARS_PER_LINE THEN
  BEGIN
    WRITELN(BLM);
    WRITE(BLM,X2);
    NCHARS:=5+N;
  END;
  IF I = NLATCHES THEN
    WRITELN(BLM,X2,LATCH_EQNS[I]^.ID.CHARS^:N)
  ELSE
    WRITE(BLM,X2,LATCH_EQNS[I]^.ID.CHARS^:N,',');
END;

NCHARS:=NCHARS+1;
IF NCHARS > CHARS_PER_LINE THEN
  WRITELN(BLM);
WRITELN(BLM,'      : SIGNAL_VALUES;');

IF NCHAINS > 0 THEN
BEGIN
  FOR I:= 1 TO NCHAINS DO
  BEGIN
    WRITELN(BLM);
    WRITELN(BLM,X2,'{ Pointers to chain information in the CHAIN_CONTROLLER. }');
    WRITELN(BLM);
    WRITELN(BLM,X2,'SET_CHAIN',I:-1,' : FLAG_PTR;');
    WRITELN(BLM,X2,'SDI',I:-1,'_OFFSET : INTEGER16;');
    WRITELN(BLM,X2,'CHAIN',I:-1,' : CHAIN_DATA_PTR;');
```

```
      END;
    END;

  END;

  WRITELN(BLM,'  END;');
  WRITELN(BLM);
  WRITELN(BLM,SEPARATOR);


  IF NCHAINS > 0 THEN
  BEGIN

    WRITELN(BLM,SEPARATOR);
    WRITELN(BLM);
    WRITELN(BLM,'{ This procedure should be found in the CHAIN_CONTROLLER. }');
    WRITELN(BLM);
    WRITELN(BLM,'PROCEDURE CHAIN_CONTROLLER_HERE_I_AM(IN SDI_NET:BUFFER300;');
    WRITELN(BLM,X2,'IN SDI_NET_LENGTH:INTEGER16;  IN CHIP:BUFFER12;');
    WRITELN(BLM,X2,'IN OUT UDA_CHAIN_PTR:CHAIN_DATA_PTR; IN OUT UDA_OFFSET:INTEGER16; ');
    WRITELN(BLM,X2,'IN OUT UDA_SET_CHAIN_PTR:FLAG_PTR); EXTERN;');
    WRITELN(BLM,SEPARATOR);

  END;
End; {Generate_declarations}

{* * * * * * * * * * * * * * * * * * * * * * * * * * * * * * * * * * * * * * *}

Procedure Generate_allocate; {level 3}
VAR IOPIN:BOOLEAN; I,C,NCHARS,N:INTEGER;
Begin {Generate_allocate}
  {%debug MSG('GENERATE ALLOCATE REACHED!');}
  WRITELN(BLM,PROC,COMPONENT:LEN,'$$ALLOCATE;');
  WRITELN(BLM,'VAR ');
  WRITELN(BLM,X2,COMP_REC_PTR_NAME:LEN+8,' : ',COMP_REC_PTR_TYPE:LEN+4,';');
  WRITELN(BLM,X2,'ENTRY_POINT_EVALUATE : UNIV_PTR;');
  WRITELN(BLM,BEG,'{ALLOCATE}');

  {Write code for installing pin handlers.}
{ **************************************************************************************
 The following block of code has been commented out due to problems with
 SIM_$INSTALL_PIN_HANDLER.  Pin handler procedures will be used until
 this problem has been solved.

  * * * Return to using SIM_$INSTALL_PIN_HANDLER (7-28-85) }


  WRITELN(BLM,X2,WITHSTART_I);
  WRITELN(BLM,X4,
    'IF NOT SIM_$DEFINE_ENTRY_POINT(''',COMPONENT:LEN,'_EVALUATE''',',(9+LEN):-1,',ENTRY_POINT_EVALUATE) THEN');
  WRITELN(BLM,X6,'SIM_$MESSAGE(''',COMPONENT:LEN,' ENTRY POINT GENERATION FAILURE.''',',(32+LEN):-1,');');
  WRITELN(BLM);
```

```
FOR I:=1 TO NINPIN_PTRS DO
BEGIN
  IF IN_PIN_PTR[I].PIN^.TYPE_ID=PRIMARY_IO THEN
    IOPIN:=TRUE
  ELSE
     IOPIN:=FALSE;
  COUNT_CHARS(IN_PIN_PTR[I].I,L_ID,NCHARS);
  WRITELN(BLM,X4,'SIM_$INSTALL_PIN_HANDLER(I.',IN_PIN_PTR[I].I:NCHARS,
    ', ENTRY_POINT_EVALUATE, ',IOPIN:5,', ',PRIORITY:-1,');');
END;
WRITELN(BLM,X2,ENND);
{ ******************************************************************************************}

{Write code for memory allocation.}

WRITELN(BLM,X2,'SIM_$ALLOCATE(SIZEOF(',COMP_REC_NAME:LEN+4,'), ',
  COMP_REC_PTR_NAME:LEN+8,');');


IF (NSTATES > 0) OR (NLATCHES > 0)  THEN
BEGIN
  WRITELN(BLM,X2,'WITH ',COMP_REC_PTR_NAME:-1,'^ DO BEGIN');
  WRITE(BLM,X2);
  NCHARS:=2;

  FOR I:=1 TO NEW_NSTATES DO
  BEGIN
    N:=NEW_STATE_EQNS[I]^.ID.LEN;
    NCHARS:=NCHARS+N+15;
    IF NCHARS > CHARS_PER_LINE THEN
    BEGIN
      WRITELN(BLM);
      WRITE(BLM,'  ');
      NCHARS:=17+N;
    END;
    WRITE(BLM,'  ',NEW_STATE_EQNS[I]^.ID.CHARS^:N,':=SIM_$UNKNOWN;');
  END;
FOR C:= 1 TO NCHAINS DO
BEGIN
  FOR I:= 1 TO CHAINS[C].LEN DO
  BEGIN
    N:=CHAINS[C].STATES[I]^.ID.LEN;
    NCHARS:=NCHARS+N+15;
    IF NCHARS > CHARS_PER_LINE THEN
    BEGIN
      WRITELN(BLM);
      WRITE(BLM,'  ');
      NCHARS:=17+N;
    END;
    WRITE(BLM,'  ',CHAINS[C].STATES[I]^.ID.CHARS^:N,':=SIM_$UNKNOWN;');
  END;
END;
```

```
FOR I:=1 TO NLATCHES DO
BEGIN
  N:=LATCH_EQNS[I]^.ID.LEN;
  NCHARS:=NCHARS+N+15;
  IF NCHARS > CHARS_PER_LINE THEN
  BEGIN
    WRITELN(BLM);
    WRITE(BLM,'   ');
    NCHARS:=17+N;
  END;
  WRITE(BLM,'   ',LATCH_EQNS[I]^.ID.CHARS^:N,':=SIM_$UNKNOWN;');
END;

WRITELN(BLM);

IF NCHAINS > 0 THEN
BEGIN

  FOR I:= 1 TO NCHAINS DO
  BEGIN
        WRITELN(BLM,X2,'SDI',I:-1,'_OFFSET := 0;');
        WRITELN(BLM,X2,'SET_CHAIN',I:-1,' := NIL;');
        WRITELN(BLM,X2,'CHAIN',I:-1,' := NIL;');
      END;
    END;

    WRITELN(BLM,X2,ENND);
  END;

  WRITELN(BLM,X2,'SIMBASE_$INSTANCE_PTR^.USER_DATA_AREA := ',
    COMP_REC_PTR_NAME:LEN+8,';');

  WRITELN(BLM,ENND,'{ALLOCATE}' );
  WRITELN(BLM);
  WRITELN(BLM,SEPARATOR);

End; {Generate_allocate}

{* * * * * * * * * * * * * * * * * * * * * * * * * * * * * * * * * * * * * * *}

Procedure Generate_save; {level 3}
Begin {Generate_save}
  {%debug MSG('GENERATE SAVE REACHED!');}

  WRITELN(BLM,PROC,COMPONENT:LEN,'$$SAVE;');
  WRITELN(BLM,BEG,' {SAVE}');
  WRITELN(BLM,X2,'SIM_$SAVE(SIZEOF(',COMP_REC_NAME:LEN+4,
    '), SIMBASE_$INSTANCE_PTR^.USER_DATA_AREA);');
  WRITELN(BLM,ENND,' {SAVE}' );
  WRITELN(BLM);
End; {Generate_save}
{* * * * * * * * * * * * * * * * * * * * * * * * * * * * * * * * * * * * * * *}
```

```
Procedure Generate_restore; {level 3}
Begin {Generate_restore}
  {%debug MSG('GENERATE RESTORE REACHED!');}

  WRITELN(BLM,PROC,COMPONENT:LEN,'$$RESTORE;');
  WRITELN(BLM,BEG,'{RESTORE}');
  WRITELN(BLM,X2,'SIM_$RESTORE(SIZEOF(',COMP_REC_NAME:LEN+4,
    '), SIMBASE_$INSTANCE_PTR^.USER_DATA_AREA);');
  WRITELN(BLM,ENND,' {RESTORE}' );
  WRITELN(BLM);
  WRITELN(BLM,SEPARATOR);
End; {Generate_restore}
{* * * * * * * * * * * * * * * * * * * * * * * * * * * * * * * * * * * * * * *}

Procedure Generate_pin_handlers; {level 3}

  Procedure Generate_evaluate_procedure; {level 4}
  VAR COUNT:INTEGER;

   {*     *     *     *     *     *     *     *     *     *     *     *     *     }
      Procedure Write_preorder(IN OUT p:link; IN INST:INST_ARRAY); {level 6}
      VAR N,I,INDEX:INTEGER; DUMMY:BUFFER300;
      {Procedure WRITE_PREORDER performs a preorder traversal of the tree beginning
       at P.  This is a recursive procedure which terminates after the entire tree
       has been traversed. WRITE_PREORDER can be used for writing net_eqns in preorder
       form to the BLM file.
       NOTE: This gives Polish notation.  }

        Procedure Check_line_length; {level 7}
        Begin {Check_line_length}
          COUNT:=COUNT+N;
          IF COUNT>=CHARS_PER_LINE THEN
          BEGIN
            COUNT:=N+6;
            WRITELN(BLM);
            WRITE(BLM,X6);
          END;
        End; {Check_line_length}

Begin {Write_preorder}
  IF P <> NIL THEN
  BEGIN
    INIT_NUL(DUMMY,L_STRING_T);

    IF P^.DATA.TYPE_ID = OPERATOR_ID THEN
    BEGIN
      CASE P^.DATA.ID.CHARS^[1] OF
        '+','*',
        '@'       : BEGIN
                      CASE P^.DATA.ID.CHARS^[1] OF
                        '+' : BEGIN
                                N:=12;
                                MOVE('SIM_$CON_OR(',1,N,DUMMY,1);
                              END;
```

```
              '@' : BEGIN
                      N:=13;
                      MOVE('SIM_$CON_XOR[',1,N,DUMMY,1);
                    END;
              '*' : BEGIN
                      N:=13;
                      MOVE('SIM_$CON_AND[',1,N,DUMMY,1);
                    END;
            END;

            CHECK_LINE_LENGTH;
            WRITE(BLM,DUMMY:N);

            WRITE_PREORDER(P^.LLINK,INST);
            N:=1;
            CHECK_LINE_LENGTH;
            WRITE(BLM,',');

            WRITE_PREORDER(P^.RLINK,INST);
            N:=2;
            CHECK_LINE_LENGTH;
            WRITE(BLM,'] ');
          END;

    '''' : BEGIN
            N:=12;
            MOVE('SIM_CON_NOT[',1,N,DUMMY,1);

            CHECK_LINE_LENGTH;
            WRITE(BLM,DUMMY:N);

            WRITE_PREORDER(P^.LLINK,INST);
            N:=2;
            CHECK_LINE_LENGTH;
            WRITE(BLM,'] ');
          END;

  OTHERWISE  BEGIN
               ERROR ('Illegal operator for SIM.');
               WRITELN('>>',p^.data.id.CHARS^:P^.DATA.ID.LEN);
             END;

END;

END
ELSE
BEGIN
  IF P^.DATA.TYPE_ID = PIN_ID THEN
  BEGIN
    FIND_DATA_IN_INST_IN_LIST(P^.DATA,INST,INDEX);
    N:=NNET_DIG+5;
    CHECK_LINE_LENGTH;
    WRITE(BLM,'NET[',INDEX:NNET_DIG,']');
  END
  ELSE {LATCH_ID or STATE_ID}
```

```
        BEGIN
          N:=P^.DATA.ID.LEN+3;
          CHECK_LINE_LENGTH;
          WRITE(BLM,' R.',P^.DATA.ID.CHARS^:P^.DATA.ID.LEN);
        END;

        WRITE_PREORDER(P^.LLINK,INST);
        WRITE_PREORDER(P^.RLINK,INST);
      END;

    END;
  End;  {Write_preorder}
{ *     *      *      *      *      *      *      *      *      *  }

Procedure Gen_eval_declarations; {level 5}
Begin {Gen_eval_declarations}
  IF NNET < 100 THEN
    NNET_DIG:=2
  ELSE IF NNET < 1000 THEN
    NNET_DIG:=3
  ELSE IF NNET < 10000 THEN
    NNET_DIG:=4
  ELSE
    NNET_DIG:=7;
  WRITELN(BLM,'CONST');
  WRITELN(BLM,X2,'ZERO = SIM_$ZERO; UNKNOWN = SIM_$UNKNOWN; ONE = SIM_$ONE;');
  WRITELN(BLM);

  WRITELN(BLM,'VAR ');
  WRITELN(BLM,X2,COMP_REC_PTR_NAME:LEN+8,' : ',COMP_REC_PTR_TYPE:LEN+4,';');
  WRITELN(BLM,X2,'{All signal values will be stored in array NET.}');
  WRITELN(BLM,X2,'NET : ARRAY [1..',NNET:NNET_DIG,'] OF SIGNAL_VALUES;');
  WRITELN(BLM,X2,'SIM_CON_NOT : ARRAY [ZERO..ONE] OF SIGNAL_VALUES;');
  WRITELN(BLM,X2,'LOOP_COUNT:INTEGER;');
  WRITELN(BLM,X2,'OLD_STATE:SIGNAL_VALUES;');
  WRITELN(BLM,X2,'STATE_CHANGE:BOOLEAN;');

  WRITELN(BLM);
End; {Gen_eval_declarations}
{ *     *      *      *      *      *      *      *      *      *  }
{ *     *   REVISION AJ      *      *      *      *      *      *  }
PROCEDURE GEN_SET_CHAIN_IN_PROCEDURES;
VAR I,J,K:INTEGER16;
BEGIN { GEN_SET_CHAIN_IN_PROCEDURES }
  FOR I:=1 TO NCHAINS DO
  BEGIN
    WRITELN(BLM,SEPARATOR);
    WRITELN(BLM,X2,'PROCEDURE SET_CHAIN',I:-1,'_IN;');
    WRITELN(BLM,X2,'VAR N:INTEGER16;');
    WRITELN(BLM,X2,'BEGIN {SET_CHAIN_IN}');
    WRITELN(BLM,X4,'{%DEBUG} SIM_$MESSAGE(''SET_CHAIN'',I:1,''_IN'',13);');
    WRITELN(BLM);
    WRITELN(BLM,X4,'WITH ',COMP_REC_PTR_NAME:LEN+1,'^ DO BEGIN');
```

```
    WRITELN(BLM,X6,'{ Chain piece #',I:-1,' }');
    WRITELN(BLM);

    WRITELN(BLM,X6,'N:=R.SDI',I:-1,'_OFFSET;');

    {Setup masters and slaves.}

    K:=0;
    FOR J:= 1 TO CHAINS[I].LEN DO
    BEGIN
      WRITELN(BLM,X6,'R.',CHAINS[I].STATES[J]^.ID.CHARS^:CHAINS[I].STATES[J]^.ID.LEN,
        ' := R.CHAIN',I:-1,'^[N+',K:-1,'];');
      IF (J MOD 2) = 0 THEN
        K:=K+1;
    END;


    {Setup slaves.}

    K:=0;
    FOR J:= 2 TO CHAINS[I].LEN STEP 2 DO
    BEGIN
      WRITELN(BLM,X6,'R.',CHAINS[I].STATES[J]^.ID.CHARS^:CHAINS[I].STATES[J]^.ID.LEN,
        ' := R.CHAIN',I:-1,'^[N+',K:-1,'];');
      K:=K+1;
    END;

    WRITELN(BLM,X4,ENND,' { WITH }');
    WRITELN(BLM);
    WRITELN(BLM,X2,'END; {SET_CHAIN',I:-1,'_IN}');
    WRITELN(BLM);

  END;

END; { GEN_SET_CHAIN_IN_PROCEDURES }
{ *     *     *     *     *     *     *     *     *     *  }
{ *     *   REVISION AJ    *     *     *     *     *     *  }
{ *     *     *     *     *     *     *     *     *     *  }
PROCEDURE GEN_SET_CHAIN_OUT_PROCEDURE;
VAR I,J,K:INTEGER16;
BEGIN { GEN_SET_CHAIN_OUT_PROCEDURE }
  WRITELN(BLM,SEPARATOR);
  WRITELN(BLM,X2,'PROCEDURE SET_CHAIN_OUT;');
  WRITELN(BLM,X2,'VAR N:INTEGER16;');
  WRITELN(BLM,X2,'BEGIN {SET_CHAIN_OUT}');
  WRITELN(BLM,X4,'{%DEBUG} SIM_$MESSAGE(''SET_CHAIN_OUT'',13);');
  WRITELN(BLM);
  WRITELN(BLM,X4,'WITH ',COMP_REC_PTR_NAME:-1,'^:R DO BEGIN');

  FOR I:= 1 TO NCHAINS DO
  BEGIN
    WRITELN(BLM);
    WRITELN(BLM,X6,'{ Chain piece #',I:-1,' }');
    WRITELN(BLM);
```

```
WRITELN(BLM,X6,'N:=R.SDI',I:-1,'_OFFSET;');

{Use slaves only.}

K:=0;
FOR J:= 1 TO CHAINS[I].LEN DO
BEGIN
  IF (J MOD 2) = 0 THEN
  BEGIN
    WRITELN(BLM,X6,'R.CHAIN',I:-1,'^[N+',K:-1,'] := R.',
      CHAINS[I].STATES[J]^.ID.CHARS^:CHAINS[I].STATES[J]^.ID.LEN,';');
    K:=K+1;
  END;
  END;

  WRITELN(BLM,X4,ENND,' { WITH }');
  WRITELN(BLM);
  WRITELN(BLM,X2,'END; {SET_CHAIN_OUT}');
  WRITELN(BLM,SEPARATOR);
END; { GEN_SET_CHAIN_OUT_PROCEDURE }
{ *     *     *     *     *     *     *     *     *     * }
Procedure Gen_set_state_procedure; {level 5}
VAR I,N,INDEX:INTEGER;
Begin {Gen_set_state_procedure}
  WRITELN(BLM);
  WRITELN(BLM,X2,PROC,'SET_STATE_EQNS;');
  WRITELN(BLM,X2,BEG,'{SET_STATE_EQNS}');
  WRITELN(BLM,X4,
    '{Nets with state must be initialized to their latest value.}');
  WRITELN(BLM,X4,
    '{NOTE: state nets are outputs of flip flops or latches.    }');

  WRITELN(BLM,X4,'WITH ',COMP_REC_PTR_NAME:-1,'^:R DO BEGIN');

  FOR I:= 1 TO NSTATE_NETS DO
  BEGIN
    FIND_NET_EQN(STATE_NETS[I]^.ID,FALSE,INDEX);
    COUNT:=20;
    GET_NAME(NET_EQNS[INDEX],NAME);
    WRITELN(BLM,X4,'{',NAME:-1,'}');
    WRITE(BLM,X4,'NET[',INDEX:NNET_DIG,']:=');
    WRITE_PREORDER(NET_EQNS[INDEX]^.EQN,NET_EQNS[INDEX]^.INST);
    WRITELN(BLM,';');
  END;

  WRITELN(BLM,X4,ENND);
  WRITELN(BLM,X2,ENND,'{SET_STATE_EQNS}');
  WRITELN(BLM);
End; {Gen_set_state_procedure}

{ *     *     *     *     *     *     *     *     *     * }

Procedure Gen_evaluate_state_procedure; {level 5}
VAR C,I,N,INDEX:INTEGER;
```

```
Begin {Gen_evaluate_state_procedure}
  WRITELN(BLM);
  WRITELN(BLM,X2,PROC,'EVALUATE_STATE_EQNS;');
  WRITELN(BLM,X2,BEG,'{EVALUATE_STATE_EQNS}');
  WRITELN(BLM,X4,
    '{FF states will be evaluated separately.}');
  WRITELN(BLM,X4,'WITH ',COMP_REC_PTR_NAME:-1,'^:R DO BEGIN');


  FOR C:= 1 TO NCHAINS DO
  BEGIN
    WRITELN(BLM);
    WRITELN(BLM,X4,'{ Equations for chain piece #',C:-1,'}');
    WRITELN(BLM);

    WRITELN(BLM,X4,'IF ',COMP_REC_PTR_NAME:-1,'^.SET_CHAIN',C:-1,'^.FLAG THEN');
    WRITELN(BLM,X6,'SET_CHAIN',C:-1,'_IN');
    WRITELN(BLM,X4,'ELSE BEGIN');

   FOR I:= 1 TO CHAINS[C].LEN DO
   BEGIN
     WRITELN(BLM,X4,'OLD_STATE := R.',CHAINS[C].STATES[I]^.ID.CHARS^:CHAINS[C].STATES[I]^.ID.LEN,';');
     COUNT:=30;
     WRITE(BLM,X4,'R.',CHAINS[C].STATES[I]^.ID.CHARS^:CHAINS[C].STATES[I]^.ID.LEN,' := ');
     WRITE_PREORDER(CHAINS[C].STATES[I]^.EQN,CHAINS[C].STATES[I]^.INST);
     WRITELN(BLM,';');
     WRITELN(BLM,X4,'STATE_CHANGE := STATE_CHANGE OR (OLD_STATE <> R.',CHAINS[C].STATES[I]^.ID.CHARS^:CHAINS[C].STATES[I]^.ID.L
   END;

   WRITELN(BLM,X4,ENND);
   WRITELN(BLM);

  END;

  { State equations must be executed in reverse order.
    This will cause masters to be executed before slaves.}


  FOR I:= NEW_NSTATES DOWNTO 1 DO
  BEGIN

    WRITELN(BLM,X4,'OLD_STATE := R.',NEW_STATE_EQNS[I]^.ID.CHARS^:NEW_STATE_EQNS[I]^.ID.LEN,';');
    COUNT:=30;
    WRITE(BLM,X4,'R.',NEW_STATE_EQNS[I]^.ID.CHARS^:NEW_STATE_EQNS[I]^.ID.LEN,' := ');
    WRITE_PREORDER(NEW_STATE_EQNS[I]^.EQN,NEW_STATE_EQNS[I]^.INST);
    WRITELN(BLM,';');
    WRITELN(BLM,X4,'STATE_CHANGE := STATE_CHANGE OR (OLD_STATE <> R.',NEW_STATE_EQNS[I]^.ID.CHARS^:NEW_STATE_EQNS[I]^.ID.LEN,');
  END;


  WRITELN(BLM,X4,ENND);
  WRITELN(BLM,X2,ENND,'{EVALUATE_STATE_EQNS}');
  WRITELN(BLM);
End; {Gen_evaluate_state_procedure}
```

```
{ *     *     *     *     *     *     *     *     *     *  }

Procedure Gen_evaluate_latch_procedure; {level 5}
VAR I,N,INDEX:INTEGER;
Begin {Gen_evaluate_latch_procedure}
  WRITELN(BLM);
  WRITELN(BLM,X2,PROC,'EVALUATE_LATCH_EQNS;');
  WRITELN(BLM,X2,BEG,'{EVALUATE_LATCH_EQNS}');
  WRITELN(BLM,X4,
    '{ LATCH states will be evaluated separately.}');
  WRITELN(BLM,X4,'WITH ',COMP_REC_PTR_NAME:-1,'^:R DO BEGIN');


  FOR I:= NLATCHES DOWNTO 1 DO
  BEGIN

    WRITELN(BLM,X4,'OLD_STATE := R.',LATCH_EQNS[I]^.ID.CHARS^:LATCH_EQNS[I]^.ID.LEN,';');
    COUNT:=30;
    WRITE(BLM,X4,'R.',LATCH_EQNS[I]^.ID.CHARS^:LATCH_EQNS[I]^.ID.LEN,' := ');
    WRITE_PREORDER(LATCH_EQNS[I]^.EQN,LATCH_EQNS[I]^.INST);
    WRITELN(BLM,';');
    WRITELN(BLM,X4,'STATE_CHANGE := STATE_CHANGE OR (OLD_STATE <> R.',LATCH_EQNS[I]^.ID.CHARS^:LATCH_EQNS[I]^.ID.LEN,');');
  END;

  WRITELN(BLM,X4,ENND);
  WRITELN(BLM,X2,ENND,'{EVALUATE_LATCH_EQNS}');
  WRITELN(BLM);
End; {Gen_evaluate_latch_procedure}

{ *     *     *     *     *     *     *     *     *     *  }

Procedure Gen_rank_procedures; {level 5}
VAR I,J,INDEX,RANK,N,INDEX2:INTEGER;
    THIS_BUS_ID:DFI_$OBJECT_IDENTIFIER;
    CONSTANT_VALUE:SIGNAL_VALUES;

  Procedure Find_constant(IN NET:PTR_NETEQN;OUT VALUE:SIGNAL_VALUES);
  VAR I:INTEGER;
    TEMP:BUFFER10;
  Begin {Find_constant}

    FOR I:=1 TO NCONSTANTS DO
    BEGIN
      IF EQUIV(CONSTANTS[I]^.ID,NET^.ID) THEN
      BEGIN
        VALUE:=CONSTANTS[I]^.VALUE;
        RETURN;
      END;
    END;

    {Pin not found!}

    INIT_NUL(TEMP,10);
    MOVE(NET^.ID.CHARS^,1,MIN(10,NET^.ID.LEN),TEMP,1);
    IF (INTERFACE = BURLIST) AND (TEMP = 'VEE') THEN
```

```
BEGIN
  VALUE := ZERO;
END
ELSE
BEGIN
  GET_NAME(NET,NAME);
  WARNING ('Net is undefined.  It will be assigned a constant value of SIM_$UNKNOWN.');
  WRITELN('>>',NAME:-1);
  VALUE:=UNKNOWN;
END;
End; {Find_constant}

Begin {Gen_rank_procedures}
  J:=1;

  {Rank 0 contains all primary inputs.  These must be initialized to
   their pin pointer values.}

  RANK:=0;
  THIS_BUS_ID:=DFI_$NULL_OBJ_ID;

  WRITELN(BLM);
  WRITELN(BLM,X2,PROC,'EVALUATE_RANK_0_EQNS;');
  WRITELN(BLM,X2,BEG,'{EVALUATE_RANK_0_EQNS}');
  WRITELN(BLM,X4,WITHSTART_I);

  WHILE NET_EQNS[J]^.RANK = RANK DO
  BEGIN
    IF NET_EQNS[J]^.BUS_ID = 0 THEN
      FIND_IN_PIN_PTR(NET_EQNS[J]^.bus_name,INDEX)
    ELSE
    BEGIN

      { There is only one IN_PIN_PTR for each bus.  }

      IF NET_EQNS[J]^.BUS_ID <> THIS_BUS_ID THEN
      BEGIN

        {  New bus }
        THIS_BUS_ID:=NET_EQNS[J]^.BUS_ID;
        FIND_IN_PIN_PTR(NET_EQNS[J]^.bus_name,INDEX);
      END;
    END;


    IF INDEX > 0 THEN
    BEGIN

    {       Primary   Input          }
    GET_NAME(NET_EQNS[J],NAME);
    WRITELN(BLM,X6,'{',NAME:-1,'}');
    WRITELN(BLM,X10,'NET[',J:NNET_DIG,'] := SIM_$CON_VALUE[I.',
      IN_PIN_PTR[INDEX].I:-1,'^^.BITS[', NET_EQNS[J]^.OFFSET:-1,']] ;');
  END
```

```
  ELSE
  BEGIN

    {       Constant              }

    FIND_CONSTANT(NET_EQNS[J],CONSTANT_VALUE);
    GET_NAME(NET_EQNS[J],NAME);
    WRITELN(BLM,X6,'{',NAME:-1,'}');
      WRITELN(BLM,X10,'NET[',J:NNET_DIG,'] := ',
      CONSTANT_VALUE:-1,';');
  END;

  J:=J+1;
  IF J>NNET THEN EXIT;
END;

{Primary_io pins will have the rank of the output eqn but
 the input must be initialized here.  }

FOR I:= 1 TO NINPINS DO
BEGIN
  IF PRIMARY_INPINS[I].TYPE_ID = PRIMARY_IO THEN
  BEGIN
    GET_NAME(PRIMARY_INPINS[I].NET,NAME);
    FIND_IN_PIN_PTR(PRIMARY_INPINS[I].NET^.BUS_NAME,INDEX);
    IF INDEX > 0 THEN
    BEGIN
      FIND_NET_EQN(PRIMARY_INPINS[I].ID,FALSE,INDEX2);
      WRITELN(BLM,X6,'{',NAME:-1,'}');
      WRITELN(BLM,X10,'NET[',INDEX2:NNET_DIG,'] := SIM_$CON_VALUE[I.',
        IN_PIN_PTR[INDEX].I:-1,'^^.BITS[',PRIMARY_INPINS[I].NET^.OFFSET:-1,']] ;');
    END
    ELSE
    BEGIN
      ERROR ('Problem with primary io pin.');
      WRITELN('>>',NAME:-1);
    END;
  END;
END;

WRITELN(BLM,X4,ENND);
WRITELN(BLM,X2,ENND,'{EVALUATE_RANK_0_EQNS}');
IF J>NNET THEN RETURN;

{Ranks 1 -> MAX_RANK are processed here.  When RANK = MAX_STATE_RANK  .
 state values must be computed before the equations for that rank.}

FOR RANK:= 1 TO MAX_RANK DO
BEGIN
  WRITELN(BLM);
  WRITELN(BLM,X2,PROC,'EVALUATE_RANK_',RANK:-1,'_EQNS;');
  WRITELN(BLM,X2,BEG,'{EVALUATE_RANK_',RANK:-1,'_EQNS}');
```

```
IF RANK = MAX_STATE_RANK THEN
BEGIN
  { STATE EQNS need a WITH statement to access the state variables in the
    user data area. }

  WRITELN(BLM,X4,'WITH ',COMP_REC_PTR_NAME:-1,'^:R DO BEGIN');

END;


{ Write equations. }

 WHILE NET_EQNS[J]^.RANK = RANK DO
 BEGIN

   IF NOT NET_EQNS[J]^.VALID THEN
   BEGIN
     WRITELN(BLM,'*********  Feedback on path from package output.');
     WRITELN(BLM,'*********  The equation for the following net is not valid.');
     WRITELN(BLM,'*********  Please verify this design in NETED.');
     WRITELN(BLM,'*********  If feedback is correct the equation must be completed by hand.');
   END;

   COUNT:=20;
   GET_NAME(NET_EQNS[J],NAME);
   WRITELN(BLM,X4,'{',NAME:-1,'}');
   WRITE(BLM,X4,'NET[',J:NNET_DIG,']:=');
   WRITE_PREORDER(NET_EQNS[J]^.EQN,NET_EQNS[J]^.INST);
   WRITELN(BLM,';');
   J:=J+1;
   IF J>NNET THEN EXIT;
 END;
     IF RANK = MAX_STATE_RANK THEN
       WRITELN(BLM,X4,ENND);

     WRITELN(BLM,X2,ENND,'{EVALUATE_RANK_',RANK:-1,'_EQNS}');
     IF J>NNET THEN RETURN;
   END;
 End; {Gen_rank_procedures}

 { *     *     *     *     *     *     *     *     *     *  }

 Procedure Gen_output_procedure; {level 5}
 VAR I,NN,INDEX,DELAY:INTEGER;
   THIS_BUS_ID:DFI_$OBJECT_IDENTIFIER;
 Begin {Gen_output_procedure}
   WRITELN(BLM);
   WRITELN(BLM,X2,PROC,'OUTPUT_VALUES;');
   WRITELN(BLM,X2,'CONST');
   IF TECHNOLOGY = 'MCAII' THEN
     WRITELN(BLM,X4,'UNIT_DELAY = ',MCAII_DELAY:-1,';  {ns}')
   ELSE IF TECHNOLOGY = 'CMOS' THEN
     WRITELN(BLM,X4,'UNIT_DELAY = ',CMOS_DELAY:-1,';  {ns}')
   ELSE IF TECHNOLOGY = 'ALS' THEN
```

```
    WRITELN(BLM,X4,'UNIT_DELAY = ',ALS_DELAY:-1,';  {ns}')
  ELSE IF TECHNOLOGY = 'ETL' THEN
    WRITELN(BLM,X4,'UNIT_DELAY = ',ETL_DELAY:-1,';  {ns}')
  ELSE
  BEGIN
    { Use MCAII delay. }
    { WRITELN('TECHNOLOGY >>',TECHNOLOGY:-1);
    ERROR ('CAE section must add delay value for this technology.');
    WRITELN(BLM,X4,'UNIT_DELAY = ',MCAII_DELAY:-1,';  {ns}')
  END;

  WRITELN(BLM,X2,'VAR');
  WRITELN(BLM,X4,'STATE_OF : ARRAY [ZERO..ONE] OF CHAR;');
  WRITELN(BLM,X4,'VALUE : SIM_$BIT_STRING_T;  {  All signals on each bus will be packed into VALUE for output.  }');
  WRITELN(BLM,X4,'                            {  Note: single pins are treated as single bit busses.            }');
  WRITELN(BLM,X2,BEG ,' {OUTPUT_VALUES}');
  WRITELN(BLM,X4,'STATE_OF[ZERO]:=SIM_$0r; STATE_OF[UNKNOWN]:=SIM_$Xr; STATE_OF[ONE]:=SIM_$1s;');
  WRITELN(BLM);
  WRITELN(BLM,X4,WITHSTART_I);

  NN:=1;
  THIS_BUS_ID:=PRIMARY_OUTPINS[1].NET^.BUS_ID;
  FIND_NET_EQN(PRIMARY_OUTPINS[1].ID,FALSE,INDEX);
  DELAY:=PRIMARY_OUTPINS[1].DELAY;
  GET_NAME(PRIMARY_OUTPINS[1].NET,NAME);
  WRITELN(BLM,X6,'{ ',NAME:-1,' }  VALUE[',PRIMARY_OUTPINS[1].NET^.OFFSET:-1,
    '] := STATE_OF[NET[',INDEX:NNET_DIG,']];');

  FOR I:=2 TO NOUTPINS DO
  BEGIN
    FIND_NET_EQN(PRIMARY_OUTPINS[I].ID,FALSE,INDEX);

    IF (PRIMARY_OUTPINS[I-1].NET^.BUS_ID = 0)
     OR (PRIMARY_OUTPINS[I].NET^.BUS_ID <> THIS_BUS_ID) THEN
    BEGIN
      {  The last pin was not part of a bus OR  }
      {  This pin starts a new bus/pin          }
      WRITELN(BLM,X6,'SIM_$OUTPUT(I.',OUT_PIN_PTR[NN].O:-1,
        ',VALUE,SIM_$USER_TO_TIMESTEP(',DELAY:-1,'*UNIT_DELAY));');
      NN:=NN+1;
      THIS_BUS_ID:=NET_EQNS[INDEX]^.BUS_ID;
      DELAY:=PRIMARY_OUTPINS[I].DELAY;
    END;

    GET_NAME(PRIMARY_OUTPINS[I].NET,NAME);
    WRITELN(BLM,X6,'{ ',NAME:-1,' }  VALUE[',PRIMARY_OUTPINS[I].NET^.OFFSET:-1,
      '] := STATE_OF[NET[',INDEX:NNET_DIG,']];');

    IF DELAY < PRIMARY_OUTPINS[I].DELAY THEN
      DELAY:=PRIMARY_OUTPINS[I].DELAY;

  END;

  { Write SIM_$OUTPUT statement for last pin/bus.}
```

```
    WRITELN(BLM,X6,'SIM_$OUTPUT(I.',OUT_PIN_PTR[NN].O:-1,
    ',VALUE,SIM_$USER_TO_TIMESTEP(',DELAY:-1,'*UNIT_DELAY));');

  WRITELN(BLM,X4,ENND);
  WRITELN(BLM,X2,ENND, '{OUTPUT_VALUES}');
End; {Gen_output_procedure}
{ *     *     *     *     *     *     *     *     *     *  }


Procedure Gen_state_eqn_proc_call;  {level 5}
Begin {Gen_state_eqn_proc_call}
  WRITELN(BLM,X2,'SET_STATE_EQNS;');
End; {Gen_state_eqn_proc_call}

Procedure Gen_rank_proc_calls; {level 5}
VAR RANK,N:INTEGER;
Begin {Gen_rank_proc_calls}

  { If there are states then a settling loop must be generated.}

  IF (NSTATES >0) OR (NLATCHES > 0) THEN
  BEGIN
    WRITELN(BLM);
    WRITELN(BLM,X2,'REPEAT');
    WRITELN(BLM,X4,'STATE_CHANGE := FALSE;');
    WRITELN(BLM,X4,'LOOP_COUNT := LOOP_COUNT + 1;');
  END;

  FOR RANK:= 0 TO MAX_RANK DO
  BEGIN
    IF (NSTATES > 0)  AND (RANK = MAX_STATE_RANK) THEN
      WRITELN(BLM,X4,'EVALUATE_STATE_EQNS;');

    IF  (NLATCHES > 0) AND (RANK = MAX_STATE_RANK) THEN
      WRITELN(BLM,X4,'EVALUATE_LATCH_EQNS;');

    WRITELN(BLM,X4,'EVALUATE_RANK_',RANK:-1,'_EQNS;');


    { Generate the end of the settling loop.}

    IF ((NSTATES > 0) OR (NLATCHES > 0))  AND (RANK = MAX_STATE_RANK) THEN
    BEGIN
      WRITELN(BLM,X2,'UNTIL (NOT STATE_CHANGE) OR (LOOP_COUNT > ',NSTATES + NLATCHES:-1,');');
      WRITELN(BLM);
      WRITELN(BLM,X2,'{%DEBUG} WRITELN(''>>>>>>>>>LOOP_COUNT ='',LOOP_COUNT:-1,''<<<<<<<<<'');');

      WRITELN(BLM,X2,'IF STATE_CHANGE THEN');
      WRITELN(BLM,X4,'SIM_$MESSAGE(''>>>>>>>>>OSCILLATING<<<<<<<<<'',27);');
      WRITELN(BLM);
    END;
  END;
End; {Gen_rank_proc_calls}
```

```
  { *     *     *     *     *     *     *     *     *     *   }
Begin {Generate_evaluate_procedure}

  {"PROCEDURE component_EVALUATE" will be generated here.  This procedure was previously
   installed during ALLOCATE as the pin handler for all inputs.
   * * *    (1-2-85) * * *
   Due to problems with SIM_$INSTALL_PIN_HANDLER this procedure will be called
   by each pin handler to evaluate all logical functions. }


   { * * * (7-28-85) * * *
   SIM_$INSTALL_PIN_HANDLER is supposedly fixed.  I'll try it again! }
   {EVALUATE procedure is now external (by default).  Then component name
   was added to make it unique.}


  WRITELN(BLM,'PROCEDURE ',COMPONENT:LEN,'_EVALUATE;');
  WRITELN(BLM);
  WRITELN(BLM,'{Evaluates all possible logical functions for the blm.}');
  WRITELN(BLM);

  GEN_EVAL_DECLARATIONS;
  IF  ((NSTATES > 0) OR (NLATCHES > 0))  THEN
  BEGIN

    IF NCHAINS > 0 THEN
    BEGIN
      GEN_SET_CHAIN_IN_PROCEDURES;
      GEN_SET_CHAIN_OUT_PROCEDURE;
    END;

  GEN_SET_STATE_PROCEDURE;

  IF NSTATES > 0 THEN
  BEGIN
    GEN_EVALUATE_STATE_PROCEDURE;
  END;

  IF NLATCHES > 0 THEN
  BEGIN
    GEN_EVALUATE_LATCH_PROCEDURE;
  END;
END;

GEN_RANK_PROCEDURES;
GEN_OUTPUT_PROCEDURE;

WRITELN(BLM);
WRITELN(BLM,'Begin {',COMPONENT:LEN,'_Evaluate}');
WRITELN(BLM,X2,COMP_REC_PTR_NAME:-1,':=SIMBASE_$INSTANCE_PTR^.USER_DATA_AREA;');

WRITELN(BLM,X2,'IF (',COMP_REC_PTR_NAME:-1,'^.LAST_TIME = SIM_$TIME) AND ');
WRITELN(BLM,X4,'(',COMP_REC_PTR_NAME:-1,'^.LAST_ITERATION = SIM_$ITERATION_COUNT) THEN');
WRITELN(BLM,X2,BEG);
```

```
  WRITELN(BLM);
  WRITELN(BLM,X4,'{Allow EVALUATE to execute at most twice at the same SIM_$TIME and }');
  WRITELN(BLM,X4,'{SIM_$ITERATION_COUNT.  Executing twice will handle all FORCE      }');
  WRITELN(BLM,X4,'{statements but will avoid unnecessary calculations.               }');
  WRITELN(BLM);
  WRITELN(BLM,X4,'IF ',COMP_REC_PTR_NAME:-1,'^.EXECUTION_COUNT > 0 THEN RETURN');
  WRITELN(BLM,X4,'ELSE ',COMP_REC_PTR_NAME:-1,'^.EXECUTION_COUNT := ',
    COMP_REC_PTR_NAME:-1,'^.EXECUTION_COUNT+1;');
  WRITELN(BLM,X2,'END');
  WRITELN(BLM,X2,'ELSE');
  WRITELN(BLM,X2,BEG);
  WRITELN(BLM,X4,COMP_REC_PTR_NAME:-1,'^.EXECUTION_COUNT := 0; ');
  WRITELN(BLM,X2,ENND);

  WRITELN(BLM,X2,COMP_REC_PTR_NAME:-1,'^.LAST_TIME := SIM_$TIME;');
  WRITELN(BLM,X2,COMP_REC_PTR_NAME:-1,'^.LAST_ITERATION := SIM_$ITERATION_COUNT;');
  WRITELN(BLM,X2,'SIM_CON_NOT[ZERO]:=ONE; SIM_CON_NOT[UNKNOWN]:=UNKNOWN; SIM_CON_NOT[ONE]:=ZERO;');

  IF  ((NSTATES > 0) OR (NLATCHES > 0))  THEN
  BEGIN
    GEN_STATE_EQN_PROC_CALL;
    WRITELN(BLM,X2,'LOOP_COUNT := 0;');

  END;

  GEN_RANK_PROC_CALLS;

  IF NCHAINS > 0 THEN
    WRITELN(BLM,X2,'SET_CHAIN_OUT;');

  WRITELN(BLM);
  WRITELN(BLM,X2,'OUTPUT_VALUES;');
  WRITELN(BLM,'End; {',COMPONENT:LEN,'_Evaluate}');
  WRITELN(BLM);
  WRITELN(BLM,SEPARATOR);
End; {Generate_evaluate_procedure}
{ *     *     *     *     *     *     *     *     *     *  }

Procedure Generate_individual_pin_handlers; {level 4}
VAR I:INTEGER;
Begin {Generate_individual_pin_handlers}
    BEGIN
     WRITELN(BLM,PROC,COMPONENT:LEN,'$$',
       IN_PIN_PTR[I].PIN^.NET^.BUS_NAME.CHARS^:IN_PIN_PTR[I].PIN^.NET^.BUS_NAME.LEN,';');
     WRITELN(BLM,BEG);
     WRITELN(BLM,X2,COMPONENT:LEN,'_EVALUATE;');
     WRITELN(BLM,ENND);
    END;

    WRITELN(BLM,SEPARATOR);
  End; {Generate_individual_pin_handlers}

Begin {Generate_pin_handlers}
  {%debug MSG('GENERATE PIN_HANDLERS REACHED!');}
```

```
GENERATE_EVALUATE_PROCEDURE;

{GENERATE_INDIVIDUAL_PIN_HANDLERS;} {This procedure should be remove when SIM_$INSTALL_PIN_HANDLER is fixed.}

End; {Generate_pin_handlers}
{* * * * * * * * * * * * * * * * * * * * * * * * * * * * * * * * * * * * *}

Procedure Generate_init; {level 3}
  {*   *   *   *   *   *   *   *   *   *   *   *   *   *   *   *   *   *   *   *}
  PROCEDURE GEN_FIND_CHAIN_INFO_PROCEDURE;
  VAR C:INTEGER16;
  BEGIN {GEN_FIND_CHAIN_INFO_PROCEDURE}
    WRITELN(BLM,X2,'PROCEDURE FIND_CHAIN_INFO;');
    WRITELN(BLM,X2,'VAR NCHARS,I:INTEGER16;');
    WRITELN(BLM,X4,'SDI_NET:BUFFER300;');

    WRITELN(BLM,X2,'BEGIN {FIND_CHAIN_INFO}');

    FOR C:=1 TO NCHAINS DO
    BEGIN
      WRITELN(BLM);
      WRITELN(BLM,X4,'IF ',COMP_REC_PTR_NAME:-1,'^.CHAIN',C:-1,' = NIL THEN');
      WRITELN(BLM,X4,BEG);
      WRITELN(BLM);
      WRITELN(BLM,X6,'{ Set up data for chain piece #',C:-1,'}');
      WRITELN(BLM);
      WRITELN(BLM,X6,'NCHARS:=300;');
      WRITELN(BLM,X6,'FOR I:=1 TO NCHARS DO SDI_NET[I]:= '' '';');
      WRITELN(BLM);
      WRITELN(BLM,X6,'SIM_$NET_NAME(SIMBASE_$INSTANCE_PTR^.',COMPONENT:LEN,'_$I$',
        CHAINS[C].SDI.NET^.BUS_NAME.CHARS^:CHAINS[C].SDI.NET^.BUS_NAME.LEN,
        ', SDI_NET, NCHARS);');

      WRITELN(BLM,X6,'{%DEBUG} WRITELN(''',COMPONENT:LEN,'$$INIT  SDI_NET>>'', SDI_NET:NCHARS);');
      WRITELN(BLM);
      WRITELN(BLM,X6,'CHAIN_CONTROLLER_HERE_I_AM(SDI_NET, NCHARS, ',
        '''',COMPONENT:12,''', ',
        COMP_REC_PTR_NAME:-1,'^.CHAIN',C:-1,', I, ',COMP_REC_PTR_NAME:-1,'^.SET_CHAIN',C:-1,');');
      WRITELN(BLM,X6,COMP_REC_PTR_NAME:-1,'^.SDI',C:-1,'_OFFSET := I;');
      WRITELN(BLM);
      WRITELN(BLM,X4,ENND);
      WRITELN(BLM);
    END;

    WRITELN(BLM,X2,'END; {FIND_CHAIN_INFO}');


  END; {GEN_FIND_CHAIN_INFO_PROCEDURE}
  {*   *   *   *   *   *   *   *   *   *   *   *   *   *   *   *   *   *   *   *}

Begin {Generate_init}
  {%debug MSG('GENERATE INIT REACHED');}
```

```
    WRITELN(BLM,'PROCEDURE ',COMPONENT:LEN,'$$INIT;');
    WRITELN(BLM,'VAR ');
    WRITELN(BLM,X2,COMP_REC_PTR_NAME:-1,' : ',COMP_REC_PTR_TYPE:-1,';');

    IF NCHAINS > 0 THEN
      GEN_FIND_CHAIN_INFO_PROCEDURE;

    WRITELN(BLM,'BEGIN {INIT}');
    WRITELN(BLM,X2,COMP_REC_PTR_NAME:-1,':=SIMBASE_$INSTANCE_PTR^.USER_DATA_AREA;');
    WRITELN(BLM);

    IF NCHAINS > 0 THEN
      WRITELN(BLM,X2,'FIND_CHAIN_INFO;');

    WRITELN(BLM,X2,COMP_REC_PTR_NAME:-1,'^.LAST_TIME := SIM_$TIME - 1;');
    WRITELN(BLM,X2,COMP_REC_PTR_NAME:-1,'^.EXECUTION_COUNT := 0; ');
    WRITELN(BLM,X2,COMPONENT:LEN,'_EVALUATE; ');
    WRITELN(BLM,X2,COMP_REC_PTR_NAME:-1,'^.LAST_TIME := SIM_$TIME - 1;');
    WRITELN(BLM,'END; {INIT}' );
    WRITELN(BLM);
  End; {Generate_init}
 (* * * * * * * * * * * * * * * * * * * * * * * * * * * * * * * * * * * * * * *)

  Procedure Generate_closing; {level 3}
  Begin {Generate_closing}
    {%debug MSG('GENERATE CLOSING REACHED!');}
      IF WARNING_COUNT >0 THEN
      BEGIN
        WRITELN(BLM,'{ The design produced warnings.   Check your GENBLM     }');
        WRITELN(BLM,'{ output and verify the warnings before using this BLM.}');
      END;

      WRITELN(BLM,SEPARATOR);
  End; {Generate_closing}

 (* * * * * * * * * * * * * * * * * * * * * * * * * * * * * * * * * * * * * * *)


Begin {generate_blm}
   MSG('Generating BLM.');
   LEN:=COMP_NAME_LENGTH;

   MAKE_PIN_POINTERS;
   MAKE_BLM_VARIABLES;

   GENERATE_HEADER;
   GENERATE_INCLUDES;
   GENERATE_DECLARATIONS;
   GENERATE_SAVE;
   GENERATE_RESTORE;
   GENERATE_PIN_HANDLERS;
   GENERATE_ALLOCATE;
   GENERATE_INIT;
   GENERATE_CLOSING;
```

```
End; {generate_blm}

{*************************************************************************************}
{*************************************************************************************}

Procedure Generate_build_prim; {level 2}
CONST
  BITS_PER_BUILD_WORD = 48;
  CHARS_PER_LINE = 70;
  NSKIP = 3; { Number of extra variables per chain piece saved in array STATE.}
VAR I,NSTATE_WORDS:INTEGER; COMP:ARGUMENT;

{* * * * * * * * * * * * * * * * * * * * * * * * * * * * * * * * * * * * * * * *}

Procedure Find_primary_input(IN pin_name:dynamic_string_t; OUT INDEX:INTEGER); {level 3}
VAR I:INTEGER;
Begin {Find_primary_input}
  INDEX:=-1;

  FOR I:= 1 TO NINPINS DO
  BEGIN
    IF PRIMARY_INPINS[I].ID.LEN <= 0 THEN
      RETURN
    ELSE IF EQUIV(PRIMARY_INPINS[I].ID,PIN_NAME) THEN
    BEGIN
      INDEX:=I;
      RETURN;
    END;
  END;
End; {Find_primary_input}

{* * * * * * * * * * * * * * * * * * * * * * * * * * * * * * * * * * * * * * * *}
PROCEDURE MAP_PIN_NAMES_AND_NUMBERS; {LEVEL 3}

  { This procedure was added in version 1.4 to coordinate the
    Mentor names with the names received back from Motorola in
    the pinlock information.  The design control path will include

      -When the gate array has been fully simulated and is ready for release
       to Motorola

         Run GADCBI to produce a BIFLIST/BURLIST netlist.
         GADCBI will also produce the file
           component/BURLIST.EXT
         This file contains translation information regarding
         external signals.  Both the Mentor names and the BIF
         names are given.  The BIF names are the names which
         Motorola will refer to.

      -Motorola will give fixtract information which contains the
       physical pinnumber mappings.  The user must paste this
       information into the file  component/PINLOCK.

         Next, run "GENBLM component -BUILD".
         This will produce the files
```

```
        component/BLM.PAS          For further Mentor simulation,
                                   if not needed, use the -NOBLM option
        component/BUILD_PRIM       For mainframe BUILD simulation
        component/TRANS_INFO       For the mainframe DESIGN program

    -If a BUILD_PRIM is desired before the gate array is through
     Motorola, then a dummy PINLOCK file must be provided.  The
     steps will need to be repeated after the actual pinlock is
     available.
    }

(*  *  *  *  *  *  *  *  *  *  *  *  *  *  *  *  *  *  *  *  *  *  *  *  *  *)

PROCEDURE FIND_PRIMARY_PIN_ID(IN ID:DYNAMIC_STRING_T;
  OUT P_TYPE:PIN_TYPE; OUT INDEX_I,INDEX_O:INTEGER16);
VAR I:INTEGER;
 { Finds the given ID in either PRIMARY_INPINS or PRIMARY_OUTPINS or
   both if IO pin.  If no match is found P_TYPE=PRIMARY_OTHER.        }

BEGIN {FIND_PRIMARY_PIN_ID}
  INDEX_I:=-1;
  INDEX_O:=-1;
  P_TYPE:=PRIMARY_OTHER;

  FOR I:= 1 TO NINPINS DO
  BEGIN
    IF EQUIV(PRIMARY_INPINS[I].ID, ID) THEN
    BEGIN
      INDEX_I:=I;
      P_TYPE:=PRIMARY_INPINS[I].TYPE_ID;

       { If the pin is a PRIMARY_INPUT then we're through,
         if it is of type PRIMARY_IO then set INDEX_O also. }

      IF P_TYPE = PRIMARY_INPUT THEN
        RETURN
      ELSE
        EXIT;
    END;
  END;

  FOR I:= 1 TO NOUTPINS DO
  BEGIN
    IF EQUIV(PRIMARY_OUTPINS[I].ID, ID) THEN
    BEGIN
      INDEX_O:=I;
      P_TYPE:=PRIMARY_OUTPINS[I].TYPE_ID;
      RETURN;
    END;
  END;

  { If we reach here there was no match. }

  { Error will be noted by the calling procedure. }
```

```
END; {FIND_PRIMARY_PIN_ID}

{* * * * * * * * * * * * * * * * * * * * * * * * * * }

PROCEDURE MAP_PINNUMBERS; {LEVEL 4}
VAR NAME,NUMBER:DYNAMIC_STRING_T;
  INDEX_I,INDEX_O:INTEGER16;
  P_TYPE:PIN_TYPE;
  TEMP:BUFFER300;

 {*    *    *    *    *    *    *    *    *    *    *    *    *    }
  FUNCTION READ_PIN_INFO(IN OUT NAME,NUMBER:DYNAMIC_STRING_T):BOOLEAN;
  VAR REC:BUFFER256;
    ST_POS,END_POS,LEN:INTEGER16;
  BEGIN {READ_PIN_INFO}
    READ_PIN_INFO:=FALSE;


    REPEAT
      IF EOF(PINLOCK) THEN
        RETURN;
      READLN(PINLOCK,REC);
      ST_POS:=1;
    UNTIL ISTR_$SKIP_WHITE_SPACE(REC,256,ST_POS);

    { Find the end of the NAME.
      END_POS will indicate the first blank pos after the name. }
 IF ISTR_$STATIC_SEARCH_NEXT_STATIC_PATTERN(REC,256,NUL,1,ST_POS,END_POS) THEN
 BEGIN
   LEN:=END_POS-ST_POS;
   MOVE_STRING_T_FROM_STATIC(REC,ST_POS,LEN,NAME);

   { Find the pinnumber. }

   ST_POS:=END_POS;

   IF ISTR_$SKIP_WHITE_SPACE(REC,256,ST_POS) THEN
   BEGIN

     IF ISTR_$STATIC_SEARCH_NEXT_STATIC_PATTERN(REC,256,NUL,1,ST_POS,END_POS) THEN
     BEGIN
       LEN:=END_POS-ST_POS;
       MOVE_STRING_T_FROM_STATIC(REC,ST_POS,LEN,NUMBER);

       { Correct syntax. Return. }

       READ_PIN_INFO:=TRUE;
       RETURN;
     END;
   END;
 END;

 { Problems!!!}
```

```
    WRITELN('>>',REC:-1);
    ERROR ('Problem in PINLOCK file.');

  END;  {READ_PIN_INFO}
{*      *       *       *       *       *       *       *       *       *       *       *       }

BEGIN {MAP_PINNUMBERS}

  { IO pins are a special case.  At the
    primitive level, the correct pinnumbers
    for IO pins will appear in the input
    list.  An 'O' will be appended to the
    front of these numbers in the output list.
    The module declaration will be used
    to tie the two together.
  }

  NEW_STRING_T(NAME);
  NEW_STRING_T(NUMBER);

  WHILE  READ_PIN_INFO(NAME,NUMBER) DO
  BEGIN
    {%debug WRITELN('NAME=',NAME.CHARS^:NAME.LEN,', NUMBER=',NUMBER.CHARS^:NUMBER.LEN);}

    FIND_PRIMARY_PIN_ID(NAME,P_TYPE,INDEX_I,INDEX_O);

    CASE P_TYPE OF
      PRIMARY_INPUT :
      BEGIN
        SUBST_STRING_T(NUMBER,PRIMARY_INPINS[INDEX_I].PIN_NUMBER);
      END;

      PRIMARY_OUTPUT:
      BEGIN
        SUBST_STRING_T(NUMBER,PRIMARY_OUTPINS[INDEX_O].PIN_NUMBER);
      END;

      PRIMARY_IO:
      BEGIN
        SUBST_STRING_T(NUMBER,PRIMARY_INPINS[INDEX_I].PIN_NUMBER);
      { Append an 'O' to the front of NUMBER before adding to
        PRIMARY_OUTPINS.                                          }

      INIT_NUL(TEMP,300);
      TEMP[1]:='O';
      MOVE(NUMBER.CHARS^,1,NUMBER.LEN,TEMP,2);
      SUBST_STRING_T_FROM_STATIC(TEMP,NUMBER.LEN+1,PRIMARY_OUTPINS[INDEX_O].PIN_NUMBER);
    END;

    OTHERWISE
    BEGIN
      ERROR ('PINLOCK file does not match external pins.');
      WRITELN('PINLOCK LINE>>',NAME.CHARS^:NAME.LEN,X6,NUMBER.CHARS^:NUMBER.LEN);
   {   TERMINATE(ABNORMAL); }
```

```
      END;
    END;
  END;


  DISPOSE_STRING_T(NAME);
  DISPOSE_STRING_T(NUMBER);


END; {MAP_PINNUMBERS}
{*  *  *  *  *  *  *  *  *  *  *  *  *  *  *  *  *  *  *  *  *  *  *  *  *  *  }

PROCEDURE WRITE_TRANS_INFO_FILE; {LEVEL 4}
VAR I,NDIG,NCHAR,POSITION:INTEGER16;
  NUMBER:BUFFER10;
  REC:BUFFER256;

 {*    *    *    *    *    *    *    *    *    *    *    *    *    }
 PROCEDURE WRITE_TRANS_INFO_HEADER;
 BEGIN {WRITE_TRANS_INFO_HEADER}
   WRITELN(TRANS_INFO,'MODEL (CARD = 1, LENGTH = ',TI_L_MODEL:-1,'),');
   WRITELN(TRANS_INFO,'BIF_NETNAME (COL=',TI_NAME_COL:-1,', LENGTH=',TI_L_NAME:-1,'),');
   WRITELN(TRANS_INFO,'PINTYPE (COL=',TI_PINTYPE_COL:-1,', LENGTH=',TI_L_PINTYPE:-1,'),');
   WRITELN(TRANS_INFO,'PIN_NUMBER (COL=',TI_PINNUMBER_COL:-1,', LENGTH=',TI_L_PINNUMBER:-1,'),');
   WRITELN(TRANS_INFO,'ELTYPE (COL=',TI_ELTYPE_COL:-1,', LENGTH=',TI_L_ELTYPE:-1,')');
   WRITELN(TRANS_INFO,'MENTOR_NAME (COL=',TI_MENTOR_NAME_COL:-1,', LENGTH=',TI_L_MENTOR_NAME:-1,')');

   WRITELN(TRANS_INFO,'$DATA');
   WRITELN(TRANS_INFO,COMPONENT:COMP_NAME_LENGTH);
 END; {WRITE_TRANS_INFO_HEADER}
 {*    *    *    *    *    *    *    *    *    *    *    *    *    }

BEGIN {WRITE_TRANS_INFO_FILE}

 WRITE_TRANS_INFO_HEADER;

 { Write records for inputs and bi-directionals. }

 FOR I:=1 TO NINPINS DO
 BEGIN
   INIT_NUL(REC,256);
   MOVE(PRIMARY_INPINS[I].ID.CHARS^,1,MIN(TI_L_NAME,PRIMARY_INPINS[I].ID.LEN),REC,TI_NAME_COL);
   MOVE(PRIMARY_INPINS[I].PIN_NUMBER.CHARS^,1,MIN(TI_L_PINNUMBER,PRIMARY_INPINS[I].PIN_NUMBER.LEN),
     REC,TI_PINNUMBER_COL);
   MOVE(PRIMARY_INPINS[I].ELTYPE.CHARS^,1,MIN(TI_L_ELTYPE,PRIMARY_INPINS[I].ELTYPE.LEN),
     REC,TI_ELTYPE_COL);
   IF PRIMARY_INPINS[I].TYPE_ID = PRIMARY_INPUT THEN
     MOVE('I',1,1,REC,TI_PINTYPE_COL)
   ELSE IF PRIMARY_INPINS[I].TYPE_ID = PRIMARY_IO THEN
     MOVE('B',1,1,REC,TI_PINTYPE_COL)
   ELSE
```

```
BEGIN
  ERROR ('Illegal pin type on package pin.');
  WRITELN('pin >>',PRIMARY_INPINS[I].ID.CHARS^:PRIMARY_INPINS[I].ID.LEN,
    ', type >>',PRIMARY_INPINS[I].TYPE_ID);
END;

{ Write  Mentor_name in BUS(BIT) format.}

IF PRIMARY_INPINS[I].NET^.BUS_ID > 0 THEN
BEGIN

    { MENTOR_NAME will be truncated to allow room for the bits.}

  INIT_NUL(NUMBER,10);
  TRANS_NUM_TO_CHAR(PRIMARY_INPINS[I].NET^.BIT,NUMBER,NDIG);
  NCHAR:=MIN( PRIMARY_INPINS[I].NET^.BUS_NAME.LEN, (TI_L_MENTOR_NAME - NDIG -2));
  POSITION:=TI_MENTOR_NAME_COL;
  MOVE(PRIMARY_INPINS[I].NET^.BUS_NAME.CHARS^,1,NCHAR,REC,POSITION);
  POSITION:=POSITION+NCHAR;
  REC[POSITION]:='(';
  POSITION:=POSITION+1;
  MOVE(NUMBER,1,NDIG,REC,POSITION);
  POSITION:=POSITION+NDIG;
  REC[POSITION]:=')';

END
ELSE
BEGIN
  MOVE(PRIMARY_INPINS[I].NET^.BUS_NAME.CHARS^,1,
    MIN( PRIMARY_INPINS[I].NET^.BUS_NAME.LEN, TI_L_MENTOR_NAME),REC,TI_MENTOR_NAME_COL);
END;
  {%debug WRITELN(REC:-1);}
  WRITELN(TRANS_INFO,REC:-1);
END;

{ Write records for outputs. }

FOR I:=1 TO NOUTPINS DO
BEGIN
  IF PRIMARY_OUTPINS[I].TYPE_ID = PRIMARY_OUTPUT THEN
  BEGIN
    INIT_NUL(REC,256);
    MOVE(PRIMARY_OUTPINS[I].ID.CHARS^,1,MIN(TI_L_NAME,PRIMARY_OUTPINS[I].ID.LEN),
      REC,TI_NAME_COL);
    MOVE(PRIMARY_OUTPINS[I].PIN_NUMBER.CHARS^,1,MIN(TI_L_PINNUMBER,PRIMARY_OUTPINS[I].PIN_NUMBER.LEN),
      REC,TI_PINNUMBER_COL);
    MOVE(PRIMARY_OUTPINS[I].ELTYPE.CHARS^,1,MIN(TI_L_ELTYPE,PRIMARY_OUTPINS[I].ELTYPE.LEN),
      REC,TI_ELTYPE_COL);
    MOVE('O',1,1,REC,TI_PINTYPE_COL);

    { Write  Mentor_name in BUS(BIT) format.}

    IF PRIMARY_OUTPINS[I].NET^.BUS_ID > 0 THEN
    BEGIN
```

```
  { MENTOR_NAME will be truncated to allow room for the bits.}

INIT_NUL(NUMBER,10);
TRANS_NUM_TO_CHAR(PRIMARY_OUTPINS[I].NET^.BIT,NUMBER,NDIG);
NCHAR:=MIN( PRIMARY_OUTPINS[I].NET^.BUS_NAME.LEN, (TI_L_MENTOR_NAME - NDIG -2));
POSITION:=TI_MENTOR_NAME_COL;
MOVE(PRIMARY_OUTPINS[I].NET^.BUS_NAME.CHARS^,1,NCHAR,REC,POSITION);
POSITION:=POSITION+NCHAR;
REC[POSITION]:='(';
POSITION:=POSITION+1;
MOVE(NUMBER,1,NDIG,REC,POSITION);
POSITION:=POSITION+NDIG;
REC[POSITION]:=')';
         END
         ELSE
         BEGIN
           MOVE(PRIMARY_OUTPINS[I].NET^.BUS_NAME.CHARS^,1,
             MIN( PRIMARY_OUTPINS[I].NET^.BUS_NAME.LEN, TI_L_MENTOR_NAME),REC,TI_MENTOR_NAME_COL);
         END;

         {%debug WRITELN(REC:-1);}
         WRITELN(TRANS_INFO,REC:-1);
       END;
     END;

  END; {WRITE_TRANS_INFO_FILE}
{*  *  *  *  *  *  *  *  *  *  *  *  *  *  *  *  *  *  *  *  *  *  *  *  *  *}

 BEGIN {MAP_PIN_NAMES_AND_NUMBERS}

   GET_BIF_NETNAMES;
   MAP_PINNUMBERS;
   WRITE_TRANS_INFO_FILE;

 END; {MAP_PIN_NAMES_AND_NUMBERS}
{* * * * * * * * * * * * * * * * * * * * * * * * * * * * * * * * * * * * * * *}
 Procedure Get_state_name(IN STATE_ID:dynamic_string_t; OUT STATE_NAME:BUFFER300); {level 3}
 VAR I:INTEGER;

 {  GET_STATE_NAME is used to replace '$' in the STATE_ID with '_'.
    This is necessary only in generating the BUILD primitive in Algol
    which does not accept '$' as a legal identifier character.
 }

 Begin {Get_state_name}
   INIT_NUL(STATE_NAME,300);
   FOR I:= 1 TO STATE_ID.LEN DO
     IF STATE_ID.CHARS^[I] = '$' THEN
       STATE_NAME[I]:='_'
     ELSE
       STATE_NAME[I]:=STATE_ID.CHARS^[I];
 End; {Get_state_name}
{* * * * * * * * * * * * * * * * * * * * * * * * * * * * * * * * * * * * * * *}

 Procedure Generate_module; {level 3}
```

```
VAR MODULE_KEY:CHAR;

  Procedure Make_module_dec(IN MAKE_OUTPUT:BOOLEAN;
    IN PIN:PACKAGE_PIN; OUT DEC:BLM_VAR; OUT NCHARS:INTEGER); {level 4}
  VAR POSITION,N:INTEGER; BIT:BLM_VAR;
  Begin {Make_module_dec}
    INIT_NUL(DEC,L_ID);
    POSITION:=1;

    MOVE(PIN.PIN_NUMBER.CHARS^,1,PIN.PIN_NUMBER.LEN,DEC,POSITION);
    POSITION:=POSITION + PIN.PIN_NUMBER.LEN;

    MOVE('::',1,2,DEC,POSITION);
    POSITION:=POSITION+2;

    IF (PIN.TYPE_ID = PRIMARY_IO) AND MAKE_OUTPUT THEN
    BEGIN
      { Append an 'O' to the front of PIN.ID to make unique net names.    }

        DEC[POSITION]:='O';
        POSITION:=POSITION+1;
  END;

  MOVE(PIN.ID.CHARS^,1,PIN.ID.LEN,DEC,POSITION);
  POSITION:=POSITION+PIN.ID.LEN;

  NCHARS:=POSITION-1;

  {%DEBUG WRITELN('DEC=',DEC:-1,', LENGTH=',NCHARS:-1);}
End; {Make_module_dec}

Procedure Set_module_ordering;{level 4}
VAR I,CHARS_OUT,NCHARS:INTEGER;
  THIS_PIN:dynamic_string_t;
  DEC:BLM_VAR;
  FIRST:BOOLEAN;
Begin {Set_module_ordering}

  { Set ordering for outputs }

  NEW_STRING_T(THIS_PIN);
  FIRST:=TRUE;

  FOR I:= 1 TO NOUTPINS DO
  BEGIN
    IF (PRIMARY_OUTPINS[I].TYPE_ID = PRIMARY_OUTPUT) THEN
       OR (MODULE_KEY = NUL) THEN} {This line should only be used if IO pins are NOT desired in the module output list.}
    BEGIN

      MAKE_MODULE_DEC(TRUE,PRIMARY_OUTPINS[I],DEC,NCHARS);
      CHARS_OUT:=CHARS_OUT+NCHARS+2;
      IF CHARS_OUT >= CHARS_PER_LINE THEN
      BEGIN
        WRITELN(BUILD);
```

```
  CHARS_OUT:=NCHARS+2;
END;

      IF FIRST THEN
      BEGIN
        FIRST:=FALSE;
        WRITE(BUILD,X2,DEC:-1);
      END
      ELSE
        WRITE(BUILD,',  ',DEC:-1);
   END;
 END;

 WRITELN(BUILD);
 WRITELN(BUILD,X4,':=  ',MODULE_KEY:-1,COMP:LEN);

 { Set ordering for inputs }

 MAKE_MODULE_DEC(FALSE,PRIMARY_INPINS[1],DEC,NCHARS);
 WRITE(BUILD,X2,DEC:-1);
 CHARS_OUT:=NCHARS+2;

 FOR I:= 2 TO NINPINS DO
 BEGIN
   MAKE_MODULE_DEC(FALSE,PRIMARY_INPINS[I],DEC,NCHARS);
   CHARS_OUT:=CHARS_OUT+NCHARS+2;
   IF CHARS_OUT >= CHARS_PER_LINE THEN
   BEGIN
       WRITELN(BUILD);
     CHARS_OUT:=NCHARS+2;
   END;
        WRITE(BUILD,',  ',DEC:-1);
     END;

     WRITELN(BUILD,';');
     WRITELN(BUILD);
     DISPOSE_STRING_T(THIS_PIN);
   End; {Set_module_ordering}

 Begin {Generate_module}
   WRITELN(BUILD,'$ MODULE M',COMP:LEN);
   WRITELN(BUILD,'%',X10,VERSION_STM);
   WRITELN(BUILD,'%',X10,TIME_STAMP);

   MODULE_KEY:='M';

   SET_MODULE_ORDERING;

   MODULE_KEY:=NUL;
   SET_MODULE_ORDERING;
 End; {Generate_module}
{* * * * * * * * * * * * * * * * * * * * * * * * * * * * * * * * * * * * * * *}

 Procedure Generate_header; {level 3}
```

```
Procedure Make_dec(IN PIN:PACKAGE_PIN; OUT DEC:BLM_VAR; OUT NCHARS:INTEGER); {level 4}
VAR POSITION,N:INTEGER; BIT:BLM_VAR;
Begin {Make_dec}
  INIT_NUL(DEC,L_ID);

  MOVE(PIN.PIN_NUMBER.CHARS^,1,PIN.PIN_NUMBER.LEN,DEC,1);
  POSITION:=PIN.PIN_NUMBER.LEN+1;
  MOVE('::1',1,3,DEC,POSITION);
  NCHARS:=POSITION+2;

  {%DEBUG WRITELN('DEC=',DEC:-1,', LENGTH=',NCHARS:-1);}
End; {Make_dec}

Procedure Set_ordering;{level 4}
VAR I,CHARS_OUT,NCHARS:INTEGER;
  THIS_PIN:dynamic_string_t;
  DEC:BLM_VAR;
Begin {Set_ordering}

  { Set ordering for outputs }

  NEW_STRING_T(THIS_PIN);

  MAKE_DEC(PRIMARY_OUTPINS[1],DEC,NCHARS);
  WRITE(BUILD,X2,DEC:-1);
  CHARS_OUT:=NCHARS+2;
{   SUBST_STRING_T(PRIMARY_OUTPINS[1].ID,THIS_PIN);} {for busses}

  FOR I:= 2 TO NOUTPINS DO
  BEGIN
{     IF EQUIV(PRIMARY_OUTPINS[I].ID, THIS_PIN) THEN
       NEXT;
    SUBST_STRING_T(PRIMARY_OUTPINS[I].ID,THIS_PIN);
} {for busses}
    MAKE_DEC(PRIMARY_OUTPINS[I],DEC,NCHARS);
    CHARS_OUT:=CHARS_OUT+NCHARS+2;
    IF CHARS_OUT >= CHARS_PER_LINE THEN
    BEGIN
      WRITELN(BUILD);
      CHARS_OUT:=NCHARS+2;
    END;

    WRITE(BUILD,', ',DEC:-1);
  END;

  WRITELN(BUILD);
  WRITELN(BUILD,X4,':=');


  { Set ordering for inputs }

  MAKE_DEC(PRIMARY_INPINS[1],DEC,NCHARS);
  WRITE(BUILD,X2,DEC:-1);
  CHARS_OUT:=NCHARS+2;
{   SUBST_STRING_T(PRIMARY_INPINS[1].ID,THIS_PIN);} {for busses}
```

```
      FOR I:= 2 TO NINPINS DO
      BEGIN
{         IF EQUIV(PRIMARY_INPINS[I].ID,THIS_PIN) THEN
           NEXT;
        SUBST_STRING_T(PRIMARY_INPINS[I].ID,THIS_PIN);
} {for busses}
        MAKE_DEC(PRIMARY_INPINS[I],DEC,NCHARS);
        CHARS_OUT:=CHARS_OUT+NCHARS+2;
        IF CHARS_OUT >= CHARS_PER_LINE THEN
        BEGIN
          WRITELN(BUILD);
          CHARS_OUT:=NCHARS+2;
        END;

        WRITE(BUILD,', ',DEC:-1);
      END;

      WRITELN(BUILD,';');
      WRITELN(BUILD);
      DISPOSE_STRING_T(THIS_PIN);
    End; {Set_ordering}

  Begin {Generate_header}
    WRITELN(BUILD,'$ PRIMITIVE ',COMP:LEN,'  % STATE = ',NSTATES:-1,' LATCH = ',NLATCHES:-1);
    WRITELN(BUILD,'%',X10,VERSION_STM);
    WRITELN(BUILD,'%',X10,TIME_STAMP);


    SET_ORDERING;

    WRITELN(BUILD,'BOOLEAN PROCEDURE ',COMP:LEN,';');

    {Write statistics.}

    WRITELN(BUILD,'%-----------------------------------------');
    WRITELN(BUILD,'% Instances processed:  ',ninst:5);
    WRITELN(BUILD,'% Nets processed:       ',nnet:5);
    WRITELN(BUILD,'% Twin outs:            ',ntwin_outs:5);
    WRITELN(BUILD,'% Flip flops:           ',nstates DIV 2:5);
    WRITELN(BUILD,'% Latches:              ',nLATCHES:5);
    WRITELN(BUILD,'% Package pins:         ',npins:5);
    WRITELN(BUILD,'%   input pins:       ',ninpins:5);
    WRITELN(BUILD,'%   output pins:      ',noutpins:5);
    WRITELN(BUILD);

    IF NCHAINS > 0 THEN
    BEGIN
      WRITELN(BUILD,'%----------- CHAIN STATISTICS -----------');
      WRITELN(BUILD,'% ',NCHAINS:2,' chain piece(s) found.');
      WRITELN(BUILD,'% SOO                        LENGTH');
```

```
  FOR I:=1 TO NCHAINS DO
  BEGIN
    GET_NAME(CHAINS[I].SDO.NET,NAME);
    WRITELN(BUILD,'% ',NAME:25,X4,(CHAINS[I].LEN DIV 2):4);

  END;
  WRITELN(BUILD,'%-----------------------------------------');
 END;

 WRITELN(BUILD,'% Warnings :  ',warning_count:5);
 WRITELN(BUILD,'% Errors :    ',ERROR_COUNT:5);
 WRITELN(BUILD,'%-----------------------------------------');

 WRITELN(BUILD);

 WRITELN(BUILD,BEG);
End; {Generate_header}
{* * * * * * * * * * * * * * * * * * * * * * * * * * * * * * * * * * * * * * *}

Procedure Generate_includes; {level 3}
Begin {Generate_includes}
 {%debug MSG('GENERATE INCLUDES REACHED!');}
 WRITELN(BUILD);
 WRITELN(BUILD);
End; {Generate_includes}
{* * * * * * * * * * * * * * * * * * * * * * * * * * * * * * * * * * * * * * *}

Procedure Generate_init; {level 3}
Begin {Generate_init}
 {%debug MSG('GENERATE INIT REACHED!');}

 WRITELN(BUILD);
End; {Generate_init}

{* * * * * * * * * * * * * * * * * * * * * * * * * * * * * * * * * * * * * * *}

Procedure Generate_declarations; {level 3}
VAR C,I,II,NCHARS,N,
 BIT,   { Bit position for packing states. }
 SWORD, { Slave word index 0 -relative.}
 MWORD, { Master word index, starts at last SWORD+1.}
 WORD :INTEGER;
Begin {Generate_declarations}
 {%debug MSG('GENERATE DECLARATIONS REACHED!');}
 WRITELN(BUILD);

 {  Defines  }

 WRITELN(BUILD,'DEFINE');
 WRITELN(BUILD,X2,'ZERO = FALSE #,');
 WRITELN(BUILD,X2,'ONE = TRUE #,');
 WRITELN(BUILD,X2,'SIM_OR(A,B) = (A OR B) #,');
 WRITELN(BUILD,X2,'SIM_AND(A,B) = (A AND B) #,');
 WRITELN(BUILD,X2,'SIM_XOR(A,B) = (NOT(A EQV B)) #,');
```

```
WRITELN(BUILD,X2,'SIM_NOT(A) = (NOT A) #,');

IF ((NSTATES > 0) OR (NLATCHES > 0) )  THEN
BEGIN
  WRITELN(BUILD);
  NCHARS:=0;
  WORD:=0;
  BIT:=0;
  WRITELN(BUILD,X2,'NBITSPERWORD = ',BITS_PER_BUILD_WORD:-1,' #,');

 FOR C:=1 TO NCHAINS DO
 BEGIN
   SWORD:=WORD;
   MWORD:=ROUND((((CHAINS[C].LEN DIV 2)-1)/ BITS_PER_BUILD_WORD)+0.5)+WORD;
   WORD:=MWORD;
   WRITELN(BUILD);
   WRITELN(BUILD,X2,'CHAIN',C:-1,'_LEN = ',(CHAINS[C].LEN DIV 2):-1,' #,');
   WRITELN(BUILD);
   WRITELN(BUILD,X2,'%  The following states are on chain piece #',C:-1);
   WRITELN(BUILD);

   FOR I:=1 TO CHAINS[C].LEN DO
   BEGIN
     GET_STATE_NAME(CHAINS[C].STATES[I]^.ID,STATE_NAME);
     WRITELN(BUILD,X2,STATE_NAME:-1,' = STATE[',(WORD):-1,
       '].[',BIT:-1,':1] #,');

     IF (I MOD 2) = 0 THEN { slave }
     BEGIN
       BIT:=BIT+1;
       IF BIT = BITS_PER_BUILD_WORD THEN
       BEGIN
         BIT:=0;
         MWORD:=MWORD+1;
         SWORD:=SWORD+1;
       END;
       WORD:=MWORD;
     END
     ELSE
     BEGIN
       WORD:=SWORD;
     END;

   END; { I }

   IF BIT = 0 THEN
     WORD:=MWORD
   ELSE
     WORD:=MWORD + 1;

   BIT:=0;

   WRITELN(BUILD);
   WRITELN(BUILD,X2,'SAVE_CHAIN_NUM',C:-1,' = STATE[',WORD:-1,
      ']:=BOOLEAN(CHAIN_NUM',C:-1,') #,');
```

```
WRITELN(BUILD,X2,'GET_CHAIN_NUM',C:-1,' = CHAIN_NUM',C:-1,
  ':=REAL(STATE[',WORD:-1,']) #,');
WORD:=WORD+1;

WRITELN(BUILD);
WRITELN(BUILD,X2,'SAVE_WORD',C:-1,' = STATE[',WORD:-1,
   ']:=BOOLEAN(WORD',C:-1,') #,');
WRITELN(BUILD,X2,'GET_WORD',C:-1,' = WORD',C:-1,
  ':=REAL(STATE[',WORD:-1,']) #,');
WORD:=WORD+1;

WRITELN(BUILD);
WRITELN(BUILD,X2,'SAVE_BIT',C:-1,' = STATE[',WORD:-1,
   ']:=BOOLEAN(BIT',C:-1,') #,');
WRITELN(BUILD,X2,'GET_BIT',C:-1,' = BIT',C:-1,
  ':=REAL(STATE[',WORD:-1,']) #,');
WORD:=WORD+1;

WRITELN(BUILD);
WRITELN(BUILD,X2,'SAVE_CHAIN',C:-1,'_INDICES = BEGIN');
WRITELN(BUILD,X4,'SAVE_CHAIN_NUM',C:-1,';SAVE_WORD',C:-1,';SAVE_BIT',C:-1,';');
WRITELN(BUILD,X2,'END #,');
WRITELN(BUILD,X2,'GET_CHAIN',C:-1,'_INDICES = BEGIN');
WRITELN(BUILD,X4,'GET_CHAIN_NUM',C:-1,
  ';GET_WORD',C:-1,';GET_BIT',C:-1,';');
WRITELN(BUILD,X2,'END #,');

END; { C }

 WRITELN(BUILD);
 WRITELN(BUILD,X2,'%  The following states are NOT on any chain piece.');
 WRITELN(BUILD);

 FOR I:=1 TO NEW_NSTATES DO
 BEGIN
   GET_STATE_NAME(NEW_STATE_EQNS[I]^.ID,STATE_NAME);
   WRITELN(BUILD,X2,STATE_NAME:-1,' = STATE[',(WORD):-1,
       '].[',BIT:-1,':1] #,');

   BIT:=BIT+1;
   IF BIT = BITS_PER_BUILD_WORD THEN
   BEGIN
     WORD:=WORD+1;
     BIT:=0;
   END;
 END;

 WRITELN(BUILD);
 WRITELN(BUILD,X2,'% Latches.');
 WRITELN(BUILD);

 FOR I:=1 TO NLATCHES DO
 BEGIN
   GET_STATE_NAME(LATCH_EQNS[I]^.ID,STATE_NAME);
   WRITELN(BUILD,X2,STATE_NAME:-1,' = STATE[',(WORD):-1,
```

```
          '].[',BIT:-1,':1] #,');

      BIT:=BIT+1;
      IF BIT = BITS_PER_BUILD_WORD THEN
      BEGIN
        WORD:=WORD+1;
        BIT:=0;
      END;
    END;
    WRITELN(BUILD);
  END;

  WRITELN(BUILD);
  WRITELN(BUILD,'END_DEFINES = #;');
  WRITELN(BUILD);
  NSTATE_WORDS:=WORD+1;

  { Variable declarations  }

  WRITELN(BUILD);
  WRITELN(BUILD,X2,'%  All signal values will be stored in array NET.');
  WRITELN(BUILD);
  WRITELN(BUILD,X2,'OWN BOOLEAN ARRAY NET [1 : ',NNET:NNET_DIG,'] ;');
  WRITELN(BUILD,X2,'INTEGER LOOP_COUNT;');
  WRITELN(BUILD,X2,'BOOLEAN STATE_CHANGE, OLD_STATE;');
  FOR C:=1 TO NCHAINS DO
    { Note: There are 3 variables/chain piece. This is the number for NSKIP. }
    WRITELN(BUILD,X2,'INTEGER CHAIN_NUM',C:-1,', WORD',C:-1,', BIT',C:-1,';');
  WRITELN(BUILD);
  WRITELN(BUILD,SEPARATOR2);
End; {Generate_declarations}

 {* * * * * * * * * * * * * * * * * * * * * * * * * * * * * * * * * * * * * * *}

Procedure Generate_pin_handlers; {level 3}
  VAR COUNT:INTEGER;


  {*     *     *     *     *     *     *     *     *     *     *     *     *      }
      Procedure Write_preorder(IN OUT p:link; IN INST:INST_ARRAY); {level 5}
      VAR N,I,INDEX:INTEGER; DUMMY:BUFFER300;
      {Procedure WRITE_PREORDER performs a preorder traversal of the tree beginning
       at P.  This is a recursive procedure which terminates after the entire tree
       has been traversed. WRITE_PREORDER can be used for writing net_eqns in preorder
       form to the BUILD file.
       NOTE: This gives Polish notation.  }

        Procedure Check_line_length; {level 6}
        Begin {Check_line_length}
          COUNT:=COUNT+N;
          IF COUNT>=CHARS_PER_LINE THEN
          BEGIN
            COUNT:=N+6;
            WRITELN(BUILD);
            WRITE(BUILD,X6); {Indents next line.}
```

```
    END;
  End; {Check_line_length}


Begin {Write_preorder}
  IF P <> NIL THEN
  BEGIN
    INIT_NUL(DUMMY,L_STRING_T);

    IF P^.DATA.TYPE_ID = OPERATOR_ID THEN
    BEGIN
      CASE P^.DATA.ID.CHARS^[1] OF
        '+','*',
        '@'      : BEGIN
                     CASE P^.DATA.ID.CHARS^[1] OF
                       '+' : BEGIN
                               N:=7;
                               MOVE('SIM_OR(',1,N,DUMMY,1);
                             END;
                       '@' : BEGIN
                               N:=8;
                               MOVE('SIM_XOR(',1,N,DUMMY,1);
                             END;
                       '*' : BEGIN
                               N:=8;
                                 MOVE('SIM_AND(',1,N,DUMMY,1);
                             END;
                     END;

                     CHECK_LINE_LENGTH;
                     WRITE(BUILD,DUMMY:N);

                     WRITE_PREORDER(P^.LLINK,INST);
                     N:=1;
                     CHECK_LINE_LENGTH;
                     WRITE(BUILD,',');

                     WRITE_PREORDER(P^.RLINK,INST);
                     N:=1;
                     CHECK_LINE_LENGTH;
                     WRITE(BUILD,')');
                   END;
                   N:=8;
                   MOVE('SIM_NOT(',1,N,DUMMY,1);

                   CHECK_LINE_LENGTH;
                   WRITE(BUILD,DUMMY:N);

                   WRITE_PREORDER(P^.LLINK,INST);
                   N:=1;
                   CHECK_LINE_LENGTH;
                   WRITE(BUILD,')');
                 END;

        OTHERWISE  BEGIN
```

```
                    ERROR ('Illegal operator for BUILD.');
                    WRITELN('>>',p^.data.id.CHARS^:P^.DATA.ID.LEN);
                  END;

      END;

    END
    ELSE
    BEGIN
      IF P^.DATA.TYPE_ID = PIN_ID THEN
      BEGIN
        FIND_DATA_IN_INST_IN_LIST(P^.DATA,INST,INDEX);
        N:=NNET_DIG+5;
        CHECK_LINE_LENGTH;
        WRITE(BUILD,'NETI',INDEX:NNET_DIG,']');
      END
      ELSE {LATCH_ID or STATE_ID}
      BEGIN
        N:=P^.DATA.ID.LEN;
        GET_STATE_NAME(P^.DATA.ID,STATE_NAME);
        CHECK_LINE_LENGTH;
        WRITE(BUILD,STATE_NAME:N);
      END;

      WRITE_PREORDER(P^.LLINK,INST);
      WRITE_PREORDER(P^.RLINK,INST);
    END;

  END;
 End;  {Write_preorder}
{ *     *     *     *     *     *     *     *     *     *  }

Procedure Gen_eval_declarations; {level 4}
Begin {Gen_eval_declarations}
End; {Gen_eval_declarations}

{ *     *     *     *     *     *     *     *     *     *  }
PROCEDURE GEN_SET_CHAIN_IN_PROCEDURES;
VAR C,I,NWORDS,NEXT_WORD:INTEGER16;
BEGIN { GEN_SET_CHAIN_IN_PROCEDURES}
  WRITELN(BUILD);
  NEXT_WORD:=0;

  FOR C:= 1 TO NCHAINS DO
  BEGIN
    WRITELN(BUILD,X2,PROC,'SET_CHAIN',C:-1,'_IN;');
    WRITELN(BUILD,X2,BEG,'% SET_CHAIN',C:-1,'_IN');
    WRITELN(BUILD,X2,'INTEGER WA,BA,WB,BB;');

    NWORDS:= ((CHAINS[C].LEN DIV [illegible]) DIV BITS_PER_BUILD_WORD; { zero relative }

    WRITELN(BUILD,X4,'WA:=',NEXT_WORD:-1,';  BA:=0;');
    WRITELN(BUILD,X4,'WB:=WORD',C:-1,';  BB:=BIT',C:-1,';');
    WRITELN(BUILD);
```

```
    WRITELN(BUILD,X4,'THRU CHAIN',C:-1,'_LEN DO BEGIN');
    WRITELN(BUILD,X6,'STATE[WA].[BA:1]:=CCCHAIN_DATA[CHAIN_NUM',C:-1,',WB].[BB:1];');
    WRITELN(BUILD,X6,'BA:=BA+1;');
    WRITELN(BUILD,X6,'BB:=BB+1;');
    WRITELN(BUILD);
    WRITELN(BUILD,X6,'IF (BA >= NBITSPERWORD) THEN');
    WRITELN(BUILD,X6,BEG);
    WRITELN(BUILD,X8,'BA:=0;');
    WRITELN(BUILD,X8,'STATE[WA+1]:=STATE[WA];');
    WRITELN(BUILD,X8,'WA:=WA+2;');
    WRITELN(BUILD,X6,ENND);
    WRITELN(BUILD);
    WRITELN(BUILD,X6,'IF (BB >= NBITSPERWORD) THEN');
    WRITELN(BUILD,X6,BEG);
    WRITELN(BUILD,X8,'BB:=0;');
    WRITELN(BUILD,X8,'WB:=WB+1;');
    WRITELN(BUILD,X6,ENND);
    WRITELN(BUILD,X4,ENND,'% THRU');
    WRITELN(BUILD);
    WRITELN(BUILD,X4,'IF BA NEQ 0 THEN');
    WRITELN(BUILD,X6,'STATE[WA+1]:=STATE[WA];');

    WRITELN(BUILD,X2,ENND,'% SET_CHAIN',C:-1,'_IN');
    NEXT_WORD:=NEXT_WORD + (NWORDS+1)*2 + NSKIP;
  END;
END;  { GEN_SET_CHAIN_IN_PROCEDURES}
{ *     *     *     *     *     *     *     *     *     *  }
PROCEDURE GEN_SET_CHAIN_OUT_PROCEDURE;
VAR NBITS,C,I,NWORDS,NEXT_WORD:INTEGER16;
BEGIN { GEN_SET_CHAIN_OUT_PROCEDURE}
  WRITELN(BUILD);
  NEXT_WORD:=0;
  WRITELN(BUILD,X2,PROC,'SET_CHAIN_OUT;');
  WRITELN(BUILD,X2,BEG,'% SET_CHAIN_OUT');
  WRITELN(BUILD,X2,'INTEGER WA,BA,WB,BB;');

FOR C:= 1 TO NCHAINS DO
BEGIN
  WRITELN(BUILD,X4,'% Chain piece # ',C:-1);
  NWORDS:= ((CHAINS[C].LEN DIV 2)-1) DIV BITS_PER_BUILD_WORD; { zero relative }

  WRITELN(BUILD,X4,'WA:=',NEXT_WORD:-1,';  BA:=0;');
  WRITELN(BUILD,X4,'WB:=WORD',C:-1,';  BB:=BIT',C:-1,';');
  WRITELN(BUILD);
  WRITELN(BUILD,X4,'THRU CHAIN',C:-1,'_LEN DO BEGIN');
  WRITELN(BUILD,X6,'CCCHAIN_DATA[CHAIN_NUM',C:-1,',WB].[BB:1]:=STATE[WA].[BA:1];');
  WRITELN(BUILD,X6,'BA:=BA+1;');
  WRITELN(BUILD,X6,'BB:=BB+1;');
  WRITELN(BUILD);
  WRITELN(BUILD,X6,'IF (BA >= NBITSPERWORD) THEN');
  WRITELN(BUILD,X6,BEG);
  WRITELN(BUILD,X8,'BA:=0;');
  WRITELN(BUILD,X8,'WA:=WA+2;');
  WRITELN(BUILD,X6,ENND);
```

```
    WRITELN(BUILD);
    WRITELN(BUILD,X6,'IF (BB >= NBITSPERWORD) THEN');
    WRITELN(BUILD,X6,BEG);
    WRITELN(BUILD,X8,'BB:=0;');
    WRITELN(BUILD,X8,'WB:=WB+1;');
    WRITELN(BUILD,X6,ENND);
    WRITELN(BUILD,X4,ENND,'% THRU');
    WRITELN(BUILD);

    NEXT_WORD:=NEXT_WORD + (NWORDS+1)*2 + NSKIP;
  END;
      WRITELN(BUILD,X2,ENND,'% SET_CHAIN_OUT');
    END;  { GEN_SET_CHAIN_OUT_PROCEDURE}
    { *     *     *     *     *     *     *     *     *     *  }

    Procedure Gen_set_state_procedure; {level 4}
    VAR I,N,INDEX:INTEGER;
    Begin {Gen_set_state_procedure}
      WRITELN(BUILD);
      WRITELN(BUILD,X2,PROC,'SET_STATE_EQNS;');
      WRITELN(BUILD,X2,BEG,'% SET_STATE_EQNS');
      WRITELN(BUILD,X4,'% Nets with state must be initialized to their latest value.');
      WRITELN(BUILD,X4,'% These nets are the outputs of flip flops or latches.');

      FOR I:= 1 TO NSTATE_NETS DO
      BEGIN
        FIND_NET_EQN(STATE_NETS[I]^.ID,FALSE,INDEX);
        COUNT:=11+NNET_DIG;
        GET_NAME(NET_EQNS[INDEX],NAME);
        WRITELN(BUILD,X4,'% ',NAME:-1);

        WRITE(BUILD,X4,'NET[',INDEX:NNET_DIG,']:=');
        WRITE_PREORDER(NET_EQNS[INDEX]^.EQN,NET_EQNS[INDEX]^.INST);
        WRITELN(BUILD,';');

      END;

      WRITELN(BUILD,X2,ENND,'% SET_STATE_EQNS');
      WRITELN(BUILD);
    End; {Gen_set_state_procedure}

  { *     *     *     *     *     *     *     *     *     *  }

  Procedure Gen_evaluate_state_procedure; {level 5}
  VAR C,I,N,INDEX:INTEGER;
  Begin {Gen_evaluate_state_procedure}
    WRITELN(BUILD);
    WRITELN(BUILD,X2,PROC,'EVALUATE_STATE_EQNS;');
    WRITELN(BUILD,X2,BEG,'% EVALUATE_STATE_EQNS');
    WRITELN(BUILD,X4,
      '% FF and LATCH states will be evaluated separately.');

    FOR C:=1 TO NCHAINS DO
    BEGIN
      WRITELN(BUILD);
```

```
WRITELN(BUILD,X4,'%  Equations for chain piece #',C:-1);
WRITELN(BUILD);

WRITELN(BUILD,X4,'IF [[CHAIN_INFO[CHAIN_NUM',C:-1,
  ',[[SET_FLAG] EQL [[TRUE THEN');
WRITELN(BUILD,X6,'SET_CHAIN',C:-1,'_IN');
WRITELN(BUILD,X4,'ELSE');
WRITELN(BUILD,X4,BEG);

FOR I:= 1 TO CHAINS[C].LEN DO
BEGIN
  GET_STATE_NAME(CHAINS[C].STATES[I]^.ID,STATE_NAME);
  WRITELN(BUILD,X4,'OLD_STATE := ',STATE_NAME:-1,';');

  COUNT:=6+CHAINS[C].STATES[I]^.ID.LEN;
  WRITE(BUILD,X4,STATE_NAME:-1,':=');
  WRITE_PREORDER(CHAINS[C].STATES[I]^.EQN,CHAINS[C].STATES[I]^.INST);
  WRITELN(BUILD,';');

  GET_STATE_NAME(CHAINS[C].STATES[I]^.ID,STATE_NAME);
  WRITELN(BUILD,X4,'STATE_CHANGE := STATE_CHANGE OR NOT(OLD_STATE EQV ',STATE_NAME:-1,');');
END;
    WRITELN(BUILD,X4,ENND);
  END;

  { State equations must be executed in reverse order.
    This will cause masters to be executed before slaves.}

  WRITELN(BUILD);

  FOR I:= NEW_NSTATES DOWNTO 1 DO
  BEGIN
    GET_STATE_NAME(NEW_STATE_EQNS[I]^.ID,STATE_NAME);

    WRITELN(BUILD,X4,'OLD_STATE := ',STATE_NAME:-1,';');
    COUNT:=6+NEW_STATE_EQNS[I]^.ID.LEN;
    WRITE(BUILD,X4,STATE_NAME:-1,':=');
    WRITE_PREORDER(NEW_STATE_EQNS[I]^.EQN,NEW_STATE_EQNS[I]^.INST);
    WRITELN(BUILD,';');

    GET_STATE_NAME(NEW_STATE_EQNS[I]^.ID,STATE_NAME);
    WRITELN(BUILD,X4,'STATE_CHANGE := STATE_CHANGE OR NOT(OLD_STATE EQV ',STATE_NAME:-1,');');
  END;

  WRITELN(BUILD,X2,ENND,'% EVALUATE_STATE_EQNS');
  WRITELN(BUILD);
End; {Gen_evaluate_state_procedure}

{ *     *     *     *     *     *     *     *     *     *  }
PROCEDURE GEN_EVALUATE_LATCH_PROCEDURE; {LEVEL 5}
VAR C,I,N,INDEX:INTEGER;
BEGIN {GEN_EVALUATE_LATCH_PROCEDURE}
  WRITELN(BUILD);
  WRITELN(BUILD,X2,PROC,'EVALUATE_LATCH_EQNS;');
```

```
WRITELN(BUILD,X2,BEG,'% EVALUATE_LATCH_EQNS');

FOR I:= NLATCHES DOWNTO 1 DO
BEGIN
  GET_STATE_NAME(LATCH_EQNS[I]^.ID,STATE_NAME);

  WRITELN(BUILD,X4,'OLD_STATE := ',STATE_NAME:-1,';');
  COUNT:=6+LATCH_EQNS[I]^.ID.LEN;
  WRITE(BUILD,X4,STATE_NAME:-1,':=');
  WRITE_PREORDER(LATCH_EQNS[I]^.EQN,LATCH_EQNS[I]^.INST);
  WRITELN(BUILD,';');

  GET_STATE_NAME(LATCH_EQNS[I]^.ID,STATE_NAME);
  WRITELN(BUILD,X4,'STATE_CHANGE := STATE_CHANGE OR NOT(OLD_STATE EQV ',STATE_NAME:-1,');');
END;

WRITELN(BUILD,X2,ENND,'% EVALUATE_LATCH_EQNS');
WRITELN(BUILD);
END; {GEN_EVALUATE_LATCH_PROCEDURE}
{ *     *     *     *     *     *     *     *     *     *  }


Procedure Gen_rank_procedures; {level 4}
VAR I,J,INDEX,INDEX2,RANK,N:INTEGER;
    THIS_BUS_ID:DFI_$OBJECT_IDENTIFIER;
    CONSTANT_VALUE:SIGNAL_VALUES;
    TEMP:BUFFER10;
  Procedure Find_constant(IN NET:PTR_NETEQN;OUT VALUE:SIGNAL_VALUES); {level 5}
  VAR I:INTEGER;
  Begin {Find_constant}
    FOR I:=1 TO NCONSTANTS DO
    BEGIN
      IF EQUIV(CONSTANTS[I]^.ID,NET^.ID) THEN
      BEGIN
        VALUE:=CONSTANTS[I]^.VALUE;
        RETURN;
      END;
    END;

    {Pin not found!}

    INIT_NUL(TEMP,10);
    MOVE(NET^.ID.CHARS^,1,MIN(10,NET^.ID.LEN),TEMP,1);
    IF (INTERFACE = BURLIST) AND (TEMP = 'VSE') THEN
    BEGIN
      VALUE := ZERO;
    END
    ELSE
    BEGIN
      GET_NAME(NET,NAME);
      WARNING ('Net is undefined.  It will be assigned a constant value of ZERO.');
      WRITELN('>>',NAME:-1);
      VALUE:=ZERO;
```

```
    END;
  End; {Find_constant}

Begin {Gen_rank_procedures}
  J:=1;

  {Rank 0 contains all primary inputs.  These must be initialized to
   their pin pointer values.}

  RANK:=0;
  THIS_BUS_ID:=DFI_$NULL_OBJ_ID;

  WRITELN(BUILD);
  WRITELN(BUILD,X2,PROC,'EVALUATE_RANK_0_EQNS;');
  WRITELN(BUILD,X2,BEG,'% EVALUATE_RANK_0_EQNS');
  WRITELN(BUILD,X4,'REAL FORCE_SEG; % DUMMY VARIABLE TO FORCE SEGMENTATION.');

  WHILE NET_EQNS[J]^.RANK = RANK DO
  BEGIN
    FIND_PRIMARY_INPUT(NET_EQNS[J]^.ID,INDEX);

    IF INDEX > 0 THEN
    BEGIN

      {       Primary    Input          }

      INDEX:=INDEX-1; {PRIMARY_INPINS is 1 relative, but SIGIN is zero
                       relative; so subtract one.}
      GET_NAME(NET_EQNS[J],NAME);
      WRITELN(BUILD,X6,'% ',NAME:-1);
      WRITELN(BUILD,X10,'NET[',J:NNET_DIG,
        '] := SIGIN[',INDEX:-1,'];');
    END
    ELSE
    BEGIN

      {       Constant              }

      FIND_CONSTANT(NET_EQNS[J],CONSTANT_VALUE);
      WRITELN(BUILD,X6,'% ',NET_EQNS[J]^.BUS_NAME.CHARS^:NET_EQNS[J]^.BUS_NAME.LEN);
      WRITELN(BUILD,X10,'NET[',J:NNET_DIG,'] := ',
        CONSTANT_VALUE:-1,';');
    END;

   J:=J+1;
   IF J>NNET THEN EXIT;
 END;

 {Primary_io pins will have the rank of the output eqn but
  the input must be initialized here.  }

 FOR I:= 1 TO NINPINS DO
 BEGIN
   IF PRIMARY_INPINS[I].TYPE_ID = PRIMARY_IO THEN
```

```
    BEGIN
      GET_NAME(PRIMARY_INPINS[I].NET,NAME);
      INDEX:=I-1; {PRIMARY_INPINS is 1 relative, but SIGIN is zero
                   relative; so subtract one.}
      FIND_NET_EQN(PRIMARY_INPINS[I].ID,FALSE,INDEX2);
      WRITELN(BUILD,X6,'% ',NAME:-1);
      WRITELN(BUILD,X10,'NET[',INDEX2:NNET_DIG,
        '] := SIGIN[',INDEX:-1,'];');
    END;
  END;


  WRITELN(BUILD,X2,ENND,'% EVALUATE_RANK_0_EQNS');
  IF J>NNET THEN RETURN;



  {Ranks 1 -> MAX_RANK are processed here.  When RANK = MAX_STATE_RANK
   state values must be computed before the equations for that rank.}

  FOR RANK:= 1 TO MAX_RANK DO
  BEGIN
    WRITELN(BUILD);
    WRITELN(BUILD,X2,PROC,'EVALUATE_RANK_',RANK:-1,'_EQNS;');
    WRITELN(BUILD,X2,BEG,'% EVALUATE_RANK_',RANK:-1,'_EQNS');
    WRITELN(BUILD,X4,'REAL FORCE_SEG; % DUMMY VARIABLE TO FORCE SEGMENTATION.');


  { Write equations. }

    WHILE NET_EQNS[J]^.RANK = RANK DO
    BEGIN

      IF NOT NET_EQNS[J]^.VALID THEN
      BEGIN
        WRITELN(BUILD,'*********  Feedback on path from package output.');
        WRITELN(BUILD,'*********  The equation for the following net is not valid.');
        WRITELN(BUILD,'*********  Please verify this design in NETED.');
        WRITELN(BUILD,'*********  If feedback is correct the equation must be completed by hand.');
      END;


      COUNT:=11+NNET_DIG;
      GET_NAME(NET_EQNS[J],NAME);
      WRITELN(BUILD,X4,'% ',NAME:-1);

      WRITE(BUILD,X4,'NET[',J:NNET_DIG,']:=');
      WRITE_PREORDER(NET_EQNS[J]^.EQN,NET_EQNS[J]^.INST);
      WRITELN(BUILD,';');
      J:=J+1;
      IF J>NNET THEN EXIT;
    END;
```

```
    WRITELN(BUILD,X2,ENND,'% EVALUATE_RANK_',RANK:-1,'_EQNS');
    IF J>NNET THEN RETURN;
  END;
End; {Gen_rank_procedures}

Procedure Gen_output_procedure; {level 4}
VAR I,NN,INDEX:INTEGER;
  THIS_BUS_ID:DFI_$OBJECT_IDENTIFIER;
Begin {Gen_output_procedure}
  WRITELN(BUILD);
  WRITELN(BUILD,X2,PROC,'OUTPUT_VALUES;');
  WRITELN(BUILD,X2,BEG ,' % OUTPUT_VALUES');
  WRITELN(BUILD,X2,'DEFINE');
  IF TECHNOLOGY = 'MCAII' THEN
    WRITELN(BUILD,X4,'UNIT_DELAY = ',MCAII_DELAY_BUILD:-1,' #;  % ns')
  ELSE IF TECHNOLOGY = 'CMOS' THEN
    WRITELN(BUILD,X4,'UNIT_DELAY = ',CMOS_DELAY_BUILD:-1,' #;  % ns')
  ELSE IF TECHNOLOGY = 'ETL' THEN
    WRITELN(BUILD,X4,'UNIT_DELAY = ',ETL_DELAY_BUILD:-1,' #;  % ns')
  ELSE IF TECHNOLOGY = 'ALS' THEN
    WRITELN(BUILD,X4,'UNIT_DELAY = ',ALS_DELAY_BUILD:-1,' #;  % ns')
  ELSE
  BEGIN
    { Use MCAII delay. }
    { WRITELN('TECHNOLOGY >>',TECHNOLOGY:-1);
    ERROR ('CAE section must add delay value for this technology.');
    }
    WRITELN(BUILD,X4,'UNIT_DELAY = ',MCAII_DELAY_BUILD:-1,' #;  % ns')
  END;

  WRITELN(BUILD);

  FOR I:=1 TO NOUTPINS DO
  BEGIN
    GET_NAME(PRIMARY_OUTPINS[I].NET,NAME);
    FIND_NET_EQN(PRIMARY_OUTPINS[I].ID,FALSE,INDEX);

    WRITELN(BUILD,X4,'SIGOUT[',I-1:-1,'] := NET[',INDEX:NNET_DIG,'];  %  ',NAME:-1);
    WRITELN(BUILD,X4,'SIGDELAY[',I-1:-1,'] := ',PRIMARY_OUTPINS[I].DELAY:-1,' * UNIT_DELAY ;');
  END;

  WRITELN(BUILD,X2,ENND, '% OUTPUT_VALUES');
End; {Gen_output_procedure}

Procedure Gen_state_eqn_proc_call;  {level 4}
Begin {Gen_state_eqn_proc_call}
  WRITELN(BUILD,X2,'SET_STATE_EQNS;');
End; {Gen_state_eqn_proc_call}

Procedure Gen_rank_proc_calls; {level 4}
VAR RANK,N:INTEGER;
Begin {Gen_rank_proc_calls}

  { If there are states then generate a settling loop. }
```

```
IF ((NSTATES >0) OR (NLATCHES > 0)) THEN
BEGIN
  WRITELN(BUILD,X2,'LOOP_COUNT := 0;');
  WRITELN(BUILD);

  WRITELN(BUILD,X2,'DO BEGIN');
  WRITELN(BUILD);
  WRITELN(BUILD,X4,'LOOP_COUNT := LOOP_COUNT + 1;');
  WRITELN(BUILD,X4,'STATE_CHANGE := FALSE;');
   FOR RANK:= 0 TO MAX_RANK DO
   BEGIN

     IF (NSTATES >0)  AND (RANK = MAX_STATE_RANK) THEN
       WRITELN(BUILD,X4,'EVALUATE_STATE_EQNS;');

     IF  (NLATCHES > 0) AND (RANK = MAX_STATE_RANK) THEN
       WRITELN(BUILD,X4,'EVALUATE_LATCH_EQNS;');

     WRITELN(BUILD,X4,'EVALUATE_RANK_',RANK:-1,'_EQNS;');

   { If there are states then generate  the end of the settling loop. }

     IF ((NSTATES >0) OR (NLATCHES > 0))  AND (RANK = MAX_STATE_RANK) THEN
     BEGIN
       WRITELN(BUILD,X2,'END');
       WRITELN(BUILD,X2,'UNTIL (NOT STATE_CHANGE) OR (LOOP_COUNT GTR ',(NSTATES+NLATCHES):-1,');');
       WRITELN(BUILD);

       WRITELN(BUILD,X2,'IF STATE_CHANGE THEN');
       WRITELN(BUILD,X4,'QUIT(">>>>OSCILLATING<<<<");');
       WRITELN(BUILD);
     END;
   END;
End; {Gen_rank_proc_calls}

PROCEDURE GEN_CHAIN_INDICES_STMTS;
VAR C:INTEGER16;
BEGIN {GEN_CHAIN_INDICES_STMTS}
  FOR C:= 1 TO NCHAINS DO
    WRITELN(BUILD,X2,'GET_CHAIN',C:-1,'_INDICES;');

END; { GEN_CHAIN_INDICES_STMTS }


Begin {Generate_pin_handlers}
 {%debug MSG('GENERATE PIN_HANDLERS REACHED!');}

 {"PROCEDURE EVALUATE" will be generated here.  This procedure will be called
  during the main procedure to evaluate all outputs for all inputs.}

 WRITELN(BUILD,'PROCEDURE EVALUATE;');
 WRITELN(BUILD);
 WRITELN(BUILD,'%    Evaluates all possible logical functions for the primitive.');
```

```
WRITELN(BUILD);
WRITELN(BUILD,'BEGIN  % Evaluate');

GEN_EVAL_DECLARATIONS;

IF ((NSTATES > 0) OR (NLATCHES > 0)) THEN
BEGIN
  IF (NCHAINS > 0)  THEN
  BEGIN
    GEN_SET_CHAIN_IN_PROCEDURES;
    GEN_SET_CHAIN_OUT_PROCEDURE;
  END;

  GEN_SET_STATE_PROCEDURE;

  IF (NSTATES >0)  THEN
  BEGIN
    GEN_EVALUATE_STATE_PROCEDURE;
  END;
     IF  (NLATCHES > 0)  THEN
     BEGIN
       GEN_EVALUATE_LATCH_PROCEDURE;
     END;
   END;

   GEN_RANK_PROCEDURES;
   GEN_OUTPUT_PROCEDURE;

   WRITELN(BUILD);

   IF NCHAINS > 0 THEN
     GEN_CHAIN_INDICES_STMTS;

   IF ((NSTATES > 0) OR (NLATCHES > 0))  THEN GEN_STATE_EQN_PROC_CALL;
   GEN_RANK_PROC_CALLS;

   IF NCHAINS > 0 THEN
     WRITELN(BUILD,X2,'SET_CHAIN_OUT;');

   WRITELN(BUILD,X2,'OUTPUT_VALUES;');
   WRITELN(BUILD,'END; % Evaluate');
   WRITELN(BUILD);
   WRITELN(BUILD,SEPARATOR2);
 End; {Generate_pin_handlers}
(* * * * * * * * * * * * * * * * * * * * * * * * * * * * * * * * * * * * * * *)
 PROCEDURE GEN_FIND_CHAIN_INFO;
 VAR C,BIT1,BIT2,INDEX_I,INDEX_O:INTEGER16;
   PTYPE:PIN_TYPE;
 BEGIN {GEN_FIND_CHAIN_INFO}
   WRITELN(BUILD);
   WRITELN(BUILD,X2,PROC,'FIND_CHAIN_INFO;');
   WRITELN(BUILD,X2,BEG,'% FIND_CHAIN_INFO');

   WRITELN(BUILD,X4,'EBCDIC ARRAY CHIP[0:CCLCHIP_NAME-1];');
   WRITELN(BUILD,X4,'REPLACE CHIP BY "',COMPONENT:12,'";');
```

```
FOR C:= 1 TO NCHAINS DO
BEGIN
  WRITELN(BUILD);
  WRITELN(BUILD,X4,'% Chain piece #',C:-1);

  FIND_PRIMARY_INPUT(CHAINS[C].SDI.ID,INDEX_I);

  IF INDEX_I <= 0 THEN
  BEGIN
    GET_NAME(CHAINS[C].SDI.NET,NAME);
    ERROR ('SDI not found.');
    WRITELN('SDI >>',NAME:-1);
  END
  ELSE
    WRITELN(BUILD,X4,'GETSIGNALNAME(0,',(INDEX_I-1):-1,',0); % GET NETNAME ON SDI');


  WRITELN(BUILD,X4,'CCSETUP(SIGNAMEAR,LSIGNAME,CHIP,CHAIN_NUM',C:-1,',',
    'WORD',C:-1,',BIT',C:-1,');');
  WRITELN(BUILD,X4,'SAVE_CHAIN',C:-1,'_INDICES;');
 END;

 WRITELN(BUILD,X2,ENND,'% FIND_CHAIN_INFO');

 WRITELN(BUILD);
END; {GEN_FIND_CHAIN_INFO}
{* * * * * * * * * * * * * * * * * * * * * * * * * * * * * * * * * * * * * * *}
Procedure Generate_body; {level 3}
VAR IOPIN:BOOLEAN; I,NCHARS,N:INTEGER;
Begin {Generate_body}
  {%debug MSG('GENERATE BODY REACHED!');}

  IF NCHAINS > 0 THEN
    GEN_FIND_CHAIN_INFO;

  WRITELN(BUILD,X2,'%* * * * * M A I N    C O D E * * * * * * * ');

  {Write code for memory allocation.}

  IF ((NSTATES >0) OR (NLATCHES > 0))  THEN
  BEGIN
    WRITELN(BUILD,X2,'IF INITIALIZING THEN');
    WRITELN(BUILD,X2,BEG);
    WRITELN(BUILD,X4,'DECLARESTATE(',(NSTATE_WORDS):-1,', FALSE);');
    IF NCHAINS > 0 THEN
      WRITELN(BUILD,X4,'FIND_CHAIN_INFO;');
    WRITELN(BUILD,X2,ENND);
  END;

  WRITELN(BUILD);

  WRITELN(BUILD,X2,'EVALUATE;');

  WRITELN(BUILD);
```

```
End; {Generate_body}
(* * * * * * * * * * * * * * * * * * * * * * * * * * * * * * * * * * * * * * *)

Procedure Generate_closing; {level 3}
Begin {Generate_closing}
  {%debug MSG('GENERATE CLOSING REACHED!');}
  IF WARNING_COUNT >0 THEN
  BEGIN
    WRITELN(BUILD,'% The design produced warnings.  Check your GENBLM ');
    WRITELN(BUILD,'% output and verify the warnings before using this PRIMITIVE.');
    END;

    WRITELN(BUILD,ENND);
    WRITELN(BUILD,SEPARATOR2);
  End; {Generate_closing}

(* * * * * * * * * * * * * * * * * * * * * * * * * * * * * * * * * * * * * * *)

Begin {Generate_build_prim}
   MSG('Generating BUILD primitive.');
   LEN:=COMP_NAME_LENGTH;
   FOR I:= 1 TO LEN DO
     COMP[I]:=UPPER_CASE(COMPONENT[I]);

   MAP_PIN_NAMES_AND_NUMBERS; { * * * * Version 1.4 addition * * * *   }


   GENERATE_MODULE;
   GENERATE_HEADER;
   GENERATE_DECLARATIONS;
   GENERATE_PIN_HANDLERS;
   GENERATE_BODY;
   GENERATE_CLOSING;

 End;{Generate_build_prim}

(* * * * * * * * * * * * * * * * * * * * * * * * * * * * * * * * * * * * * * *)
PROCEDURE GEN_DDRIVE_INFO;
VAR C,S,NTYPE:INTEGER16;
  THIS_TYPE,LAST_TYPE:BUFFER80;

   PROCEDURE GET_TYPE(IN STATE:DYNAMIC_STRING_T;OUT TYP:BUFFER80);
   VAR I:INTEGER16;
   BEGIN {GET_TYPE}
     INIT_NUL(TYP,80);

     FOR I:=1 TO STATE.LEN DO
     BEGIN
       IF (I > 80) OR (STATE.CHARS^[I] = '$') THEN
         EXIT;

       TYP[I]:=STATE.CHARS^[I];

     END;
```

```
END; {GET_TYPE}

BEGIN {GEN_DDRIVE_INFO}
  { This procedure is called if DDRIVE is true -- meaning the DDRIVE option
    has been used.  The DDRIVE option will automatically activate the CHAIN
    option.  The BURLIST.EXT translation file is required for DDRIVE.}

  IF NOT GEN_BUILD THEN
    GET_BIF_NETNAMES;

  {The format for this file is

    <# of chain pieces>
    <length of piece 1>
    <sdi piece 1> <sdo piece 1> <clock piece 1>  <first shift piece 1>
                                                 <next shift piece 1 (optional)>
                                                 <next shift piece 1 (optional)>
                                                     ...
    <bit count for elemtype> <elemtype for flip flops in chain order>
    ...
    <records for next piece>
    ...

   }

  WRITELN(DDRIVE_INFO,NCHAINS:-1);

  FOR C:= 1 TO NCHAINS DO
  BEGIN

    { Write chain length. }

    WRITELN(DDRIVE_INFO,(CHAINS[C].LEN DIV 2):-1);

    { Write SDI, SDO, CLK pinnames. }

    WRITE(DDRIVE_INFO,CHAINS[C].SDI.ID.CHARS^:CHAINS[C].SDI.ID.LEN,X2,
                      CHAINS[C].SDO.ID.CHARS^:CHAINS[C].SDO.ID.LEN,X2,
                      CHAINS[C].CLK.ID.CHARS^:CHAINS[C].CLK.ID.LEN);

    { Write records for shift enables. }

    FOR S:= 1 TO MAX_SHIFT_ENABLES DO
    BEGIN
      IF CHAINS[C].SHIFT_ENABLE[S].ID.LEN <= 0 THEN
      BEGIN
        IF S = 1 THEN
          WRITELN(DDRIVE_INFO);
        EXIT;
      END;
```

```
    WRITELN(DDRIVE_INFO,X2,CHAINS[C].SHIFT_ENABLE[S].ID.CHARS^:CHAINS[C].SHIFT_ENABLE[S].ID.LEN);
  END;

  { Write flip-flop records. Count number of same type in a row. }

  NTYPE:=1;
  GET_TYPE(CHAINS[C].STATES[1]^.ID,LAST_TYPE);

  FOR S:= 3 TO CHAINS[C].LEN DO
  BEGIN
    IF (S MOD 2) = 0 THEN NEXT;

    GET_TYPE(CHAINS[C].STATES[S]^.ID,THIS_TYPE);

    IF THIS_TYPE = LAST_TYPE THEN
    BEGIN
      NTYPE:=NTYPE+1;
    END
    ELSE
    BEGIN
      WRITELN(DDRIVE_INFO,NTYPE:-1,X2,LAST_TYPE:-1);
      LAST_TYPE:=THIS_TYPE;
      NTYPE:=1;
    END;
  END;

  WRITELN(DDRIVE_INFO,NTYPE:-1,X2,LAST_TYPE:-1);


 END;
END; {GEN_DDRIVE_INFO}
(* * * * * * * * * * * * * * * * * * * * * * * * * * * * * * * * * * * * * * *)
Begin {Generate_files}
 NUM_32:=NNET;
 TRANS_NUM_TO_CHAR(NUM_32,CHAR_NNET,NNET_DIG);

 IF GEN_BLM THEN
   Generate_blm;

 IF GEN_BUILD THEN
   GENERATE_BUILD_PRIM;

 IF DDRIVE THEN
   GEN_DDRIVE_INFO;

End;  {Generate_files}
{****************************************************************************}

Procedure Terminate; {level 1}
VAR MSGTEXT,NUMBUF:BUFFER80;
    I,J,NDIGITS:INTEGER;
    STATUS:STATUS_$T;
Begin {terminate}

 {%debug MSG('TERMINATE REACHED!');}
```

```
IF FILES_OPEN THEN CLOSE_FILES;

CLOSE(BLM); {Close BLM separately because it will be in use till TERMINATE is called.}
CLOSE(BUILD); {Close BUILD separately because it will be in use till TERMINATE is called.}


CLOSE(EXT);
CLOSE(TRANS_INFO);
CLOSE(PINLOCK);
{If any errors, remove BLM and BUILD}

IF ERROR_COUNT > 0 THEN
BEGIN
  STREAM_$OPEN(BLM_TITLE,BLM_TITLE_LENGTH,STREAM_$OVERWRITE,STREAM_$UNREGULATED,CONNV[2],STATUS);
  STREAM_$DELETE(CONNV[2],STATUS);
  STREAM_$OPEN(BUILD_TITLE,BUILD_TITLE_LENGTH,STREAM_$OVERWRITE,STREAM_$UNREGULATED,CONNV[2],STATUS);
  STREAM_$DELETE(CONNV[2],STATUS);
END;

WRITELN('#-----------------------------------------');

IF TERM_STATUS = NORMAL THEN
BEGIN
  WRITELN('# Macros in library:     ',nmacros:5);
  WRITELN('# Instances processed:  ',ninst:5);
  WRITELN('# Nets processed:        ',nnet:5);
 {%debug WRITELN('# Twin outs:              ',ntwin_outs:5);}
  WRITELN('# Flip flops:            ',nstates DIV 2:5);
  WRITELN('# Latches:               ',nLATCHES:5);
  WRITELN('# Package pins:          ',npins:5);
  WRITELN('#   input pins:        ',ninpins:5);
  WRITELN('#   output pins:       ',noutpins:5);
  WRITELN;

  IF NCHAINS > 0 THEN
  BEGIN
    WRITELN('#----------- CHAIN STATISTICS ------------');
    WRITELN('# ',NCHAINS:2,' chain piece(s) found.');
    WRITELN('# SDO                            LENGTH');

    FOR I:=1 TO NCHAINS DO
    BEGIN
      GET_NAME(CHAINS[I].SDO.NET,NAME);
      WRITELN('# ',NAME:25,X4,(CHAINS[I].LEN DIV 2):4);

    END;
    WRITELN('#-----------------------------------------');
  END;
END
ELSE   WRITELN('# ',TERM_STATUS:-1,' termination of GENBLM.');

WRITELN('# Warnings :   ',warning_count:5);
WRITELN('# Errors :     ',ERROR_COUNT:5);
WRITELN('#-----------------------------------------');
```

```
  PGM_$EXIT;
End; {terminate}

{*******************************************************************************}

Procedure generate_lib_schematics;
CONST
      PAGE_SIZE_HEIGHT = 35.;
      PAGE_SIZE_WIDTH  = 45.;
      PAGE_SIZE_HEIGHT_int = 34; {must be <= to page_size_length}
      PAGE_SIZE_WIDTH_int  = 44; {must be <= to page_size_width}
      COMP_SIZE_x = 2;
      COMP_SIZE_y  = 2;
      start_x = -comp_size_x;
      start_y = -comp_size_y;
      max_comp_col = page_size_HEIGHT_int DIV (2 * comp_size_y);
      max_comp_row = page_size_WIDTH_int DIV (2 * comp_size_x);
      pin_size = 10;
      num_lib_info = 50;
      lfunct = 1;
      lpathname = 80;
      pin_spacing = 0.1;
      text_height = 0.05;

TYPE
     coordinate_rec = RECORD
                        x:REAL;
                        y:REAL;
                      END;

     pin_info_rec = RECORD
                      pinname:ARRAY [1..32] OF CHAR;
                      lpinname:INTEGER;
                      loc:coordinate_rec;
                      pintype:ARRAY [1..3] OF CHAR;
                    END;


     prim_ptr = ^prim_rec;
     prim_rec = RECORD
                  funct:CHAR;
                  pathname:STRING;
                  lpathname:INTEGER;
                  upper_right:coordinate_rec;
                  lower_left:coordinate_rec;
                  base_coordinate:coordinate_rec;
                  pin_info:ARRAY [1..pin_size] of pin_info_rec;
                  in_count,
                  out_count:INTEGER;
                  plink:prim_ptr;
                END;

     schematic_ptr = ^schematic_array_rec;
```

```
schematic_array_rec = RECORD
                          base_point:coordinate_rec;
                          prim_ptr:prim_ptr;
                          in_count,
                          out_count:INTEGER;
                          schem_down : schematic_ptr;
                          END;
VAR STATUS:INTEGER32;
     J,
     I:INTEGER;
     proot_expression: link;
     command_file,
     prim_file:TEXT;
     schematic_title,
     command_title,
     prim_title:STRING;
     real_value:dfi_$value_t;
     status_string:status_$t;
     value:dfi_$string_t;
     error_val:INTEGER16;
     pin_count:INTEGER;
     schematic:array[-max_comp_row..max_comp_row,-max_comp_col..max_comp_col] of schematic_ptr;
     comp_count,
     start_point_x,
     start_point_y:INTEGER;
     row,
     col:INTEGER;
     ptemp:prim_ptr;
     proot:prim_ptr;
     temp:STRING;
     topin,
     top:schematic_ptr;
     pinname_out:dynamic_string_t;
     out_count : INTEGER;

Procedure find_blank(IN word:UNIV BUFFER300; IN length:integer; {LEVEL 1}
                     OUT nchars:INTEGER;start:INTEGER);
VAR I:INTEGER;

{Procedure COUNT_CHARS takes the string in WORD with LENGTH characters total
 and returns the number of characters (NCHARS) before the first blank character
 in WORD.}
Begin {Count_chars}
  IF start <= length THEN
    BEGIN
    NCHARS:=start;
    FOR I:=start TO LENGTH DO
      IF WORD[I] = NUL THEN
      BEGIN
        NCHARS:=I;
        EXIT;
      END;
    END;
End; {Count_chars}
```

```
Procedure find_non_blank(IN word:UNIV BUFFER300; IN length:integer; {LEVEL 1}
                         OUT nchars:INTEGER;start:INTEGER);
VAR I:INTEGER;

{Procedure COUNT_CHARS takes the string in WORD with LENGTH characters total
 and returns the number of characters (NCHARS) before the first blank character
 in WORD.}
Begin {Count_chars}
  IF start < length THEN
    BEGIN
    NCHARS:=start;
    FOR I:=start TO LENGTH DO
      IF NOT (WORD[I] = NUL) THEN
      BEGIN
        NCHARS:=I;
        EXIT;
      END;
    END;
End; {Count_chars}


{*******************************************************************}
{ This procedure will output the abort message and go to the abort   }
{ process.                                                           }
{*******************************************************************}

PROCEDURE abort_proc;

BEGIN
WRITELN;
WRITELN('Program is aborting:');
goto abort;
END; {abort_proc}

{*******************************************************************}
{ This procedure will handle status checking for the status value    }
{ assigned as the result of a dfi or system procedure call.          }
{*******************************************************************}
PROCEDURE status_proc(IN status:status_$t);

BEGIN
IF status.all <> status_$ok THEN
  BEGIN
  dfi_$error_print(status);
  abort_proc;
  END;
END; {status_proc}


PROCEDURE load_prim_file;

VAR prim_array:ARRAY [1..256] OF CHAR;
    i,
```

```
    start,
    position1,
    position2:INTEGER;
    plink:prim_ptr;
    pin_expected,
    pintype_expected,
    x_expected,
    y_expected:BOOLEAN;

BEGIN
real_value.ty := dfi_$double;
proot := NIL;
NEW(proot);
NEW(value.chars);
plink := proot;
pin_expected := TRUE;
x_expected := FALSE;
y_experted := FALSE;
WHILE NOT EOF(prim_file) DO
  BEGIN
pin_count := 0;
position1 := 0;
position2 := 0;
plink^.in_count := 0;
plink^.out_count := 0;
INIT_NUL(prim_array,
         sizeof(prim_array));
READLN(prim_file,prim_array);
FOR j := 1 TO num_lib_info DO
  BEGIN
  start := position2 + 1;
  find_non_blank(prim_array,
                 sizeof(prim_array),
                 position1,
                 start);
  find_blank(prim_array,
             sizeof(prim_array),
             position2,
             position1);
  IF prim_array[position1] = ';' THEN EXIT;
  IF position1 = position2 THEN  position2 := sizeof(prim_array);
  CASE j OF

    1:  BEGIN
        IF (position2 -position1) > lfunct THEN
          BEGIN
          ERROR ('FATAL >> FUNCTION LENGTH IS TOO LONG:');
          writeln(''COMPONENT DESCRIPTION = ',prim_array:sizeof(prim_array));
          terminate(abnormal);
          END
        ELSE
          BEGIN
          FOR i := position1 to position2-1 DO
```

```
          plink^.funct := prim_array[i];
        END;
      END;

2:  BEGIN
    IF (position2 -position1) > lpathname THEN
      BEGIN
      ERROR ('FATAL >> FUNCTION LENGTH IS TOO LONG:');
      writeln('COMPONENT DESCRIPTION = ',prim_array:sizeof(prim_array));
      terminate(abnormal);
      END
    ELSE
      BEGIN
      FOR i := position1 to position2-1 DO
        plink^.pathname[i - position1 + 1] := prim_array[i];
      plink^.lpathname := position2-position1;
      END;
    END;

3:  BEGIN
    real_value.doub := 0.;
    FOR i := position1 to position2-1 DO
      IF prim_array[i] IN ['0'..'9','.'] THEN
        value.chars^[i - position1 + 1] := prim_array[i]
      ELSE
        BEGIN
        WRITELN;
        WRITELN('ILLEGAL REAL VALUE FROM PRIMITIVES FILE');
        WRITELN('RECORD = ',prim_array:sizeof(prim_array));
        abort_proc;
        END ;
    value.len := position2-position1;
    dfi_$evaluate_expression(
                  value,
                  real_value,
                  error_val,
                  status_string);
    status_proc(status_string);
    plink^.upper_right.x := real_value.doub;
    END;

4:  BEGIN
    real_value.doub := 0.;
    FOR i := position1 to position2-1 DO
      IF prim_array[i] IN ['0'..'9','.'] THEN
        value.chars^[i - position1 + 1] := prim_array[i]
      ELSE
        BEGIN
        WRITELN;
        WRITELN('ILLEGAL REAL VALUE FROM PRIMITIVES FILE');
        WRITELN('RECORD = ',prim_array:sizeof(prim_array));
        abort_proc;
        END ;
```

```
    value.len := position2-position1;
    dfi_$evaluate_expression(value,
                             real_value,
                             error_val,
                             status_string);
    status_proc(status_string);
    plink^.upper_right.y := real_value.doub;
    END;

5:  BEGIN
    real_value.doub := 0.;
    FOR i := position1 to position2-1 DO
      IF prim_array[i] IN ['0'..'9','.'] THEN
        value.chars^[i - position1 + 1] := prim_array[i]
      ELSE
        BEGIN
        WRITELN;
        WRITELN('ILLEGAL REAL VALUE FROM PRIMITIVES FILE');
        WRITELN('RECORD = ',prim_array:sizeof(prim_array));
        abort_proc;
        END ;
    value.len := position2-position1;
    dfi_$evaluate_expression(value,
                             real_value,
                             error_val,
                             status_string);
    status_proc(status_string);
    plink^.lower_left.x := real_value.doub;
    END;

6:  BEGIN
    real_value.doub := 0.;
    FOR i := position1 to position2-1 DO
      IF prim_array[i] IN ['0'..'9','.'] THEN
        value.chars^[i - position1 + 1] := prim_array[i]
      ELSE
        BEGIN
        WRITELN;
        WRITELN('ILLEGAL REAL VALUE FROM PRIMITIVES FILE');
        WRITELN('RECORD = ',prim_array:sizeof(prim_array));
        abort_proc;
        END ;
    value.len := position2-position1;
    dfi_$evaluate_expression(value,
                             real_value,
                             error_val,
                             status_string);
    status_proc(status_string);
    plink^.lower_left.y := real_value.doub;
    END;

7:  BEGIN
    real_value.doub := 0.;
```

```
    FOR i := position1 to position2-1 DO
      IF prim_array[i] IN ['0'..'9','.'] THEN
        value.chars^[i - position1 + 1] := prim_array[i]
      ELSE
        BEGIN
        WRITELN;
        WRITELN('ILLEGAL REAL VALUE FROM PRIMITIVES FILE');
        WRITELN('RECORD = ',prim_array:sizeof(prim_array));
        abort_proc;
        END ;
    value.len := position2-position1;
    dfi_$evaluate_expression(value,
                             real_value,
                             error_val,
                             status_string);
    status_proc(status_string);
    plink^.base_coordinate.x := real_value.doub;
    END;
 8: BEGIN
    real_value.doub := 0.;
    FOR i := position1 to position2-1 DO
      IF prim_array[i] IN ['0'..'9','.'] THEN
        value.chars^[i - position1 + 1] := prim_array[i]
      ELSE
        BEGIN
        WRITELN;
        WRITELN('ILLEGAL REAL VALUE FROM PRIMITIVES FILE');
        WRITELN('RECORD = ',prim_array:sizeof(prim_array));
        abort_proc;
        END ;
    value.len := position2-position1;
    dfi_$evaluate_expression(value,
                             real_value,
                             error_val,
                             status_string);
    status_proc(status_string);
    plink^.base_coordinate.y := real_value.doub;
    END;

OTHERWISE
    BEGIN
    IF pin_expected THEN
      BEGIN
      IF (prim_array[position1] = 'I') OR (prim_array[position1] = 'O') THEN
      IF (prim_array[position1] = 'I') OR (prim_array[position1] = 'O') THEN
        BEGIN
        pin_count := pin_count + 1;
        FOR i := position1 to position2-1 DO
          plink^.pin_info[pin_count].pinname[i - position1 + 1] := prim_array[i];
        plink^.pin_info[pin_count].lpinname := position2-position1;
        pin_expected := FALSE;
        pintype_expected := TRUE;
        END
      ELSE
```

```
    BEGIN
    writeln;
    writeln('ILLEGAL PIN NAME FROM PRIMITIVES FILE');
    writeln('RECORD = ',prim_array:sizeof(prim_array));
    abort_proc;
    END
  END
ELSE
  IF pintype_expected THEN
    BEGIN
    INIT_NUL(temp,
             sizeof(temp));
    INIT_NUL(plink^.pin_info[pin_count].pintype,
             sizeof(plink^.pin_info[pin_count].pintype));
    IF (position2 - position1) >
        sizeof(plink^.pin_info[pin_count].pintype) THEN
      BEGIN
      writeln;
      writeln('ILLEGAL PINTYPE FROM PRIMITIVES FILE');
      writeln('RECORD = ',prim_array:sizeof(prim_array));
      abort_proc;
      END;
    FOR i := position1 to position2-1 DO
      BEGIN
      plink^.pin_info[pin_count].pintype[i - position1 + 1] := prim_array[i];
      temp[i - position1 + 1] := prim_array[i];
      END;
    IF temp = 'IN' THEN
      plink^.in_count := plink^.in_count + 1
    ELSE
      IF temp = 'OUT' THEN plink^.out_count := plink^.out_count + 1
      ELSE
        BEGIN
        writeln;
        writeln('ILLEGAL PINTYPE FROM PRIMITIVES FILE');
        writeln('RECORD = ',prim_array:sizeof(prim_array));
        abort_proc;
        END;
        pintype_expected := FALSE;
        x_expected := TRUE;
        END
      ELSE
        BEGIN
        real_value.doub := 0.;
        FOR i := position1 to position2-1 DO
            IF prim_array[i] IN ['0'..'9','.'] THEN
              value.chars^[i - position1 + 1] := prim_array[i]
          ELSE
            BEGIN
            writeln;
            writeln('ILLEGAL REAL VALUE FROM PRIMITIVES FILE');
            writeln('RECORD = ',prim_array:sizeof(prim_array));
            abort_proc;
            END ;
```

```
            value.len := position2-position1;
            dfi_$evaluate_expression(value,
                                     real_value,
                                     error_val,
                                     status_string);
            status_proc(status_string);
            IF x_expected THEN
              BEGIN
              plink^.pin_info[pin_count].loc.x := real_value.doub;
              x_expected := FALSE;
              y_expected := TRUE;
              END
            ELSE
              IF y_expected THEN
                BEGIN
                plink^.pin_info[pin_count].loc.y := real_value.doub;
                y_expected := FALSE;
                pin_expected := TRUE;
                END
              ELSE
                BEGIN
                WRITELN;
                WRITELN('PROGRAM BUG IN LOAD_PRIM_FILE PROCEDURE');
                abort_proc;
                END;
            END;
        END;
      END;
    END;
  NEW(plink^.plink);
  plink := plink^.plink;
  END;
plink := NIL;
END; {load_prim_file}

PROCEDURE create_neted_command(IN symbol_name:dynamic_string_t);

VAR  i,
     loc,
     lschematic_title:INTEGER;

BEGIN
FOR i := 1 TO sizeof(schematic_title) DO
  IF NOT (schematic_title[i] = ' ') THEN
    BEGIN
    loc := i;
    EXIT;
    END;
FOR i := loc TO sizeof(schematic_title) DO
  IF schematic_title[i] = ' ' THEN
    BEGIN
    loc := i;
    EXIT;
    END;
```

```
WRITELN(command_file,
         'NETED ',
         schematic_title:loc-1,
         '/',
         symbol_name.chars^:symbol_name.len,
         ' <<!');
WRITELN(command_file,
         'temp page ',
         page_size_width:2:5,
         ' ',
         page_size_height:2:5,
         ' ',
         pin_spacing:2:5,
         ' i');
WRITELN(command_file,
         'temp text b l O ',
         text_height:2:5,
         ' -nohidden');
END;{create_neted_command}

PROCEDURE find_primitive(IN OUT plink:prim_ptr;
                         IN funct:CHAR);

BEGIN
IF plink^.funct = funct THEN
ELSE
  BEGIN
  plink := plink^.plink;
  find_primitive(plink,
                 funct);
  END;
END;

PROCEDURE pop_out(IN OUT top:schematic_ptr);

VAR temp:schematic_ptr;

BEGIN
IF top^.schem_down <> NIL THEN
  top := top^.schem_down;
END; {pop_out}

PROCEDURE assign_in_name(IN top : schematic_ptr;
                         IN pinname_in:dynamic_string_t;
                         IN OUT index:INTEGER);

VAR x_val,
    y_val : REAL;

BEGIN
x_val := top^.prim_ptr^.pin_info[index].loc.x +
         top^.base_point.x;
y_val := top^.prim_ptr^.pin_info[index].loc.y +
         top^.base_point.y;
```

```
writeln(command_file,'UNSELECT ALL');
writeln(command_file,'MARK ',
                     x_val:2:5,
                     ' ',
                     y_val:2:5);
writeln(command_file,'SELECT AREA ',
                     x_val:2:5,
                     ' ',
                     y_val:2:5,
                     ' -VERTEX');
x_val := top^.prim_ptr^.pin_info[top^.in_count].loc.x +
         top^.base_point.x -
         ((pinname_in.len * text_height)/2);
y_val := top^.prim_ptr^.pin_info[top^.in_count].loc.y +
         top^.base_point.y +
         text_height;
WRITELN(command_file,'ADD PROPERTY NET ',
                     pinname_in.chars^:pinname_in.len,
                     ' ',
                     x_val:2:5,
                     ' ',
                     y_val:2:5);
index := index -1;
END; {assign_in_name}

PROCEDURE assign_out_name(IN top : schematic_ptr;
                          IN OUT pinname_out:dynamic_string_t;
                          IN  OUT out_count:INTEGER;
                          IN OUT pin_out_count:INTEGER);

VAR x_val,
    y_val : REAL;

BEGIN
pin_out_count := pin_out_count - 1;
IF out_count <> -1 THEN
  BEGIN
  out_count := out_count + 1;
  IF out_count <= 9 THEN
    BEGIN
     pinname_out.chars^[3] := chr(ord('0') + out_count);
     pinname_out.len := 3;
     END
   ELSE
    BEGIN
    pinname_out.chars^[3] := chr(ord('0') + (out_count DIV 10));
    pinname_out.chars^[4] := chr(ord('0') + (out_count MOD 10));
    pinname_out.len := 4;
    END;
  END;
x_val := top^.prim_ptr^.pin_info[top^.prim_ptr^.in_count + 1].loc.x +
         top^.base_point.x;
y_val := top^.prim_ptr^.pin_info[top^.prim_ptr^.in_count + 1].loc.y +
         top^.base_point.y;
```

```
writeln(command_file,'UNSELECT ALL');
writeln(command_file,'MARK ',
                      x_val:2:5,
                      ' ',
                      y_val:2:5);
writeln(command_file,'SELECT AREA ',
                      x_val:2:5,
                      ' ',
                      y_val:2:5,
                      ' -VERTEX');
x_val := top^.prim_ptr^.pin_info[top^.prim_ptr^.in_count + 1].loc.x +
         top^.base_point.x -
         ((pinname_out.len * text_height)/2);
y_val := top^.prim_ptr^.pin_info[top^.prim_ptr^.in_count + 1].loc.y +
         top^.base_point.y +
         text_height;
WRITELN(command_file,'ADD PROPERTY NET ',
                      pinname_out.chars^:pinname_out.len,
                      ' ',
                      x_val:2:5,
                      ' ',
                      y_val:2:5);
END; {assign_out_name}

PROCEDURE find_first_in(IN OUT top : schematic_ptr;
                        IN OUT top_in:schematic_ptr);

BEGIN
IF top^.in_count > 0 THEN
  top_in := top
ELSE
  IF top^.schem_down <> NIL THEN
    find_first_in(top^.schem_down,
                  top_in)
  ELSE
    BEGIN
    WRITELN('PROGRAM BUG IN FIND_FIRST_IN');
    abort_proc;
    END;
END; {find_first_in}

PROCEDURE assign_net_command(IN OUT top:schematic_ptr;
                             IN pinname_in:dynamic_string_t;
                             IN OUT index,out_count:INTEGER);

VAR top_temp:schematic_ptr;

BEGIN
assign_in_name(top,
               pinname_in,
               index);
top_temp := top;
WHILE (top_temp^.in_count = 0) AND (top_temp^.schem_down <> NIL) DO
    BEGIN
```

```
      assign_out_name(top_temp,
                      pinname_out,
                      out_count,
                      top_temp^.out_count);
      pop_out(top);
      pop_out(top_temp);
      find_first_in(top,
                    top_temp);
      assign_in_name(top_temp,
                     pinname_out,
                     top_temp^.in_count);
      END
  END; {assign_net_command}

  PROCEDURE push_out(IN schem_out:schematic_ptr;
                     IN OUT top:schematic_ptr);

  VAR temp:schematic_ptr;

  BEGIN
  IF top <> NIL THEN
    BEGIN
    temp := top;
    top := schem_out;
    top^.schem_down := temp;
    END
  ELSE
    BEGIN
    top := schem_out;
    top^.schem_down := NIL;
    END;
  END; {push_out}

PROCEDURE create_placement_commands(p:link);

Begin {preorder}
IF P <> NIL THEN
  BEGIN
  PREORDER_COUNT:=PREORDER_COUNT+1;
  IF p^.data.id.chars^[1] IN ['+','@','*','#','=',''''] THEN
    BEGIN
    ptemp := proot;
    NEW(schematic[row,col]);
    find_primitive(ptemp,
                   p^.data.id.chars^[1]);
    schematic[row,col]^.prim_ptr := ptemp;
    schematic[row,col]^.in_count := ptemp^.in_count;
    schematic[row,col]^.out_count := ptemp^.out_count;
    schematic[row,col]^.base_point.x := ptemp^.base_coordinate.x +
                                        ((row) * comp_size_x);
    schematic[row,col]^.base_point.y := ptemp^.base_coordinate.y +
                                        ((col) * comp_size_y);
    push_out(schematic[row,col],
             top);
```

```
      push_out(schematic[row,col],
               topin);
      writeln(command_file,
              'ACT COMP ',
              schematic[row,col]^.prim_ptr^.pathname:
              schematic[row,col]^.prim_ptr^.lpathname);
      writeln(command_file,
              'INST COMP ',
              schematic[row,col]^.base_point.x:2:5,
              ' ',
              schematic[row,col]^.base_point.y:2:5);
      IF row = -max_comp_row THEN
        BEGIN
        row := start_point_x;
        col := col - 1;
        END
      ELSE row := row - 1;
      END
    ELSE
      BEGIN
      find_first_in(top,
                    topin);
      IF topin^.in_count > 0 THEN
          assign_net_command(topin,
                             p^.data.id,
                             topin^.in_count,
                             out_count)
      ELSE
        BEGIN
        WRITELN;
        WRITELN('PROGRAM BUG IN CREATE_PLACEMENT_COMMANDS');
        abort_proc;
        END;
      comp_count := comp_count + 1;
      END;
    create_placement_commands(P^.LLINK);
    create_placement_commands(P^.RLINK);
    END;
  End;  {create_placement_commands}

  PROCEDURE count_functions(IN OUT function_count:INTEGER;
                            p:link);

 BEGIN
 IF P <> NIL THEN
   BEGIN
   count_functions(function_count,
                   P^.LLINK);
   count_functions(function_count,
                   P^.RLINK);
   IF p^.data.id.chars^[1] IN ['+','@','*','#',''''] THEN
     function_count := function_count + 1;
   END;
 End;  {count_functions}
```

```
PROCEDURE assign_out_net_commands(IN OUT top:schematic_ptr;
                                  IN OUT pinname_out:dynamic_string_t;
                                  IN OUT out_count:INTEGER;
                                  out_name:boolean_equation);

VAR top_temp:schematic_ptr;
    count,
    temp:INTEGER;
    found :BOOLEAN;

BEGIN
WHILE top^.schem_down <> NIL DO
  BEGIN
  WHILE top^.out_count = 0 DO
    pop_out(top);
  assign_out_name(top,
                  pinname_out,
                  out_count,
                  top^.out_count);
  pop_out(top);
  top_temp := top;
  find_first_in(top,
                top_temp);
  IF out_count <= 9 THEN
    BEGIN
    pinname_out.chars^[3] := chr(ord('0') + out_count);
    pinname_out.len := 3;
    END
  ELSE
    BEGIN
    pinname_out.chars^[3] := chr(ord('0') + (out_count DIV 10));
    pinname_out.chars^[4] := chr(ord('0') + (out_count MOD 10));
    pinname_out.len := 4;
    END;
  assign_in_name(top_temp,
                 pinname_out,
                 top_temp^.in_count);
  END;
temp := out_count;
out_count := -1;
count := 0;
found := FALSE;
FOR i := 1 TO out_name.id.len DO
  IF found THEN
    BEGIN
    count := count + 1;
    out_name.id.chars^[count] := out_name.id.chars^[i]
    END
  ELSE
    IF out_name.id.chars^[i] = '$' THEN found := TRUE;
IF NOT found THEN
  BEGIN
  WRITELN('PROGRAM BUG IN ASSIGN OUT NET COMMAND');
```

```
   abort_proc;
   END;
 out_name.id.len := count;
 assign_out_name(top,
                 out_name.id,
                 out_count,
                 top^.out_count);
 out_count := temp;
 pop_out(top);
 END; {assign_out_net_commands}

 PROCEDURE assign_buffer(IN OUT pinname_in,pinname_out:dynamic_string_t);

 VAR x_val,
     y_val:REAL;
     found :BOOLEAN;
     i,
     count :INTEGER;

 BEGIN
 count := 0;
 found := FALSE;
 NEW(schematic[row,col]);
 find_primitive(ptemp,
                '=');
 schematic[row,col]^.prim_ptr := ptemp;
 writeln('in_count = ',ptemp^.in_count:5);
 writeln('out_count = ',ptemp^.out_count:5);
 schematic[row,col]^.in_count := ptemp^.in_count;
 schematic[row,col]^.out_count := ptemp^.out_count;
 schematic[row,col]^.base_point.x := ptemp^.base_coordinate.x +
                                     ((row) * comp_size_x);
 schematic[row,col]^.base_point.y := ptemp^.base_coordinate.y +
                                     ((col) * comp_size_y);
 writeln(command_file,
         'ACT COMP ',
         schematic[row,col]^.prim_ptr^.pathname:
         schematic[row,col]^.prim_ptr^.lpathname);
 writeln(command_file,
         'INST COMP ',
         schematic[row,col]^.base_point.x:2:5,
         ' ',
         schematic[row,col]^.base_point.y:2:5);
 x_val := ptemp^.pin_info[ptemp^.out_count].loc.x +
          schematic[row,col]^.base_point.x;
 y_val := ptemp^.pin_info[ptemp^.out_count].loc.y +
          schematic[row,col]^.base_point.y;
 writeln(command_file,'UNSELECT ALL');
 writeln(command_file,'MARK ',
                      x_val:2:5,
                      ' ',
                      y_val:2:5);
 writeln(command_file,'SELECT AREA ',
```

```
                        x_val:2:5,
                        ' ',
                        y_val:2:5,
                        ' -VERTEX');
x_val := ptemp^.pin_info[ptemp^.out_count].loc.x +
          schematic[row,col]^.base_point.x -
          ((pinname_out.len * text_height)/2);
y_val := ptemp^.pin_info[ptemp^.out_count].loc.y +
          schematic[row,col]^.base_point.y +
          text_height;
WRITELN(command_file,'ADD PROPERTY NET ',
                        pinname_out.chars^:pinname_out.len,
                        ' ',
                        x_val:2:5,
                        ' ',
                        y_val:2:5);
x_val := ptemp^.pin_info[ptemp^.in_count+1].loc.x +
          schematic[row,col]^.base_point.x;
y_val := ptemp^.pin_info[ptemp^.in_count+1].loc.y +
          schematic[row,col]^.base_point.y;
writeln(command_file,'UNSELECT ALL');
writeln(command_file,'MARK ',
                        x_val:2:5,
                        ' ',
                        y_val:2:5);
writeln(command_file,'SELECT AREA ',
                        x_val:2:5,
                        ' ',
                        y_val:2:5,
                        ' -VERTEX');
x_val := ptemp^.pin_info[ptemp^.in_count+1].loc.x +
          schematic[row,col]^.base_point.x -
          ((pinname_in.len * text_height)/2);
y_val := ptemp^.pin_info[ptemp^.in_count+1].loc.y +
          schematic[row,col]^.base_point.y +
          text_height;
WRITELN(command_file,'ADD PROPERTY NET ',
                        pinname_in.chars^:pinname_in.len,
                        ' ',
                        x_val:2:5,
                        ' ',
                        y_val:2:5);
IF row = -max_comp_row THEN
  BEGIN
  row := start_point_x;
  col := col - 1;
  END
ELSE row := row - 1;
END;

PROCEDURE create_net_command_file;

VAR function_count,
    k,
```

```
      I,
      i,
      temp_index,
      index3,
      index4,
      j:INTEGER;
      pinname_temp1,
      pinname_temp2,
      pinname_temp:dynamic_string_t;
      found :BOOLEAN;

BEGIN
Open(command_file,'NETED_COMMAND_FILE','new',status);
rewrite(command_file);
NEW(pinname_temp.chars);
NEW(pinname_temp1.chars);
NEW(pinname_temp2.chars);
FOR i:=1 TO NMACROS DO
  BEGIN
  WRITELN;
  writeln('MACRO BEING PROCESSED IS ',MACRO_LIBRARY[I].ID.CHARS^:MACRO_LIBRARY[I].ID.LEN);
  out_count := 0;
  function_count := 0;
create_neted_command(macro_library[i].id);
FOR j:=1 TO MAX_INPINS DO
  BEGIN
  IF MACRO_LIBRARY[I].IN_LIST[J].ID.LEN <= 0 THEN EXIT;
  END;
FOR j := 1 TO MAX_OUTPINS DO
  BEGIN
  IF MACRO_LIBRARY[I].OUT_DEFS[J] = NIL  THEN EXIT;
  IF MACRO_LIBRARY[I].OUT_DEFS[J]^.ID.LEN <= 0 THEN EXIT;
  count_functions(function_count,
                  MACRO_LIBRARY[I].OUT_DEFS[J]^.EQN);
  END;
start_point_x := ((function_count DIV (2 * max_comp_row)) * comp_size_x) + start_x;
start_point_y := ((function_count DIV (2 * max_comp_col)) * comp_size_y) + start_y;
row := start_point_x;
col := start_point_y;
IF (row > max_comp_row) OR ((-row) < (-max_comp_row)) OR
   (col > max_comp_col) OR ((-col) < (-max_comp_col)) THEN
  BEGIN
  ERROR ('FATAL >> SCHEMATIC SHEET IS TOO SMALL:');
  terminate(abnormal);
  END;
FOR j := 1 TO MAX_OUTPINS DO
  BEGIN
  IF MACRO_LIBRARY[I].OUT_DEFS[J] = NIL THEN EXIT;
  IF MACRO_LIBRARY[I].OUT_DEFS[J]^.ID.LEN <= 0 THEN EXIT;
  comp_count := 0;
  ptemp := proot;
  preorder_count := 0;
  top := NIL;
  topin := NIL;
```

```
l := 0;
found := FALSE;
pinname_temp.len := 0;
FOR k := 1 TO MACRO_LIBRARY[I].OUT_DEFS[J]^.id.len DO
IF found THEN
  BEGIN
  pinname_temp.len := pinname_temp.len + 1;
  l := l + 1;
  pinname_temp.chars^[l] := MACRO_LIBRARY[I].OUT_DEFS[J]^.id.chars^[k];
  END
ELSE
  IF MACRO_LIBRARY[I].OUT_DEFS[J]^.id.chars^[k] = '$' THEN found := TRUE;
  IF duplicate_pin(pinname_temp,
                 i,
                    index3) THEN
    BEGIN
    assign_buffer(pinname_temp,
                 MACRO_LIBRARY[I].OUT_DEFS[index3]^.id);
    writeln('pin =',MACRO_LIBRARY[I].OUT_DEFS[J]^.id.chars^:
            MACRO_LIBRARY[I].OUT_DEFS[J]^.ID.LEN, ' is a dupout of ',
            MACRO_LIBRARY[I].OUT_DEFS[INDEX3]^.ID.CHARS^:
            MACRO_LIBRARY[I].OUT_DEFS[INDEX3]^.ID.LEN);
    END
  ELSE
    IF (MACRO_LIBRARY[I].OUT_DEFS[J]^.eqn^.data.type_id = state_id) OR
       (MACRO_LIBRARY[I].OUT_DEFS[J]^.eqn^.data.type_id = latch_id) THEN
      BEGIN
      l := 0;
      pinname_temp1.len := 0;
      found := FALSE;
      IF (MACRO_LIBRARY[I].OUT_DEFS[J]^.eqn^.data.type_id = state_id) THEN
        BEGIN
        l := 0;
        found := FALSE;
        pinname_temp2.len := 0;
        FOR k := 1 TO MACRO_LIBRARY[I].OUT_DEFS[J]^.eqn^.data.id.len DO
IF found THEN
  BEGIN
  pinname_temp2.len := pinname_temp2.len + 1;
  l := l + 1;
  pinname_temp2.chars^[l] := MACRO_LIBRARY[I].OUT_DEFS[J]^.eqn^.data.id.chars^[k];
  END
ELSE
  IF MACRO_LIBRARY[I].OUT_DEFS[J]^.eqn^.data.id.chars^[k] = '$' THEN found := TRUE;
writeln('state id');
find_eqn_in_state_library(pinname_temp2,index4);
writeln('state length = ',MACRO_LIBRARY[I].OUT_DEFS[J]^.eqn^.data.id.len:5);
 FOR k :=  MACRO_state_LIBRARY[index4].id.len DOWNTO 1 DO                }
FOR k :=  MACRO_LIBRARY[I].OUT_DEFS[J]^.eqn^.data.id.len DOWNTO 1 DO
  IF MACRO_LIBRARY[I].OUT_DEFS[J]^.eqn^.data.id.chars^[k] = '$' THEN
    BEGIN
    writeln('found');
    temp_index := k + 1;
```

```
      found := TRUE;
      EXIT;
      END;
  writeln ('temp_index = ',temp_index:5);
  IF found THEN
    FOR k :=  temp_index TO MACRO_LIBRARY[I].OUT_DEFS[J]^.eqn^.data.id.len DO
      BEGIN
      l := l + 1;
      pinname_temp1.chars^[l] := MACRO_LIBRARY[I].OUT_DEFS[J]^.eqn^.data.id.chars^[k];
      END;
  END
ELSE
  IF (MACRO_LIBRARY[I].OUT_DEFS[J]^.eqn^.data.type_id = latch_id) THEN
    BEGIN
    l := 0;
    pinname_temp2.len := 0;
    found := FALSE;.
    FOR k := 1 TO MACRO_LIBRARY[I].OUT_DEFS[J]^.eqn^.data.id.len DO
      IF found THEN
        BEGIN
        pinname_temp2.len := pinname_temp2.len + 1;
        l := l + 1;
        pinname_temp2.chars^[l] := MACRO_LIBRARY[I].OUT_DEFS[J]^.eqn^.data.id.chars^[k];
        END
      ELSE
        IF MACRO_LIBRARY[I].OUT_DEFS[J]^.eqn^.data.id.chars^[k] = '$' THEN found := TRUE;
    writeln('latch id');
      find_eqn_in_latch_library(pinname_temp2,index4);
      FOR k :=  MACRO_latch_LIBRARY[index4].id.len DOWNTO 1 DO              }
    FOR k := MACRO_LIBRARY[I].OUT_DEFS[J]^.eqn^.data.id.len DOWNTO 1 DO
      IF MACRO_LIBRARY[I].OUT_DEFS[J]^.eqn^.data.id.chars^[k] = '$' THEN
        BEGIN
        writeln('found');
        temp_index := k + 1;
        found := TRUE;
        EXIT;
        END;
    writeln ('temp_index = ',temp_index:5);
    writeln('latch length = ',MACRO_LIBRARY[I].OUT_DEFS[J]^.eqn^.data.id.len:5);
    IF found THEN
      FOR k :=  temp_index TO MACRO_LIBRARY[I].OUT_DEFS[J]^.eqn^.data.id.len DO
        BEGIN
        l := l + 1;
        pinname_temp1.chars^[l] := MACRO_LIBRARY[I].OUT_DEFS[J]^.eqn^.data.id.chars^[k];
        END;
    END
  ELSE
    BEGIN
    writeln('ERROR in LIBRARY: latch or state expected but not found.');
    abort_proc;
pinname_temp1.len := l;
assign_buffer(pinname_temp,
              pinname_temp1);
IF (MACRO_LIBRARY[I].OUT_DEFS[J]^.eqn^.data.type_id = latch_id) THEN
```

```
        BEGIN
        WRITELN('LATCH NAME = ',MACRO_latch_LIBRARY[index4].ID.CHARS^:
                                MACRO_latch_LIBRARY[index4].ID.LEN);
        create_placement_commands(MACRO_latch_LIBRARY[index4].eqn);
        IF topin <> NIL THEN
          assign_out_net_commands(topin,
                                  pinname_out,
                                  out_count,
                                  MACRO_latch_LIBRARY[index4]);
        END
      ELSE
        BEGIN
        IF (MACRO_LIBRARY[I].OUT_DEFS[J]^.eqn^.data.type_id = state_id) THEN
          create_placement_commands(MACRO_state_LIBRARY[index4].eqn);
        IF topin <> NIL THEN
          assign_out_net_commands(topin,
                                  pinname_out,
                                  out_count,
                                  MACRO_state_LIBRARY[index4]);
        END;
      END
    ELSE
      BEGIN
      create_placement_commands(MACRO_LIBRARY[I].OUT_DEFS[J]^.EQN);
      IF topin <> NIL THEN
        assign_out_net_commands(topin,
                                pinname_out,
                                out_count,
                                MACRO_LIBRARY[I].OUT_DEFS[J]^);
      END;
  END;
 writeln(command_file,
        'quit -f');
 writeln(command_file,
        '!');
 END;
close(command_file);
END; {create_net_command_file}

BEGIN
NEW(pinname_out.chars);
pinname_out.chars^ :='N$';
pinname_out.len := 2;
NEW(ptemp);
WRITELN('GENERATE SCHEMATICS');
INIT_NUL(LIBRARY_TITLE,LFILE_TITLE);
INIT_NUL(prim_title,sizeof(prim_title));
INIT_NUL(command_title,sizeof(command_title));
WRITELN;
WRITELN('ENTER THE LIBRARY PATHNAME:');
READln(LIBRARY_TITLE);
Open(library,LIBRARY_TITLE,'old',status);
IF STATUS > 0 THEN
  BEGIN
  ERROR ('Problem with file.');
```

```
  WRITELN('>>',LIBRARY_TITLE:-1);
  TERMINATE(ABNORMAL);
  END;
Reset(library);
Load_macrocell_eqn_library;
WRITELN;
WRITELN('ENTER THE PRIMITIVES PATHNAME:');
READLN(prim_title);
Open(prim_file,prim_title,'old',status);
IF STATUS > 0 THEN
  BEGIN
  ERROR ('Problem with file.');
  WRITEln('>>',prim_title:-1);
  TERMINATE(ABNORMAL);
  END;
Reset(prim_file);
load_prim_file;
PROOT_EXPRESSION := NIL;
WRITELN;
WRITELN('ENTER THE SCHEMATIC LIBRARY PATHNAME:');
READ(SCHEMATIC_TITLE);
create_net_command_file;
END; {generate_lib_schematics}

{*****************************************************************************}
{*****************************************************************************}

{*****************************************************************************}


PROCEDURE FIND_CHAIN_ORDER;
VAR C,I,LAST_SIM_TIME:INTEGER16;
  BUS:DYNAMIC_STRING_T;
 {* * * * * * * * * * * * * * * * * * * * * * * * * * * * * * * * * * * * * *}
  PROCEDURE DUMP_SIM_STATE_EQNS;
  VAR I:INTEGER16;
  BEGIN {DUMP_SIM_STATE_EQNS}

    WRITELN('************** DUMPING SIM_STATE_EQNS ********************');
    WRITELN('     #     TIME  NET ID         VALUE');
    WRITELN('---------------------------------------------------------');

    FOR I:=1 TO CHAINS[C].LEN DO
    BEGIN
      WRITELN(X4,I:3,X4,CHAINS[C].STATES[ I ]^.RANK:2,X4,CHAINS[C].STATES[ I ]^.ID.CHARS^:CHAINS[C].STATES[ I ]^.ID.LEN,
              X4, CHAINS[C].STATES[ I ]^.VALUE:-1);
    END;
  END; {DUMP_SIM_STATE_EQNS}
  {* * * * * * * * * * * * * * * * * * * * * * * * * * * * * * * * * * * * * *}

  PROCEDURE DUMP_SIM_LATCH_EQNS;
  VAR I:INTEGER16;
  BEGIN {DUMP_SIM_LATCH_EQNS}
```

```
    WRITELN('**************** DUMPING SIM_LATCH_EQNS *************************');
    WRITELN('     #     RANK  NET ID          VALUE');
    WRITELN('-----------------------------------------------------------');

    FOR I:=1 TO NSIM_LATCH_EQNS DO
    BEGIN
      WRITELN(X4,I:3,X4,SIM_LATCH_EQNS[ I ]^.RANK:2,X4,SIM_LATCH_EQNS[ I ]^.ID.CHARS^:SIM_LATCH_EQNS[ I ]^.ID.LEN,
              X4, SIM_LATCH_EQNS[ I ]^.VALUE:-1);
    END;

  END; {DUMP_SIM_LATCH_EQNS}
  (* * * * * * * * * * * * * * * * * * * * * * * * * * * * * * * * * * * * * * *)

  PROCEDURE DUMP_SIM_NETS;
  VAR I:INTEGER16;
  BEGIN {DUMP_SIM_NETS}

  WRITELN('**************** DUMPING SIM_NETS *************************');
  WRITELN('     #     RANK  NET ID          VALUE');
  WRITELN('-----------------------------------------------------------');

  FOR I:=1 TO NSIM_NETS DO
  BEGIN
    WRITELN(X4,I:3,X4,SIM_NETS[ I ]^.RANK:2,X4,SIM_NETS[ I ]^.BUS_NAME.CHARS^:SIM_NETS[ I ]^.BUS_NAME.LEN,
            X4, SIM_NETS[ I ]^.VALUE:-1);
  END;

END; {DUMP_SIM_NETS}

(* * * * * * * * * * * * * * * * * * * * * * * * * * * * * * * * * * * * * * *)
PROCEDURE DO_SIM_SETUP(IN OUT CHAIN:CHAIN_REC);
VAR S,INDEX_I,INDEX_O, BIT1,BIT2:INTEGER16;
  PTYPE:PIN_TYPE;

  (*   *   *   *   *   *   *   *   *   *   *   *   *   *   *   *   *   *   *   *   *)
  PROCEDURE FIND_EQNS_IN_PATH(IN OUT NET:PTR_NETEQN);
  VAR I,D:INTEGER16;

    (*   *   *   *   *   *   *   *   *   *   *   *   *   *   *   *   *   *   *   *   *)
    FUNCTION ADD_TO_SIM_NETS(IN NET:PTR_NETEQN):BOOLEAN;
    VAR I:INTEGER16;
    BEGIN {ADD_TO_SIM_NETS}
      { ADD_TO_SIM_NETS will check to see if NET
        is already on the list before adding it.
        NET will only be added once. }

      ADD_TO_SIM_NETS:=FALSE;

      FOR I:= 1 TO NSIM_NETS DO
      BEGIN
        IF SIM_NETS[I] = NET THEN
          RETURN;
      END;
```

```
  NSIM_NETS:=NSIM_NETS+1;

  IF NSIM_NETS > MAX_NETS THEN
  BEGIN
    ERROR ('Internal net limit exceeded while tracing chain.');
    MSG('MAX_NETS must be increased.');
    TERMINATE(ABNORMAL);
  END;

  SIM_NETS[ NSIM_NETS ]:=NET;
  SIM_NETS[ NSIM_NETS ]^.VALUE:=SIM_INIT_VALUE;
  ADD_TO_SIM_NETS:=TRUE;

END; {ADD_TO_SIM_NETS}
(*   *   *   *   *   *   *   *   *   *   *   *   *   *   *   *   *   *   *   *)
PROCEDURE ADD_TO_SIM_STATE_EQNS(IN NET:PTR_NETEQN);
VAR I,NSTATES_ADDED:INTEGER16;

  (*   *   *   *   *   *   *   *   *   *   *   *   *   *   *   *   *   *   *   *)
  PROCEDURE NEW_SIM_STATE_EQN(IN NET:PTR_NETEQN);
  BEGIN {NEW_SIM_STATE_EQN}
    CHAINS[C].LEN:=CHAINS[C].LEN+1;

    IF CHAINS[C].LEN > MAX_NSTATES THEN
    BEGIN
      ERROR ('Internal state limit exceeded while tracing chain.');
      MSG('MAX_NSTATES must be increased.');
      TERMINATE(ABNORMAL);
    END;

    CHAINS[C].STATES[ CHAINS[C].LEN ]:=NET;
    CHAINS[C].STATES[ CHAINS[C].LEN ]^.VALUE:=SIM_INIT_VALUE;
    CHAINS[C].STATES[ CHAINS[C].LEN ]^.RANK:=0;
  END; {NEW_SIM_STATE_EQN}


  (*   *   *   *   *   *   *   *   *   *   *   *   *   *   *   *   *   *   *   *)
  PROCEDURE NEW_SIM_LATCH_EQN(IN NET:PTR_NETEQN);
  BEGIN {NEW_SIM_LATCH_EQN}
    NSIM_LATCH_EQNS:=NSIM_LATCH_EQNS+1;

    IF NSIM_LATCH_EQNS > MAX_NLATCHES THEN
    BEGIN
      ERROR ('Internal latch limit exceeded while tracing chain.');
      MSG('MAX_NLATCHES must be increased.');
      TERMINATE(ABNORMAL);
    END;

    SIM_LATCH_EQNS[ NSIM_LATCH_EQNS ]:=NET;
    SIM_LATCH_EQNS[ NSIM_LATCH_EQNS ]^.VALUE:=SIM_INIT_VALUE;
  END; {NEW_SIM_LATCH_EQN}

  (*   *   *   *   *   *   *   *   *   *   *   *   *   *   *   *   *   *   *   *)
```

```
BEGIN {ADD_TO_SIM_STATE_EQNS}
  { ADD_TO_SIM_STATE_EQNS takes the driving
    INST of NET and adds all of the STATE_EQNS
    with the same driving INST to the list
    SIM_STATE_EQNS.  Note:  multiple occurances
    are skipped. }

  { Check to see if it has already been added.}

  { May be a state (flip flop)  or a latch. }

  { Check STATES. }

  { NOTE: don't index through all driving instances in INST
    because STATE_EQNS only uses INST[1].}


  FOR I:= 1 TO CHAINS[C].LEN DO
  BEGIN
    IF CHAINS[C].STATES[I]^.INST[1] = NET^.INST[1] THEN
      RETURN;
  END;

  NSTATES_ADDED:=0;

  FOR I:= 1 TO NSTATES DO
  BEGIN
    IF STATE_EQNS[I]^.INST[1] = NET^.INST[1] THEN
    BEGIN
      NEW_SIM_STATE_EQN(STATE_EQNS[I]);
      NSTATES_ADDED:=NSTATES_ADDED+1;
    END;
  END;

  { NOTE: if a flip-flop and latch are ever put in
    the same macrocell (instance) modifications will
    be necessary.}


  IF NSTATES_ADDED = 0 THEN
  BEGIN
    { Must be a latch. }

      FOR I:= 1 TO NSIM_LATCH_EQNS DO
      BEGIN
        IF SIM_LATCH_EQNS[I]^.INST[1] = NET^.INST[1] THEN
          RETURN;
      END;


      FOR I:= 1 TO NLATCHES DO
      BEGIN
        IF LATCH_EQNS[I]^.INST[1] = NET^.INST[1] THEN
```

```
          NEW_SIM_LATCH_EQN(LATCH_EQNS[I]);
        END;
      END;

    END; {ADD_TO_SIM_STATE_EQNS}
    {*   *   *   *   *   *   *   *   *   *   *   *   *   *   *   *   *   *   *   *}

  BEGIN {FIND_EQNS_IN_PATH}

    { FIND_EQNS_IN_PATH will set SIM_NETS to point to
      the records in NET_EQNS for all of the nets
      in the path from SDO to the primary inputs.
      It will initialize all VALUE fields it uses
      to SIM_INIT_VALUE. }


    {% DEBUG  WRITELN('WORKING ON >> ',NET^.BUS_NAME.CHARS^:NET^.BUS_NAME.LEN);}

    IF NET^.RANK = 0 THEN
    BEGIN
      { Primary Input }

      IF ADD_TO_SIM_NETS(NET) THEN
        {NO-OP};
      RETURN;

    END;


    IF NOT NET^.PATH THEN
    BEGIN

      IF ADD_TO_SIM_NETS(NET) THEN
      BEGIN

        { First occurance of this net. Trace all inputs. }

        NET^.PATH:=TRUE;

        IF NET^.STATE THEN
          ADD_TO_SIM_STATE_EQNS(NET);

        FOR D:= 1 TO MAX_DRIVES DO
        BEGIN
          IF NET^.INST[D] = NIL THEN EXIT;

          FOR I:= 1 TO MAX_INPINS DO
          BEGIN
            IF NET^.INST[D]^.IN_LIST[I].ID.LEN <= 0 THEN EXIT;
            FIND_EQNS_IN_PATH(NET_EQNS[NET^.INST[D]^.IN_LIST[I].INDEX]);
          END;
```

```
      NET^.PATH:=FALSE;
    END;
  END
  ELSE
  BEGIN

    { loop found !!!!! Path finished. }

    NET^.PATH:=FALSE;

  END;

  {% DEBUG  WRITELN(' << DONE WITH >> ',NET^.BUS_NAME.CHARS^:NET^.BUS_NAME.LEN);}

END; {FIND_EQNS_IN_PATH}
{*   *   *   *   *   *   *   *   *   *   *   *   *   *   *   *   *   *   *   *}
Procedure SORT_SIM_NETS_by_rank;
VAR I,J,RANK:INTEGER16;
  TEMP:PTR_NETEQN;

Begin {SORT_SIM_NETS_by_rank}

  {Arrange SIM_NETS in order of rank.}

  I:=0;
  FOR RANK:= 0 TO MAX_RANK DO
  BEGIN
    FOR J:= I+1 TO NSIM_NETS DO
    BEGIN
      IF SIM_NETS[J]^.RANK = RANK THEN
      BEGIN
        I:=I+1;
        IF I = J THEN NEXT;
        TEMP:=SIM_NETS[I];
        SIM_NETS[I]:=SIM_NETS[J];
        SIM_NETS[J]:=TEMP;
      END;
    END;
  END;

End;  {SORT_SIM_NETS_by_rank}
{*   *   *   *   *   *   *   *   *   *   *   *   *   *   *   *   *   *   *   *}

BEGIN { DO_SIM_SETUP}
  NSIM_NETS:=0;
  NSIM_LATCH_EQNS:=0;

  { All primary inputs except CLK, SDI, and SHIFT_ENABLES
    will be tied low during this simulation.

    CLK will be toggled.
    SDI will be initially high for 1 CLK cycle after simtime= 1, then low.
    SHIFT_ENABLES will be tied high.
  ;
```

```
{ Find SDO in package pin list. }

DECODE_BUS_NAME(CHAIN.SDO.ID,BUS,BIT1,BIT2);

FIND_PRIMARY_PIN(BUS,BIT1,PTYPE,INDEX_I,INDEX_O);

IF INDEX_O <= 0 THEN
BEGIN
  ERROR ('SDO not found.');
  WRITELN('SDO >> ',CHAIN.SDO.ID.CHARS^:CHAIN.SDO.ID.LEN);
END
ELSE
BEGIN
  CHAIN.SDO:=PRIMARY_OUTPINS[INDEX_O];

  IF NOT CHAIN.SDO.NET^.VALID THEN
    RETURN;


  GET_NAME(CHAIN.SDO.NET,NAME);
  WRITELN('# Tracing chain piece where the SDO is ',NAME:-1,'.');

  { FIND_EQNS_IN_PATH will set SIM_NETS to point to
    the records in NET_EQNS for all of the nets
    in the path from SDO to the primary inputs.
    It will initialize all VALUE fields it uses
    to SIM_INIT_VALUE. }


  FIND_EQNS_IN_PATH(CHAIN.SDO.NET);
END;

SORT_SIM_NETS_BY_RANK;

IF DUMP_SIM THEN
BEGIN
  DUMP_SIM_NETS;
  DUMP_SIM_STATE_EQNS;
  DUMP_SIM_LATCH_EQNS;
END;


{ Setup CLK, SDI, and SHIFT_ENABLES to
  their necessary initial values.     }

{ SDI }

DECODE_BUS_NAME(CHAIN.SDI.ID,BUS,BIT1,BIT2);
FIND_PRIMARY_PIN(BUS,BIT1,PTYPE,INDEX_I,INDEX_O);

IF INDEX_I <= 0 THEN
BEGIN
  ERROR ('SDI not found.');
```

```
  WRITELN('SDI >> ',CHAIN.SDI.ID.CHARS^:CHAIN.SDI.ID.LEN);
END
ELSE
BEGIN
  CHAIN.SDI:=PRIMARY_INPINS[INDEX_I];

  { SDI will be set true during
    simulation following initialization. }

  CHAIN.SDI.NET^.VALUE:=FALSE;
END;


{ CLK }

DECODE_BUS_NAME(CHAIN.CLK.ID,BUS,BIT1,BIT2);
FIND_PRIMARY_PIN(BUS,BIT1,PTYPE,INDEX_I,INDEX_O);

IF INDEX_I <= 0 THEN
BEGIN
  ERROR ('CLK not found.');
  WRITELN('CLK >> ',CHAIN.CLK.ID.CHARS^:CHAIN.CLK.ID.LEN);
END
ELSE
BEGIN
  CHAIN.CLK:=PRIMARY_INPINS[INDEX_I];
  CHAIN.CLK.NET^.VALUE:=TRUE;
END;


{ SHIFT_ENABLES }

FOR S:= 1 TO MAX_SHIFT_ENABLES DO
BEGIN
  IF CHAIN.SHIFT_ENABLE[S].ID.LEN <= 0 THEN
  BEGIN
    IF S = 1 THEN
    BEGIN
      MSG('NOTE:  No SHIFT_ENABLE was specified for this chain piece.');
    END;

    EXIT;
  END
  ELSE
  BEGIN

    DECODE_BUS_NAME(CHAIN.SHIFT_ENABLE[S].ID,BUS,BIT1,BIT2);
    FIND_PRIMARY_PIN(BUS,BIT1,PTYPE,INDEX_I,INDEX_O);

      IF INDEX_I <= 0 THEN
      BEGIN
        ERROR ('SHIFT_ENABLE not found.');
        WRITELN('SHIFT_ENABLE >> ',CHAIN.SHIFT_ENABLE[S].ID.CHARS^:CHAIN.SHIFT_ENABLE[S].ID.LEN);
      END
      ELSE
```

```
      BEGIN
        CHAIN.SHIFT_ENABLE[S]:=PRIMARY_INPINS[INDEX_I];
        CHAIN.SHIFT_ENABLE[S].NET^.VALUE:=TRUE;
      END;
    END;
  END;

END; { DO_SIM_SETUP }
{* * * * * * * * * * * * * * * * * * * * * * * * * * * * * * * * * * * * * * *}
PROCEDURE PERFORM_SIMULATION(IN OUT CHAIN:CHAIN_REC);
CONST LEEWAY = 10; SIM_INIT_TIME = -6;
VAR I,S,RANK,STATE_EVAL_TIME,SIM_TIME:INTEGER16;
  INITIALIZING:BOOLEAN;
  {*    *    *    *    *    *    *    *    *    *    *    *    *    *    *    *    *    *    *    *}
  PROCEDURE   FIND_SIM_STATE_EQN(IN ID:DYNAMIC_STRING_T; IN INST:INST_ARRAY; IN OUT INDEX:INTEGER16);
  VAR I:INTEGER16;
  BEGIN { FIND_SIM_STATE_EQN}
    INDEX:=1;

    FOR I:= 1 TO CHAINS[C].LEN DO
    BEGIN
      IF CHAINS[C].STATES[I]^.INST[1] = INST[1] THEN
      BEGIN
        IF EQUIV(CHAINS[C].STATES[I]^.ID, ID) THEN
        BEGIN
          INDEX:=I;
          RETURN;
        END;
      END;
    END;

    { PROBLEMS ! }

  ERROR ('State not found in CHAINS[C].STATES.');
  WRITELN('STATE >>',ID.CHARS^:ID.LEN);

END;  { FIND_SIM_STATE_EQN}
{*    *    *    *    *    *    *    *    *    *    *    *    *    *    *    *    *    *    *    *}

Procedure FIND_SIM_LATCH_eqn(IN EQN_NAME:dynamic_string_t;
                            OUT INDEX:INTEGER);
VAR I:INTEGER;
Begin {FIND_SIM_LATCH_eqn}
  {Look for LATCH_NAME in LATCH_EQNS.  }

  INDEX:= 1;
  FOR I:= 1 TO NSIM_LATCH_EQNS DO
  BEGIN
    IF EQUIV(SIM_LATCH_EQNS[I]^.ID,EQN_NAME) THEN
    BEGIN
      INDEX:=I;
      RETURN;
    END;
  END;
```

```
{  PROBLEMS! }

  ERROR ('Latch not found in LATCH_EQNS.');
  WRITELN('LATCH >>',EQN_NAME.CHARS^:EQN_NAME.LEN);

End;  {FIND_SIM_LATCH_eqn}
{*   *   *   *   *   *   *   *   *   *   *   *   *   *   *   *   *   *   *   *}
FUNCTION VALUE(IN P:LINK; IN INST:INST_ARRAY):BOOLEAN;
VAR A,B:BOOLEAN;
  INDEX:INTEGER16;
BEGIN {VALUE}
  IF P <> NIL THEN
  BEGIN

    IF P^.DATA.TYPE_ID = OPERATOR_ID THEN
    BEGIN
      CASE P^.DATA.ID.CHARS^[1] OF
        '+' : BEGIN
                VALUE:= VALUE( P^.LLINK, INST) OR VALUE(P^.RLINK, INST);

              END;
        '@' : BEGIN
                A:= VALUE(P^.LLINK, INST);
                B:= VALUE(P^.RLINK, INST);

                VALUE:= (A AND NOT B) OR (NOT A AND B)
              END;
        '*' : BEGIN
                VALUE:= VALUE( P^.LLINK, INST) AND VALUE(P^.RLINK, INST);
              END;

        '''' : BEGIN
                 VALUE:= NOT VALUE(P^.LLINK, INST);
               END;

        OTHERWISE  BEGIN
                     ERROR ('Illegal operator.');
                     WRITELN('>>',p^.data.id.CHARS^:P^.DATA.ID.LEN);
                   END;

      END; {CASE}

    END
    ELSE
    BEGIN

      IF P^.DATA.TYPE_ID = PIN_ID THEN
      BEGIN
        FIND_DATA_IN_INST_IN_LIST(P^.DATA,INST,INDEX);
        VALUE:= NET_EQNS[INDEX]^.VALUE;
      END
      ELSE IF P^.DATA.TYPE_ID = LATCH_ID THEN
      BEGIN
```

```
        FIND_SIM_LATCH_EQN(P^.DATA.ID,INDEX);
        VALUE:= SIM_LATCH_EQNS[INDEX]^.VALUE;
      END
      ELSE {STATE_ID}
      BEGIN
        FIND_SIM_STATE_EQN(P^.DATA.ID,INST,INDEX);
        {%DEBUG  WRITELN('STATE=',P^.DATA.ID.CHARS^:P^.DATA.ID.LEN);}
        VALUE:=CHAINS[C].STATES[INDEX]^.VALUE;
      END;

    END;

  END;

END; {VALUE}
(*   *   *   *   *   *   *   *   *   *   *   *   *   *   *   *   *   *   *   *)
PROCEDURE EVALUATE_STATE_EQNS(IN SIM_TIME:INTEGER16; IN  INITIALIZING:BOOLEAN);
VAR I:INTEGER16;
   OLD_STATE:BOOLEAN;
BEGIN {EVALUATE_STATE_EQNS}
  STATE_EVAL_TIME:=SIM_TIME;

  FOR I:= 1 TO CHAINS[C].LEN DO
  BEGIN

    OLD_STATE:=CHAINS[C].STATES[I]^.VALUE;
    CHAINS[C].STATES[I]^.VALUE := VALUE( CHAINS[C].STATES[I]^.EQN, CHAINS[C].STATES[I]^.INST );

    { If VALUE goes high after initialization is complete, record SIM_TIME in RANK. }

    IF NOT INITIALIZING AND NOT OLD_STATE AND CHAINS[C].STATES[I]^.VALUE THEN
      CHAINS[C].STATES[I]^.RANK:=SIM_TIME;

  END;

  FOR I:= 1 TO NSIM_LATCH_EQNS DO
  BEGIN
    SIM_LATCH_EQNS[I]^.VALUE := VALUE( SIM_LATCH_EQNS[I]^.EQN, SIM_LATCH_EQNS[I]^.INST);
  END;

END; {EVALUATE_STATE_EQNS}

(*   *   *   *   *   *   *   *   *   *   *   *   *   *   *   *   *   *   *   *)

BEGIN {PERFORM_SIMULATION}
  SIM_TIME:=SIM_INIT_TIME;
  STATE_EVAL_TIME:=SIM_TIME-1;
  INITIALIZING:=TRUE;

  { Initialize outputs of flip flops and latches to correct value. }
  FOR I:= 1 TO NSIM_NETS DO
  BEGIN

    IF SIM_NETS[I]^.RANK > MAX_STATE_RANK THEN
      SIM_NETS[I]^.VALUE := VALUE( SIM_NETS[I]^.EQN, SIM_NETS[I]^.INST );
  END;
```

```
{ Calculate the value for all nets.
  Stop when sdo goes high or too
  many iterations have been performed.}

REPEAT
BEGIN
  SIM_TIME:=SIM_TIME+1;

  IF SIM_TIME = 1 THEN
  BEGIN
    CHAIN.SDI.NET^.VALUE:=TRUE;
    INITIALIZING:=FALSE;
  END;

  FOR I:= 1 TO NSIM_NETS DO
  BEGIN

    IF (SIM_NETS[I]^.RANK = MAX_STATE_RANK) AND
       (SIM_TIME <> STATE_EVAL_TIME) THEN
      EVALUATE_STATE_EQNS(SIM_TIME,INITIALIZING);

    IF SIM_NETS[I]^.RANK <> 0 THEN
      SIM_NETS[I]^.VALUE := VALUE( SIM_NETS[I]^.EQN, SIM_NETS[I]^.INST );

  END;

  IF DUMP_SIM THEN
  BEGIN
    WRITELN('************** SIM_TIME = ',SIM_TIME:-1,' ****************');
    DUMP_SIM_NETS;
    DUMP_SIM_STATE_EQNS;
    DUMP_SIM_LATCH_EQNS;
  END;


  IF SIM_TIME = 3 THEN CHAIN.SDI.NET^.VALUE:=FALSE;
  CHAIN.CLK.NET^.VALUE:= NOT  CHAIN.CLK.NET^.VALUE; { Toggle clock. }

END
UNTIL (CHAIN.SDO.NET^.VALUE = TRUE) OR (SIM_TIME > CHAIN.LEN + LEEWAY );

IF CHAIN.SDO.NET^.VALUE <> TRUE THEN
BEGIN
  ERROR ('Unable to shift chain piece.');
  WRITELN('SDO >>',CHAIN.SDO.ID.CHARS^:CHAIN.SDO.ID.LEN);
END;

LAST_SIM_TIME:=MAX(SIM_TIME,LAST_SIM_TIME);

END; {PERFORM_SIMULATION}
{* * * * * * * * * * * * * * * * * * * * * * * * * * * * * * * * * * * * * * *}
Procedure ORDER_STATES;
VAR I,J,RANK:INTEGER16;
  TEMP:PTR_NETEQN;
```

```
Begin {ORDER_STATES}

  {Arrange CHAINS[C].STATES in order of INCREASING rank.}

  {NOTE: RANK was set by the SIM_TIME at which
   the corresponding state went high.  Because
   no two states should go high at the same time,
   equivalent RANKs is an error.}

{ Change STATES with a RANK of 0 to have a higher RANK than any other
  STATE.  Then they will be at the end of the list after the sort
  and can be deleted easily. STATES where RANK = 0 are not on this chain piece.}


FOR I:= 1 TO CHAINS[C].LEN DO
BEGIN
  IF CHAINS[C].STATES[I]^.RANK = 0 THEN
  BEGIN
    CHAINS[C].STATES[I]^.RANK := LAST_SIM_TIME+1;
  END;
END;


FOR I:= 1 TO CHAINS[C].LEN-1 DO
BEGIN
  FOR J:= I+1 TO CHAINS[C].LEN DO
  BEGIN
    IF CHAINS[C].STATES[J]^.RANK < CHAINS[C].STATES[I]^.RANK THEN
    BEGIN
      TEMP:=CHAINS[C].STATES[I];
      CHAINS[C].STATES[I]:=CHAINS[C].STATES[J];
      CHAINS[C].STATES[J]:=TEMP;
    END;
  END;
END;

FOR I:= 1 TO CHAINS[C].LEN DO
BEGIN
  IF CHAINS[C].STATES[I]^.RANK = LAST_SIM_TIME+1 THEN
  BEGIN
    CHAINS[C].LEN:=I-1;
    EXIT;
  END;
END;

{ Run through the states again to do some error checking. }


FOR I:= 1 TO CHAINS[C].LEN-1 DO
BEGIN
  IF (CHAINS[C].STATES[I]^.RANK = CHAINS[C].STATES[I+1]^.RANK) then
  BEGIN
    WARNING ('Two states went high at the same time while chain simulation was in progress.');
    WRITELN('>>',CHAINS[C].STATES[I]^.ID.CHARS^:CHAINS[C].STATES[I]^.ID.LEN,
```

```
            ', and >>',CHAINS[C].STATES[I+1]^.ID.CHARS^:CHAINS[C].STATES[I+1]^.ID.LEN,', SIMTIME=',CHAINS[C].STATES[I]^.RANK:-1);
    END
    ELSE IF (CHAINS[C].STATES[I]^.RANK <> CHAINS[C].STATES[I+1]^.RANK-1) THEN
    BEGIN
      WARNING ('Gap in chain between:');
      WRITELN('>>',CHAINS[C].STATES[I]^.ID.CHARS^:CHAINS[C].STATES[I]^.ID.LEN,
            ', and >>',CHAINS[C].STATES[I+1]^.ID.CHARS^:CHAINS[C].STATES[I+1]^.ID.LEN);
      {   MSG ('May be due to inverted logic--CHECK BLM FOR VALIDITY.');}
      MSG ('CHECK BLM FOR VALIDITY.');
    END;

  END;


  {%DEBUG  DUMP_SIM_STATE_EQNS;}
End; {ORDER_STATES}
{*   *   *   *   *   *   *   *   *   *   *   *   *   *   *   *   *   *   *   *}
PROCEDURE REORGANIZE_STATE_EQNS;
VAR S,C:INTEGER16;
BEGIN {REORGANIZE_STATE_EQNS}

    { Reset the VALUE bit to FALSE. Then use the
      VALUE bit to indicate whether that particular
      STATE_EQN was on a chain.}


    FOR S:= 1 TO NSTATES DO
    BEGIN
      STATE_EQNS[S]^.VALUE:=FALSE;
    END;

    FOR C:= 1 TO NCHAINS DO
    BEGIN

      FOR S:= 1 TO CHAINS[C].LEN DO
      BEGIN
        IF CHAINS[C].STATES[S]^.VALUE = FALSE THEN
        BEGIN
          CHAINS[C].STATES[S]^.VALUE := TRUE;
        END
        ELSE
        BEGIN
          ERROR ('Flip flop appears on more than one chain piece.');
          WRITELN('State id >>',CHAINS[C].STATES[S]^.ID.CHARS^:CHAINS[C].STATES[S]^.ID.LEN);
        END;

      END;
    END;

    NEW_NSTATES:=0;

    FOR S:= 1 TO NSTATES DO
```

```
    BEGIN
      IF STATE_EQNS[S]^.VALUE = FALSE THEN
      BEGIN
        NEW_NSTATES:=NEW_NSTATES+1;

        WRITELN('State id >>',STATE_EQNS[S]^.ID.CHARS^:STATE_EQNS[S]^.ID.LEN);
        WARNING ('Flip flop does NOT appear on any chain piece.');

        NEW_STATE_EQNS[NEW_NSTATES]:=STATE_EQNS[S];

      END;
    END;

    {%DEBUG WRITELN('NEW_NSTATES =',NEW_NSTATES:-1);}

  END; {REORGANIZE_STATE_EQNS}
  {*   *   *   *   *   *   *   *   *   *   *   *   *   *   *   *   *   *   *}
BEGIN {FIND_CHAIN_ORDER}
  IF NCHAINS <= 0 THEN
  BEGIN
    NEW_NSTATES := NSTATES;
    FOR I:=1 TO NEW_NSTATES DO
      NEW_STATE_EQNS[I]:=STATE_EQNS[I];
    RETURN;
  END;

  NEW_STRING_I(BUS);
  LAST_SIM_TIME:=0;

  { Trace each chain.}

  FOR C:= 1 TO NCHAINS DO
  BEGIN
    DO_SIM_SETUP(CHAINS[C]);

     IF NOT CHAINS[C].SDO.NET^.VALID THEN
       NEXT;

     IF ERROR_COUNT <= 0 THEN
       PERFORM_SIMULATION(CHAINS[C]);

     ORDER_STATES;

     IF DUMP_SIM THEN
     BEGIN
       DUMP_SIM_NETS;
       DUMP_SIM_STATE_EQNS;
       DUMP_SIM_LATCH_EQNS;
     END;

  END;

  REORGANIZE_STATE_EQNS;
```

```
  IF DUMP_SIM THEN
  BEGIN
    DUMP_SIM_NETS;
    DUMP_SIM_STATE_EQNS;
    DUMP_SIM_LATCH_EQNS;
  END;

  DISPOSE_STRING_T(BUS);
END; {FIND_CHAIN_ORDER}
{********************************************************************************}
{********************************************************************************}
Begin { M A I N   P R O G R A M  GENBLM }

  {%debug MSG('M A I N   P R O G R A M  REACHED!');}
  Initialize;
  IF GEN_SCHEMATICS THEN
    GENERATE_LIB_SCHEMATICS
  ELSE
  BEGIN
    Define_internal_logic;
    IF ERROR_COUNT <= 0 THEN
    BEGIN
      Rank_equations;
      {Minimize_equations;}
      FIND_CHAIN_ORDER;
      IF ERROR_COUNT <= 0 THEN
        Generate_files;
    END;
  Terminate(Normal);
  END;
  abort:
End.
```

What is claimed is:

1. An automatic machine-implemented method for creating a stored high order software representation of a logical circuit design, said method comprising the steps of:

providing a stored macrocell definition library comprised of a plurality of different macrocells, each macrocell having at least one input and one output and being represented in said library by one or more logical equations defining the logical functioning between the macrocell inputs and outputs;

providing a stored bottom-up software representation of a logical circuit design comprised of macrocell connectivity data defining a predetermined connectivity between particular ones of said macrocells; and automatically converting said stored bottom-up software representation into a stored behavioral software representation comprised of a plurality of net equation representations derived by linking the logical equations corresponding to said particular ones of said macrocells as prescribed by said connectivity data.

2. The invention in accordance with claim 1, wherein the step of converting includes ranking said net equation representations in an order which takes into account the evaluation sequencing thereof as indicated by said connectivity data.

3. The invention in accordance with claim 2, wherein the step of converting also includes assigning delay values to one or more logical circuit outputs so as to take into account the propagation delays of said cells.

4. The invention in accordance with claim 1, including the step of simulating the operation of said logical circuit design using said behavioral software representation.

5. The invention in accordance with claim 1, wherein said behavioral software representation produced by the step of automatically converting is a PASCAL-based representation.

6. The invention in accordance with claim 1, wherein one or more of said macrocells contain internal storage, wherein each such macrocell has a corresponding logical equation in said library for each internal state of the macrocell, and wherein said net equation representations include state equation representations derived therefrom.

7. The invention in accordance with claim 1, wherein the step of providing a stored bottom-up software representation of a logical circuit design includes providing a plurality of such stored bottom-up software representations corresponding to particular logical circuit designs along with connectivity data representative of the manner in which these particular logical circuit designs are to be interconnected, and wherein the step of automatically converting provides an overall stored behavioral software representation corresponding to the logical circuit designs and their interconnection.

* * * * *